US010224391B2

(12) United States Patent
Tamagawa et al.

(10) Patent No.: US 10,224,391 B2
(45) Date of Patent: *Mar. 5, 2019

(54) CHIP RESISTOR AND ELECTRONIC EQUIPMENT HAVING RESISTANCE CIRCUIT NETWORK

(71) Applicant: ROHM CO., LTD., Kyoto (JP)

(72) Inventors: Hiroshi Tamagawa, Kyoto (JP); Yasuhiro Kondo, Kyoto (JP); Yasuhiro Fuwa, Kyoto (JP); Hiroyuki Okada, Kyoto (JP); Eiji Nukaga, Kyoto (JP); Katsuya Matsuura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,592

(22) Filed: Jul. 12, 2017

(65) Prior Publication Data

US 2017/0365655 A1 Dec. 21, 2017

Related U.S. Application Data

(63) Continuation of application No. 14/956,939, filed on Dec. 2, 2015, now Pat. No. 9,735,225, which is a (Continued)

(30) Foreign Application Priority Data

Sep. 29, 2011 (JP) ................................ 2011-214761
Sep. 29, 2011 (JP) ................................ 2011-214762
(Continued)

(51) Int. Cl.
*H01L 49/02* (2006.01)
*H01L 27/08* (2006.01)
(Continued)

(52) U.S. Cl.
CPC .............. *H01L 28/20* (2013.01); *H01C 1/14* (2013.01); *H01C 13/02* (2013.01);
(Continued)

(58) Field of Classification Search
CPC ........ H01C 1/14; H01C 13/02; H01C 17/006; H01C 17/242; H01L 28/20; H01L 21/3065; H01L 21/3083; H01L 27/0676
(Continued)

(56) References Cited

U.S. PATENT DOCUMENTS 4,152,689 A 5/1979 Thompson
4,228,418 A 10/1980 Piedmont et al.
(Continued)

FOREIGN PATENT DOCUMENTS

CN 1162825 A 10/1997
CN 201936709 U 8/2011
(Continued)

*Primary Examiner* — Kyung Lee
(74) *Attorney, Agent, or Firm* — Rabin & Berdo, P.C.

(57) ABSTRACT

A compact and refined chip resistor, with which a plurality of types of required resistance values can be accommodated readily with the same design structure, was desired. The chip resistor is arranged to have a resistor network on a substrate. The resistor network includes a plurality of resistor bodies arrayed in a matrix and having an equal resistance value. A plurality of types of resistance units are respectively arranged by one or a plurality of the resistor bodies being connected electrically. The plurality of types of resistance units are connected in a predetermined mode using connection conductor films and fuse films. By selectively fusing a fuse film, a resistance unit can be electrically incorporated into the resistor network or electrically separated from the resistor network to make the resistance value of the resistor network the required resistance value.

13 Claims, 150 Drawing Sheets

1

Related U.S. Application Data continuation of application No. 14/348,581, filed as application No. PCT/JP2012/075029 on Sep. 28, 2012, now Pat. No. 9,224,731.

(30) Foreign Application Priority Data

| | | |
|---|---|---|
| Sep. 29, 2011 | (JP) | 2011-214763 |
| Sep. 29, 2011 | (JP) | 2011-214764 |
| Sep. 29, 2011 | (JP) | 2011-214765 |
| Sep. 29, 2011 | (JP) | 2011-214766 |
| Sep. 29, 2011 | (JP) | 2011-214767 |
| Dec. 28, 2011 | (JP) | 2011-289281 |
| Sep. 21, 2012 | (JP) | 2012-208513 |

(51) Int. Cl.

| | |
|---|---|
| ***H01L 27/06*** | (2006.01) |
| ***H01L 21/308*** | (2006.01) |
| ***H01C 1/14*** | (2006.01) |
| ***H01C 13/02*** | (2006.01) |
| ***H01L 21/3065*** | (2006.01) |
| *H01C 17/242* | (2006.01) |
| *H01C 17/00* | (2006.01) |
| *H05K 3/34* | (2006.01) |

(52) U.S. Cl.

CPC ...... *H01L 21/3065* (2013.01); *H01L 21/3083* (2013.01); *H01L 27/0676* (2013.01); *H01L 27/0802* (2013.01); *H01C 17/006* (2013.01); *H01C 17/242* (2013.01); *H05K 3/3431* (2013.01); *H05K 2201/10674* (2013.01)

(58) Field of Classification Search

USPC .......................................................... 338/195

See application file for complete search history.

(56) References Cited

U.S. PATENT DOCUMENTS

| | | | |
|---|---|---|---|
| 4,401,966 A | 8/1983 | Ohmura et al. | |
| 4,792,781 A | 12/1988 | Takahashi et al. | |
| 5,548,269 A | 8/1996 | Katsuno et al. | |
| 5,844,468 A | 12/1998 | Doi et al. | |
| 6,084,502 A | 7/2000 | Ariga et al. | |
| 6,507,272 B1 | 1/2003 | Nicholson et al. | |
| 6,529,116 B2 | 3/2003 | Van Den Broek et al. | |
| 7,737,817 B2 | 6/2010 | Tuinhout et al. | |
| 7,764,109 B2 | 7/2010 | Goto | |
| 7,889,048 B2 | 2/2011 | Owen et al. | |
| 8,154,379 B2 | 4/2012 | Theissl et al. | |
| 9,224,731 B2 * | 12/2015 | Tamagawa | H01L 27/0802 |
| 9,514,867 B2 | 12/2016 | Harada et al. | |
| 2002/0026706 A1 | 3/2002 | Kurita | |
| 2002/0118094 A1 | 8/2002 | Kambara et al. | |
| 2004/0041278 A1 | 3/2004 | Akhtman et al. | |
| 2008/0048823 A1 | 2/2008 | Ueki et al. | |
| 2015/0084487 A1 | 3/2015 | Mori et al. | |

FOREIGN PATENT DOCUMENTS

| | | |
|---|---|---|
| JP | S48-70896 A | 9/1973 |
| JP | S59-121854 A | 7/1984 |
| JP | H01-164001 A | 6/1989 |
| JP | H03-181103 A | 8/1991 |
| JP | H05-085776 A | 4/1993 |
| JP | H07-249501 A | 9/1995 |
| JP | H10-135016 A | 5/1998 |
| JP | 2001-044001 A | 2/2001 |
| JP | 2001-076912 A | 3/2001 |
| JP | 2002-164369 A | 6/2002 |
| JP | 2003-109844 A | 4/2003 |
| JP | 2003-158002 A | 5/2003 |
| JP | 2006-344776 A | 12/2006 |
| JP | 2007-088162 A | 4/2007 |
| JP | 2009-038281 A | 2/2009 |
| JP | 2009-231359 A | 10/2009 |
| JP | 2010-165780 A | 7/2010 |
| JP | 2011-044613 A | 3/2011 |
| WO | WO 2008-149622 A1 | 12/2008 |

* cited by examiner

CHIP RESISTOR AND ELECTRONIC EQUIPMENT HAVING RESISTANCE CIRCUIT NETWORK

CROSS-REFERENCE TO RELATED APPLICATION

This is a continuation of U.S. application Ser. No. 14/956,939, filed on Dec. 2, 2015, and allowed on Apr. 10, 2017, which is a continuation of U.S. application Ser. No. 14/348,581, filed on Mar. 28, 2014 (issued on Dec. 29, 2015 as U.S. Pat. No. 9,224,731), which was a National Stage application of PCT/JP2012/075029, filed on Sep. 28, 2012, and claims the benefit of priority of Japanese Patent Application No. 2011-214767, filed on Sep. 29, 2011, No. 2011-214765, filed on Sep. 29, 2011, No. 2011-214761, filed on Sep. 29, 2011, No. 2011-214762, filed on Sep. 29, 2011, No. 2011-214763, filed on Sep. 29, 2011, No. 2011-214764, filed Sep. 29, 2011, No. 2011-214766, filed Sep. 29, 2011, No. 2011-289281, filed Dec. 28, 2011, and No. 2012-208513, filed Sep. 21, 2012. The disclosures of these prior U.S. and foreign applications are incorporated herein by reference.

FIELD OF THE ART

The present invention relates to a chip resistor as a discrete part and to an electronic device having a resistor network.

BACKGROUND ART

Conventionally, a chip resistor has an arrangement that includes an insulating substrate, made of ceramic, etc., a resistive film formed by screen printing a material paste on a top surface of the insulating substrate, and electrodes connected to the resistive film. To set the resistance value of the chip resistor to a target value, a laser trimming of irradiating a laser beam to engrave a trimming groove in the resistive film is performed. More specifically, a method of engraving the trimming groove while measuring the resistance value of the resistive film until the measured value becomes the target value is adopted (see Patent Document 1).

PRIOR ART DOCUMENT

Patent Document

PATENT DOCUMENT 1: Japanese Unexamined Patent Publication No. 2001-76912

SUMMARY OF THE INVENTION

Problem to be Solved by the Invention

With the conventional chip resistor, the resistive film is formed by screen printing, etc., on the top surface of the insulating substrate made of ceramic, etc. In forming the resistive film, although a resistive film of the target resistance value is designed, the resistive film that is actually printed deviates from the target resistance value and the resistance value is thus adjusted to the target value by laser trimming. A wide range of resistance values thus cannot be accommodated. The present invention has been made under the above background and a main object thereof is to provide a novel chip resistor having a resistor network on a substrate and differing in arrangement from the conventional chip resistor.

Another object of the present invention is to provide an electronic device having a resistor network, with which a plurality of types of required resistance values can readily be accommodated by structures of the same design.

Means for Solving the Problem

A first aspect of the present invention provides a chip resistor including a substrate, a first connection electrode and a second connection electrode formed on the substrate, and a resistor network formed on the substrate and having one end side connected to the first connection electrode and another end side connected to the second connection electrode, the resistor network including a plurality of resistor bodies arrayed in a matrix on the substrate and having an equal resistance value, a plurality of types of resistance units each arranged from one or a plurality of the resistor bodies being connected electrically, a network connection means connecting the plurality of types of resistance units in a predetermined mode, and a plurality of fuse films respectively provided in correspondence to each individual resistance unit, the plurality of fuse films electrically incorporating the corresponding resistance unit into the resistor network or being capable of being fused to electrically separate the corresponding resistance unit from the resistor network.

A second aspect of the present invention provides the chip resistor according to the first aspect, where the resistor bodies include a resistive film line extending on the substrate and conductor films laminated on the resistive film line while being spaced apart by fixed intervals in the line direction, and a single resistor body is arranged from the resistive film line of the fixed interval portion on which the conductor film is not laminated.

A third aspect of the present invention provides the chip resistor according to the second aspect, where the conductor films of the resistor bodies, connection conductor films included in the resistance units, connection conductor films included in the network connection means, and the fuse films include metal films of the same material formed on the same layer.

A fourth aspect of the present invention provides the chip resistor according to any one of the first to third aspects, where the resistance units include a resistance unit with which a plurality of the resistor bodies are connected in series.

A fifth aspect of the present invention provides the chip resistor according to any one of the first to third aspects, where the resistance units include a resistance unit with which a plurality of the resistor bodies are connected in parallel.

A sixth aspect of the present invention provides the chip resistor according to any one of the first to fifth aspects, where the numbers of resistor bodies are set in the plurality of types of resistance units and the resistance values of resistance units form a geometric progression with respect to each other.

A seventh aspect of the present invention provides the chip resistor according to any one of the first to sixth aspects, where the network connection means includes connection conductive films connecting the plurality of types of resistance units in series.

An eighth aspect of the present invention provides the chip resistor according to any one of the first to seventh aspects, where the network connection means includes connection conductive films connecting the plurality of types of resistance units in parallel.

A ninth aspect of the present invention provides the chip resistor according to any one of the first to eighth aspects, where the plurality of fuse films are arrayed rectilinearly along one end of the matrix array of the plurality of resistor bodies.

A tenth aspect of the present invention provides the chip resistor according to the first aspect, where the resistance units include a reference resistance unit that is arranged by connecting a predetermined number of resistor bodies and is incorporated in and cannot be separated from the resistor network.

An eleventh aspect of the present invention provides the chip resistor according to any one of the first to tenth aspects, where the resistive film line of the resistor body is formed of TiN, TiON, or TiSiON.

A twelfth aspect of the present invention provides the chip resistor according to any one of the second to eleventh aspects, where the resistive film line and the conductor films are formed by patterning collectively.

A thirteenth aspect of the present invention provides an electronic device including a substrate, a first connection electrode and a second connection electrode formed on the substrate, a resistor network formed on the substrate, the resistor network having a plurality of resistor bodies connected each other by a wiring film which has one end side connected to the first connection electrode and another end side connected to the second connection electrode, and a plurality of fuse films electrically incorporating the resistor bodies into the resistor network or being capable of being fused to electrically separate the resistor bodies from the resistor network.

A fourteenth aspect of the present invention provides the electronic device according to the thirteenth aspect, where the resistor bodies are made of TiON or TiSiON.

A fifteenth aspect of the present invention provides the electronic device according to the thirteenth or fourteenth aspect, where the resistor bodies and the wiring films are patterned collectively.

Effect(s) of the Invention

With the first aspect of the present invention, the resistor network can be formed on the substrate and a plurality of chip resistors of high quality can be manufactured in a single manufacturing process. Also, miniaturization of the resistor network can be achieved and the chip resistor can be made more compact than a conventional one because the resistor network is formed. Further, the resistor network includes the plurality of resistor bodies that are arrayed in a matrix and have an equal resistance value, and a change of the required resistance value can readily be accommodated by changing the mode of connection of the plurality of resistor bodies.

Further, a change of the required resistance value can also readily be accommodated by changing the mode of connection of the plurality of types of resistance units. Yet further, any fuse film among the plurality of fuse films may be fused to electrically incorporate a resistance unit into the resistor network or electrically separate the resistance unit from the resistor network to enable the resistance value of the resistor network to be adjusted and enable the resistance value of the chip resistor to match any of a plurality of types of required resistance values without changing the basic design. Chip resistors of the same basic design that are chip resistors with which the resistance values are set to the required resistance values can thereby be provided.

With the second aspect of the present invention, the plurality of resistor bodies, arrayed in a matrix and having an equal resistance value, respectively include the resistive film line and the conductor films laminated on the resistive film line while being spaced apart by the fixed interval in the line direction. The resistive film region on which the conductor film is not laminated thus functions as a single resistor body. The resistive film regions can be made to have the same shape with the same size by making the intervals of the laminated conductor films fixed intervals. By using the characteristic that the resistance values of the resistor bodies (resistive films) of the same shape with the same size formed on the substrate are substantially equal, a plurality of resistor bodies can be formed easily using a layout pattern in common.

With the third aspect of the present invention, the conductor films of the resistor bodies, the connection conductor film included in the resistance units, the connection conductor films included in the network connection means, and the fuse films can be formed easily at once in comparatively few processes as a plurality of types of metal films (conductor films) by forming a metal film on the same layer and removing unnecessary portions of the metal film by etching, etc.

With the fourth aspect of the present invention, a resistance unit is formed by connecting a plurality of the resistor bodies in series and therefore a resistance unit with a large resistance value can be arranged.

With the fifth aspect of the present invention, a resistance unit is formed by connecting a plurality of the resistor bodies in parallel and therefore resistance units with small resistance values and low error among resistance values can be arranged.

With the sixth aspect of the present invention, the resistance values of the resistance units form a geometric progression with respect to each other and the resistance values of the resistance units can thus be set to several types from a relatively small resistance value to a relatively large resistance value. Therefore, even when the resistance values required of the chip resistors are wide in range, the connection modes of the resistance units enable accommodation with the same design contents. With the seventh aspect of the present invention, a chip resistor with a large resistance value can be arranged by connecting the resistance units in series.

With the eighth aspect of the present invention, a chip resistor can be provided with which any of various required resistance values can be accommodated by finely adjusting the resistance value of the chip resistor by connecting the resistance units in parallel. With the ninth aspect of the present invention, the fuse films are arrayed rectilinearly along one end of the matrix array of the resistor bodies, and the chip resistor can thus be made easily applicable to a fusing process of selectively fusing the fuse films.

With the tenth aspect of the present invention, the chip resistor can be made a resistor that can be set easily in resistance value because the reference resistance unit is included. It is preferable in terms of manufacture to form the resistor bodies from TiN, TION, or TiSiON as in the eleventh aspect. By patterning the resistor body films and the conductor films collectively as in the twelfth aspect, the manufacturing process can be simplified and the circuit precision can also be improved.

With the thirteenth to fifteenth aspects of the present invention, by fusing any fuse film among the plurality of fuse films, a resistor body can be electrically incorporated in the resistor network or electrically separated from the resistor network to enable the resistance value of the resistor network to be adjusted and made to match any of a plurality of types of required resistance values without changing the basic design. Electronic devices, having resistor networks of the same basic design with the resistance values being set to the required resistance values, can thereby be provided.

BRIEF DESCRIPTION OF THE DRAWINGS

FIG. 68 is an illustrative diagram of the array relationships of the connection wiring films C and fuse films F connecting a plurality of types of resistance units in the resistor network 14 shown in FIG. 63 and the connection relationships of the plurality of types of resistance units connected to the connection wiring films C and fuse films F.

FIG. 69 is an electric circuit diagram of the resistor network 14.

Figure 70:
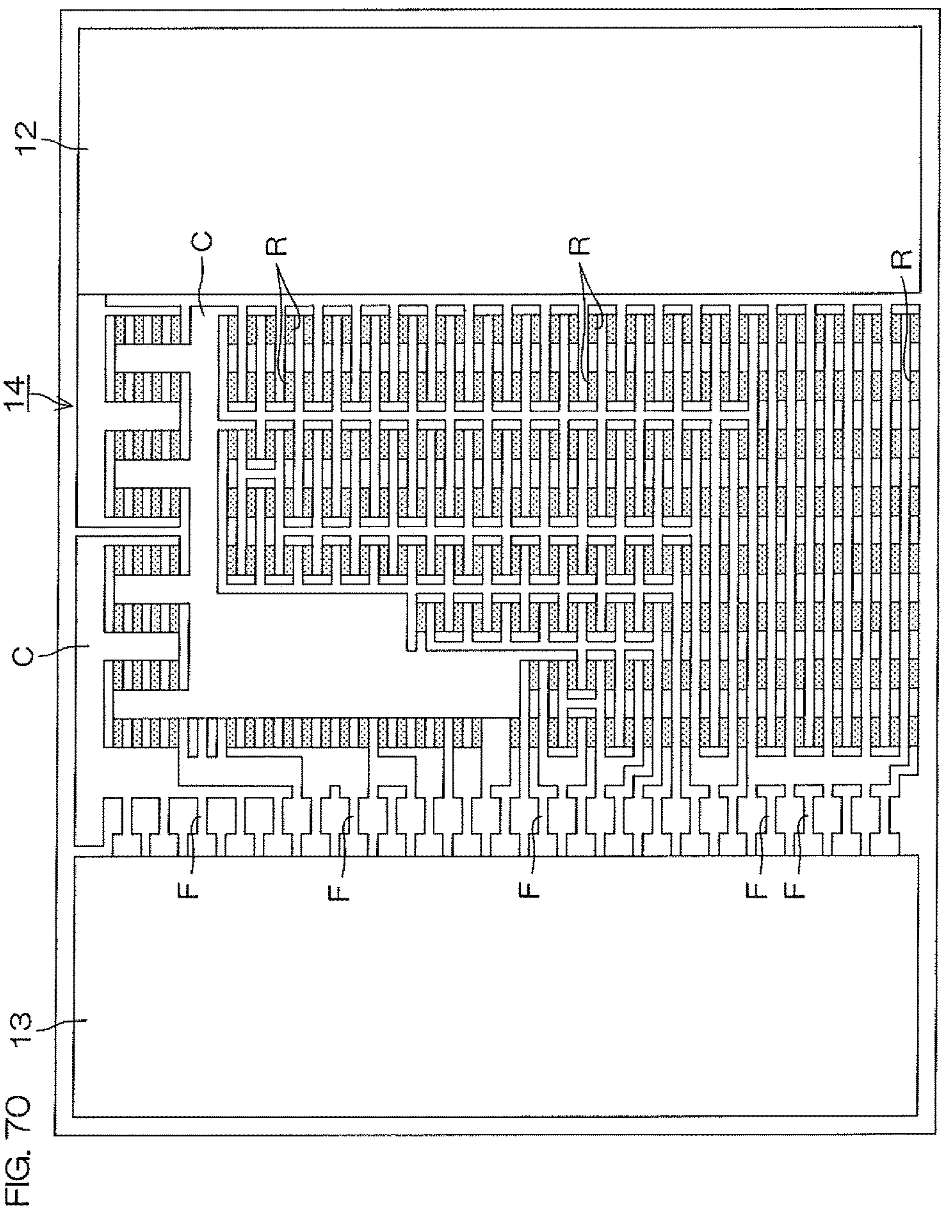

FIG. 70 is a plan view of a chip resistor 30 showing the positional relationships of the first connection electrode 12, the second connection electrode 13, and the resistor network 14 and showing the arrangement in a plan view of the resistor network 14.

Figure 71:
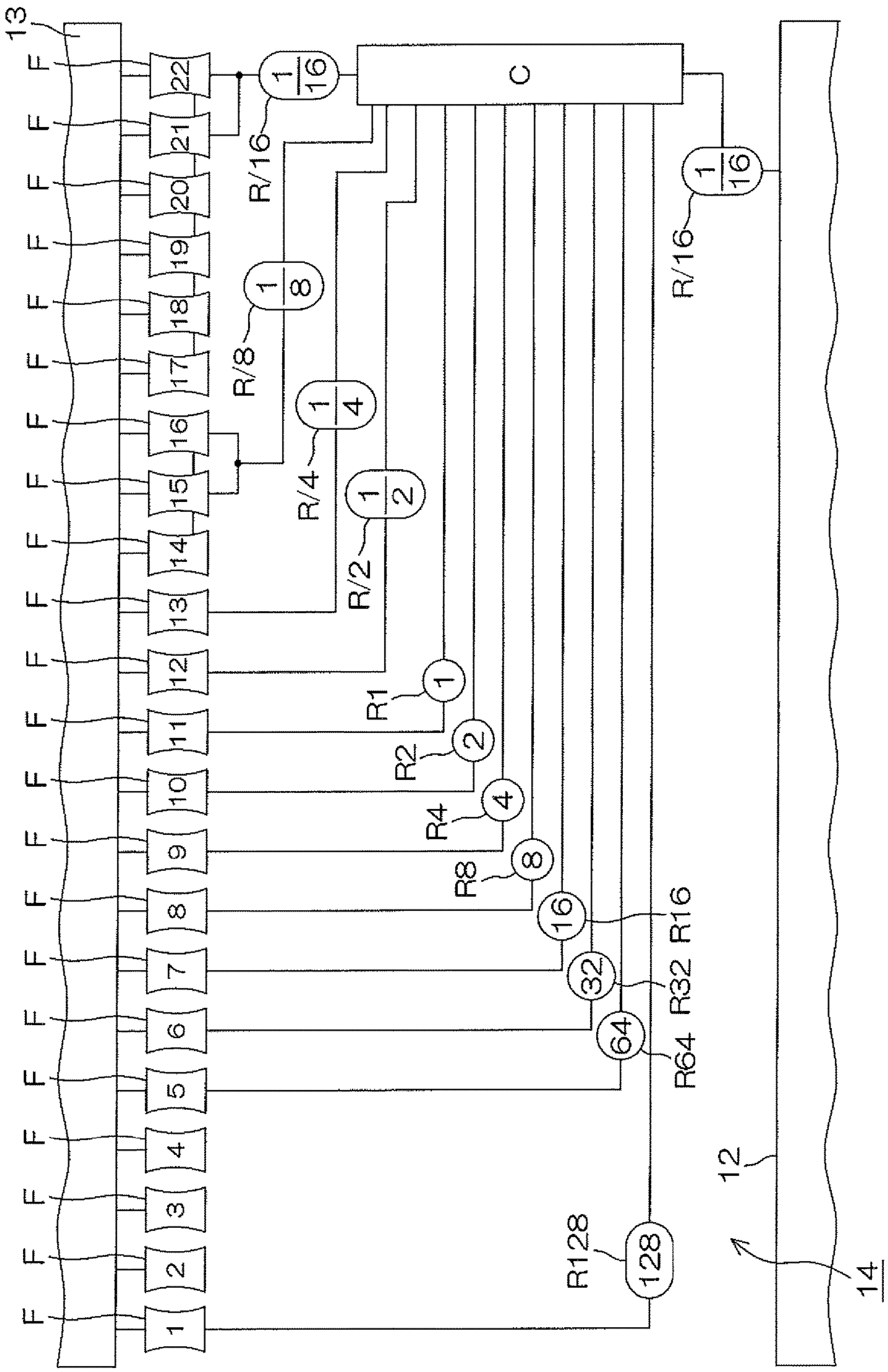

FIG. 71 is an illustrative diagram of the positional relationships of the connection wiring films C and the fuse films F connecting the plurality of types of resistance units in the resistor network 14 shown in FIG. 70 and the connection relationships of the plurality of types of resistance units connected to the connection wiring films C and fuse films F.

Figure 72:
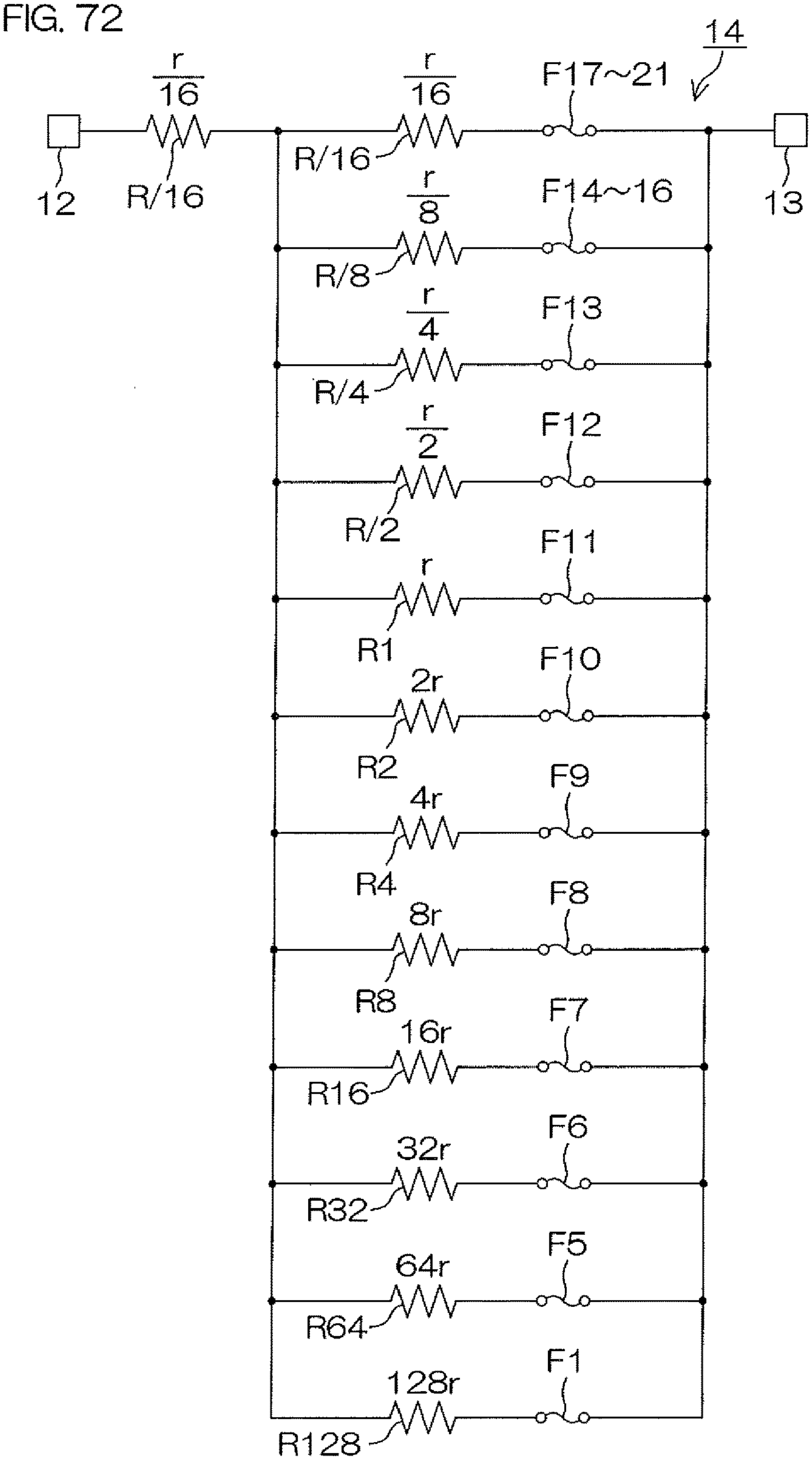

FIG. 72 is an electric circuit diagram of the resistor network 14.

Figure 73A:
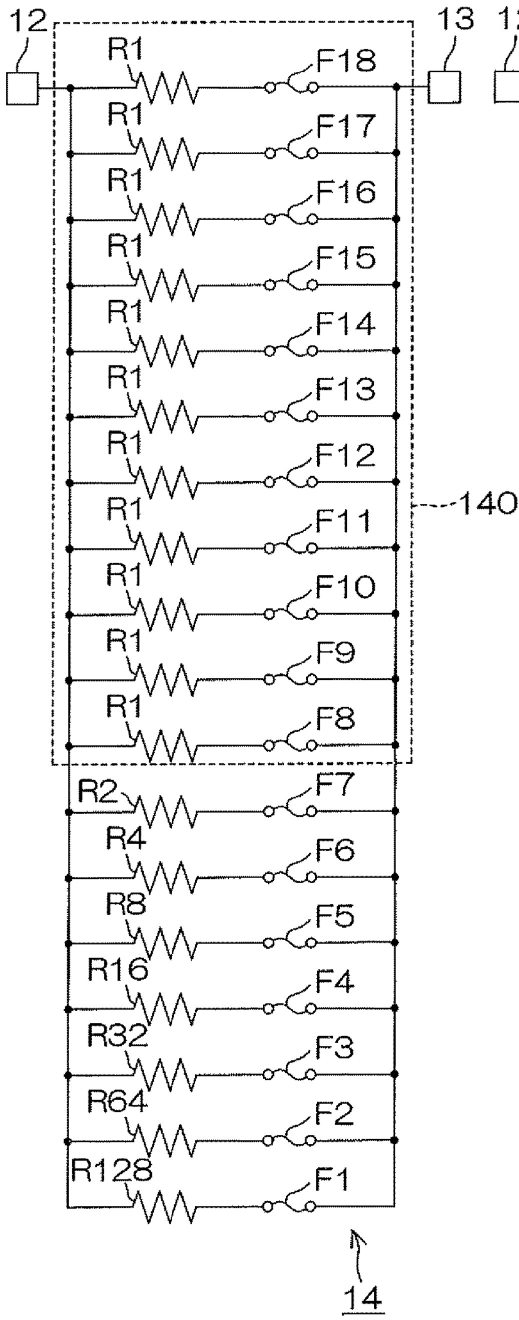

FIG. 73A is an electric circuit diagram of modification examples of the electric circuit shown in FIG. 72.

Figure 73B:
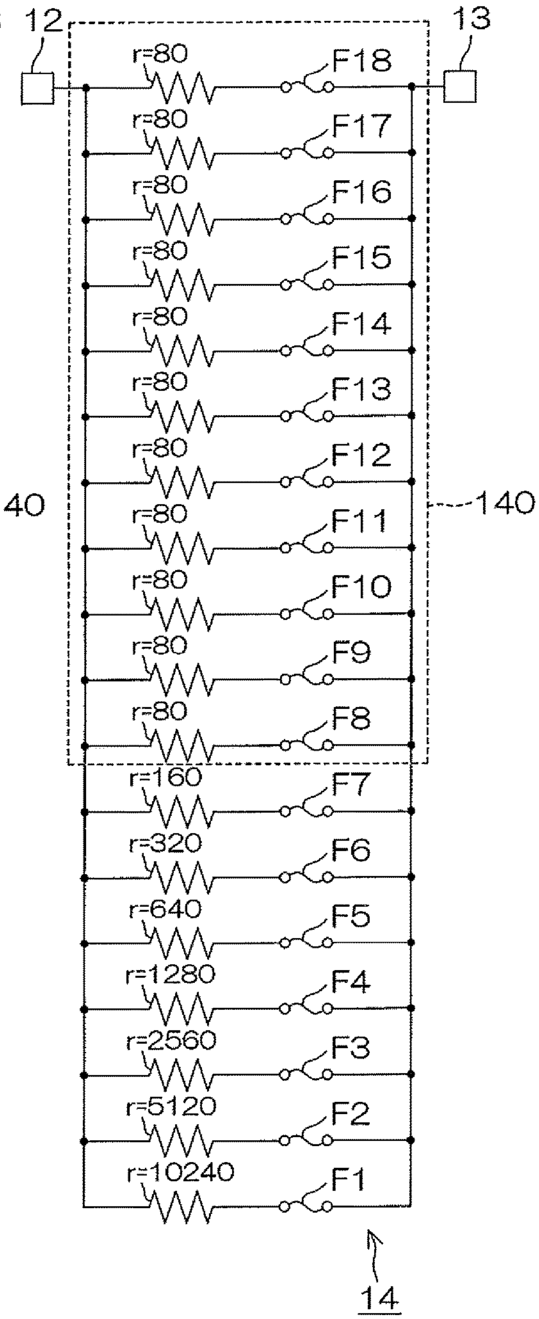

FIG. 73B is an electric circuit diagram of modification examples of the electric circuit shown in FIG. 72.

Figure 74:
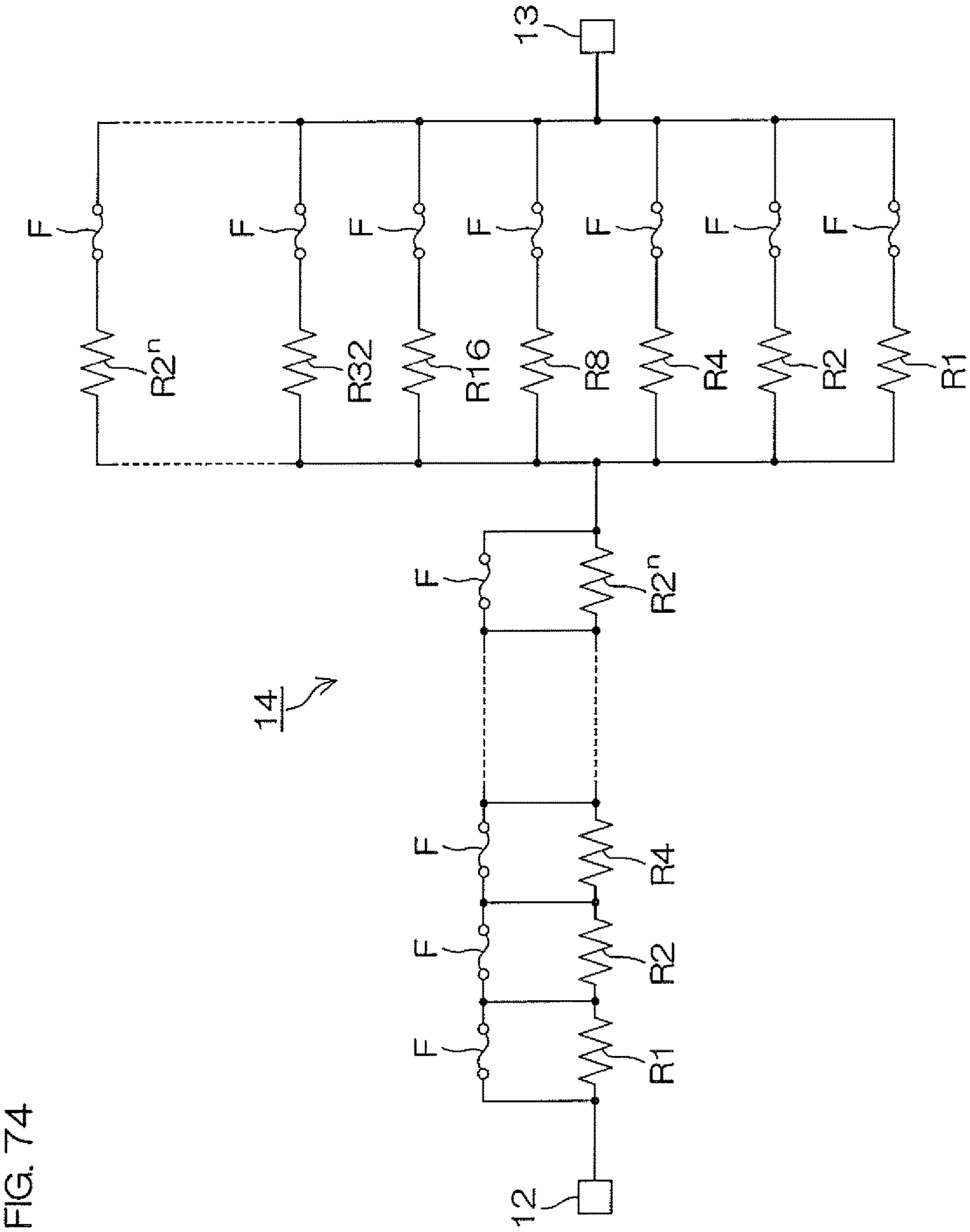

FIG. 74 is an electric circuit diagram of the resistor network 14 according to yet another preferred embodiment of the fourth reference example.

Figure 75:
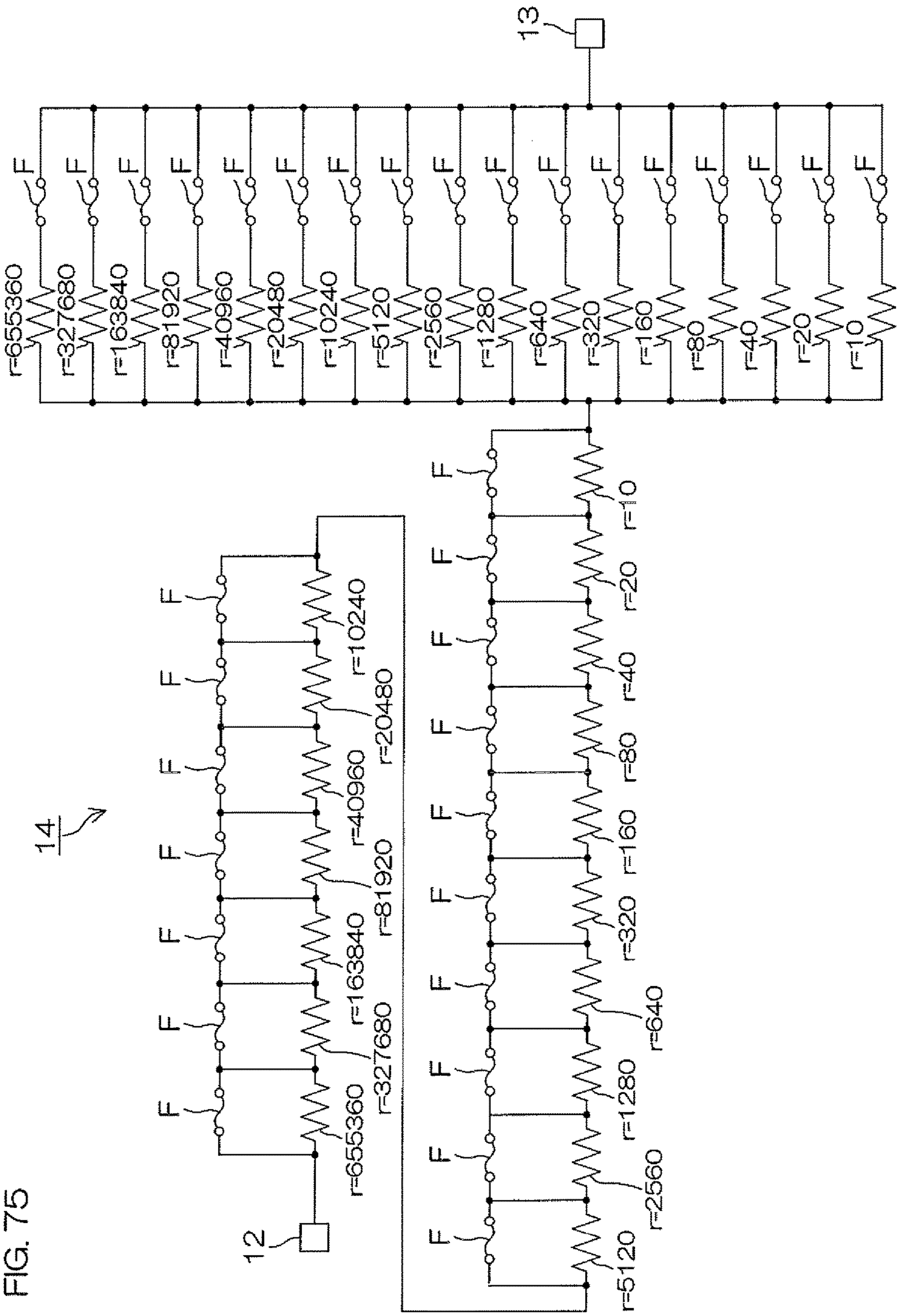

FIG. 75 is an electric circuit diagram of an arrangement example of a resistor network in a chip resistor with specific resistance values indicated.

Figure 76:
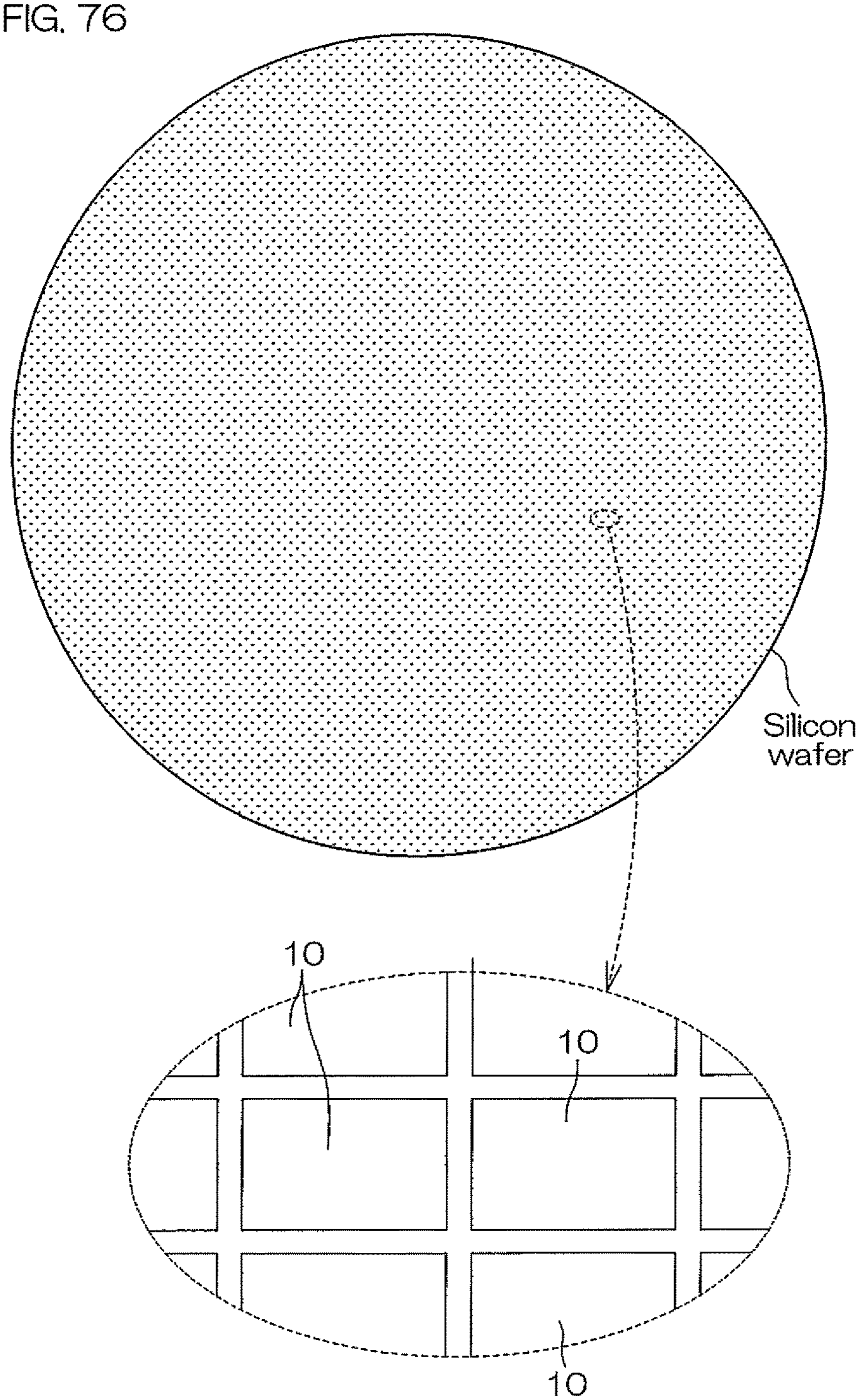

FIG. 76 is an illustrative view for describing the manner in which the chip resistor 10 is cut out from a wafer.

Figure 77A:
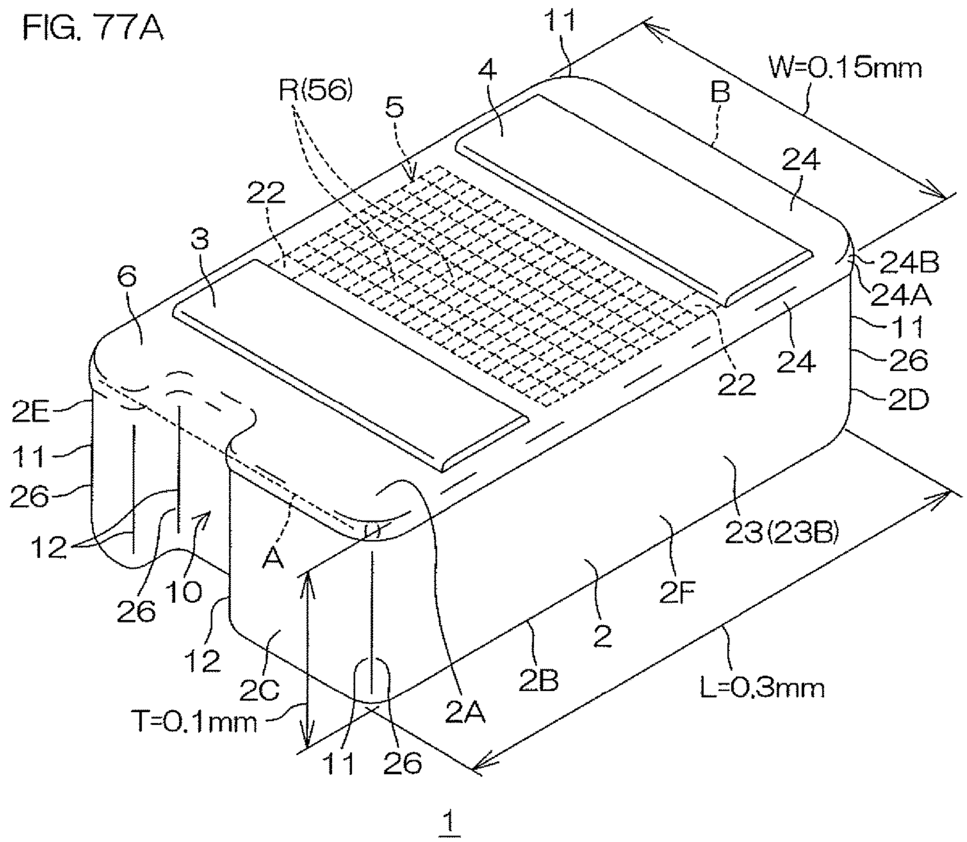

FIG. 77A is a schematic perspective view for describing the arrangement of an electronic device according to a preferred embodiment of a fifth reference example.

Figure 77B:
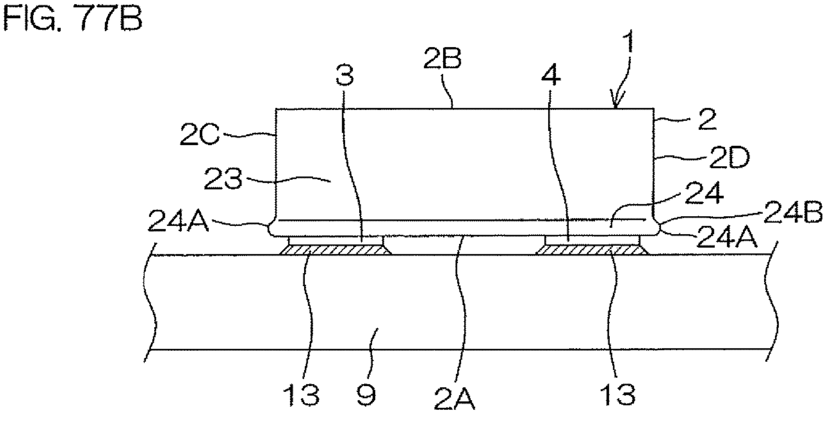

FIG. 77B is a schematic side view of a state where the electronic device is mounted on a circuit substrate.

Figure 78:
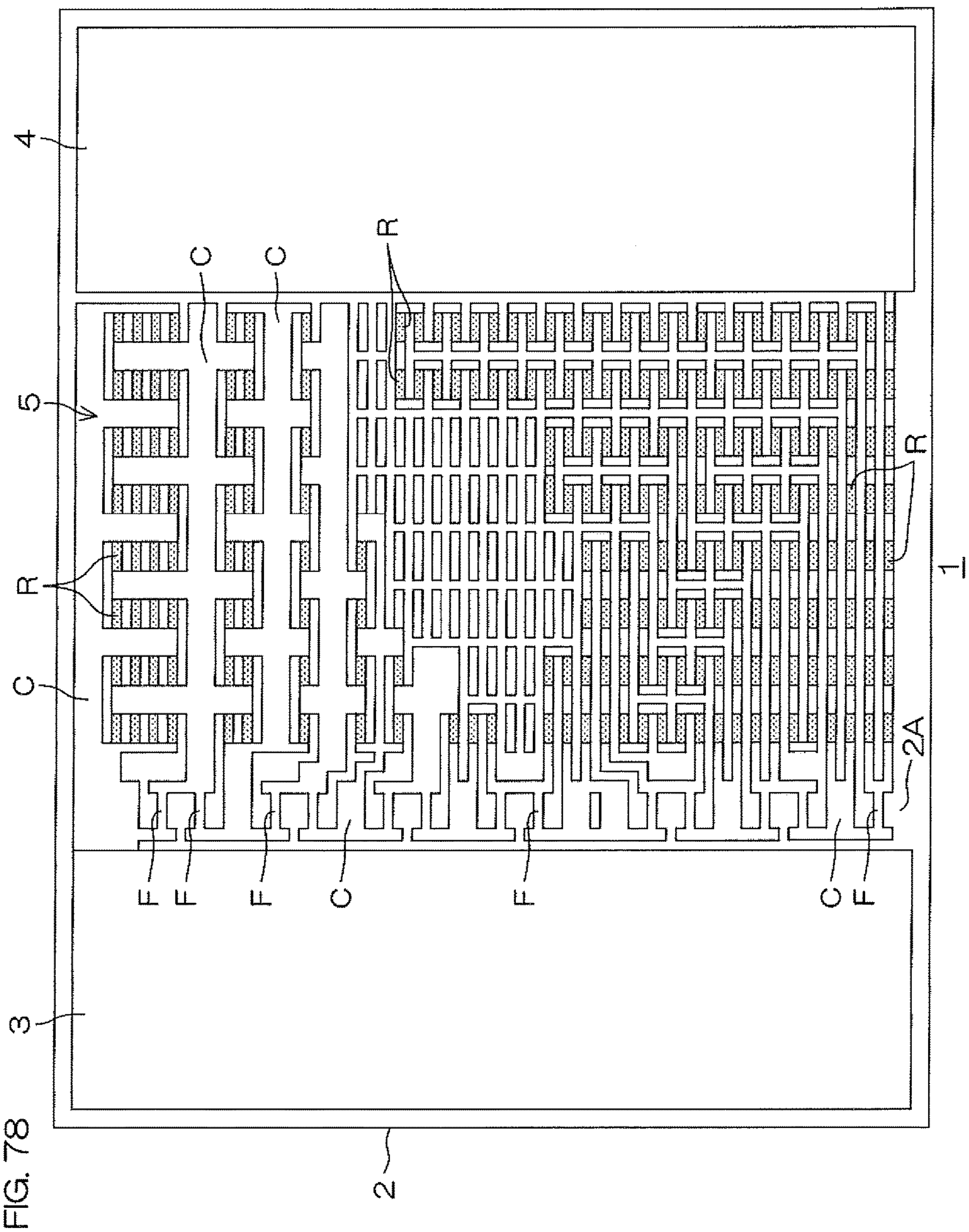

FIG. 78 is a plan view of the electronic device showing the positional relationships of a first connection electrode, a second connection electrode, and an element and showing the arrangement in a plan view of the element.

Figure 79A:
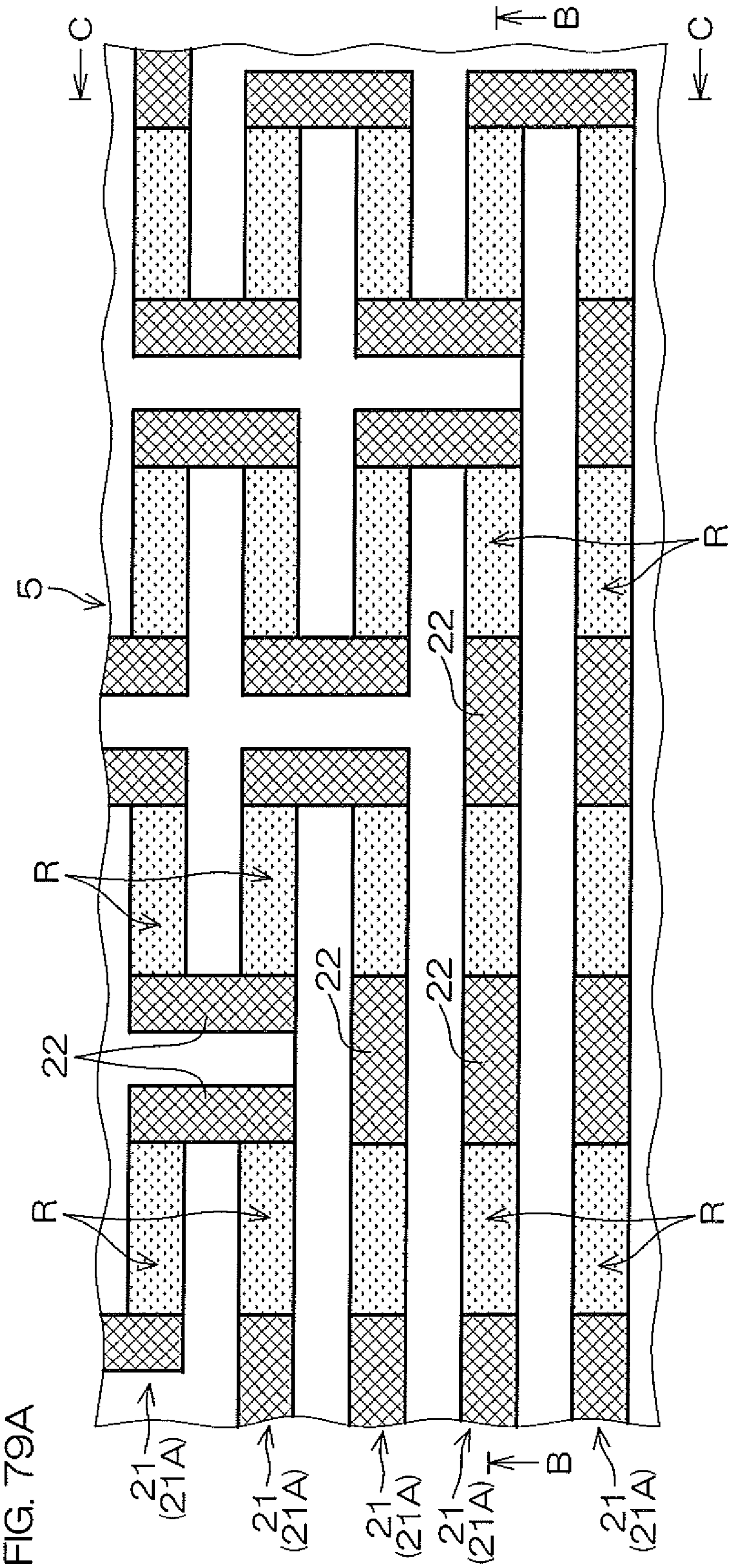

FIG. 79A is partially enlarged plan view of the element shown in FIG. 78.

Figure 79B:
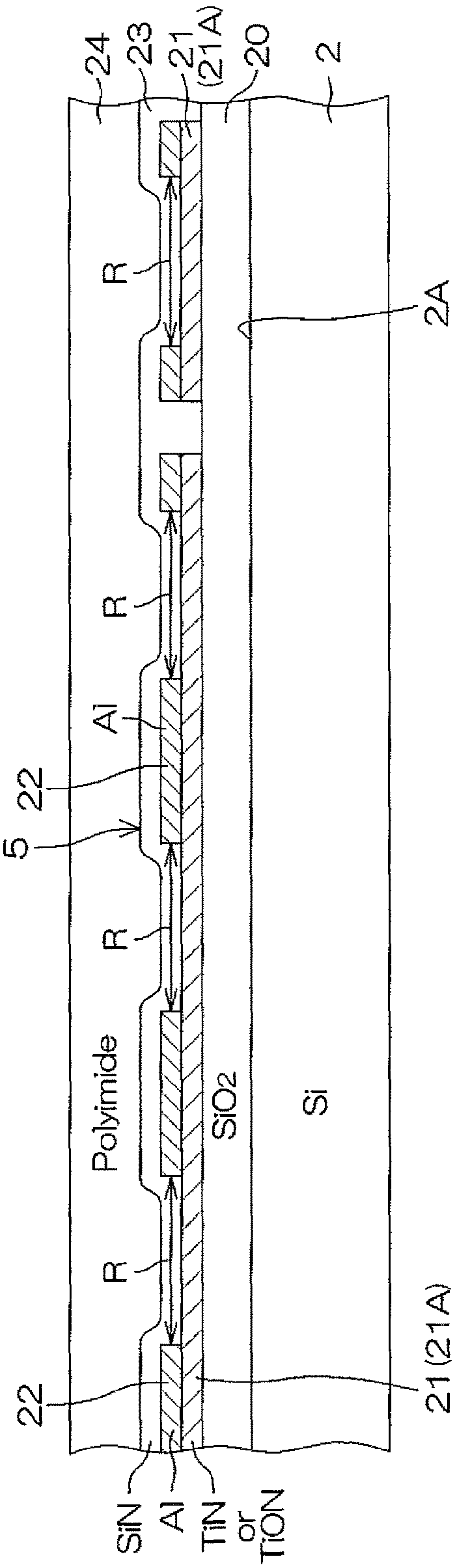

FIG. 79B is a vertical sectional view in the length direction taken along B-B of FIG. 79A for describing the arrangement of resistor bodies in the element.

Figure 79C:
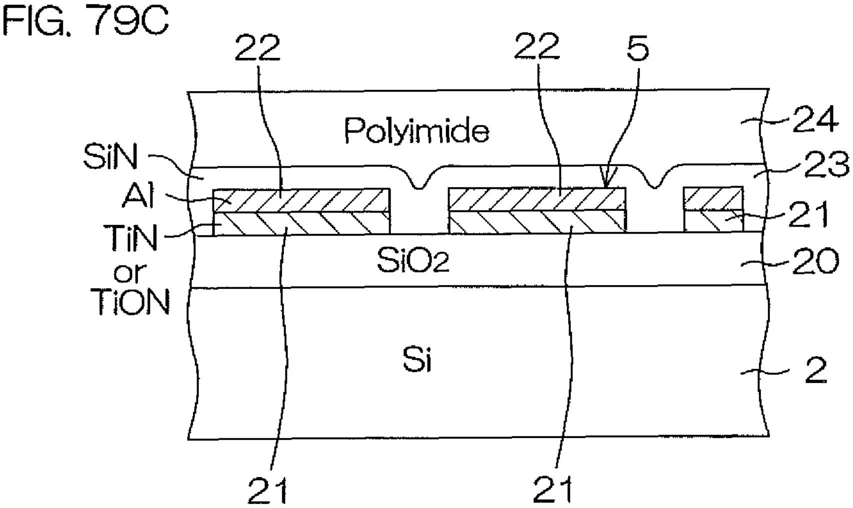

FIG. 79C is a vertical sectional view in the width direction taken along C-C of FIG. 79A for describing the arrangement of the resistor bodies in the element.

Figure 80A:
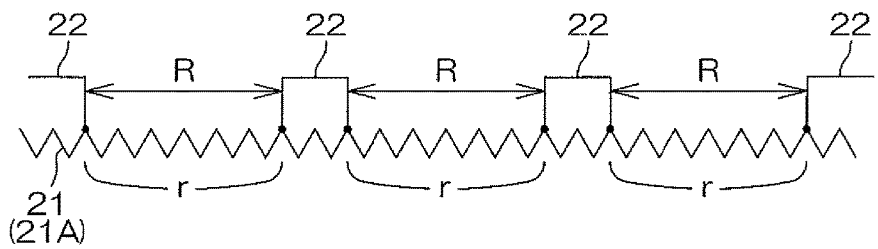

FIG. 80A is a diagram showing the electrical features of resistor body film lines and conductor films in the form of circuit symbols and an electric circuit diagram.

Figure 80B:
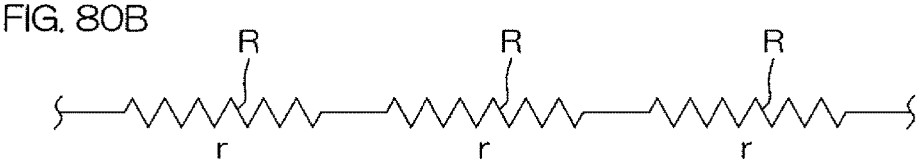

FIG. 80B is a diagram showing the electrical features of resistor body film lines and conductor films in the form of circuit symbols and an electric circuit diagram.

Figure 80C:
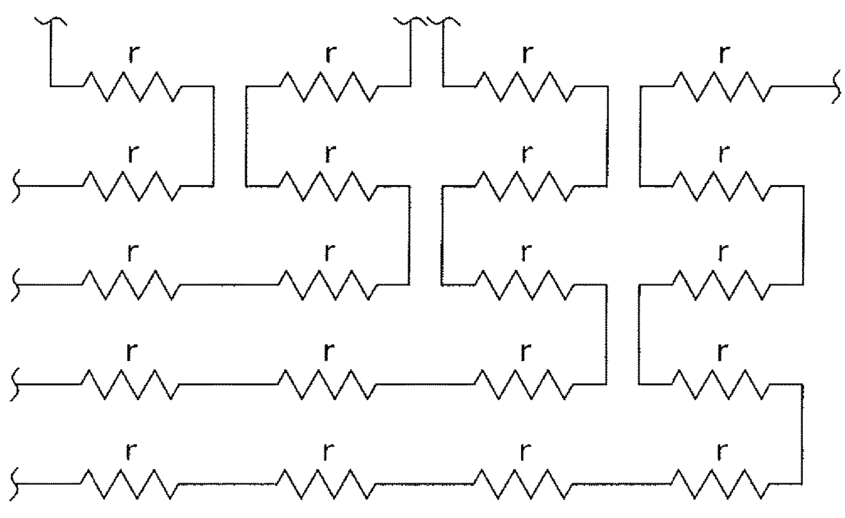

FIG. 80C is a diagram showing the electrical features of resistor body film lines and conductor films in the form of circuit symbols and an electric circuit diagram.

Figure 81A:
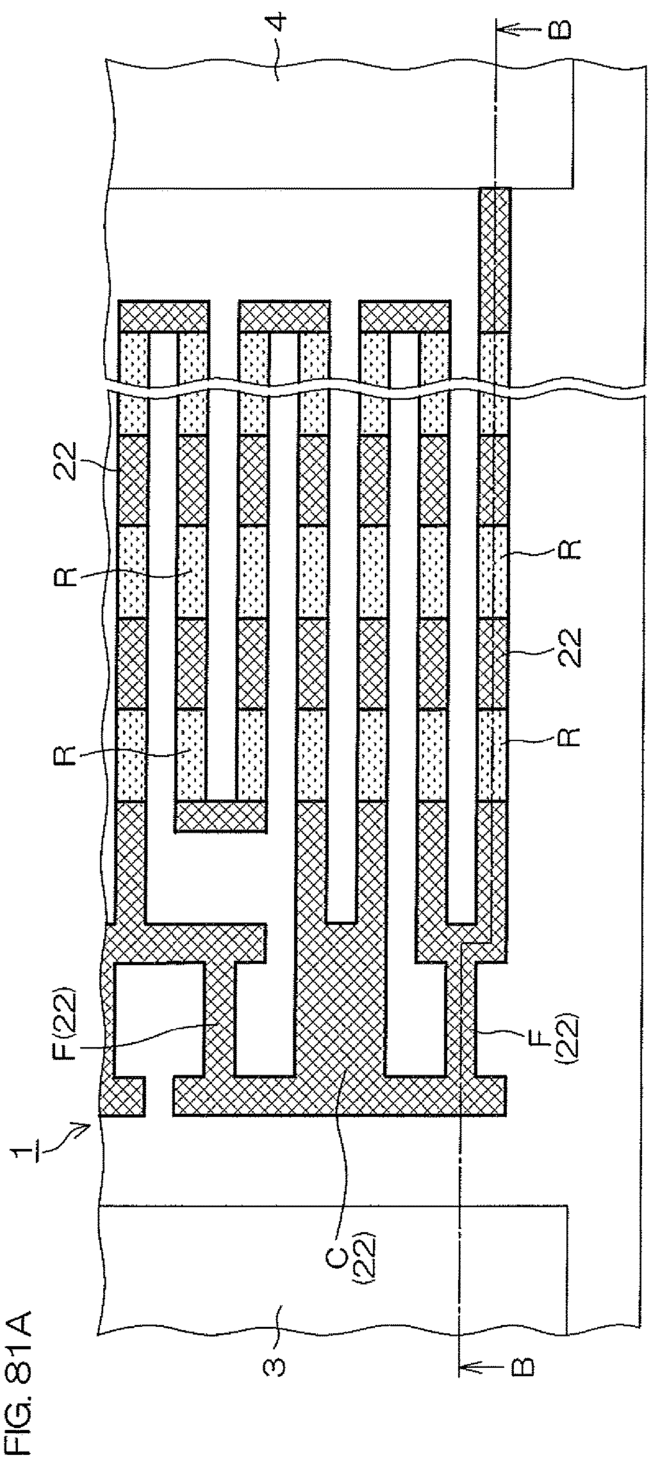

FIG. 81A is a partially enlarged plan view of a region including fuse films drawn by enlarging a portion of the plan view of the electronic device shown in FIG. 78.

Figure 81B:
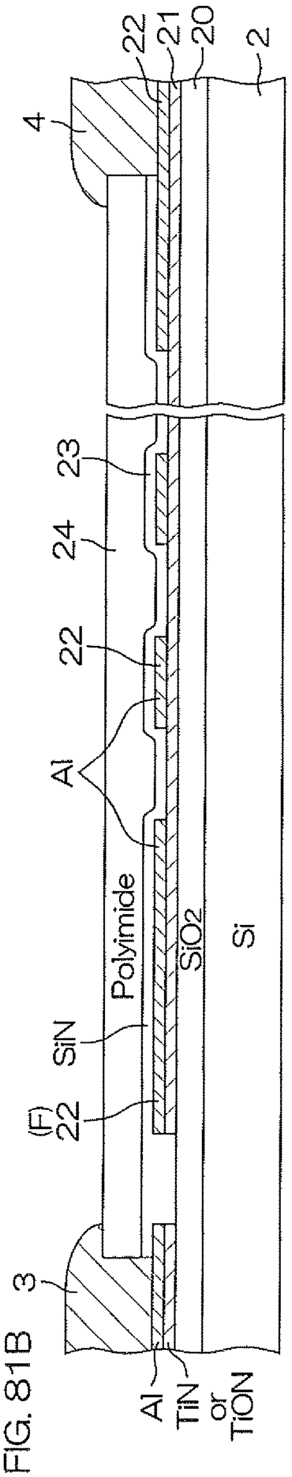

FIG. 81B is a structural sectional view taken along B-B in FIG. 81A.

Figure 82:
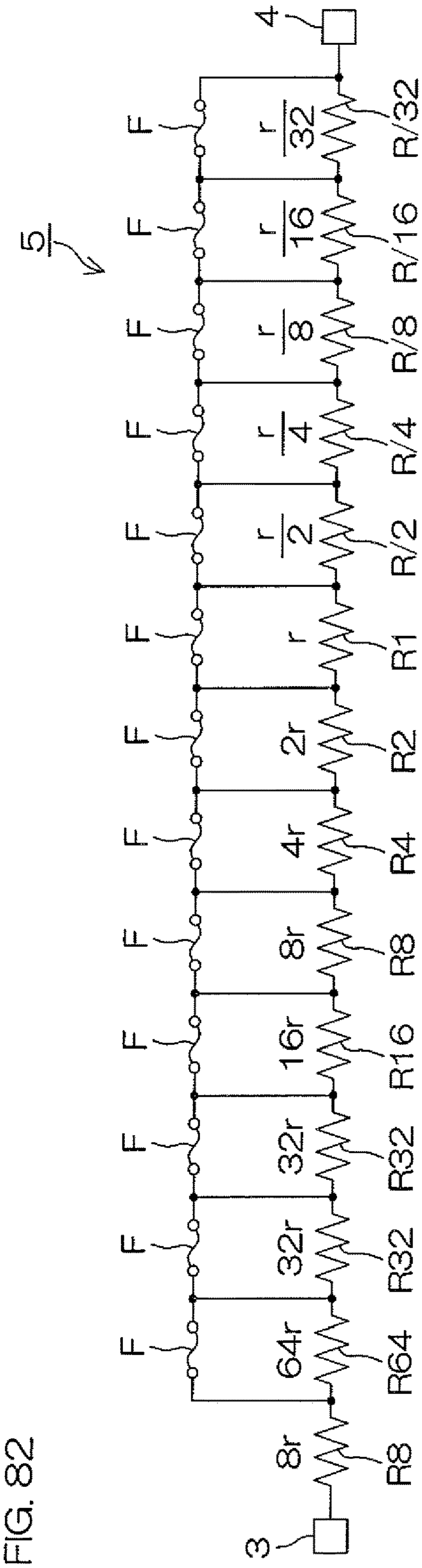

FIG. 82 is an electric circuit diagram of the element according to the preferred embodiment of the fifth reference example.

Figure 83:
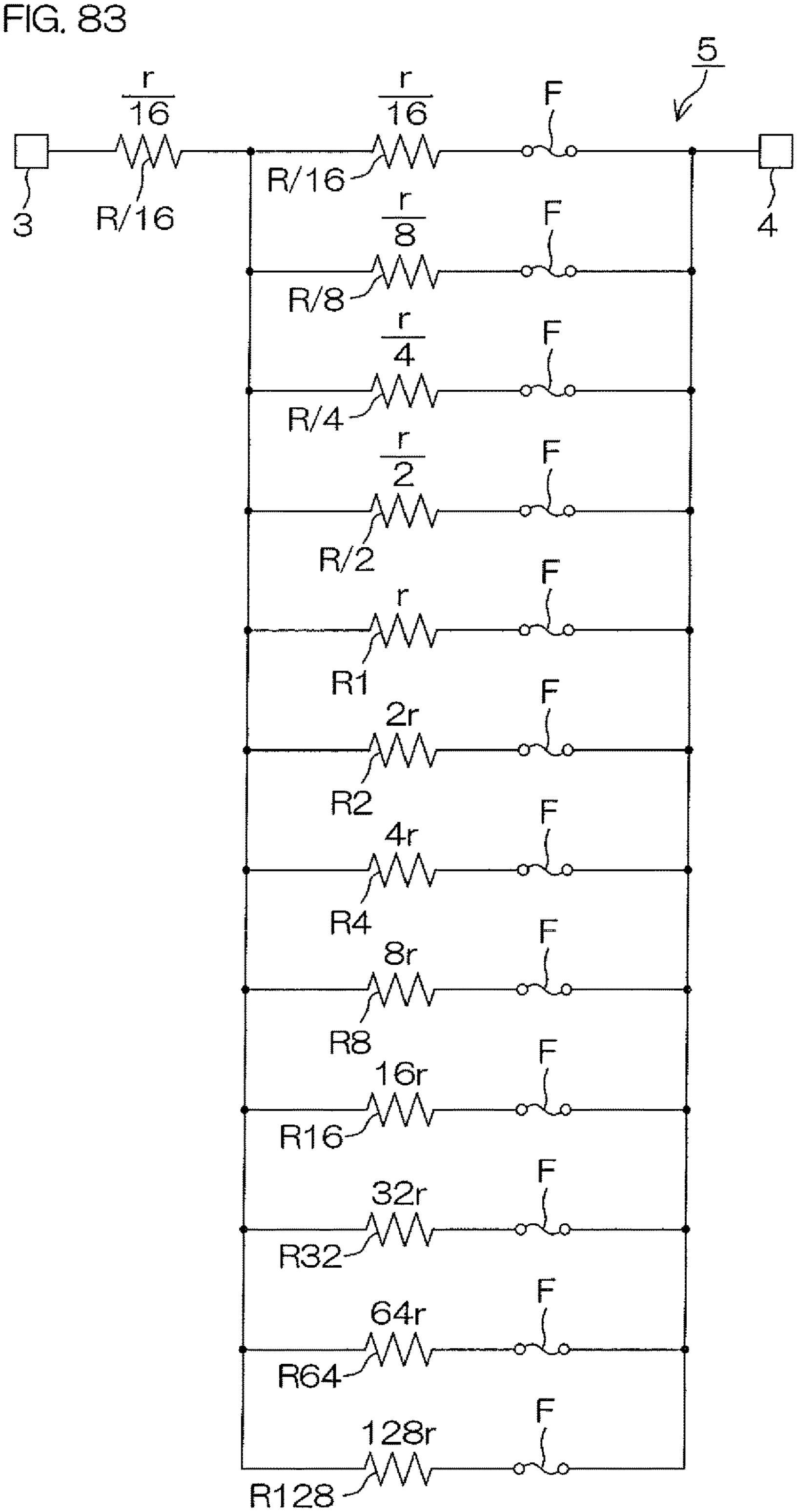

FIG. 83 is an electric circuit diagram of an element according to another preferred embodiment of the fifth reference example.

Figure 84:
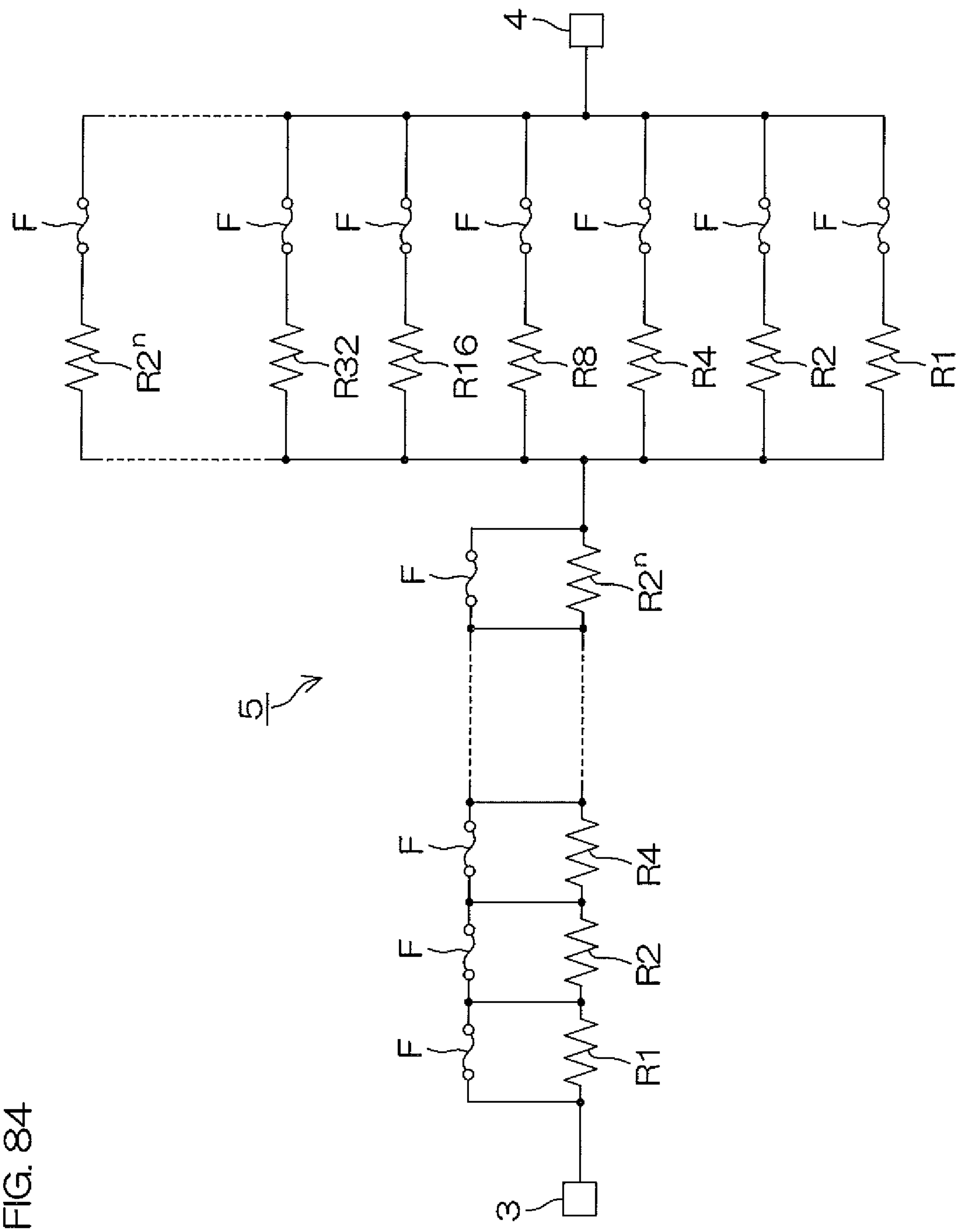

FIG. 84 is an electric circuit diagram of an element according to yet another preferred embodiment of the fifth reference example.

Figure 85:
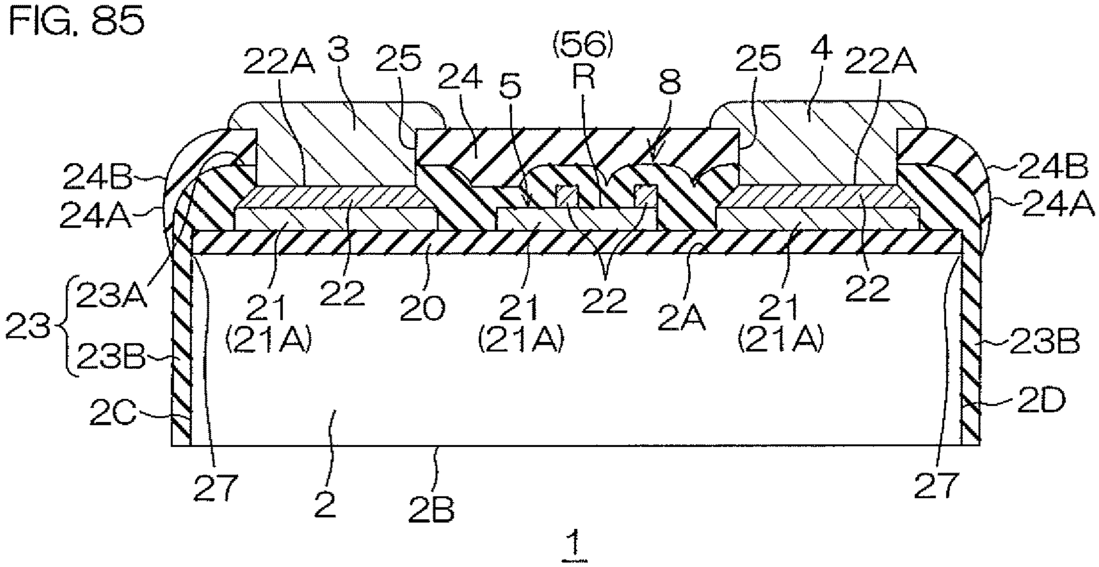

FIG. 85 is a schematic sectional view of the electronic device.

Figure 86A:
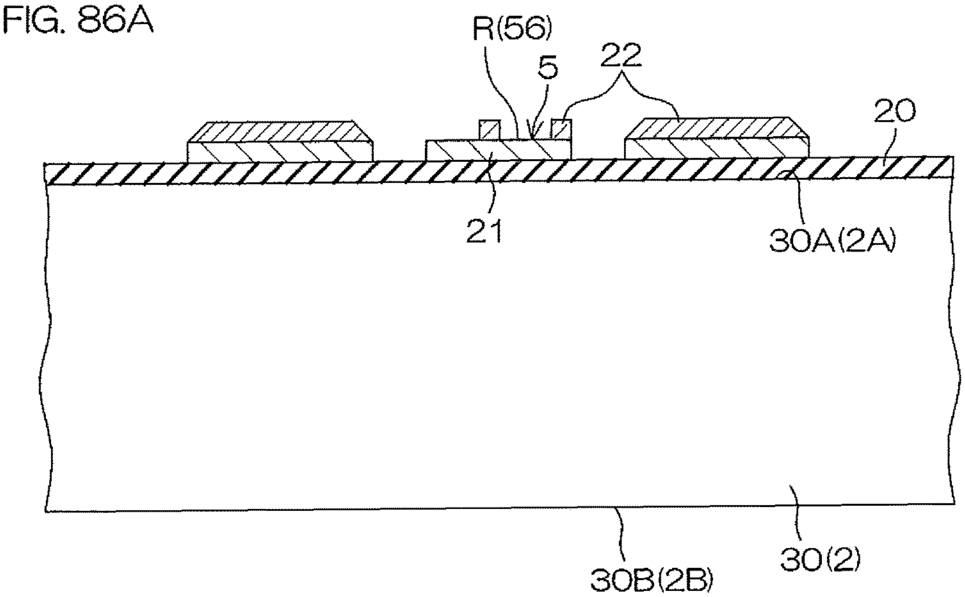

FIG. 86A is an illustrative sectional view of a method for manufacturing the electronic device shown in FIG. 85.

Figure 86B:
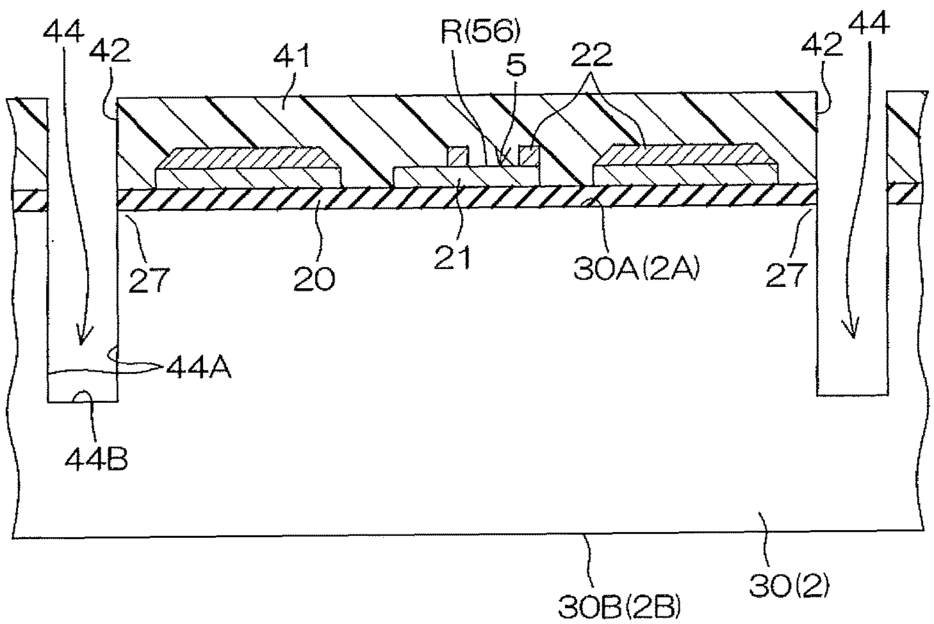

FIG. 86B is an illustrative sectional view of a step subsequent to that of FIG. 86A.

Figure 86C:
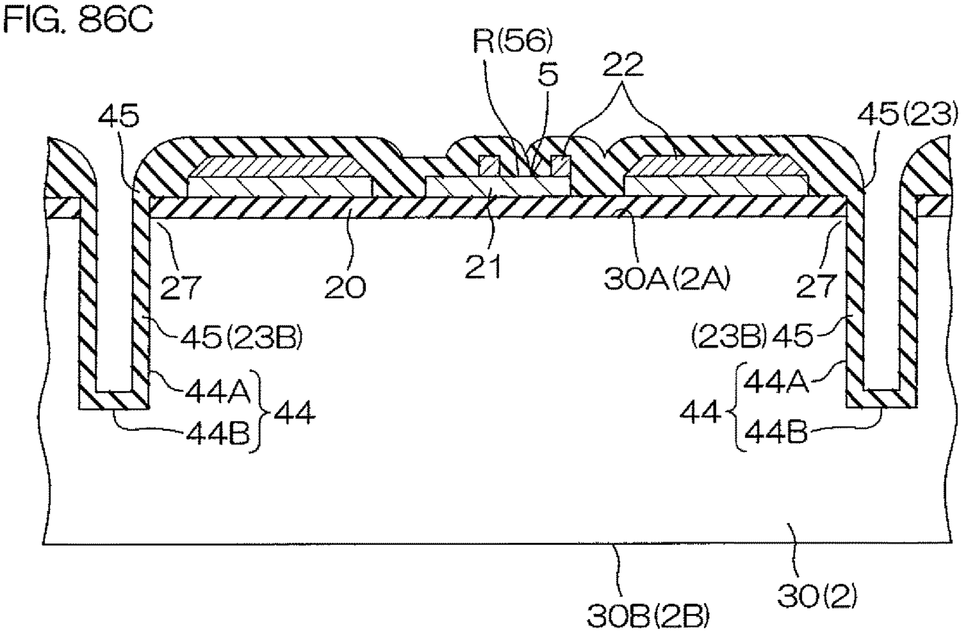

FIG. 86C is an illustrative sectional view of a step subsequent to that of FIG. 86B.

Figure 86D:
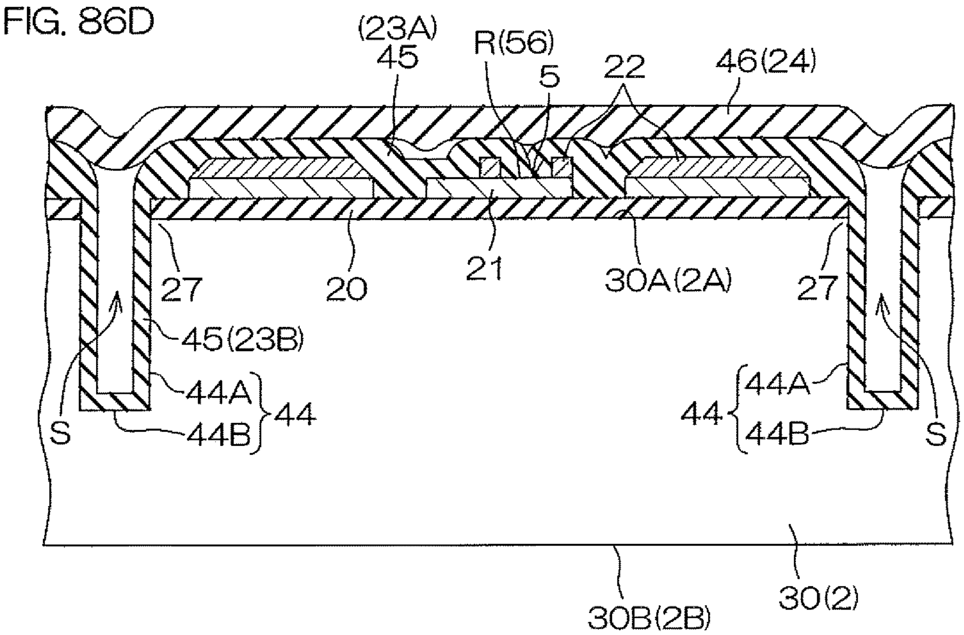

FIG. 86D is an illustrative sectional view of a step subsequent to that of FIG. 86C.

Figure 86E:
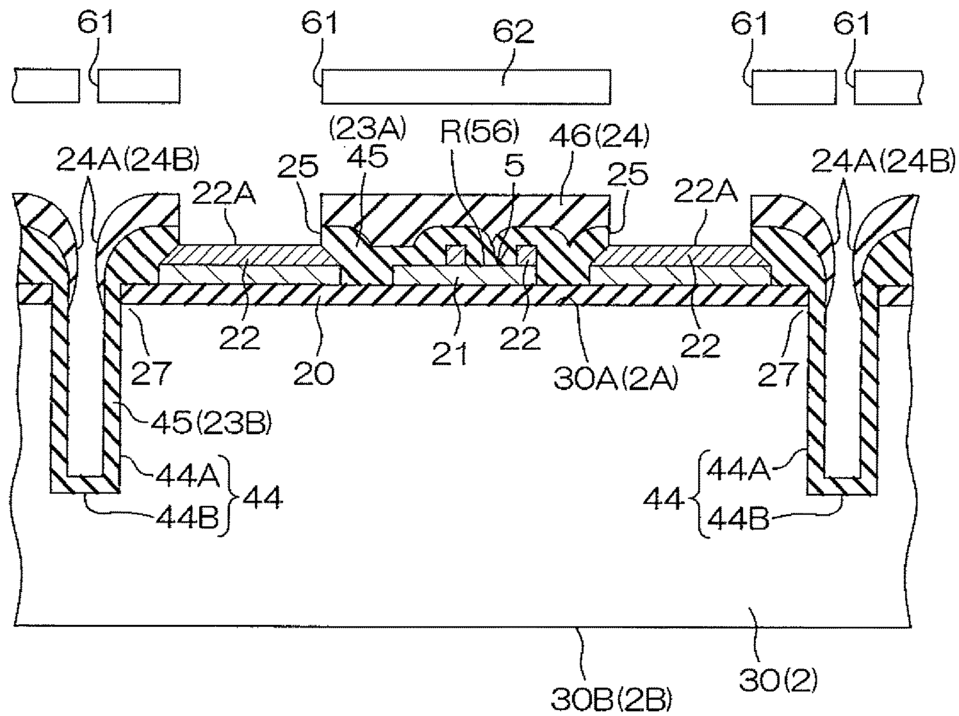

FIG. 86E is an illustrative sectional view of a step subsequent to that of FIG. 86D.

Figure 86F:
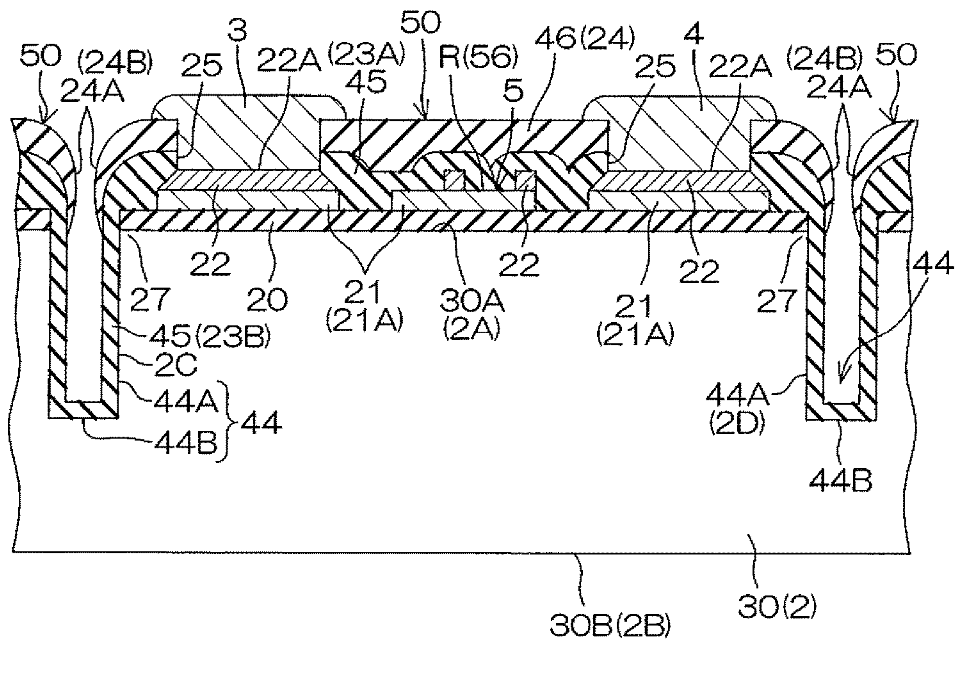

FIG. 86F is an illustrative sectional view of a step subsequent to that of FIG. 86E.

Figure 87:
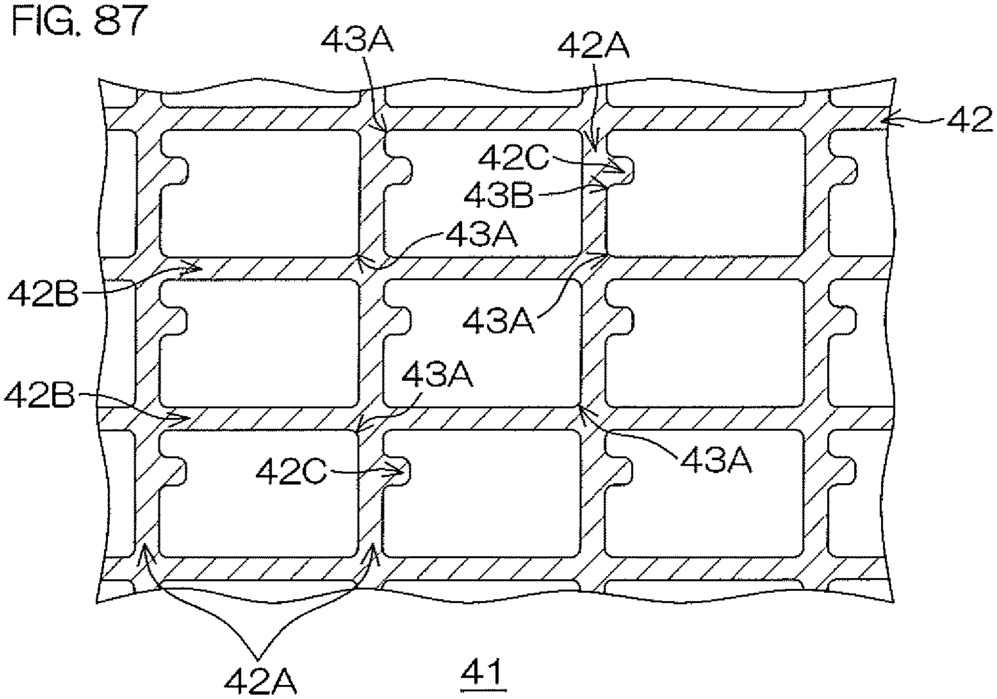

FIG. 87 is a schematic plan view of a portion of a resist pattern used for forming a groove in the step of FIG. 86B.

Figure 88A:
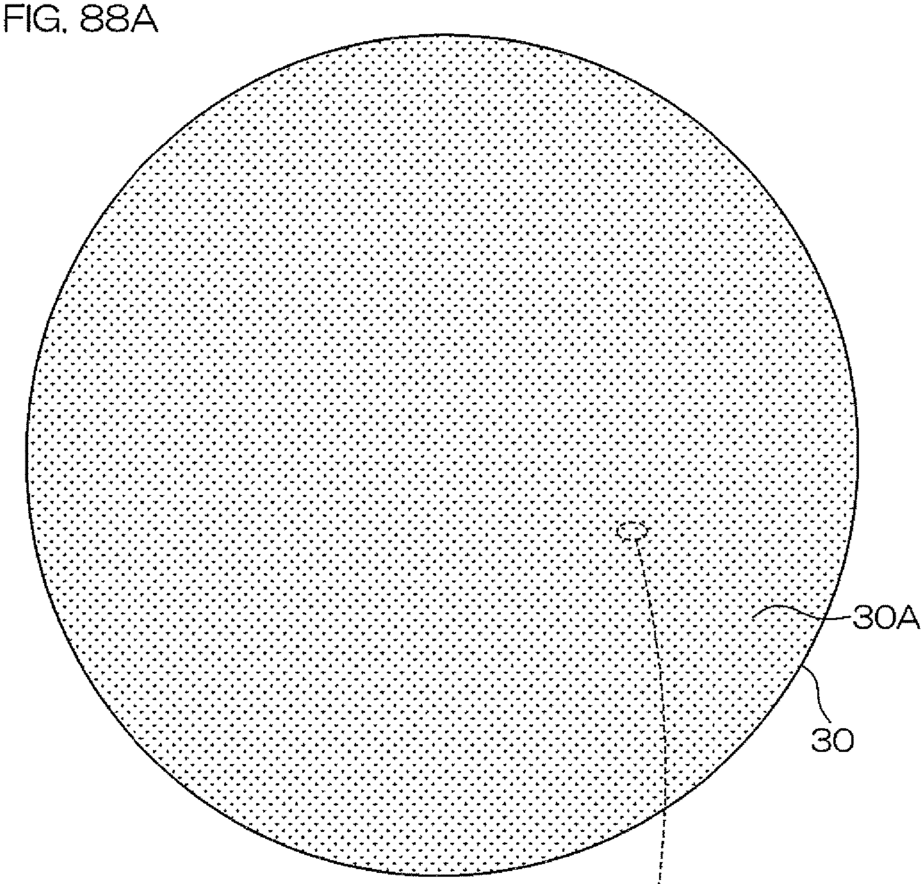

FIG. 88A is a schematic plan view of a wafer after the groove has been formed in the step of FIG. 86B.

Figure 88B:
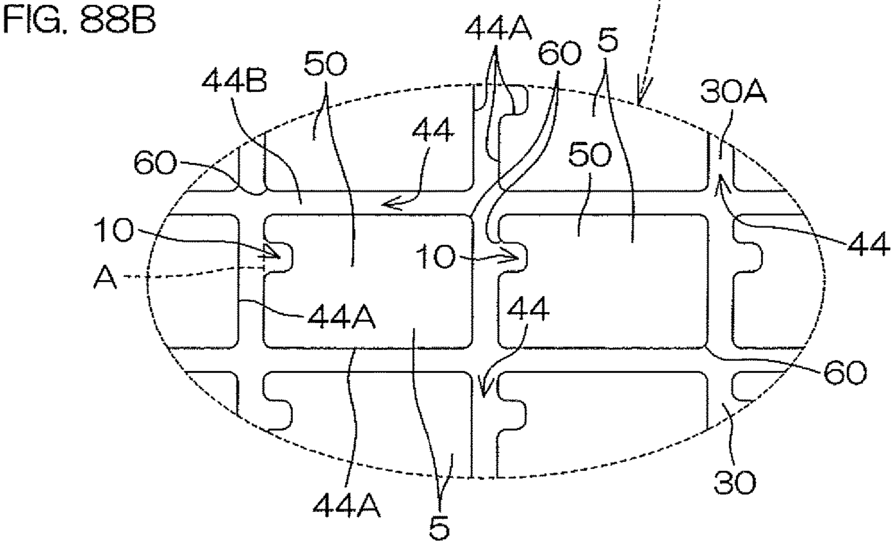

FIG. 88B is an enlarged view of a portion in FIG. 88A.

Figure 89A:
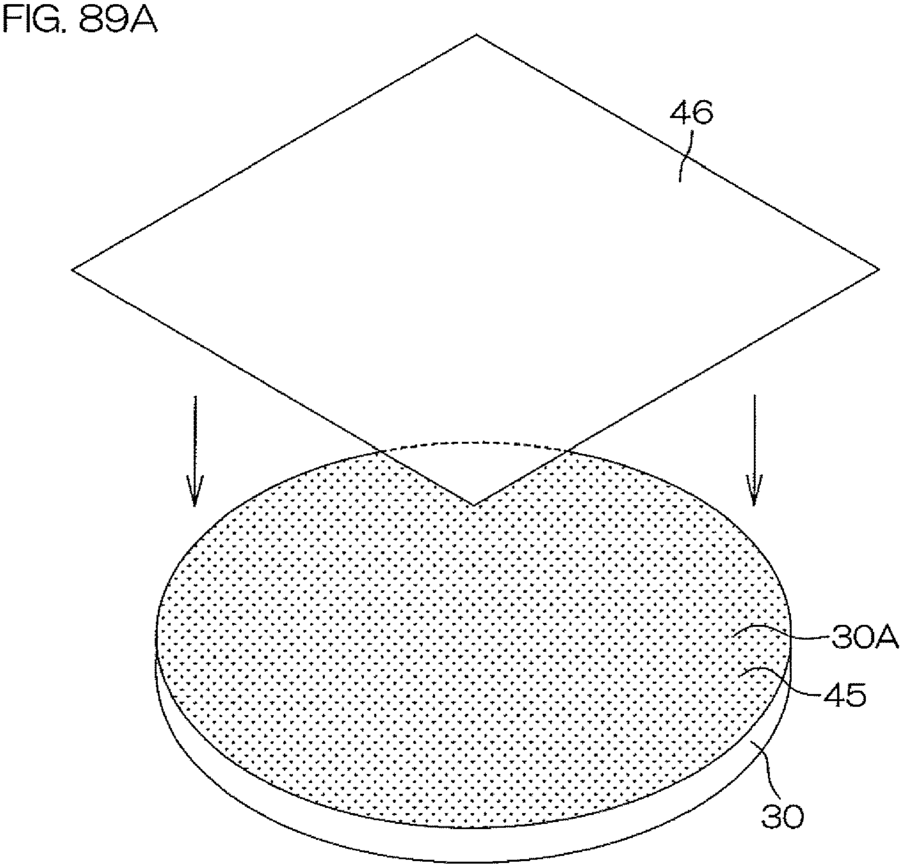

FIG. 89A is an illustrative perspective view of states of adhering a polyimide sheet onto the wafer in the step of FIG. 86D.

Figure 89B:
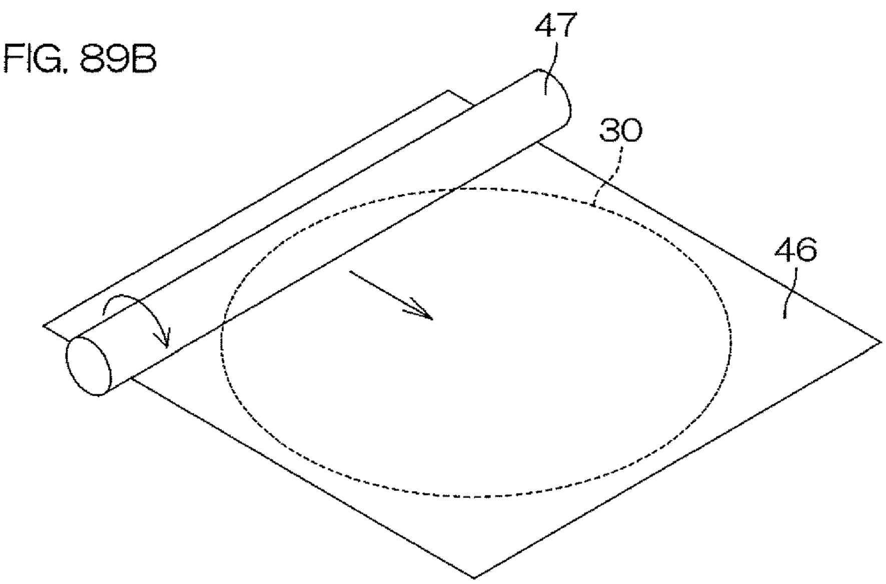

FIG. 89B is an illustrative perspective view of states of adhering a polyimide sheet onto the wafer in the step of FIG. 86D.

Figure 90A:
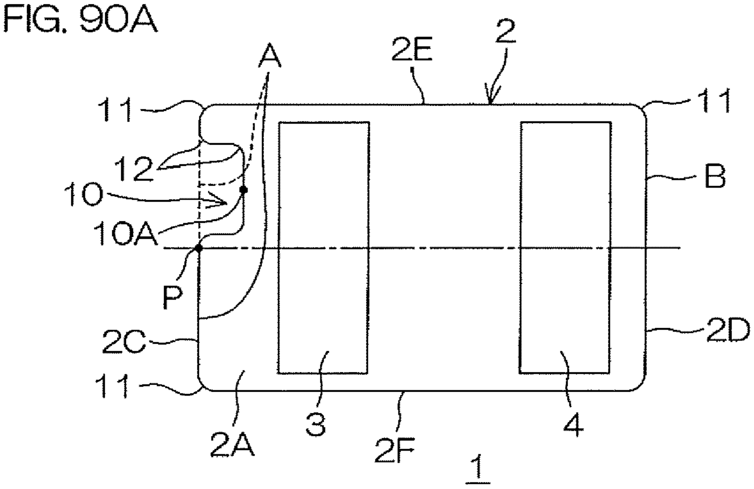

FIG. 90A is a plan view of an electronic device.

Figure 90B:
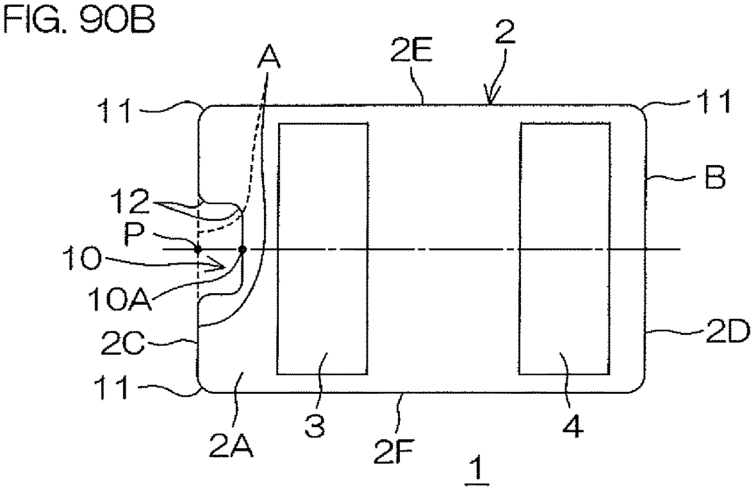

FIG. 90B is a plan view of an electronic device according to a first modification example.

Figure 90C:
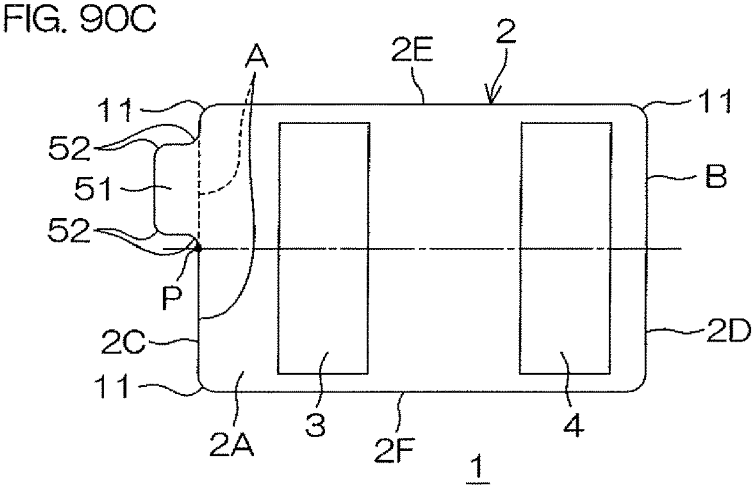

FIG. 90C is a plan view of an electronic device according to a second modification example.

Figure 91A:

FIG. 91A is a diagram of the circuit arrangement of an element according to another preferred embodiment of the electronic device.

Figure 91B:
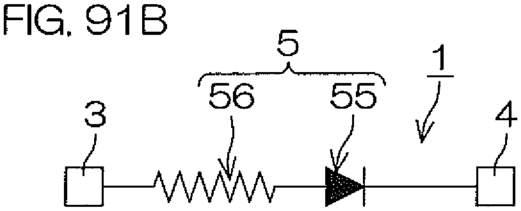

FIG. 91B is a diagram of the circuit arrangement of an element according to yet another preferred embodiment of the electronic device.

Figure 92A:
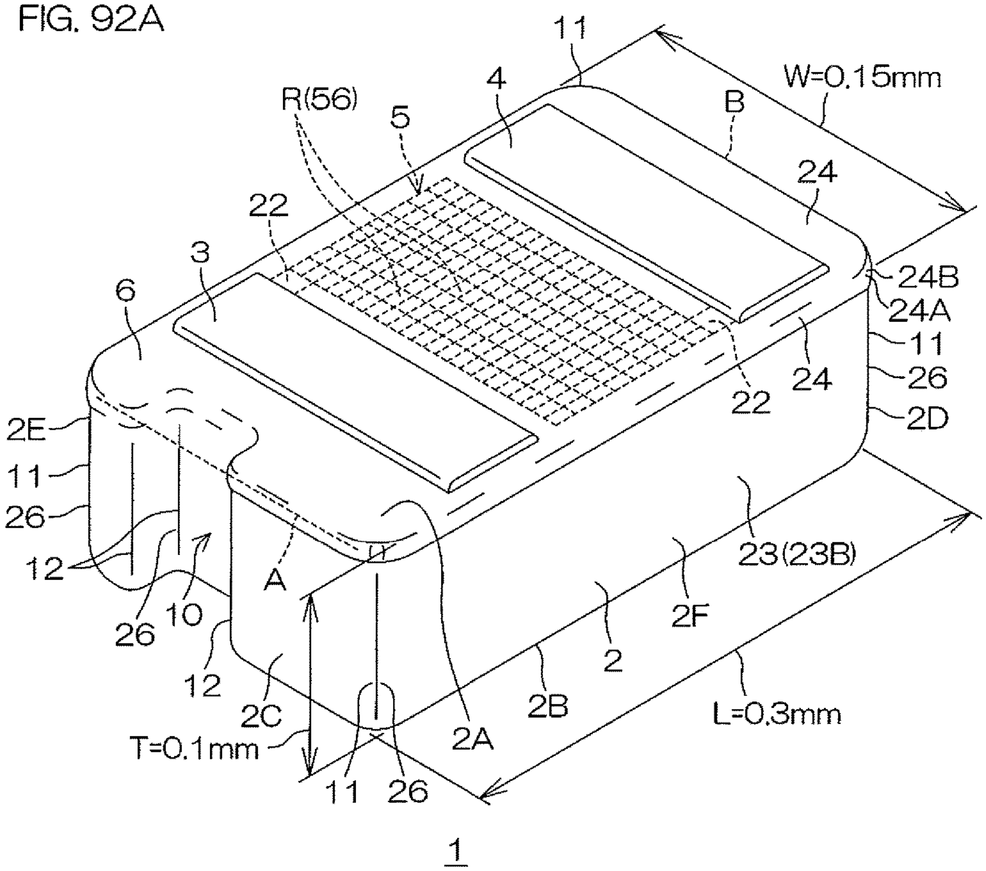

FIG. 92A is a schematic perspective view for describing the arrangement of an electronic device according to a preferred embodiment of a sixth reference example.

Figure 92B:
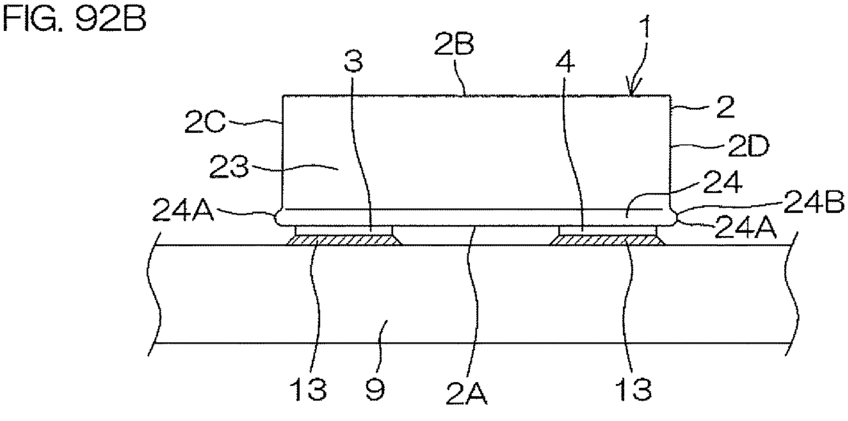

FIG. 92B is a schematic side view of a state where the electronic device is mounted on a circuit substrate.

Figure 93:
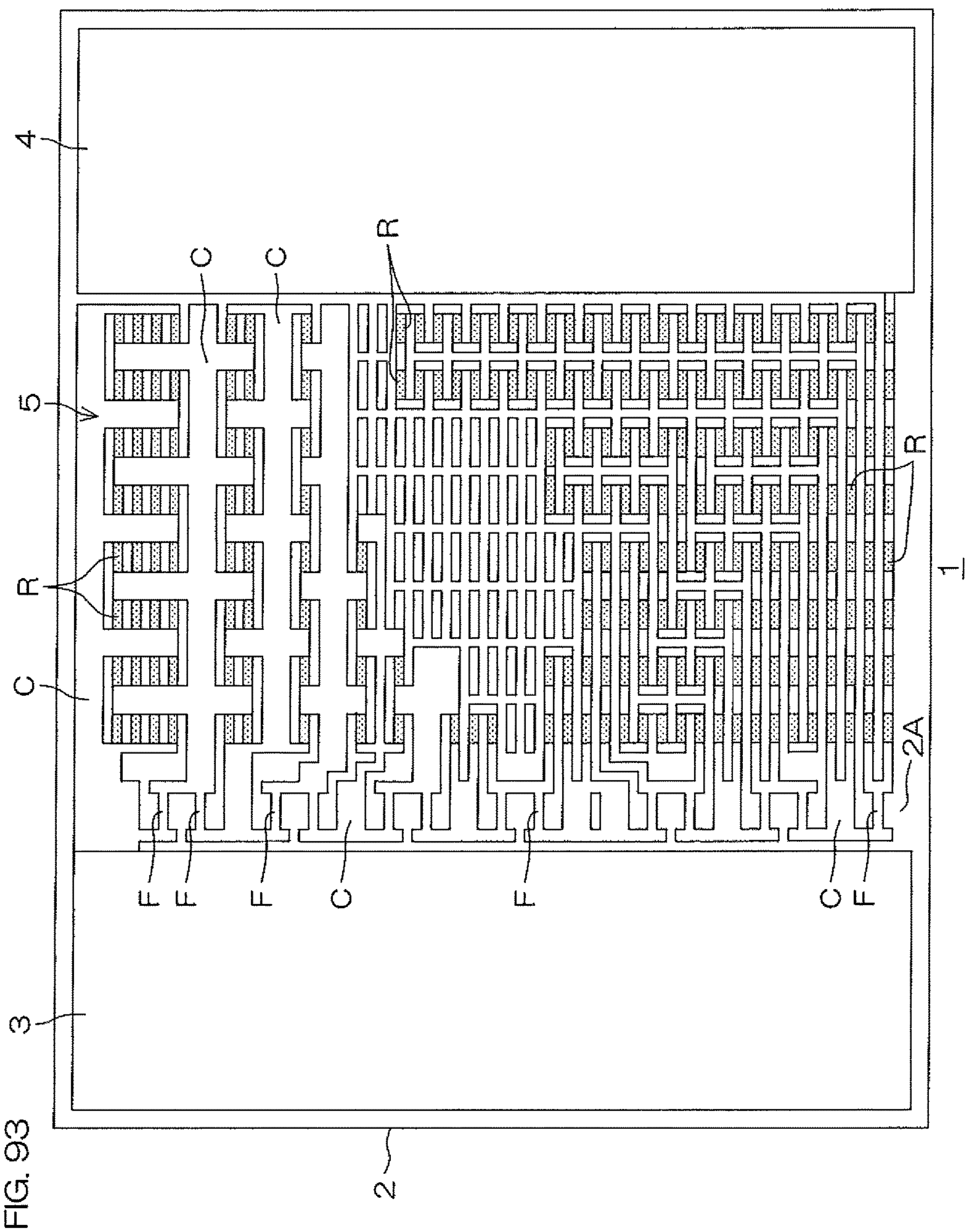

FIG. 93 is a plan view of the electronic device showing the positional relationships of a first connection electrode, a second connection electrode, and an element and showing the arrangement in a plan view of the element.

Figure 94A:
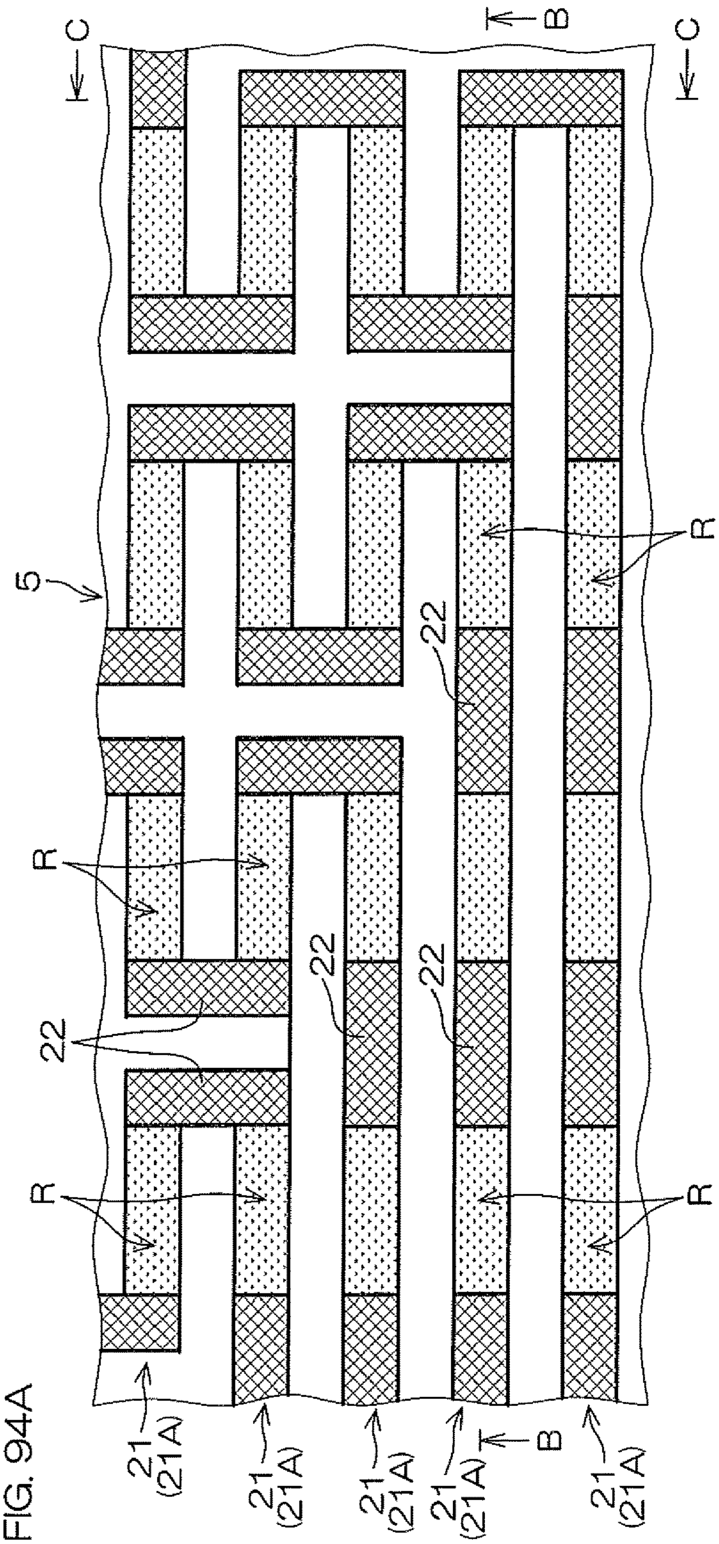

FIG. 94A is partially enlarged plan view of the element shown in FIG. 93.

Figure 94B:
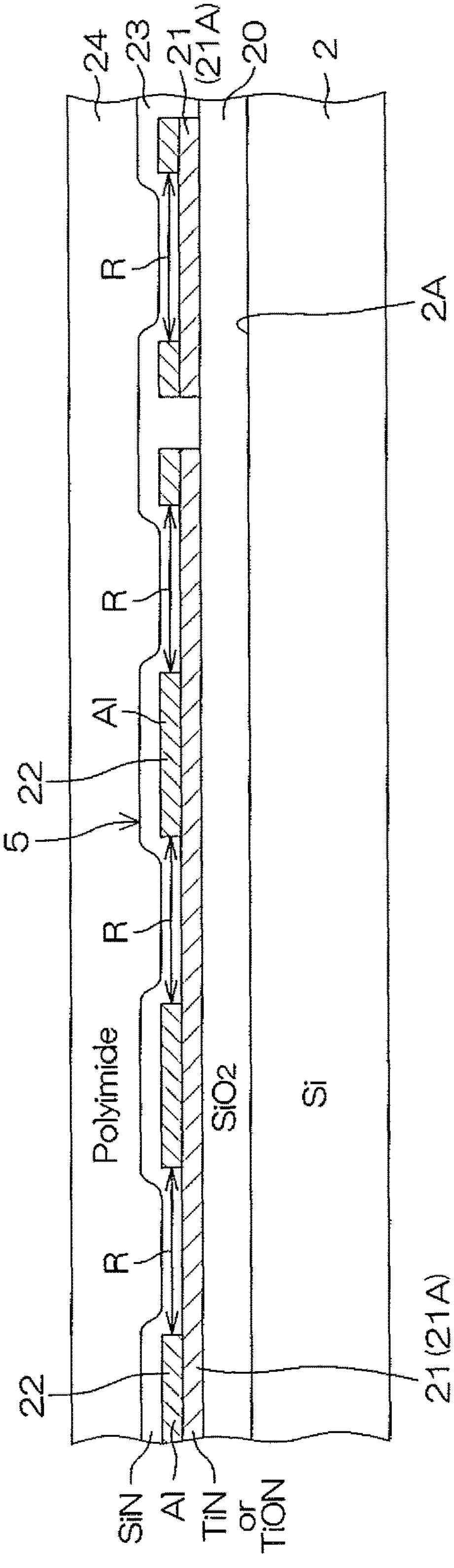

FIG. 94B is a vertical sectional view in the length direction taken along B-B of FIG. 94A for describing the arrangement of resistor bodies in the element.

Figure 94C:
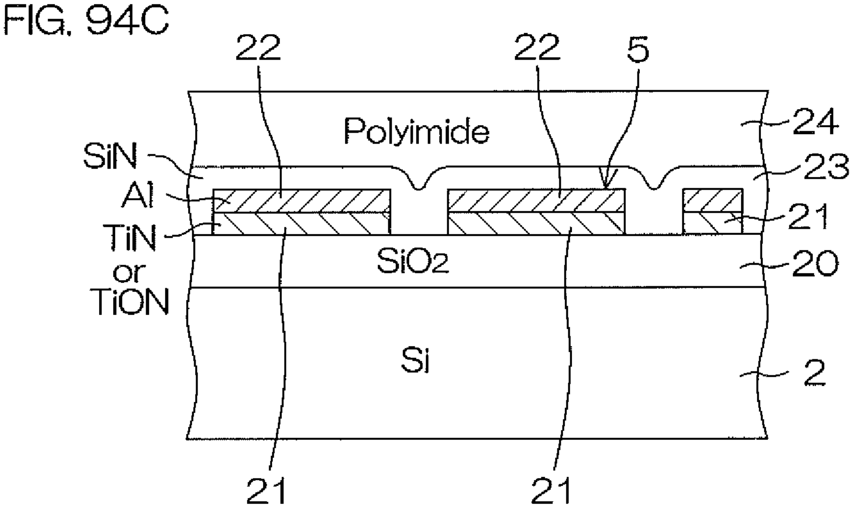

FIG. 94C is a vertical sectional view in the width direction taken along C-C of FIG. 94A for describing the arrangement of the resistor bodies in the element.

Figure 95A:
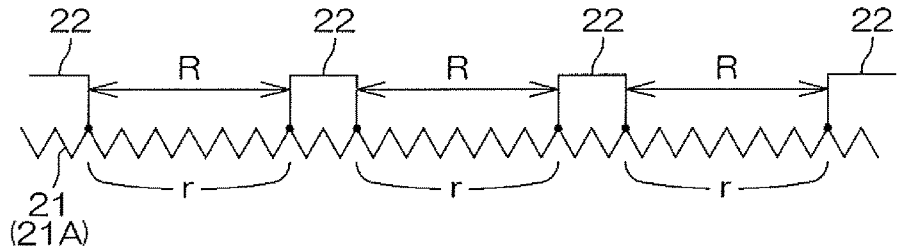

FIG. 95A is a diagram showing the electrical features of resistor body film lines and conductor films in the form of circuit symbols and an electric circuit diagram.

Figure 95B:
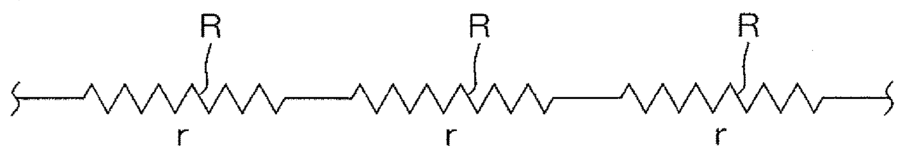

FIG. 95B is a diagram showing the electrical features of resistor body film lines and conductor films in the form of circuit symbols and an electric circuit diagram.

Figure 95C:
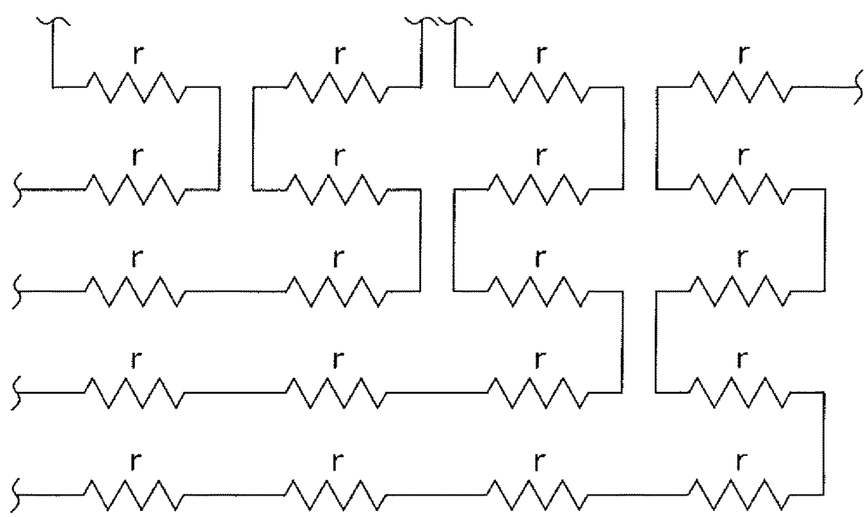

FIG. 95C is a diagram showing the electrical features of resistor body film lines and conductor films in the form of circuit symbols and an electric circuit diagram.

Figure 96A:
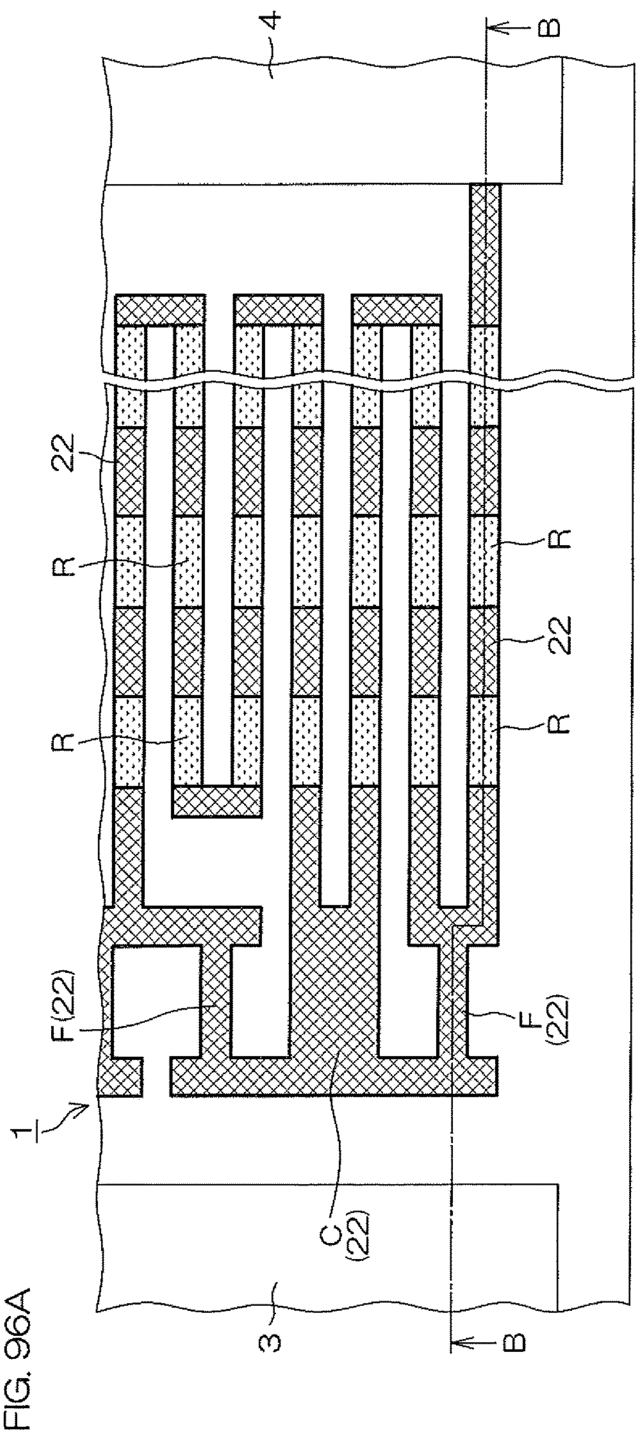

FIG. 96A is a partially enlarged plan view of a region including fuse films drawn by enlarging a portion of the plan view of the electronic device shown in FIG. 93.

Figure 96B:
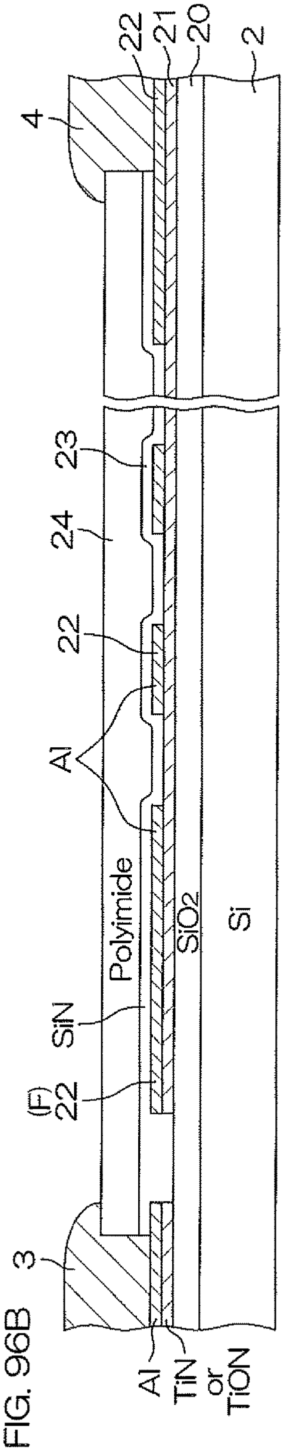

FIG. 96B is a structural sectional view taken along B-B in FIG. 96A.

Figure 97:
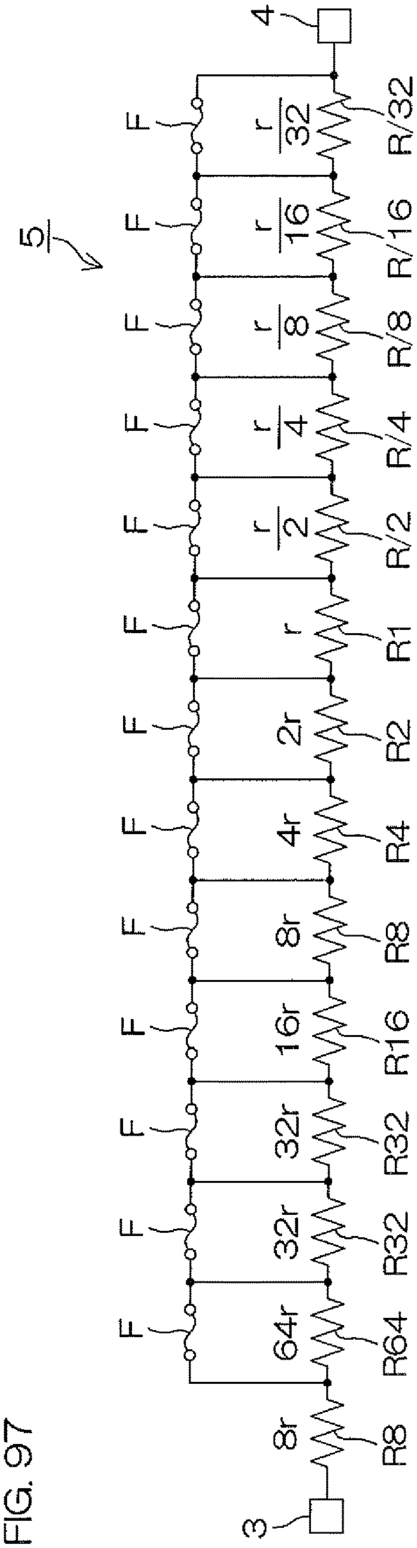

FIG. 97 is an electric circuit diagram of the element according to the preferred embodiment of the sixth reference example.

Figure 98:
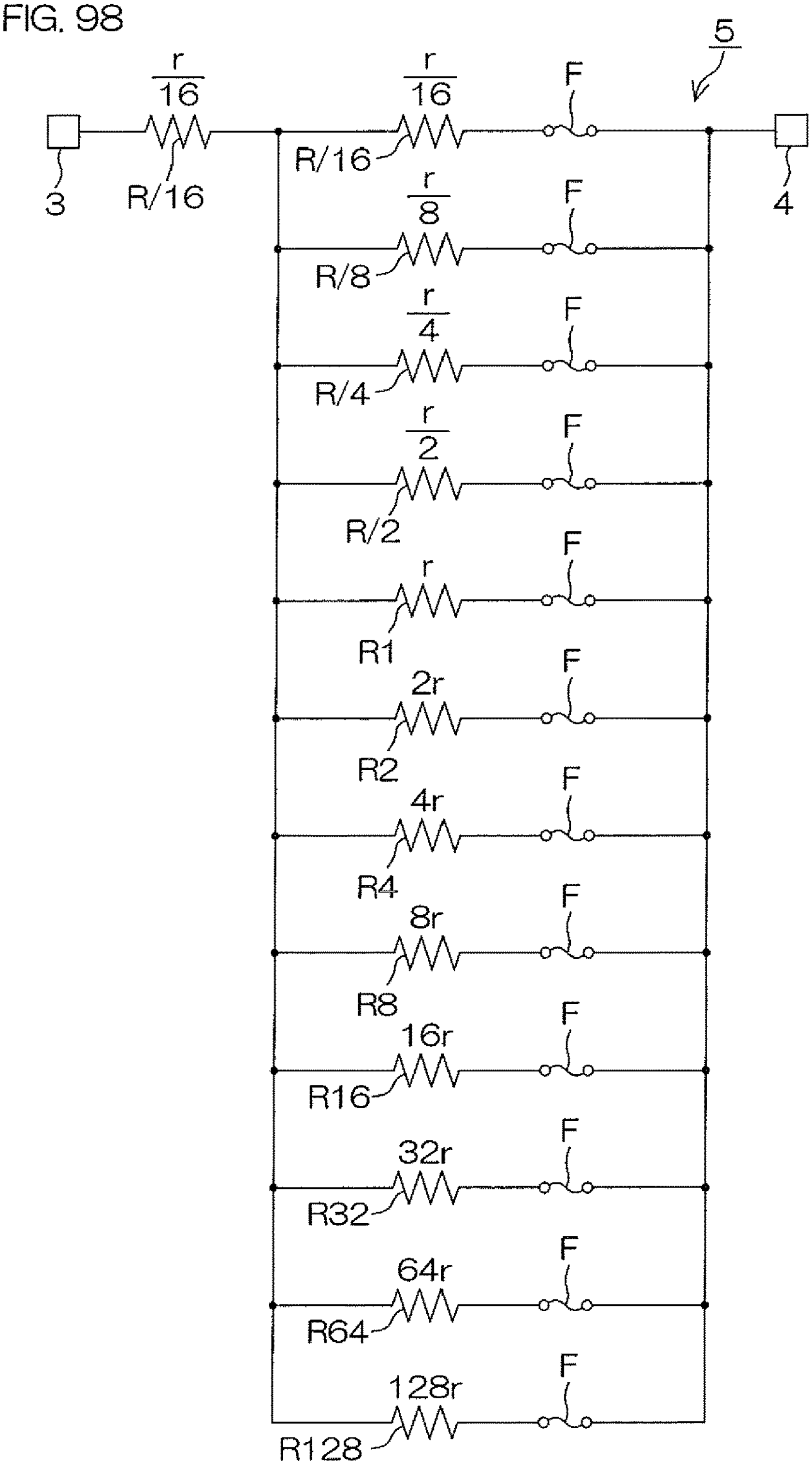

FIG. 98 is an electric circuit diagram of an element according to another preferred embodiment of the sixth reference example.

Figure 99:
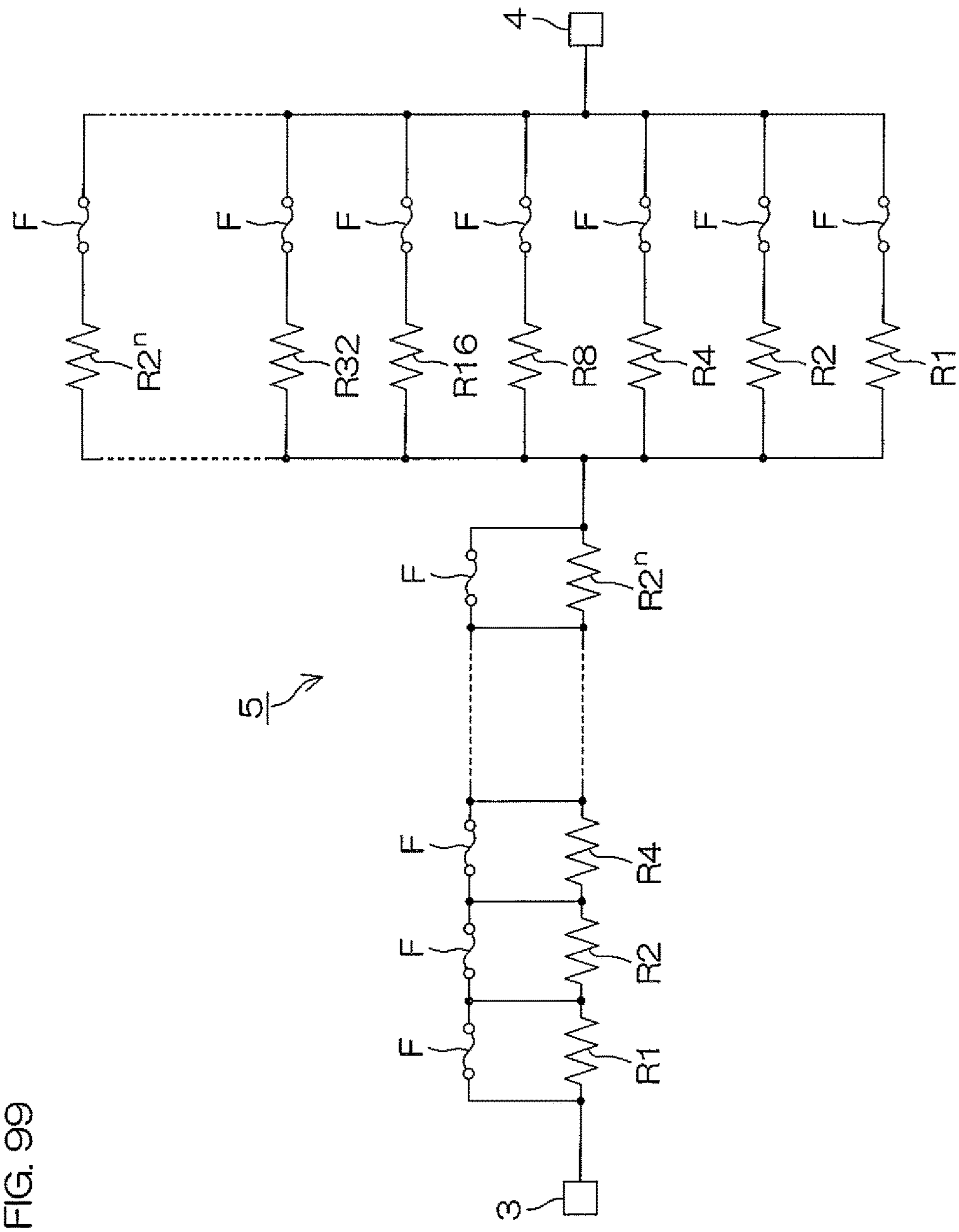

FIG. 99 is an electric circuit diagram of an element according to yet another preferred embodiment of the sixth reference example.

Figure 100:
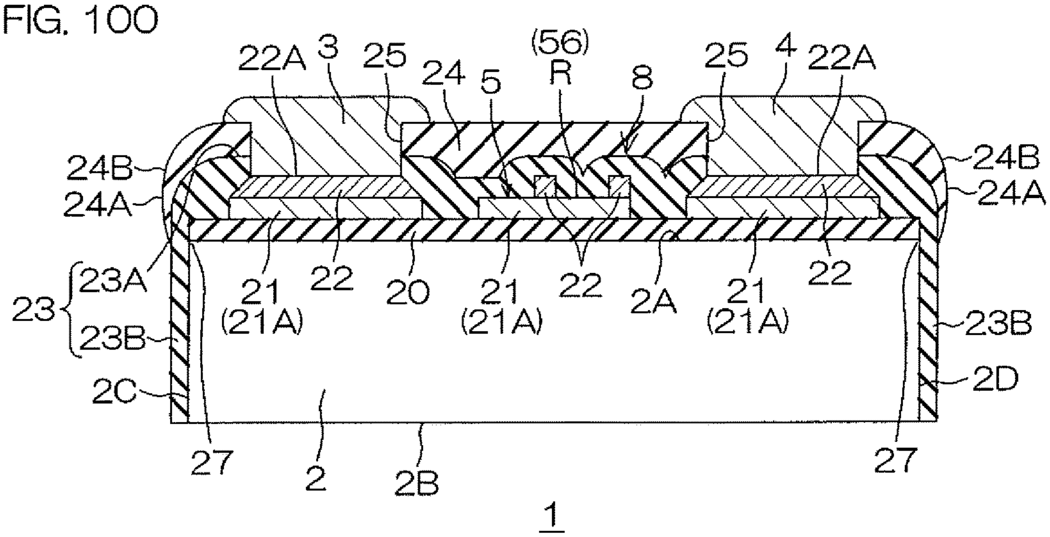

FIG. 100 is a schematic sectional view of the electronic device.

Figure 101A:
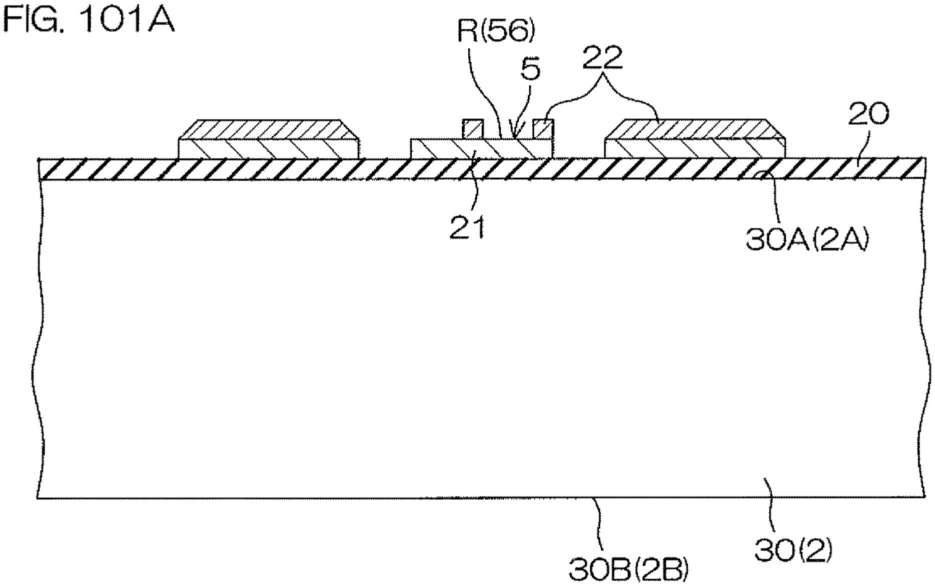

FIG. 101A is an illustrative sectional view of a method for manufacturing the electronic device shown in FIG. 100.

Figure 101B:
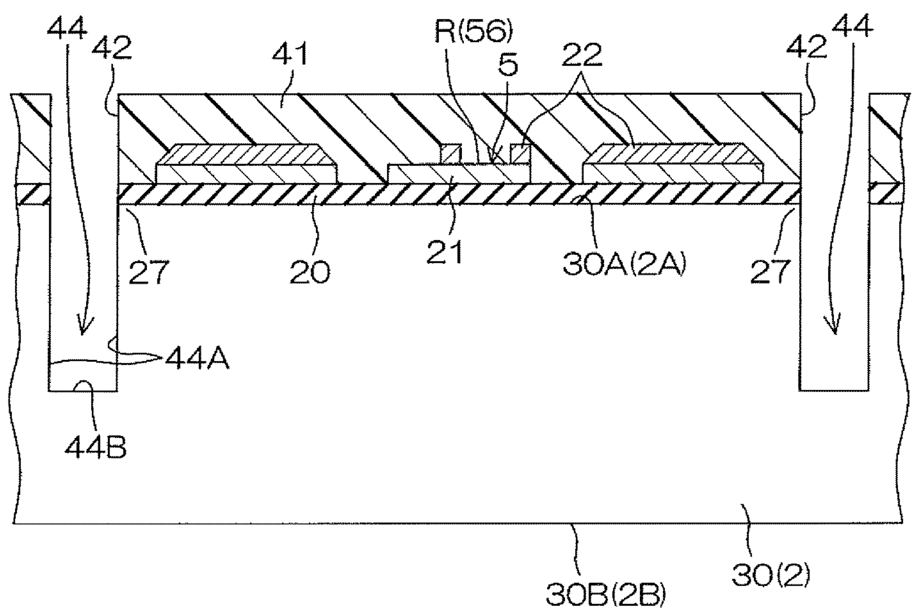

FIG. 101B is an illustrative sectional view of a step subsequent to that of FIG. 101A.

Figure 101C:
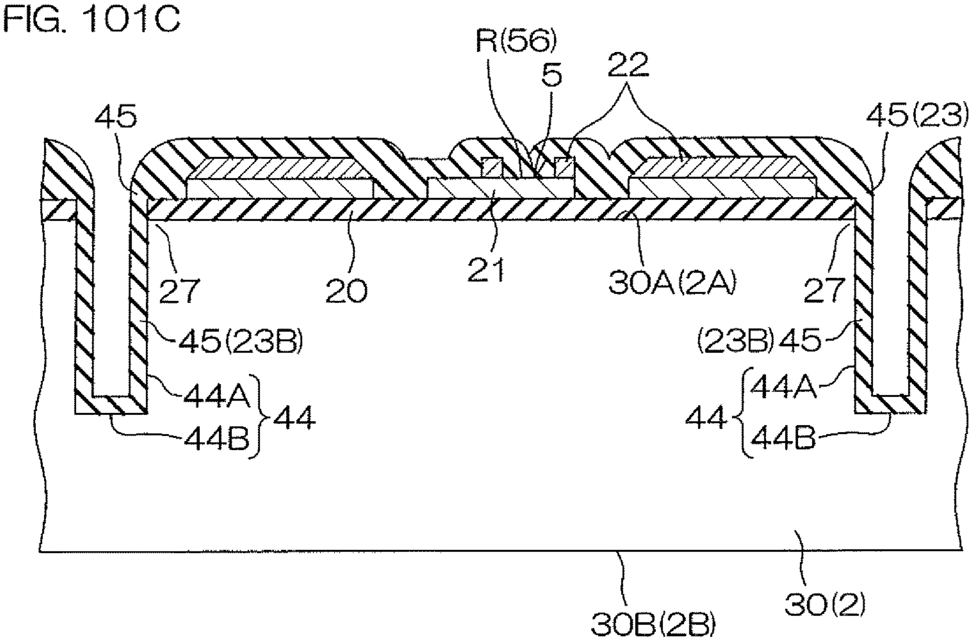

FIG. 101C is an illustrative sectional view of a step subsequent to that of FIG. 101B.

Figure 101D:
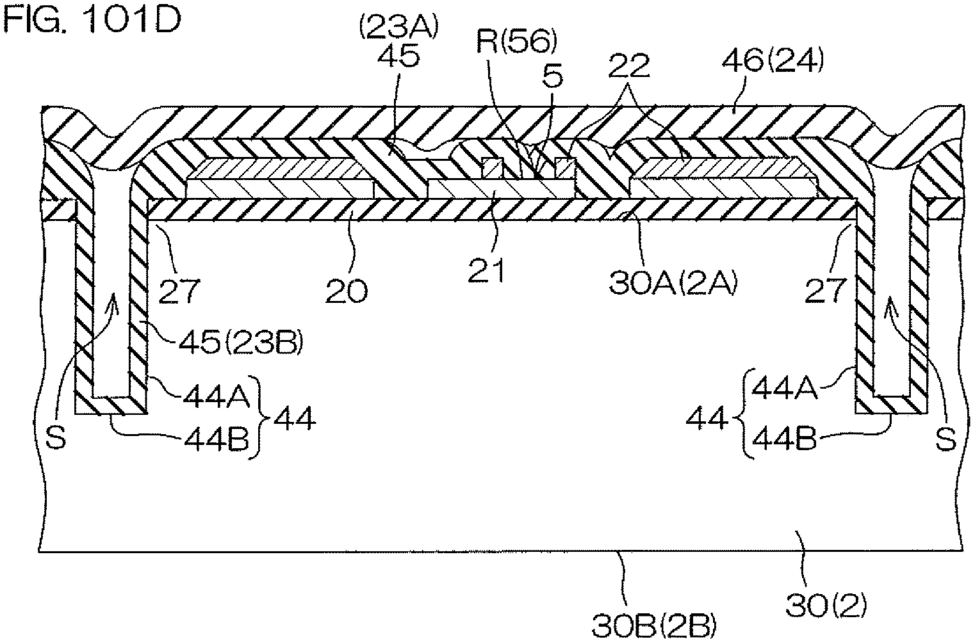

FIG. 101D is an illustrative sectional view of a step subsequent to that of FIG. 101C.

Figure 101E:
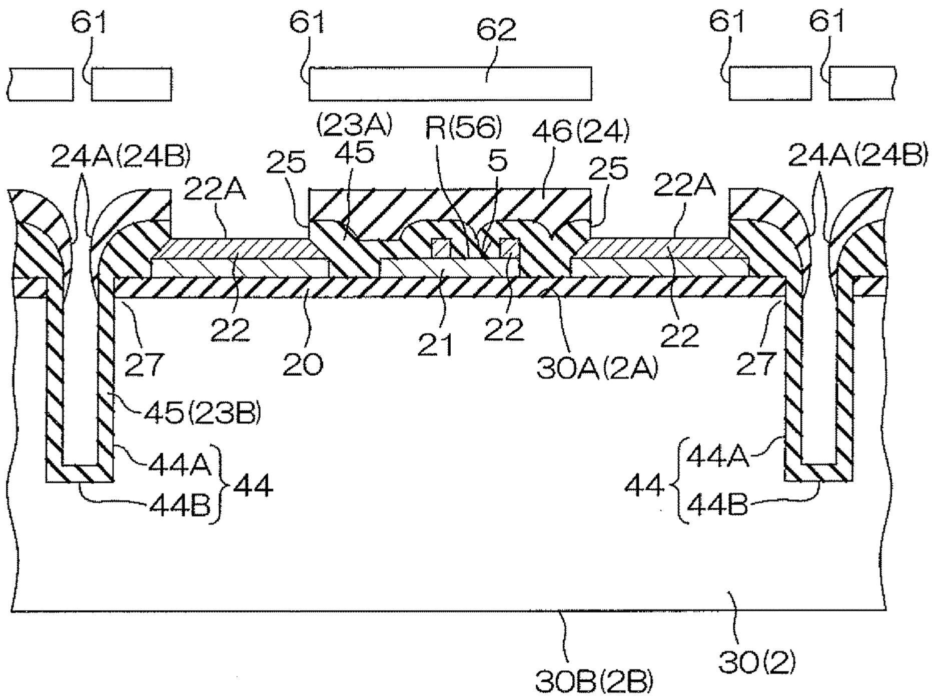

FIG. 101E is an illustrative sectional view of a step subsequent to that of FIG. 101D.

Figure 101F:
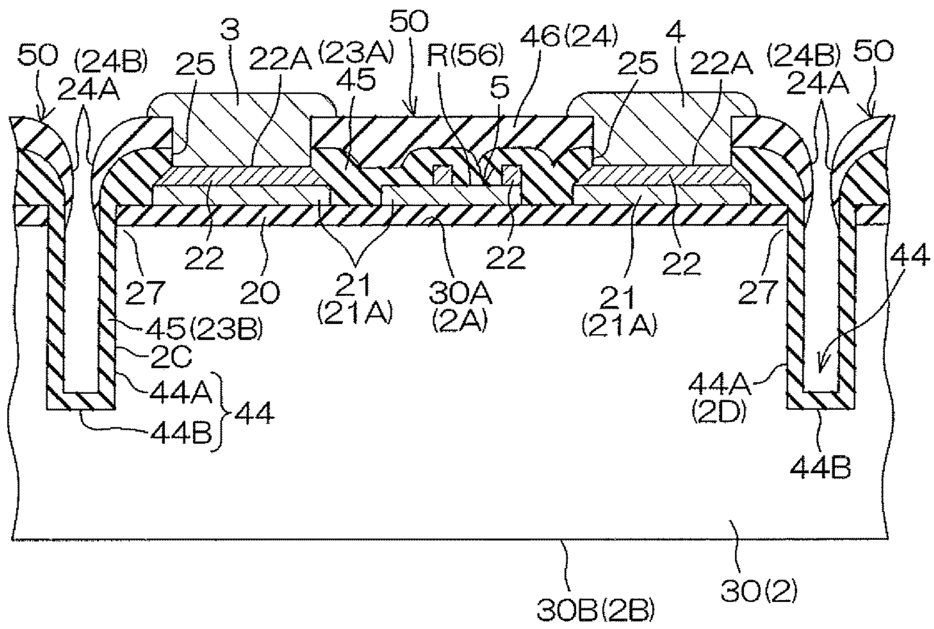

FIG. 101F is an illustrative sectional view of a step subsequent to that of FIG. 101E.

Figure 102:
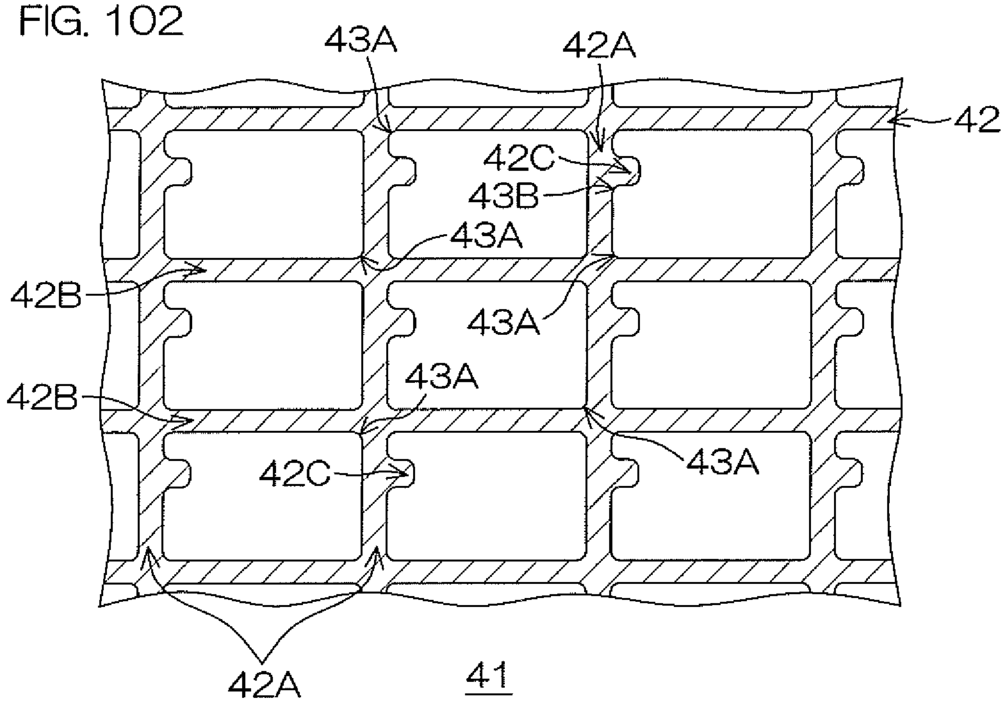

FIG. 102 is a schematic plan view of a portion of a resist pattern used for forming a groove in the step of FIG. 101B.

Figure 103A:
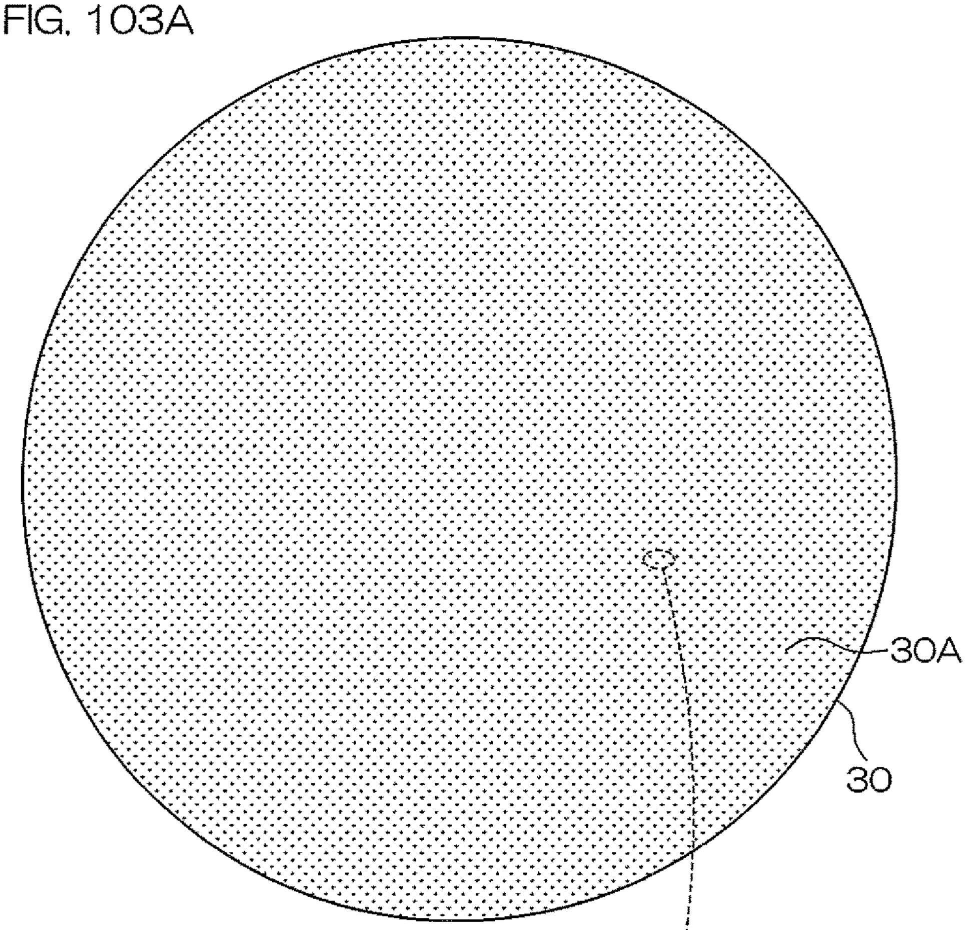

FIG. 103A is a schematic plan view of a wafer after the groove has been formed in the step of FIG. 101B.

Figure 103B:
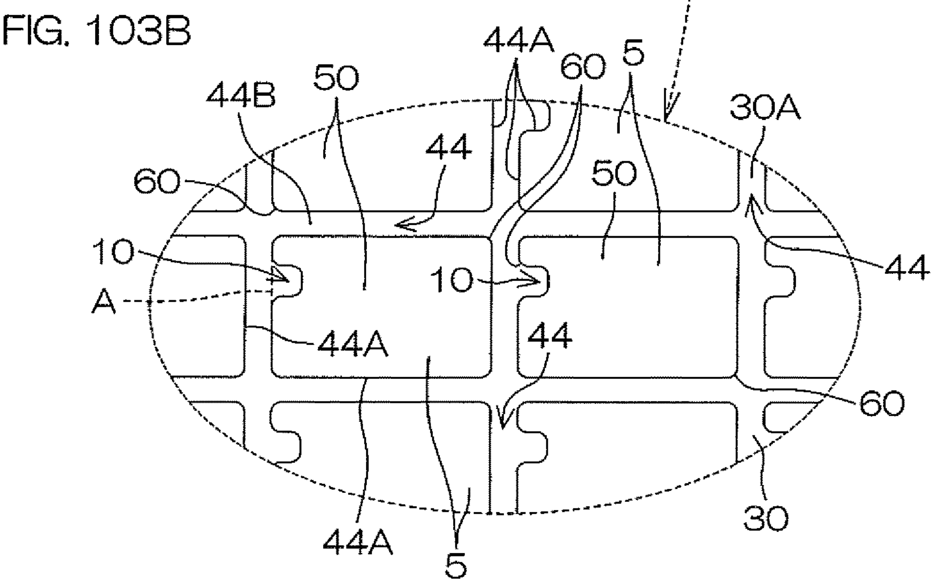

FIG. 103B is an enlarged view of a portion in FIG. 103A.

Figure 104A:
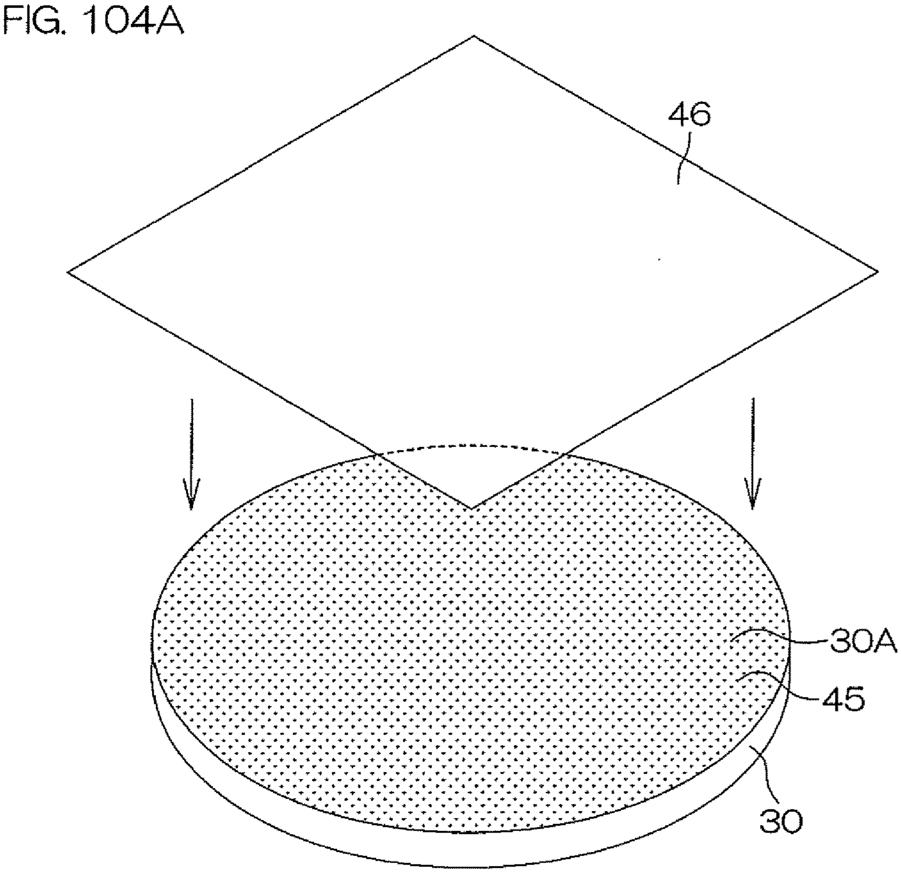

FIG. 104A is an illustrative perspective view of states of adhering a polyimide sheet onto the wafer in the step of FIG. 101D.

Figure 104B:
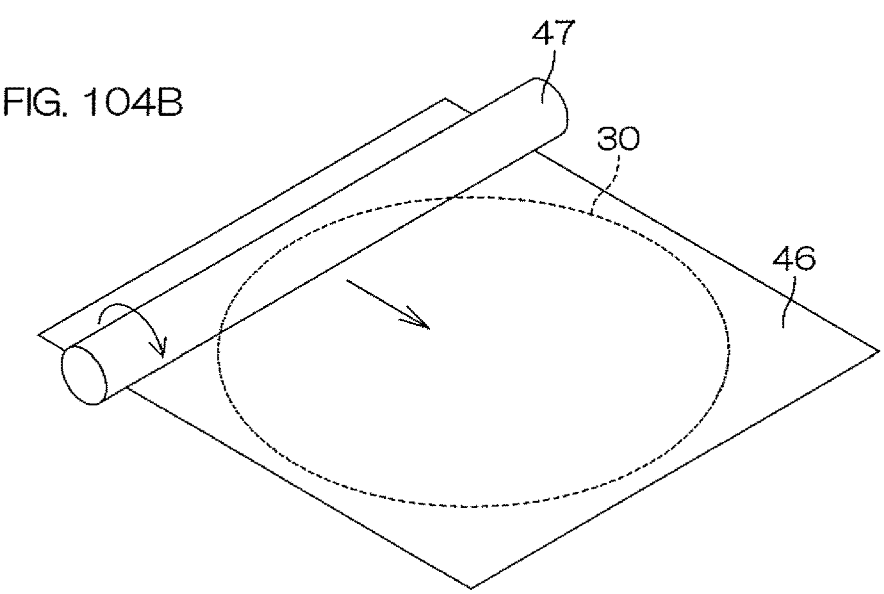

FIG. 104B is an illustrative perspective view of states of adhering a polyimide sheet onto the wafer in the step of FIG. 101D.

Figure 105A:
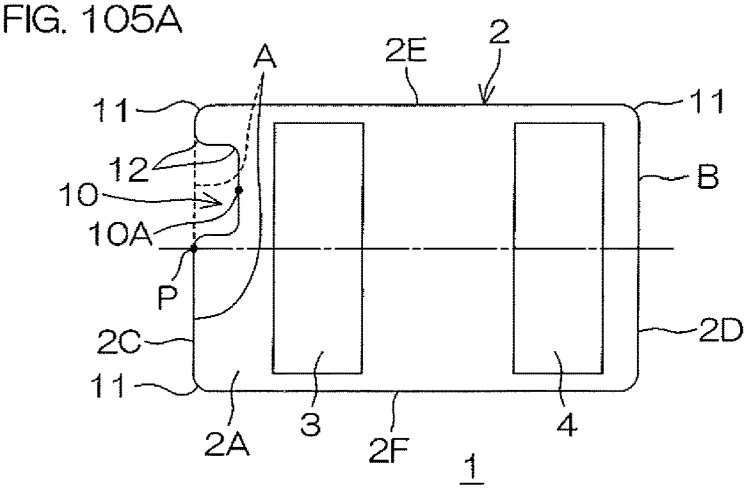

FIG. 105A is a plan view of an electronic device.

Figure 105B:
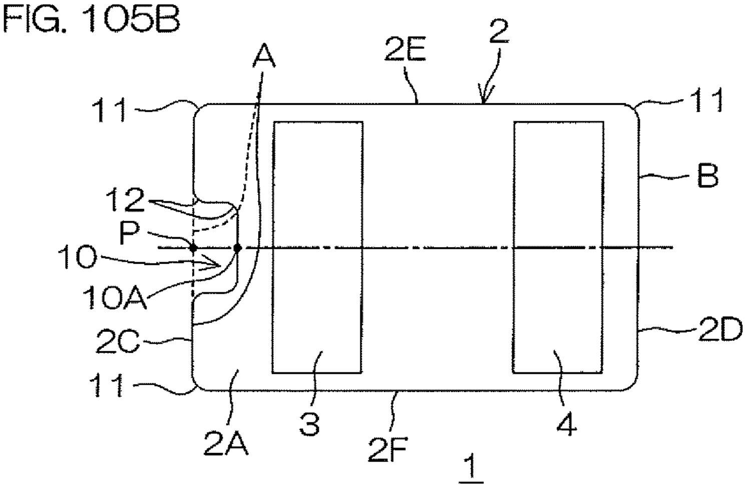

FIG. 105B is a plan view of an electronic device according to a first modification example.

Figure 105C:
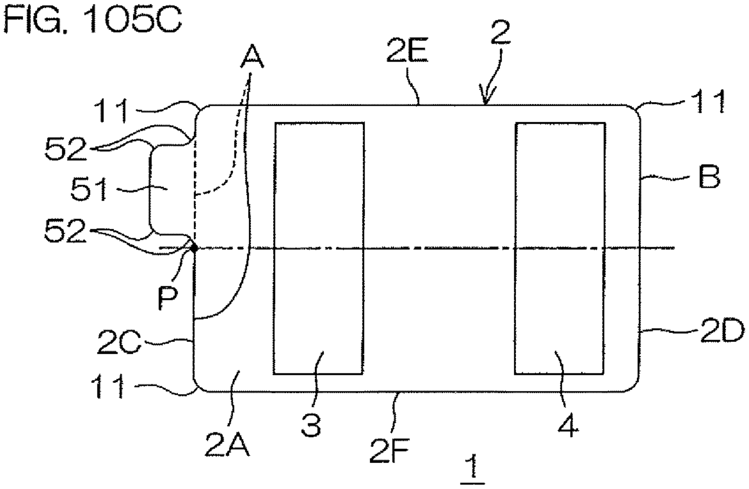

FIG. 105C is a plan view of an electronic device according to a second modification example.

Figure 106A:
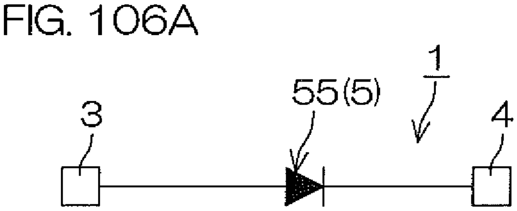

FIG. 106A is a diagram of the circuit arrangement of an element according to another preferred embodiment of the electronic device.

Figure 106B:
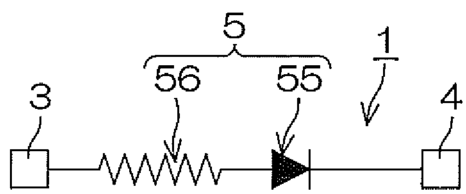

FIG. 106B is a diagram of the circuit arrangement of an element according to yet another preferred embodiment of the electronic device.

Figure 107A:
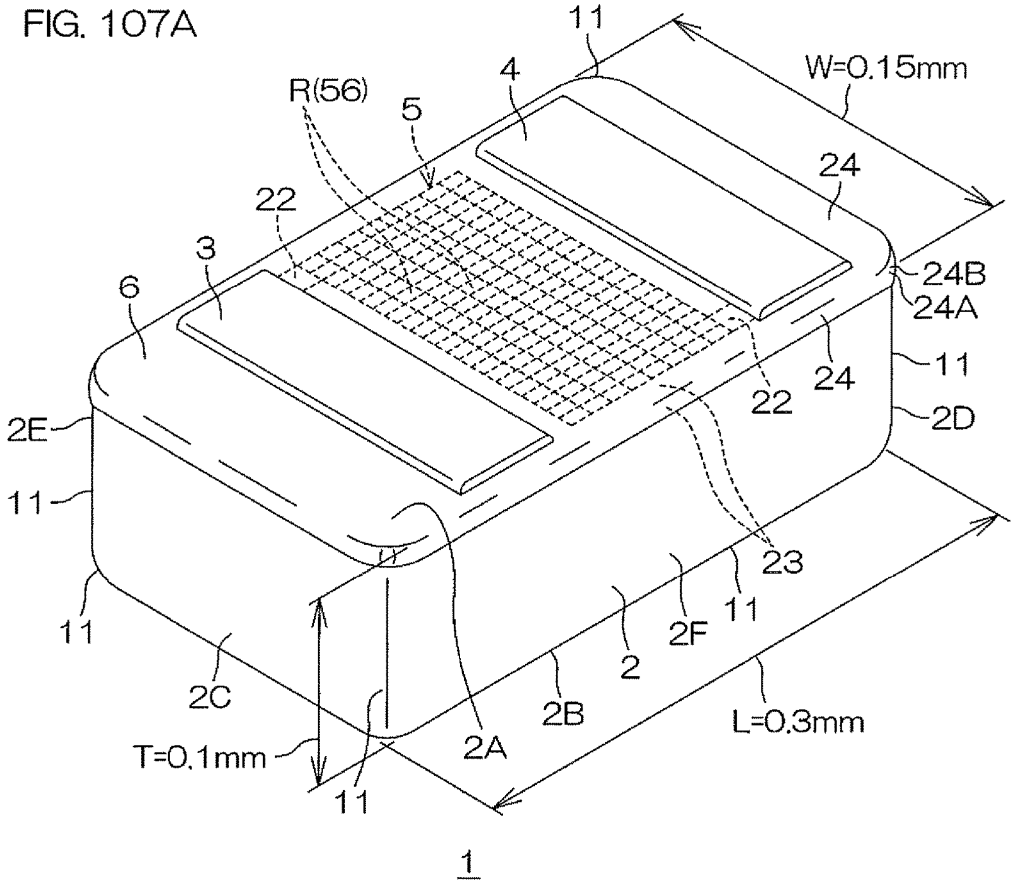

FIG. 107A is a schematic perspective view for describing the arrangement of a chip resistor according to a preferred embodiment of a seventh reference example.

Figure 107B:
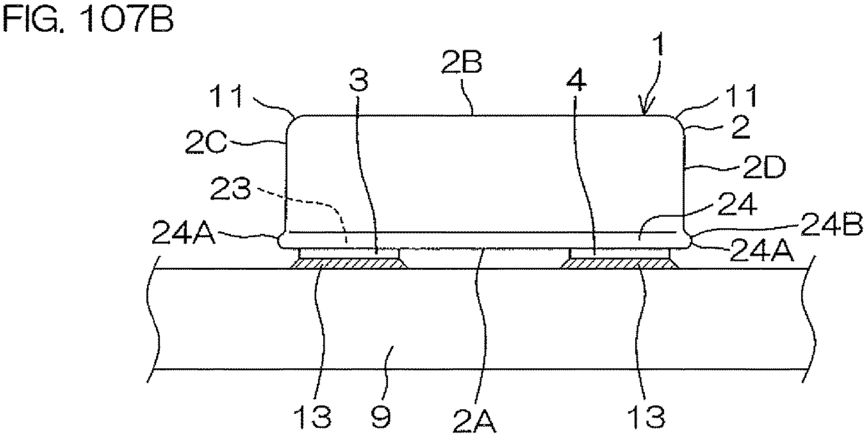

FIG. 107B is a schematic side view of a state where the chip resistor is mounted on a circuit substrate.

Figure 108:
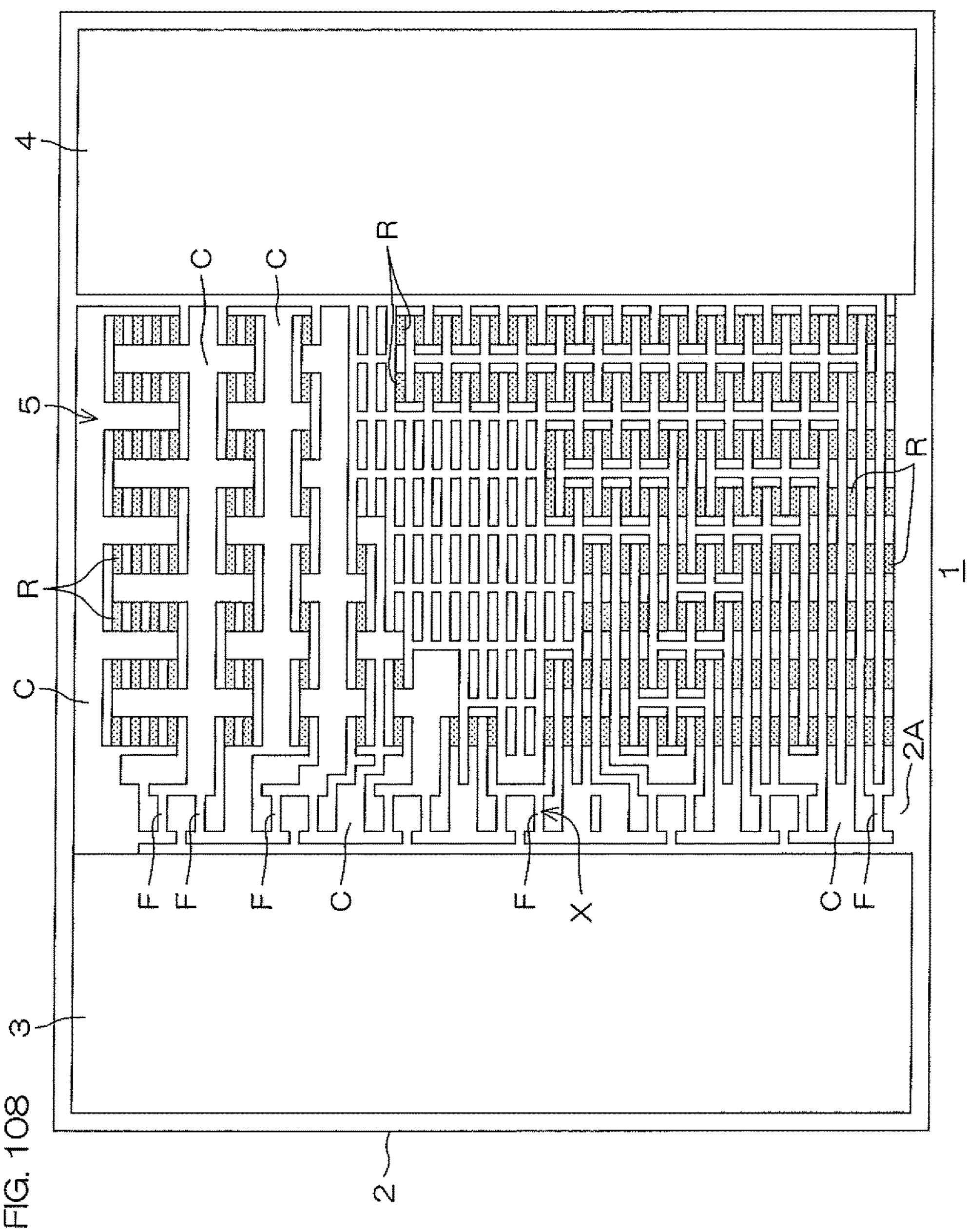

FIG. 108 is a plan view of the chip resistor showing the positional relationships of a first connection electrode, a second connection electrode, and an element and showing the arrangement in a plan view of the element.

Figure 109A:
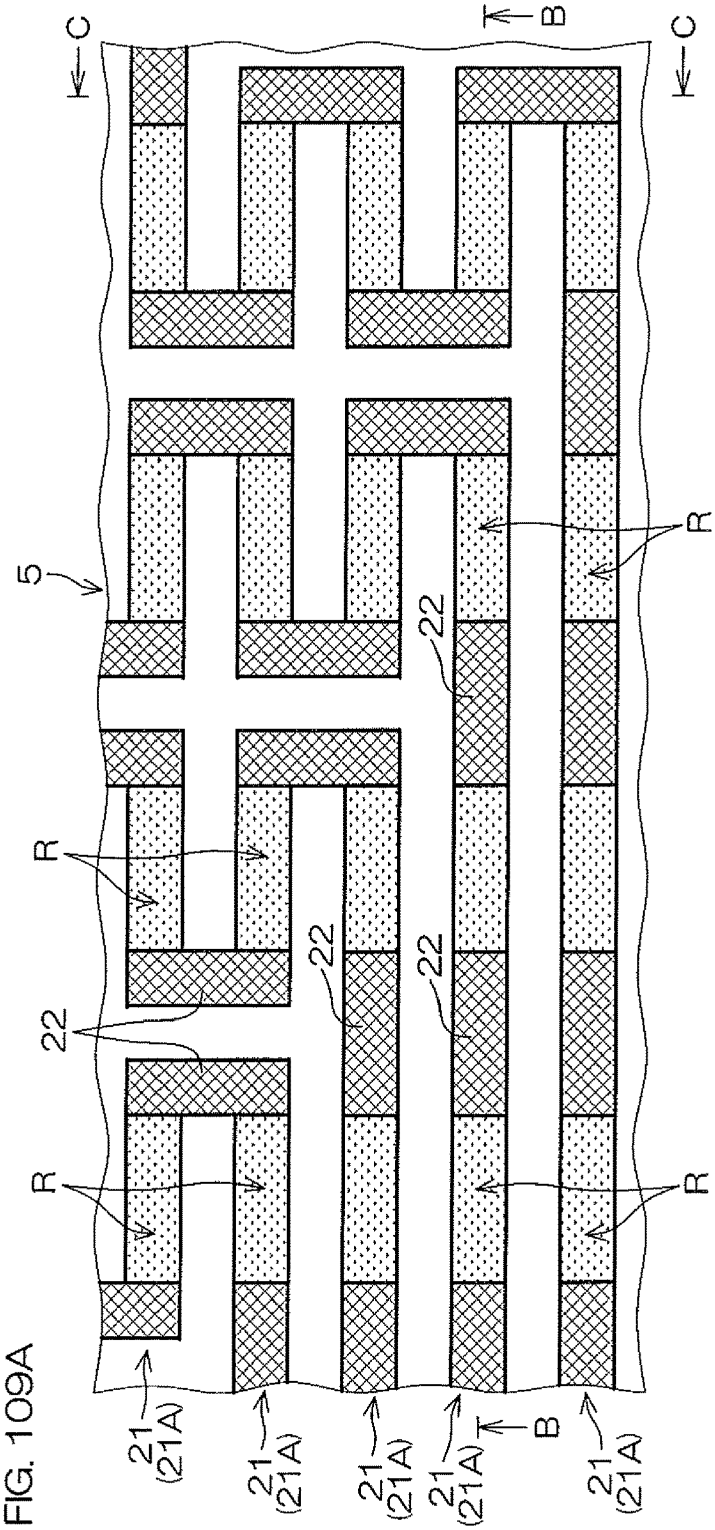

FIG. 109A is partially enlarged plan view of the element shown in FIG. 108.

Figure 109B:
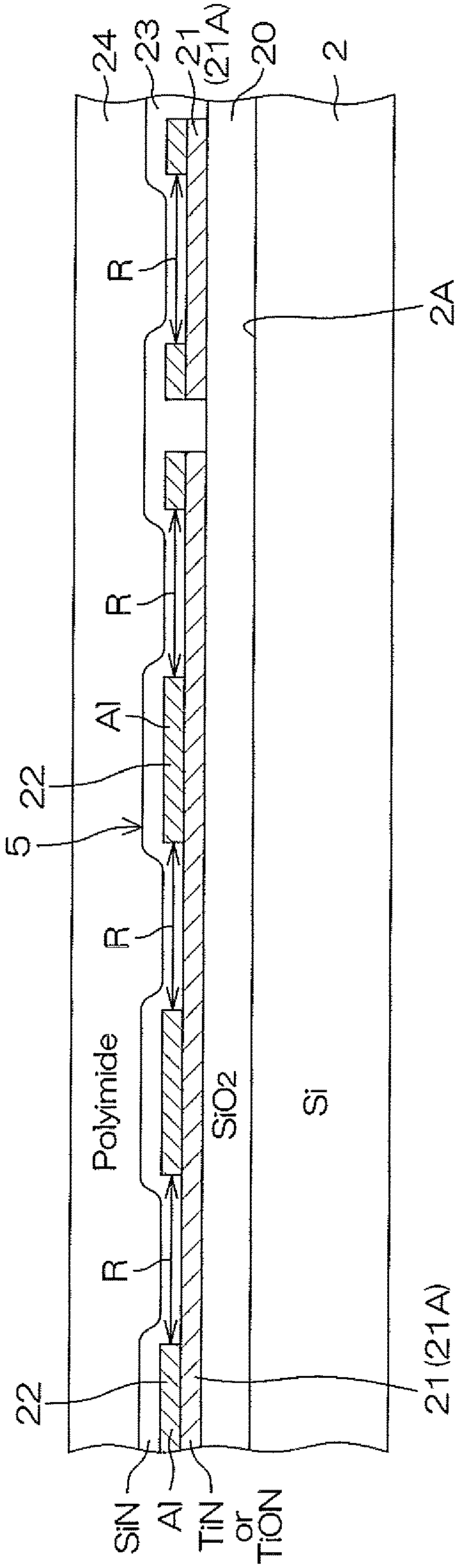

FIG. 109B is a vertical sectional view in the length direction taken along B-B of FIG. 109A for describing the arrangement of resistor bodies in the element.

Figure 109C:
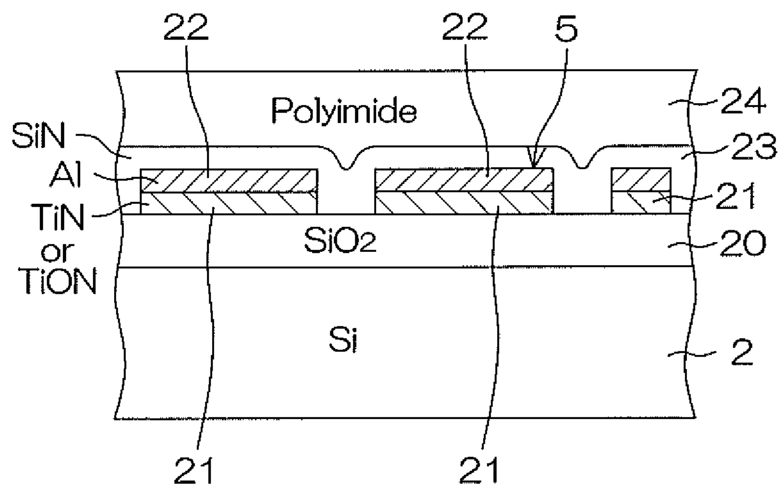

FIG. 109C is a vertical sectional view in the width direction taken along C-C of FIG. 109A for describing the arrangement of the resistor bodies in the element.

Figure 110A:
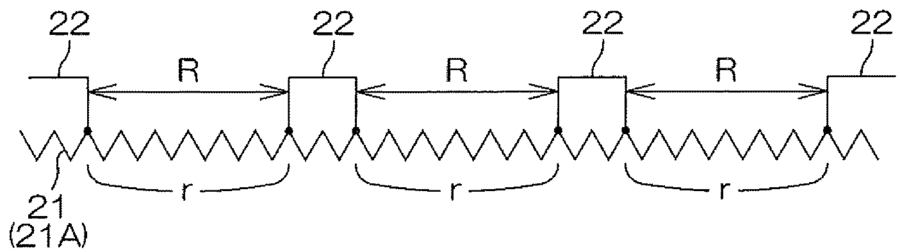

FIG. 110A is a diagram showing the electrical features of resistor body film lines and conductor films in the form of circuit symbols and an electric circuit diagram.

Figure 110B:
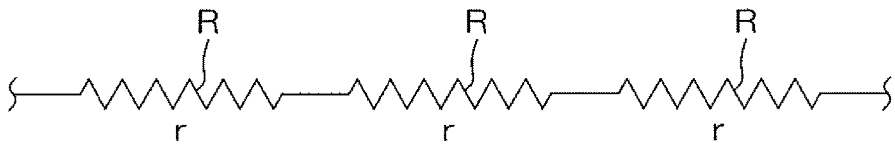

FIG. 110B is a diagram showing the electrical features of resistor body film lines and conductor films in the form of circuit symbols and an electric circuit diagram.

Figure 110C:
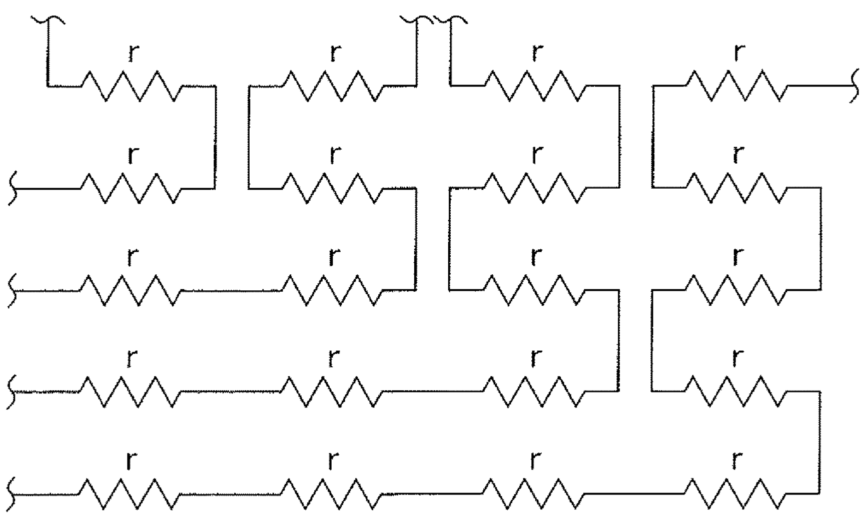

FIG. 110C is a diagram showing the electrical features of resistor body film lines and conductor films in the form of circuit symbols and an electric circuit diagram.

Figure 111A:
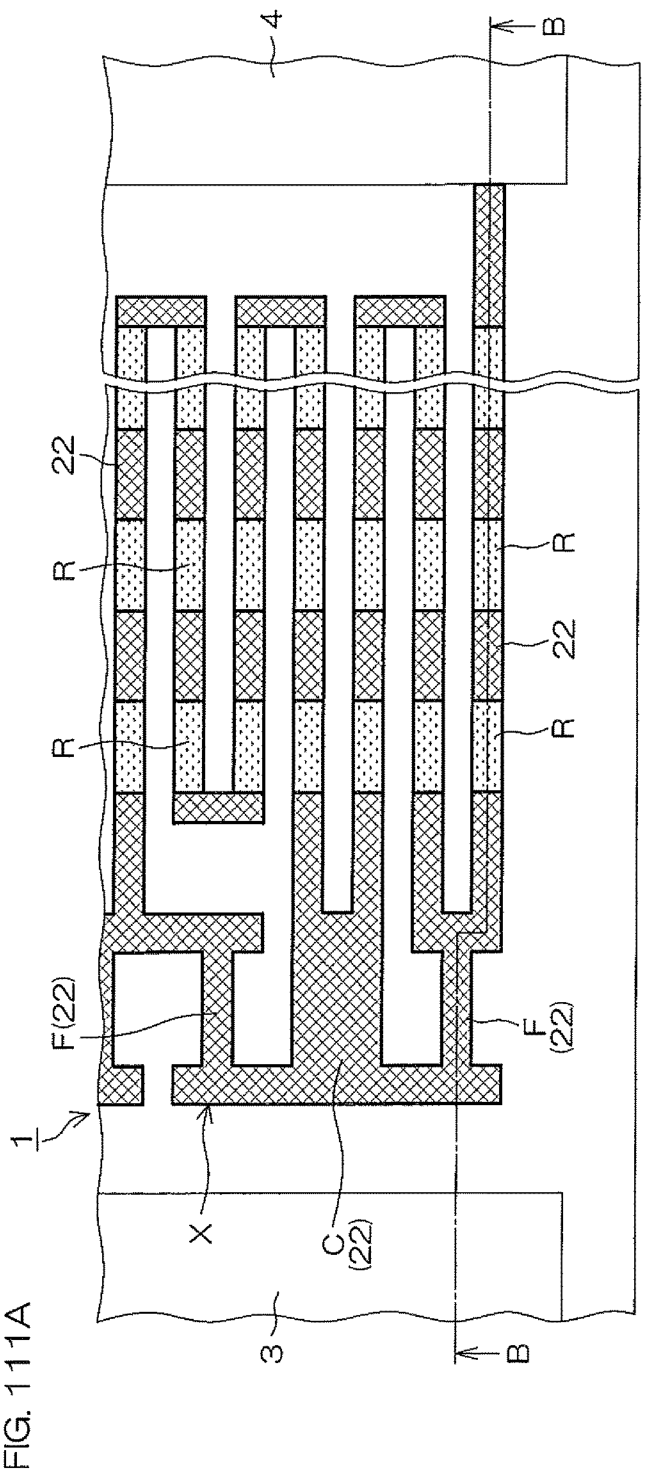

FIG. 111A is a partially enlarged plan view of a region including fuse films drawn by enlarging a portion of the plan view of the chip resistor shown in FIG. 108.

Figure 111B:
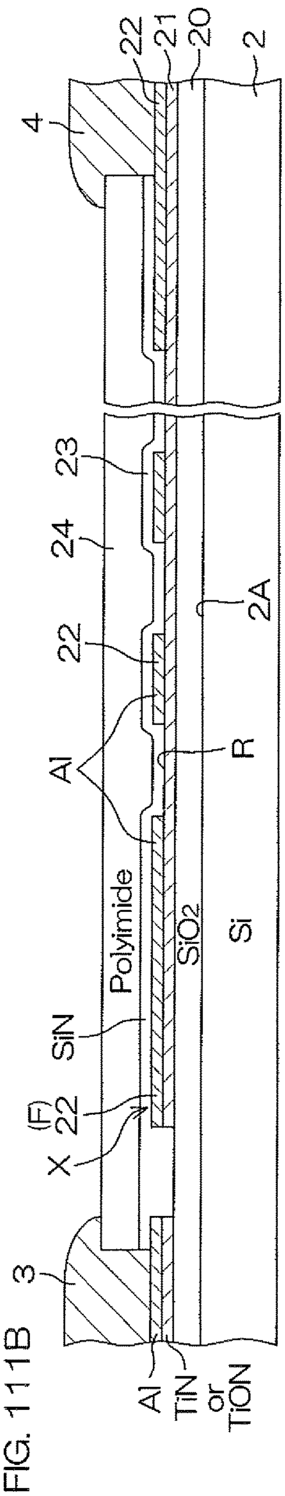

FIG. 111B is a structural sectional view taken along B-B in FIG. 111A.

Figure 112:
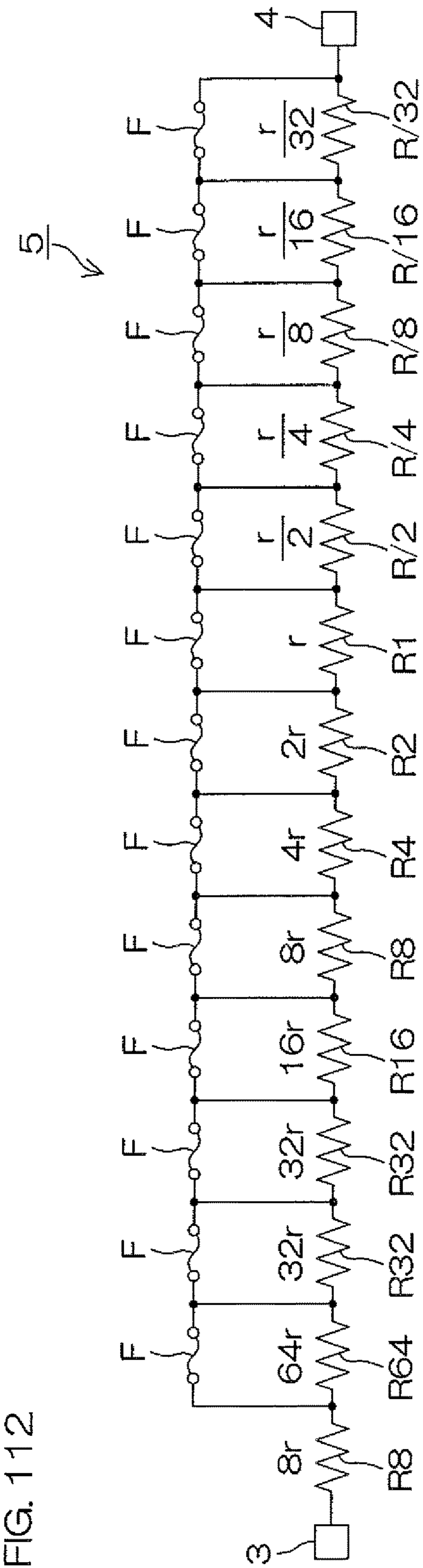

FIG. 112 is an electric circuit diagram of the element according to the preferred embodiment of the seventh reference example.

Figure 113:
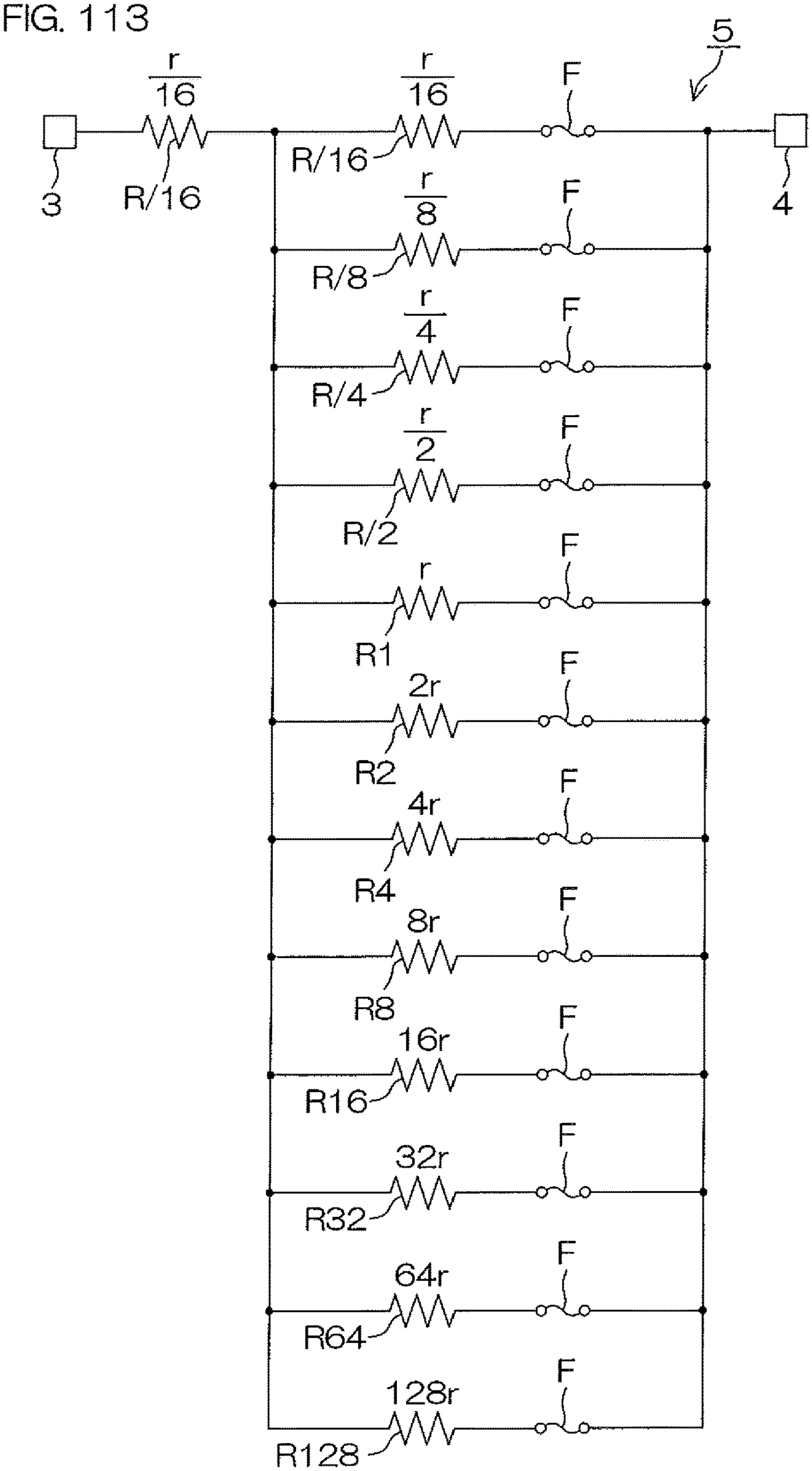

FIG. 113 is an electric circuit diagram of an element according to another preferred embodiment of the seventh reference example.

Figure 114:
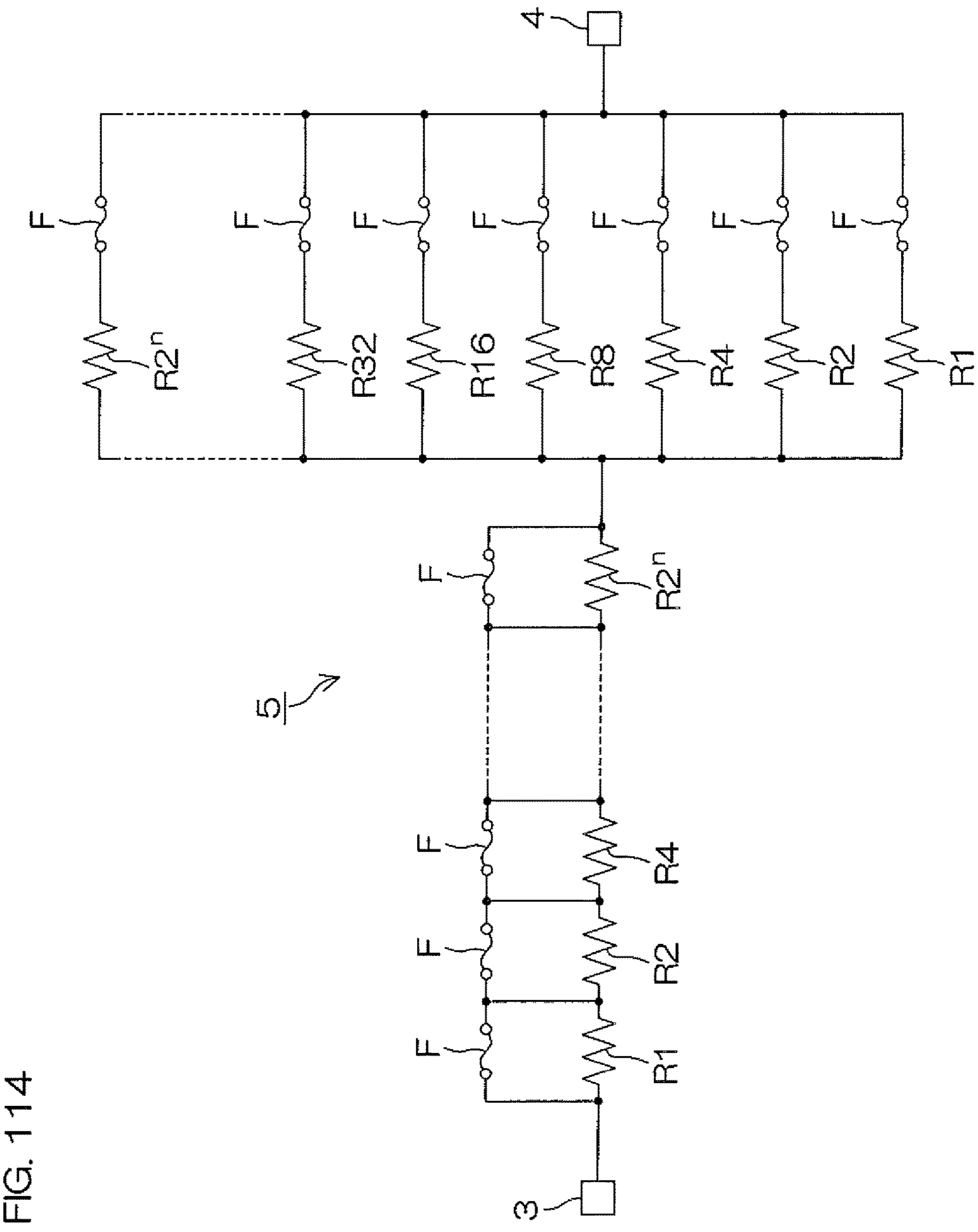

FIG. 114 is an electric circuit diagram of an element according to yet another preferred embodiment of the seventh reference example.

Figure 115:
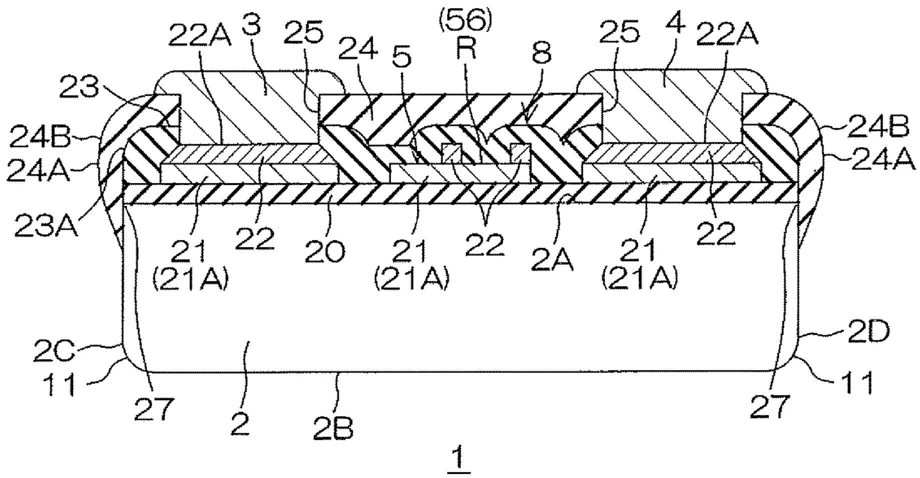

FIG. 115 is a schematic sectional view of the chip resistor.

Figure 116A:
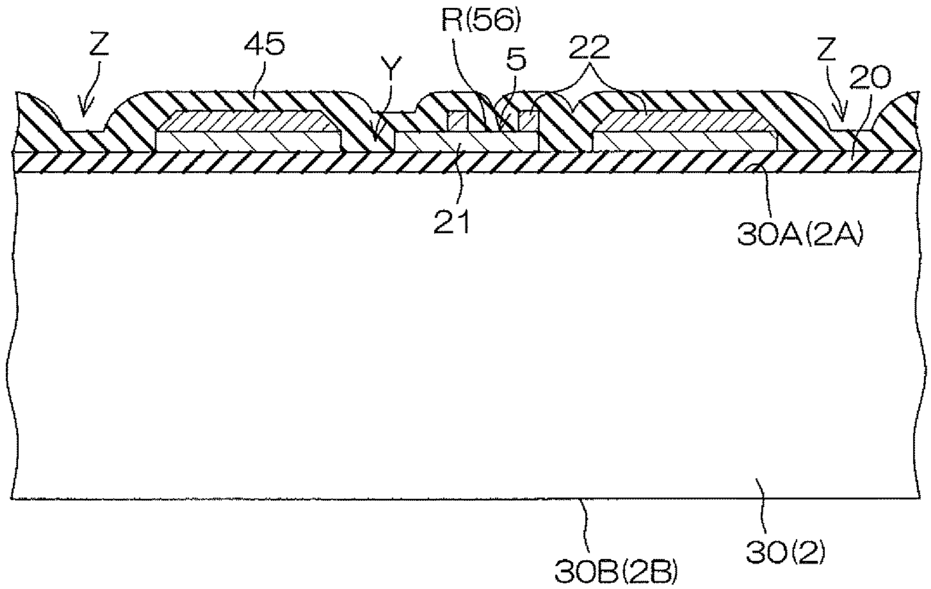

FIG. 116A is an illustrative sectional view of a method for manufacturing the chip resistor shown in FIG. 115.

Figure 116B:
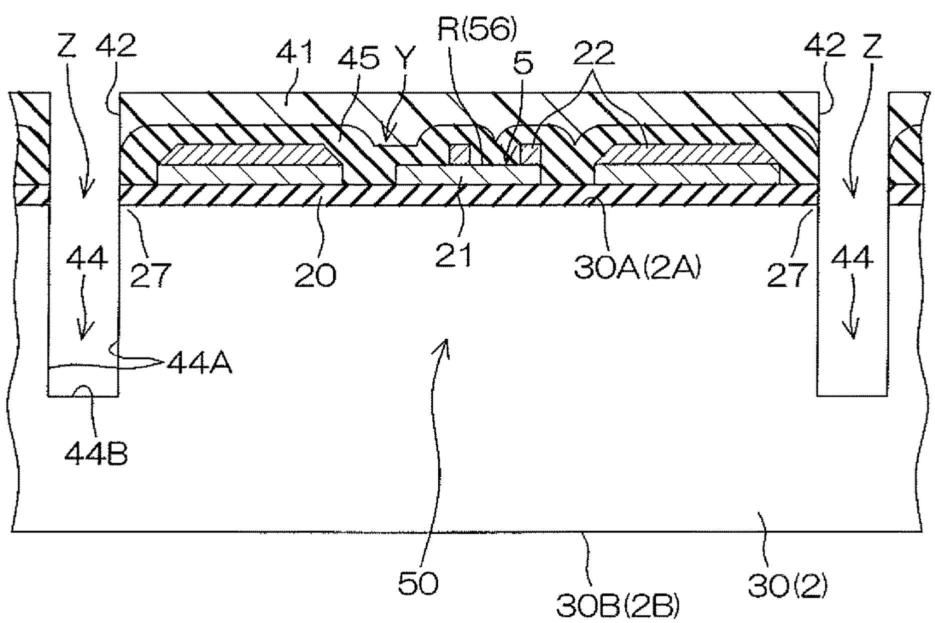

FIG. 116B is an illustrative sectional view of a step subsequent to that of FIG. 116A.

Figure 116C:
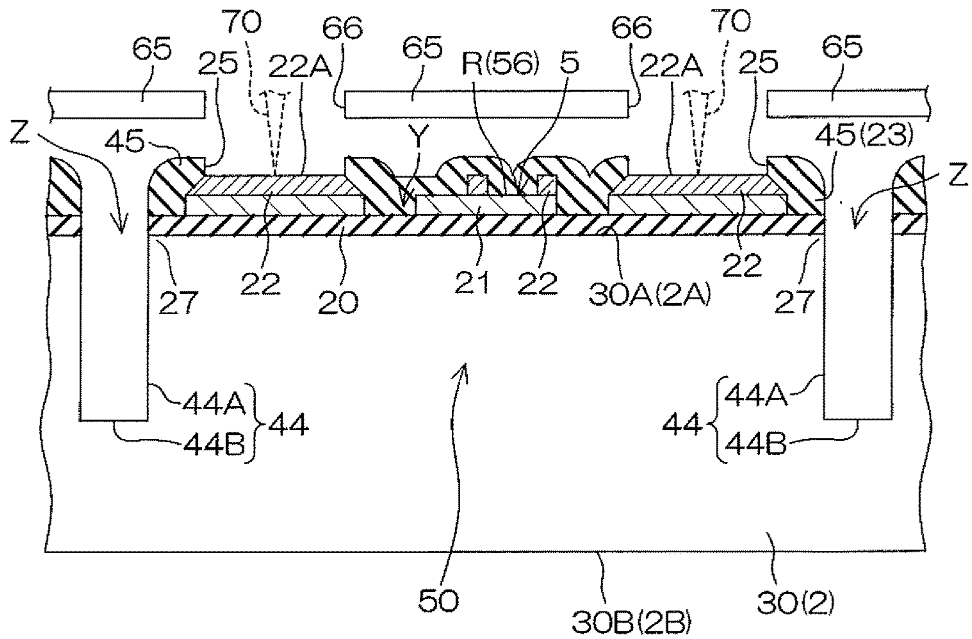

FIG. 116C is an illustrative sectional view of a step subsequent to that of FIG. 116B.

Figure 116D:
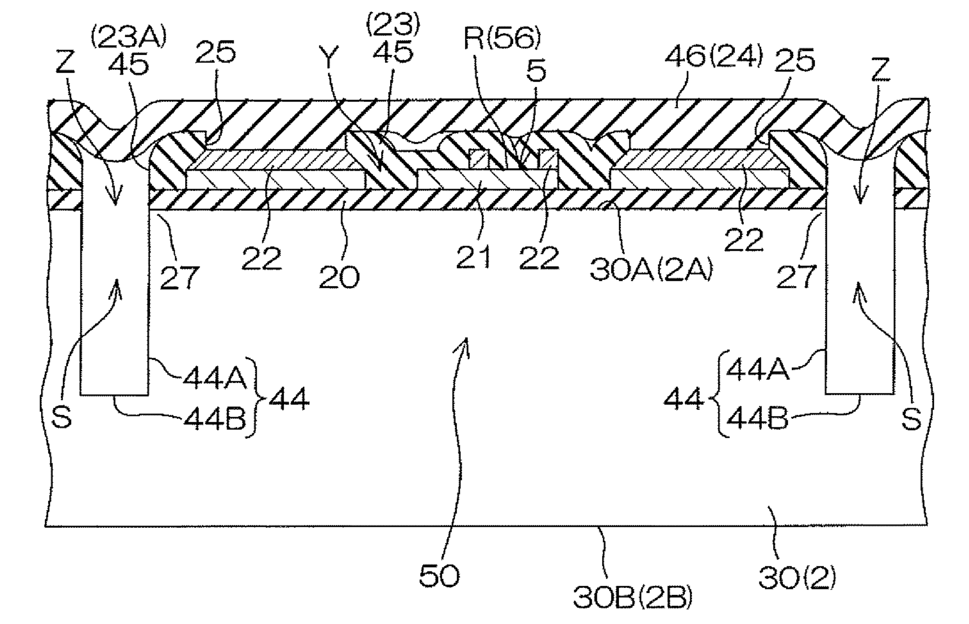

FIG. 116D is an illustrative sectional view of a step subsequent to that of FIG. 116C.

Figure 116E:
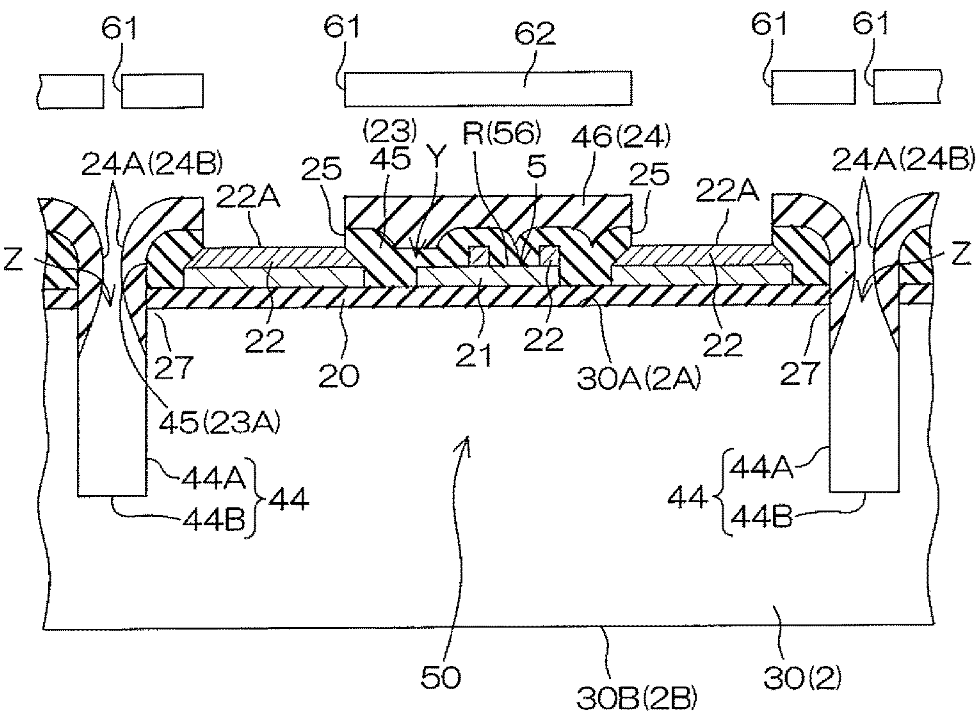

FIG. 116E is an illustrative sectional view of a step subsequent to that of FIG. 116D.

Figure 116F:
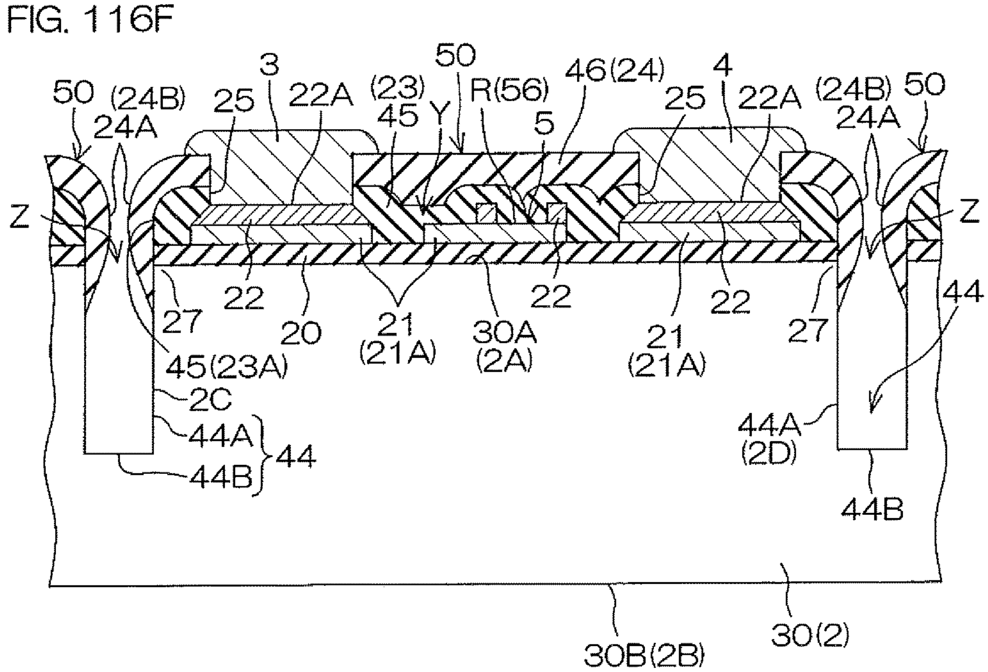

FIG. 116F is an illustrative sectional view of a step subsequent to that of FIG. 116E.

Figure 116G:
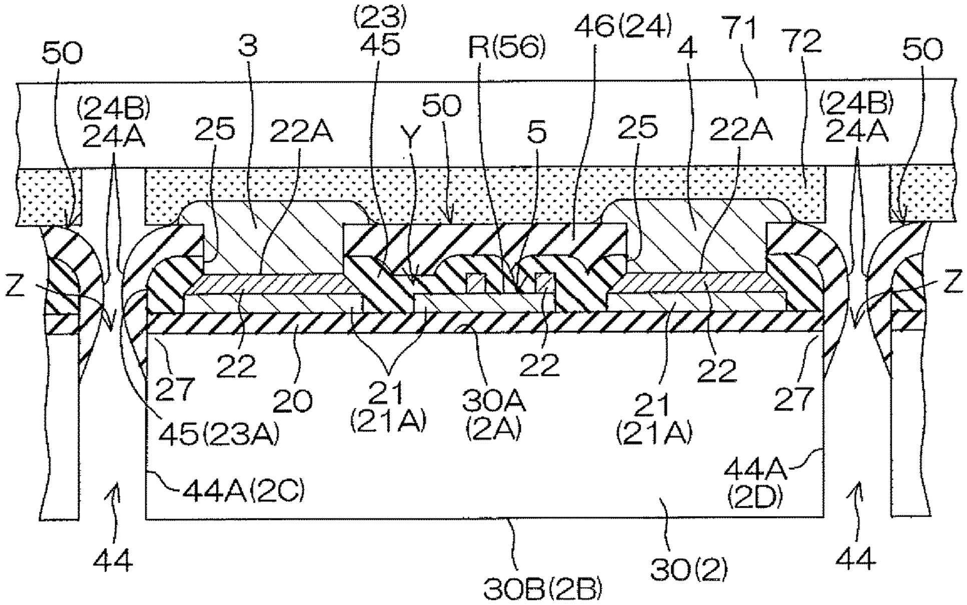

FIG. 116G is an illustrative sectional view of a step subsequent to that of FIG. 116F.

Figure 117:
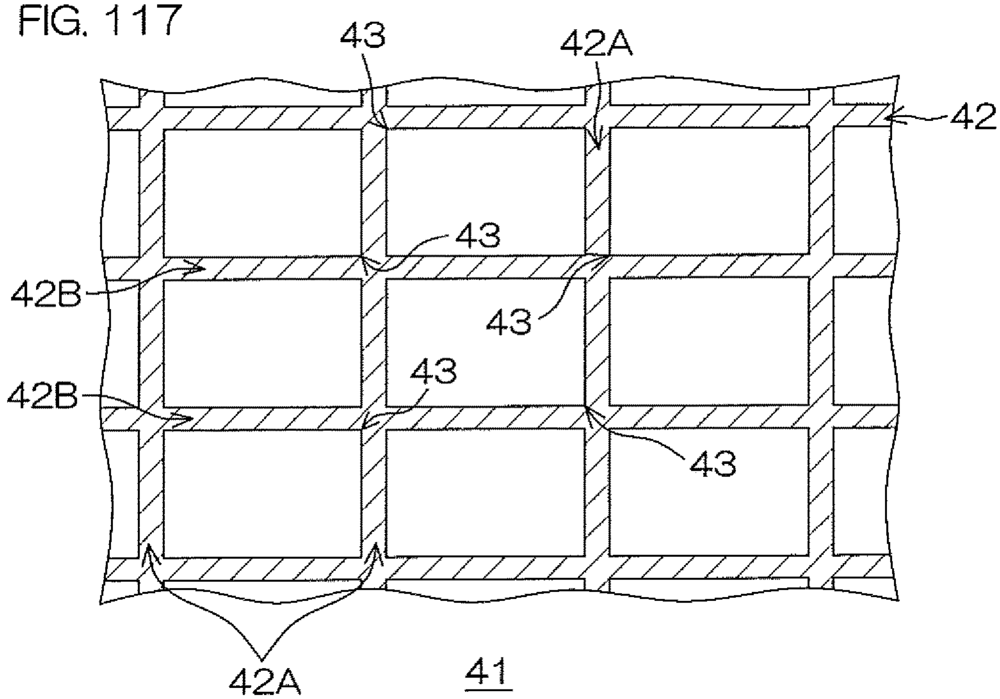

FIG. 117 is a schematic plan view of a portion of a resist pattern used for forming a groove in the step of FIG. 116B.

Figure 118A:
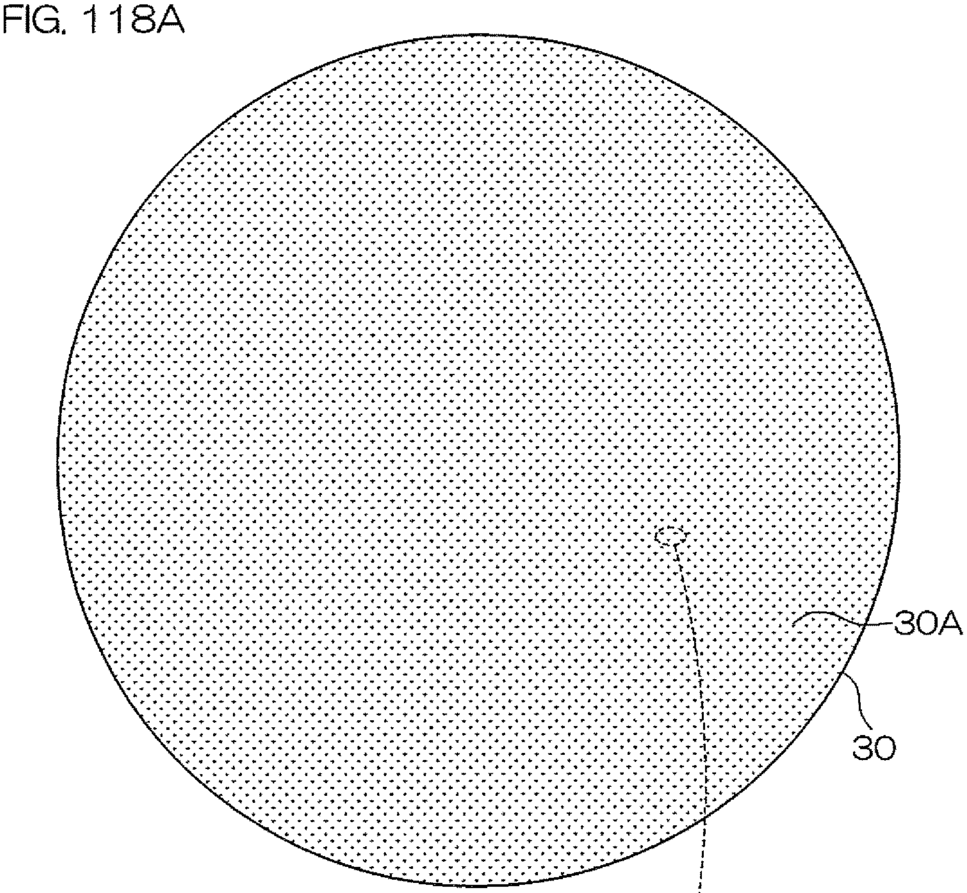

FIG. 118A is a schematic plan view of a substrate after the groove has been formed in the step of FIG. 116B.

Figure 118B:
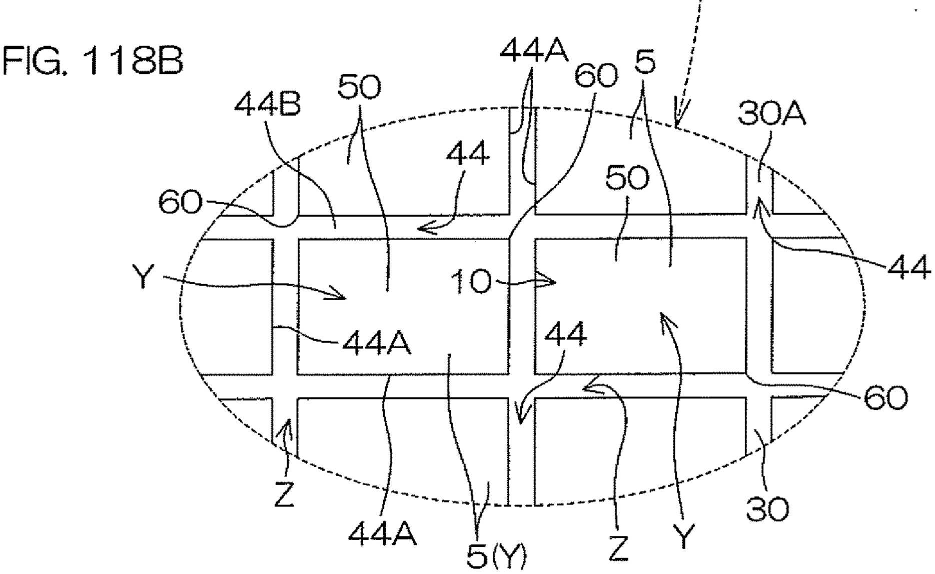

FIG. 118B is an enlarged view of a portion in FIG. 118A.

Figure 119A:
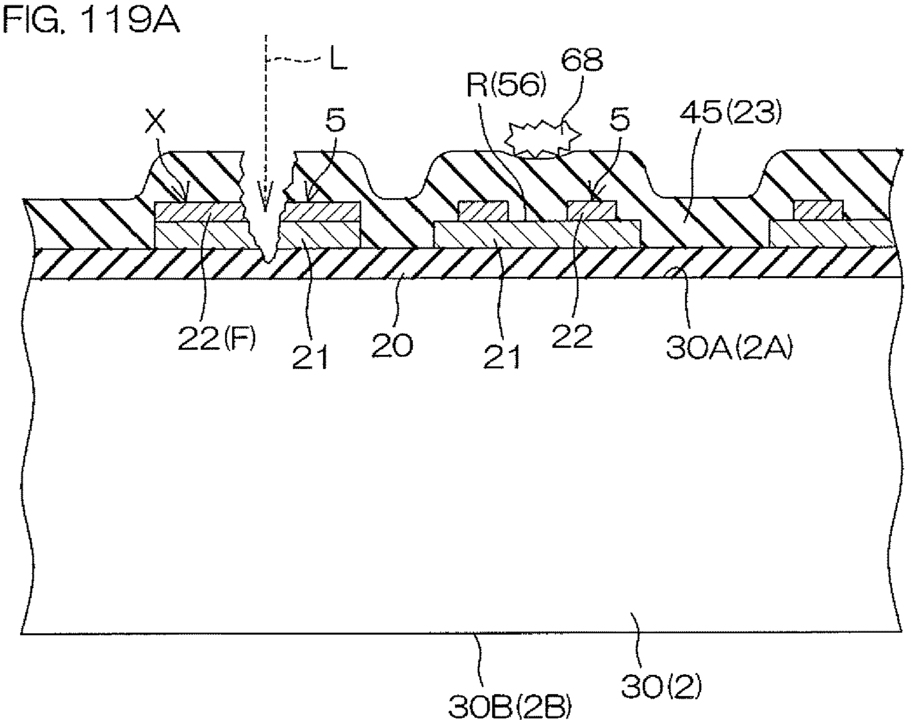

FIG. 119A is a schematic sectional view of the chip resistor according to the preferred embodiment of the seventh reference example in the middle of manufacture.

Figure 119B:
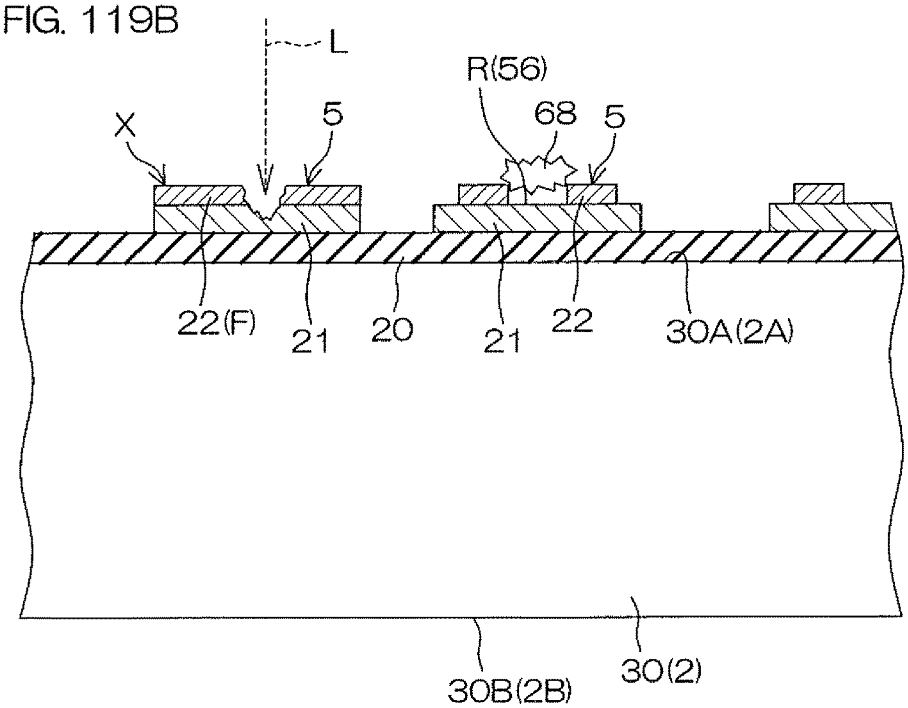

FIG. 119B is a schematic sectional view of a chip resistor according to a comparative example in the middle of manufacture.

Figure 120A:
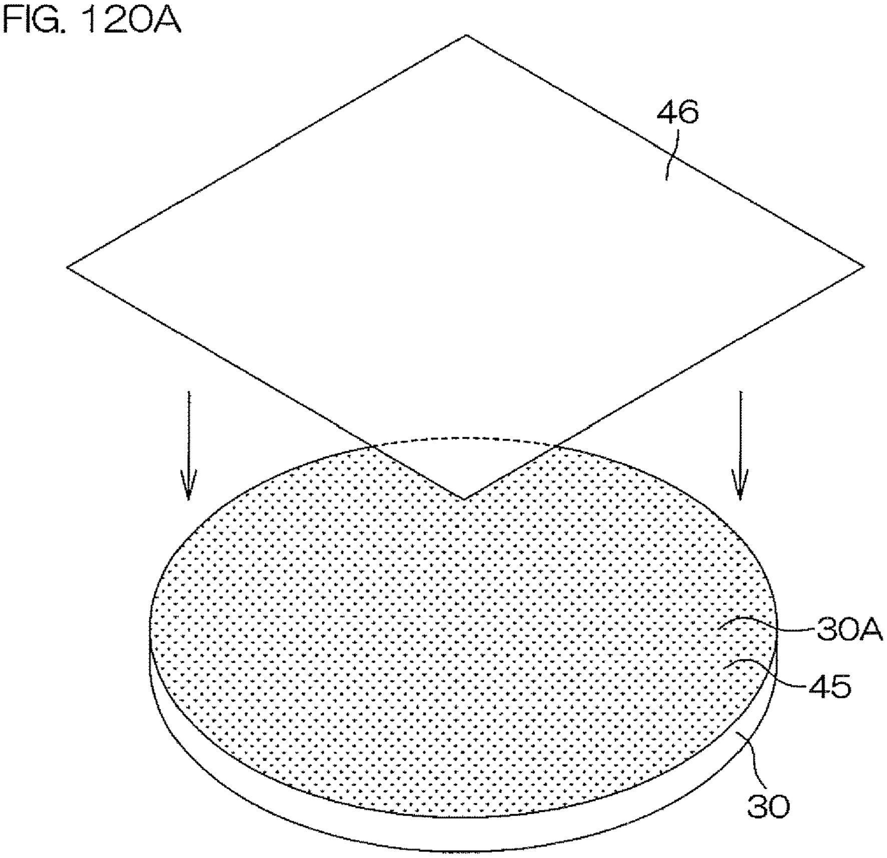

FIG. 120A is an illustrative perspective view of states of adhering a polyimide sheet onto a substrate in the step of FIG. 116D.

Figure 120B:
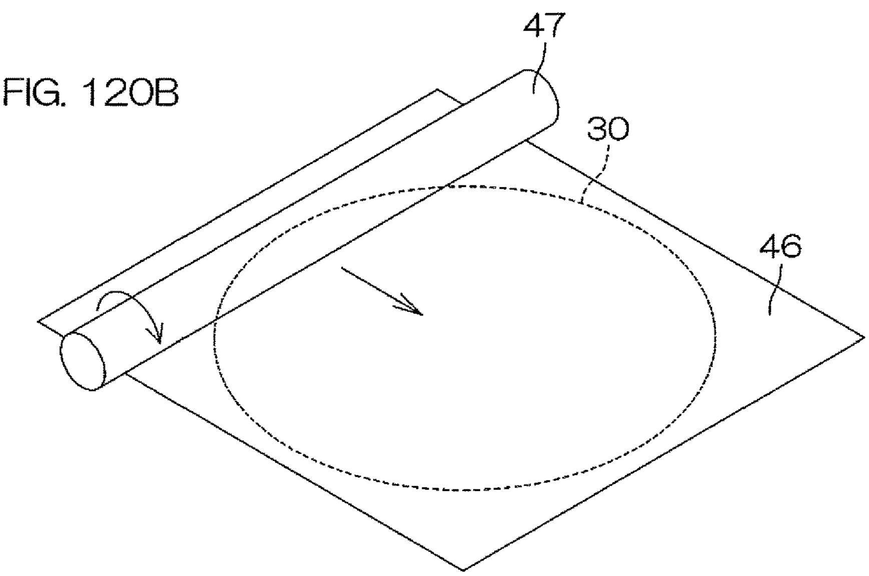

FIG. 120B is an illustrative perspective view of states of adhering a polyimide sheet onto a substrate in the step of FIG. 116D.

Figure 121:
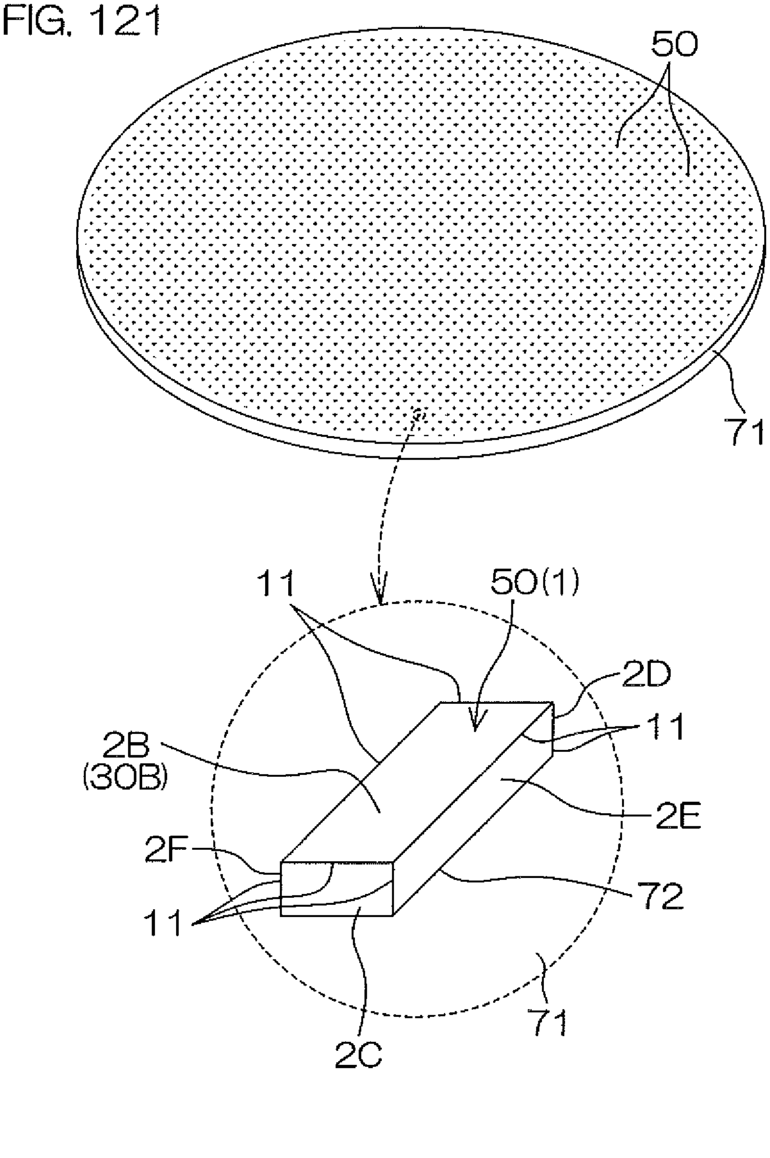

FIG. 121 is an illustrative perspective view of semi-finished chip resistor products immediately after the step of FIG. 116D.

Figure 122:
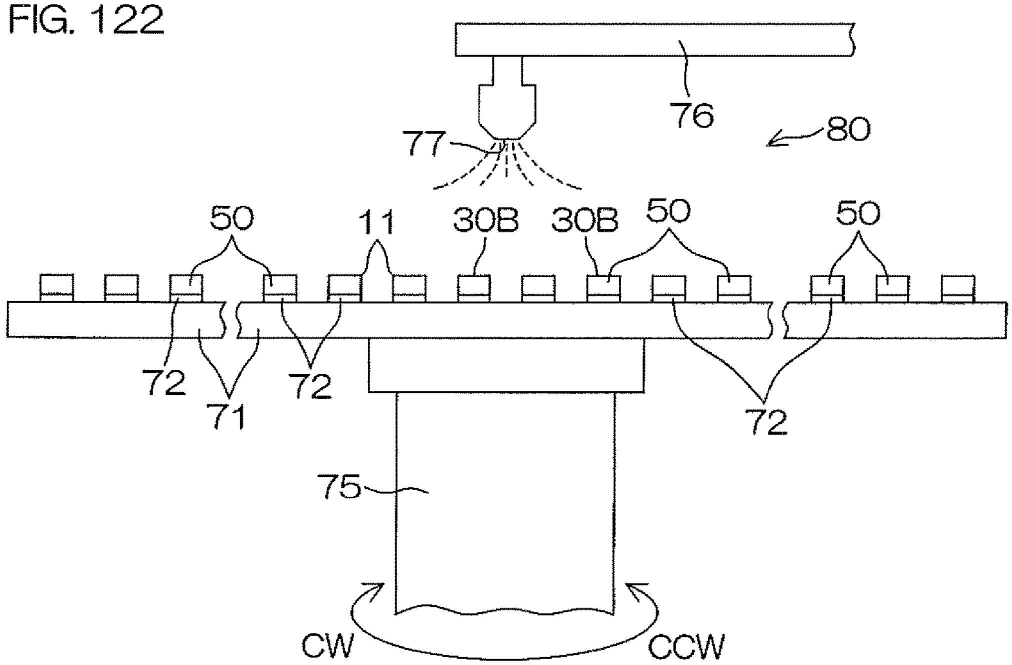

FIG. 122 is a first schematic view of a step subsequent to that of FIG. 116G.

Figure 123:
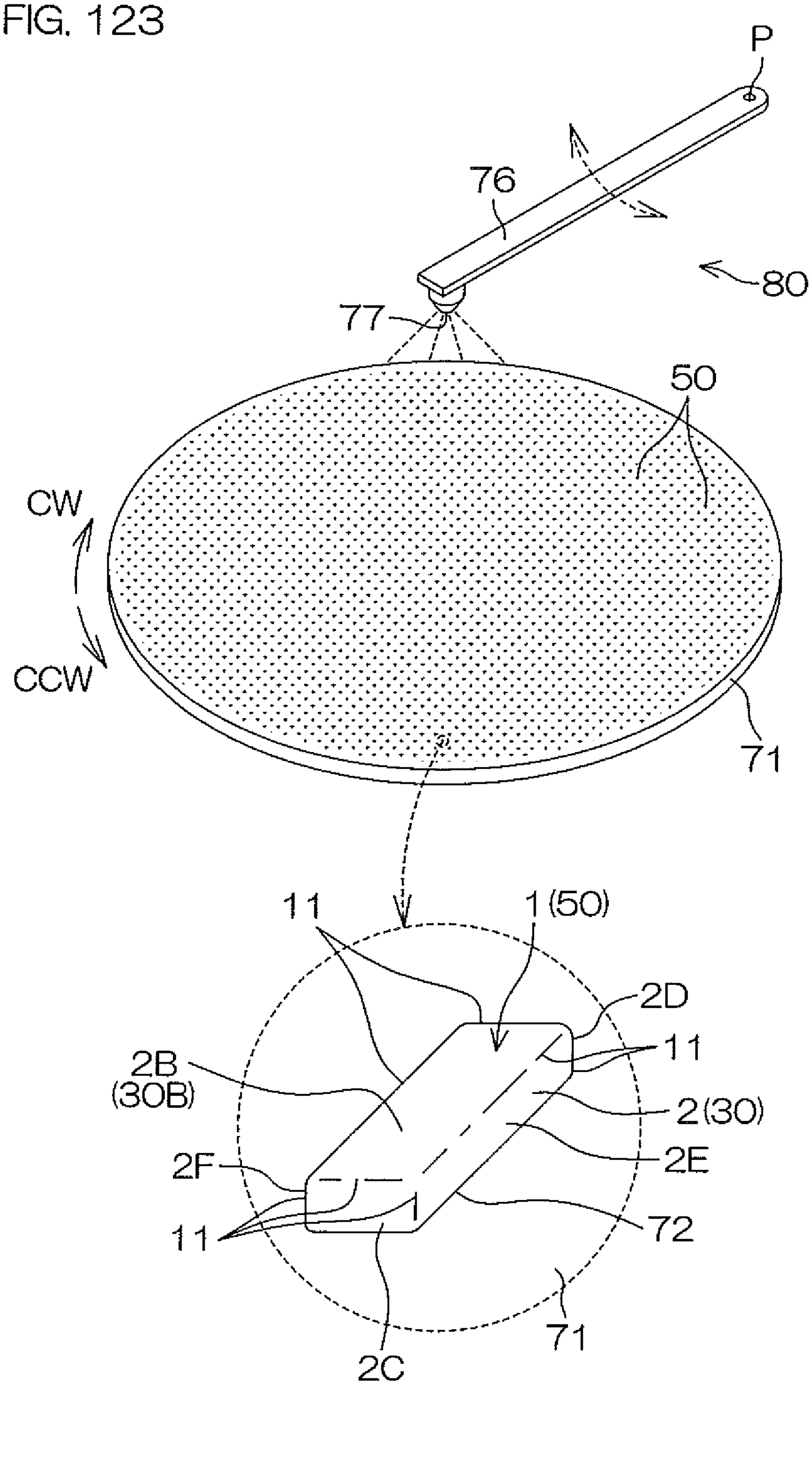

FIG. 123 is a second schematic view of the step subsequent to that of FIG. 116G.

MODES FOR CARRYING OUT THE INVENTION

Figure 1A:
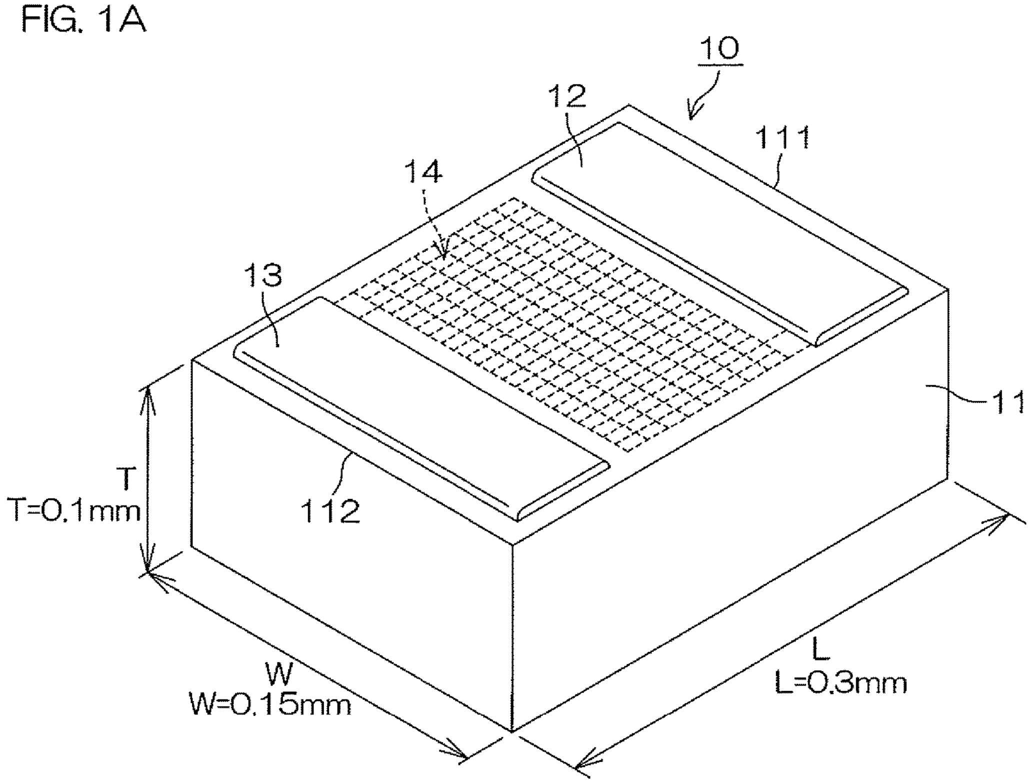
FIG. 1A is an illustrative perspective view of the external arrangement of a chip resistor 10 according to a preferred embodiment of the present invention.
Figure 1B:
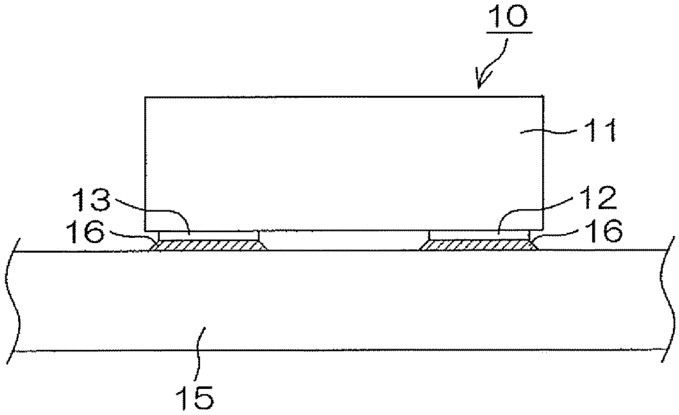
FIG. 1B is a side view of a state where the chip resistor 10 is mounted on a substrate.

Preferred embodiments of the present invention shall now be described in detail with reference to the drawings. FIG. 1A is an illustrative perspective view of the external arrangement of a chip resistor 10 according to a preferred embodiment of the present invention and FIG. 1B is a side view of a state where the chip resistor 10 is mounted on a substrate. With reference to FIG. 1A, the chip resistor 10 according to the preferred embodiment of the present invention includes a first connection electrode 12, a second connection electrode 13, and a resistor network 14 that are formed on the substrate 11 as the substrate. The substrate 11 has a rectangular parallelepiped shape with a substantially rectangular shape in a plan view and is a minute chip with, for example, the length in the long side direction being L=0.3 mm, the width in the short side direction being W=0.15 mm, and the thickness of the substrate 11 being T=0.1 mm, approximately.

Figure 15:
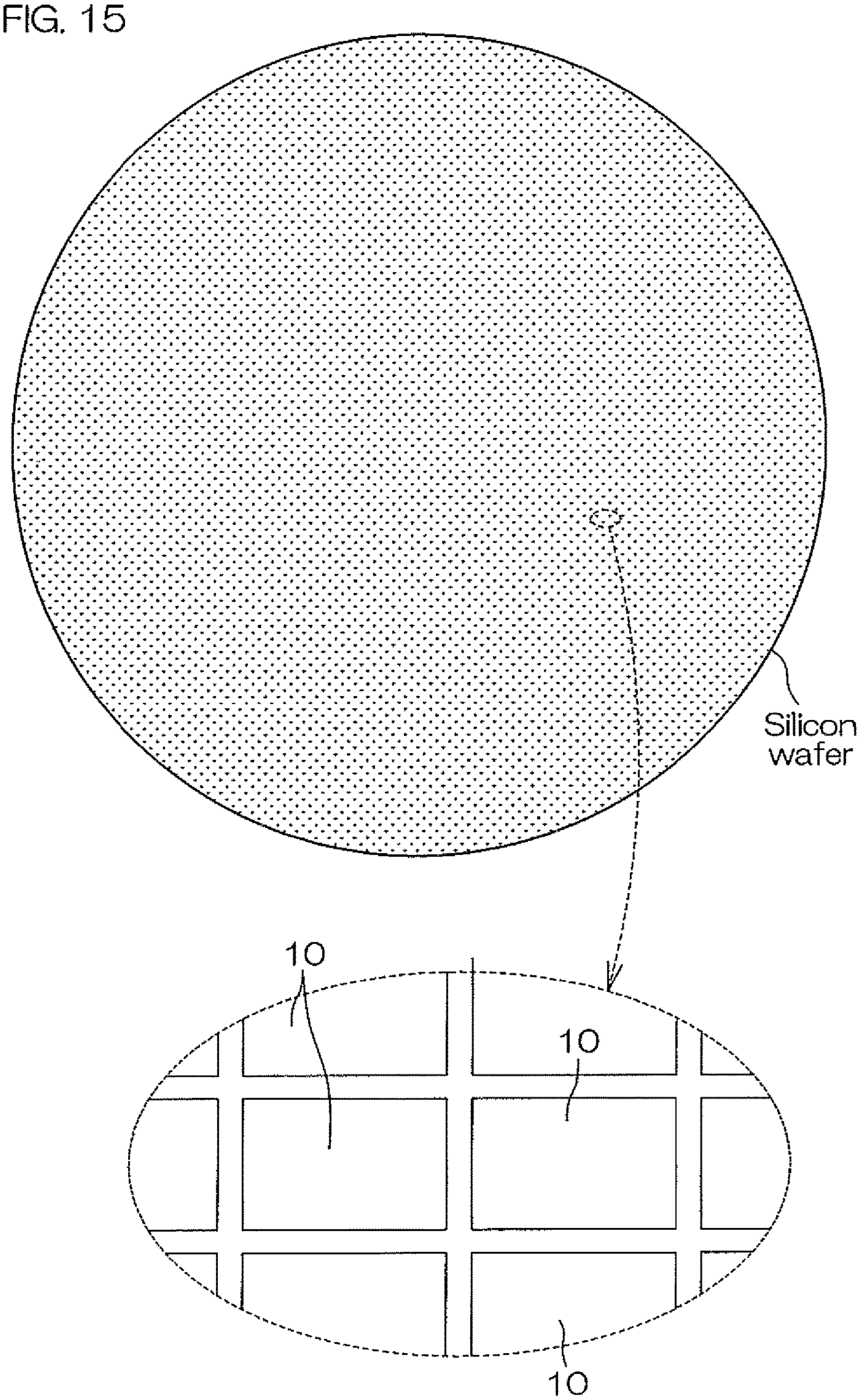
FIG. 15 is an illustrative view for describing the cutting out of a chip resistor from a wafer.

The chip resistor 10 is obtained by forming several chip resistors 10 in a lattice on a wafer as shown in FIG. 15 and cutting the wafer to separate it into individual chip resistors 10. On the substrate 11, the first connection electrode 12 is a rectangular electrode that is disposed along one short side 111 of the substrate 11 and is long in the short side 111 direction. The second connection electrode 13 is a rectangular electrode that is disposed on the substrate 11 along the other short side 112 and is long in the short side 112 direction. The resistor network 14 is provided in a central region on the substrate 11 sandwiched by the first connection electrode 12 and the second connection electrode 13. One end side of the resistor network 14 is electrically connected to the first connection electrode 12 and another end side of the resistor network 14 is electrically connected to the second connection electrode 13. As shall be described later, the first connection electrode 12, the second connection electrode 13, and the resistor network 14 are provided on the substrate 11 by using, for example, a semiconductor manufacturing process. A semiconductor substrate (semiconductor wafer), such as a silicon substrate (silicon wafer), etc., may thus be used as the substrate 11. The substrate 11 may also be another type of substrate, such as an insulating substrate, etc.

The first connection electrode 12 and the second connection electrode 13 respectively function as external connection electrodes. In a state where the chip resistor 10 is mounted on a circuit substrate 15, the first connection electrode 12 and the second connection electrode 13 are respectively connected electrically and mechanically by solder to circuits (not shown) of the circuit substrate 15 as shown in FIG. 1B. The first connection electrode 12 and the second connection electrode 13 that function as external connection electrodes are preferably formed of gold (Au) or has gold plating applied on the surfaces thereof to improve solder wettability and improve reliability.

Figure 2:
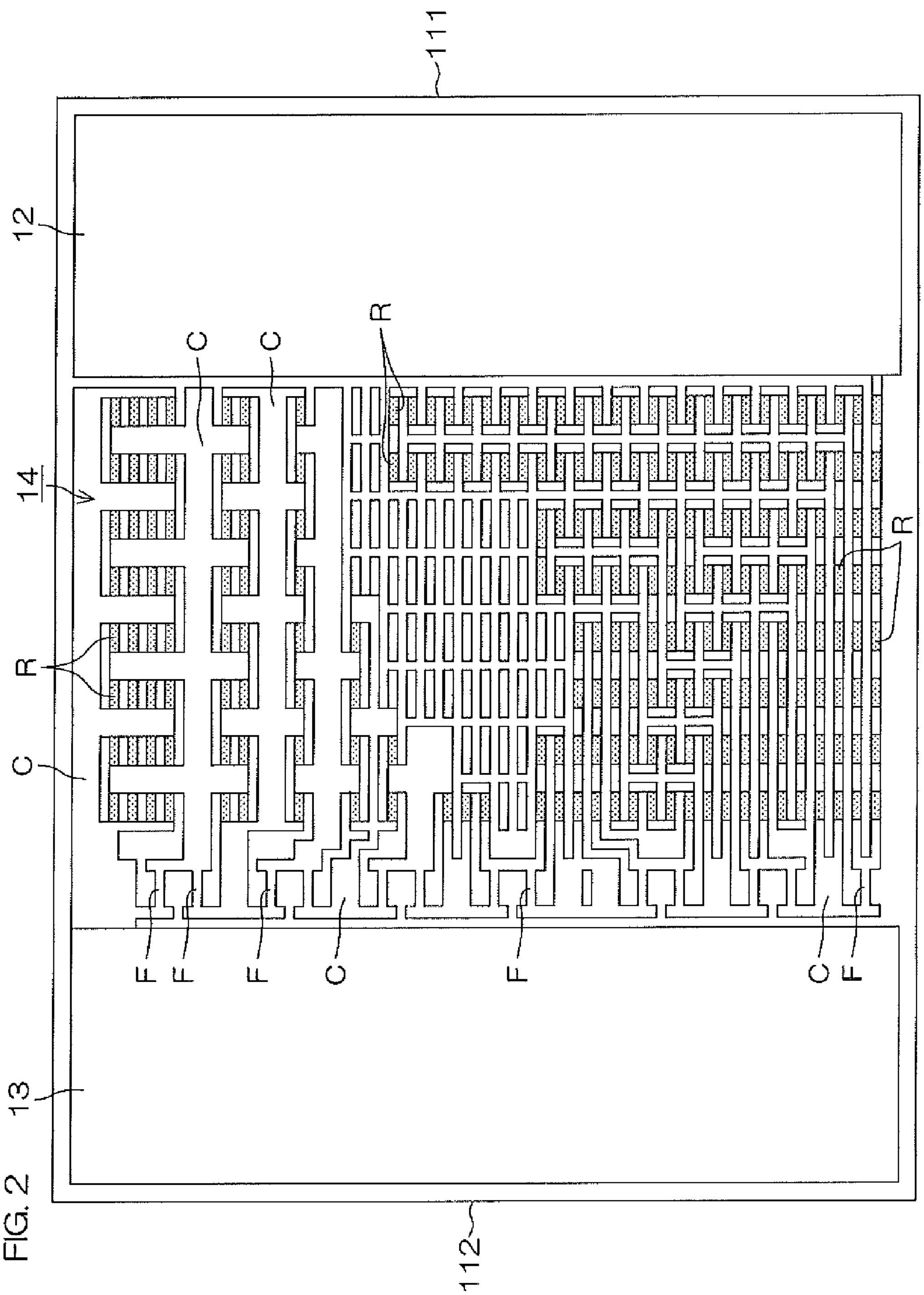
FIG. 2 is a plan view of the chip resistor 10 showing the positional relationships of a first connection electrode 12, a second connection electrode 13, and a resistor network 14 and showing the arrangement in a plan view of the resistor network 14.

FIG. 2 is a plan view of the chip resistor 10 showing the positional relationships of the first connection electrode 12, the second connection electrode 13, and the resistor network 14 and shows the arrangement in a plan view of the resistor network 14. With reference to FIG. 2, the chip resistor 10 includes the first connection electrode 12, disposed along the one short side 111 of the substrate upper surface and having the substantially rectangular shape in a plan view that is long in the width direction, the second connection electrode 13, disposed along the other short side 112 of the substrate upper surface and having the substantially rectangular shape in a plan view that is long in the width direction, and the resistor network 14 provided in the region of substantially rectangular shape in a plan view between the first connection electrode 12 and the second connection electrode 13.

The resistor network 14 has a plurality of resistor bodies R having an equal resistance value and being arrayed in a matrix on the substrate 11 (the example of FIG. 2 has an arrangement with a total of 352 resistor bodies R with 8 resistor bodies R being arrayed along the row direction (length direction of the substrate) and 44 resistor bodies being arrayed along the column direction (width direction of the substrate)). One to 64 of the plurality of resistor bodies R are electrically connected to form a plurality of types of resistance units. The plurality of types of resistance units thus formed are connected in predetermined modes by conductor films (wiring films formed of a conductor) as network connection means. Further, a plurality of fuse films F are provided that electrically incorporate resistance units into the resistor network 14 or are capable of being fused to electrically separate resistance units from the resistor network 14. The plurality of fuse films F are arrayed along the inner side of the second connection electrode 13 so that the positioning region thereof is rectilinear. More specifically, the plurality of fuse films F and the connection conductor films C are disposed rectilinearly.

Figure 3A:
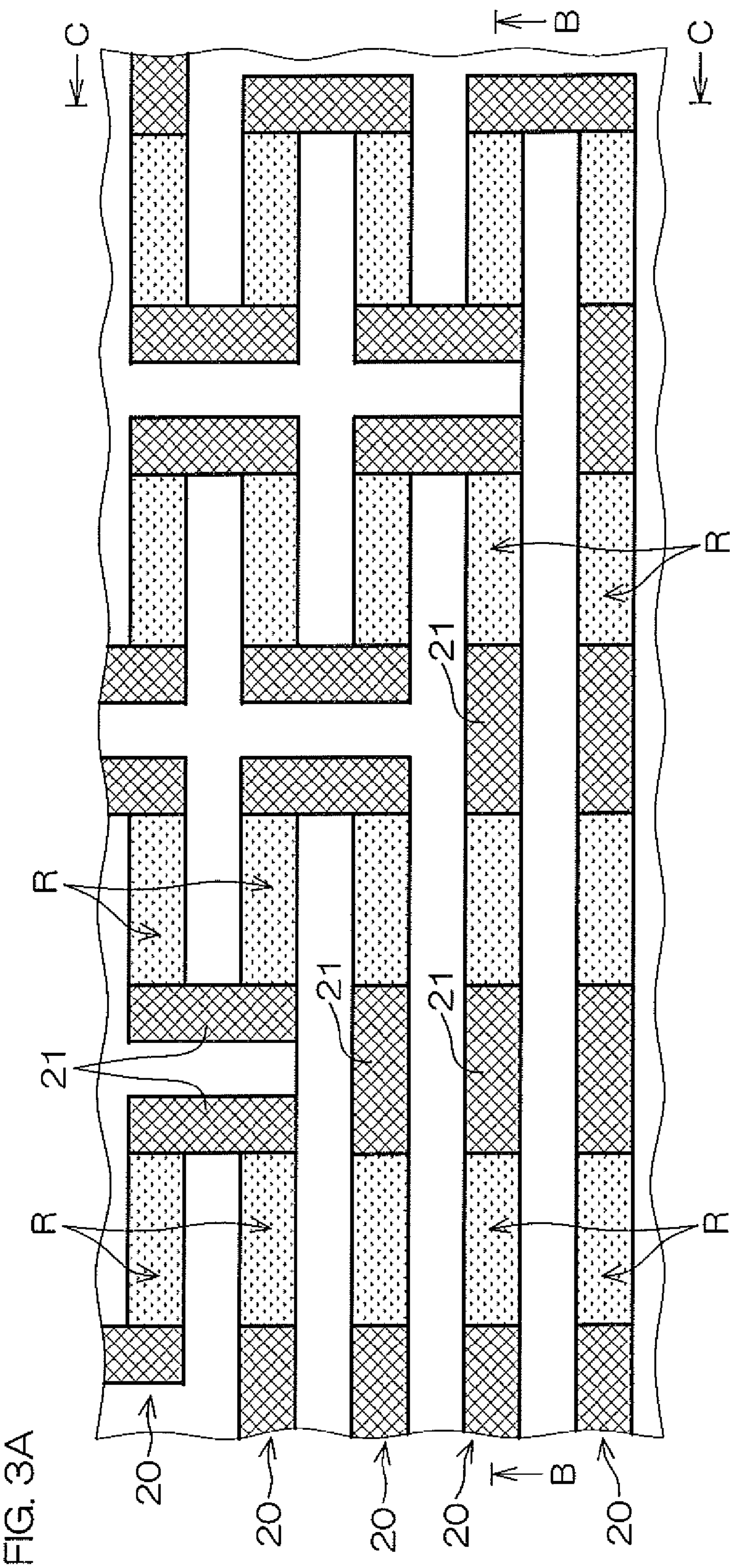
FIG. 3A is an enlarged plan view of a portion of the resistor network 14 shown in FIG. 2.
Figure 3B:
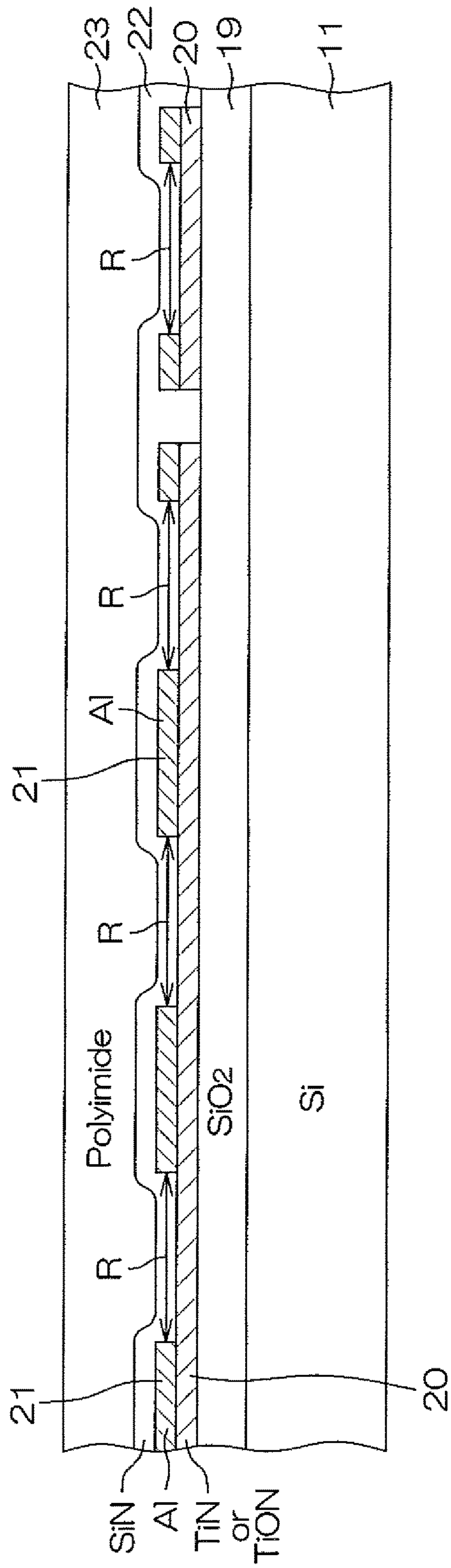
FIG. 3B is a vertical sectional view in the length direction for describing the arrangement of resistor bodies R in the resistor network 14.
Figure 3C:
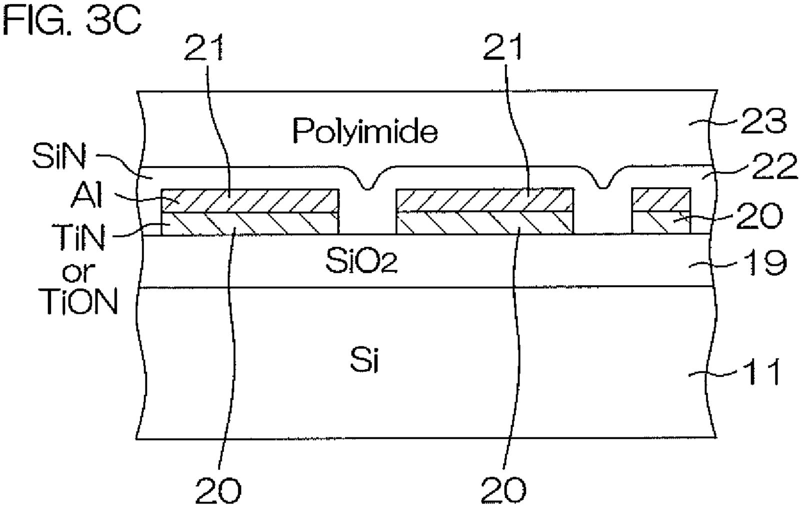
FIG. 3C is a vertical sectional view in the width direction for describing the arrangement of the resistor bodies R in the resistor network 14.

FIG. 3A is an enlarged plan view of a portion of the resistor network 14 shown in FIG. 2, and FIG. 3B and FIG. 3C are a vertical sectional view in the length direction and a vertical sectional view in the width direction, respectively, for describing the structure of the resistor bodies R in the resistor network 14. The arrangement of the resistor bodies R shall now be described with reference to FIG. 3A, FIG. 3B, and FIG. 3C. On an upper surface of the substrate 11 as the substrate, an insulating layer ($SiO_2$) 19 is formed, and resistor body films 20, which make up the resistor bodies R, are disposed on the insulating film 19. The resistor body films 20 are formed of TiN or TiON. The resistor body films 20 are arranged as a plurality of resistor body films (hereinafter referred to as "resistor body film lines") extending as lines between the first connection electrode 12 and the second connection electrode 13, and there are cases where a resistor body film line 20 is cut at predetermined positions in the line direction. Aluminum films are laminated as conductor films 21 on the resistor body film lines 21. The conductor films 21 are laminated on the resistor body film lines 20 while being spaced apart by fixed intervals R in the line direction.

Figure 4A:
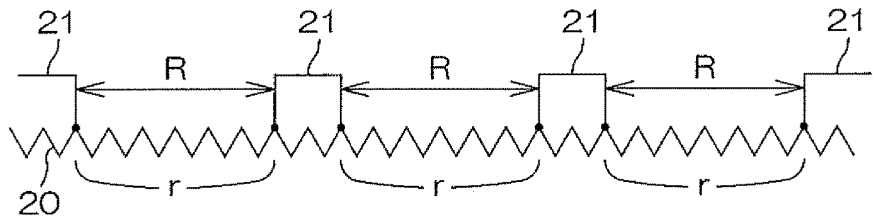
FIG. 4A is a diagram showing the electrical features of resistor body film lines 20 and conductor films 21 in the form of circuit symbols and an electric circuit diagram.
Figure 4B:
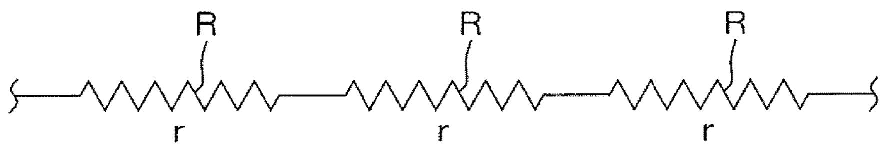
FIG. 4B is a diagram showing the electrical features of resistor body film lines 20 and conductor films 21 in the form of circuit symbols and an electric circuit diagram.
Figure 4C:
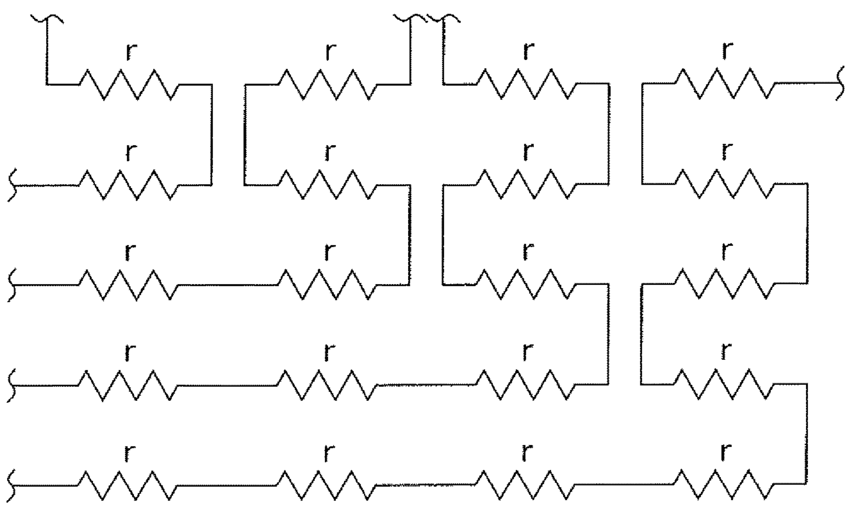
FIG. 4C is a diagram showing the electrical features of resistor body film lines 20 and conductor films 21 in the form of circuit symbols and an electric circuit diagram.

The electrical features of the resistor body film lines 20 and the conductor films 21 are indicated in the form of circuit symbols in FIGS. 4A, 4B, and 4C. That is, as shown in FIG. 4A, each of the resistor body film line 20 portions in regions of the predetermined interval R forms a resistor body R with a fixed resistance value r. In each region at which a conductor film 21 is laminated, the resistor body film line 20 is short-circuited by the conductor film 21. A resistor circuit, made up of serial connections of resistor bodies R of resistance r, is thus formed as shown in FIG. 4B.

Also, adjacent resistor body film lines 20 are connected to each other by the resistor body films 20 and conductor films 21 and therefore the resistor network shown in FIG. 3A forms the resistor circuit shown in FIG. 4C. The manufacturing process of the resistor network 14 shall now be described briefly. (1) The top surface of the substrate 11 is thermally oxidized to form a silicon dioxide ($SiO_2$) layer as the insulating layer 19. (2) Then by sputtering, the resistor body film 20 of TiN, TiON, or TiSiON is formed on the entire surface of the insulating layer 19. (3) Further by sputtering, the conductor film 21 of aluminum (Al) is laminated on the resistor body film 20. (4) Thereafter, a photolithography process is used and, for example, dry etching is performed to selectively remove the conductor film 21 and the resistor body film 20 to obtain the arrangement where, as shown in FIG. 3A, the resistor body film lines 20 and the conductor films 21 of fixed width are arrayed in the column direction while being spaced apart by fixed intervals in a plan view. Regions at which the resistor body film lines 20 and the conductor films 21 are interrupted are also formed at this point. (5) The conductor films 21 laminated on the resistor body film lines 20 are then removed selectively. The arrangement where the conductor films 21 are laminated on the resistor body film lines 20 while being spaced apart by the fixed intervals R is consequently obtained. (6) Thereafter, an SiN film 22 is deposited as a protective film and further, a polyimide layer 23, which is a protective layer, is laminated thereon.

In the present preferred embodiment, the resistor bodies R, included in the resistor network 14 formed on the substrate 11, include the resistor body film lines 20 and the conductor films 21 that are laminated on the resistor body film lines 20 while being spaced apart by the fixed intervals in the line direction, and a single resistor body R is arranged from the resistor body film line 20 at the fixed interval R portion on which the conductor film 21 is not laminated. The resistor body film lines 20 making up the resistor bodies R are all equal in shape and size. Therefore based on the characteristic that resistor body films of the same shape with the same size that are formed on a substrate are substantially the same in value, the plurality of resistor bodies R arrayed in a matrix on the substrate 11 have an equal resistance value.

Figure 5A:
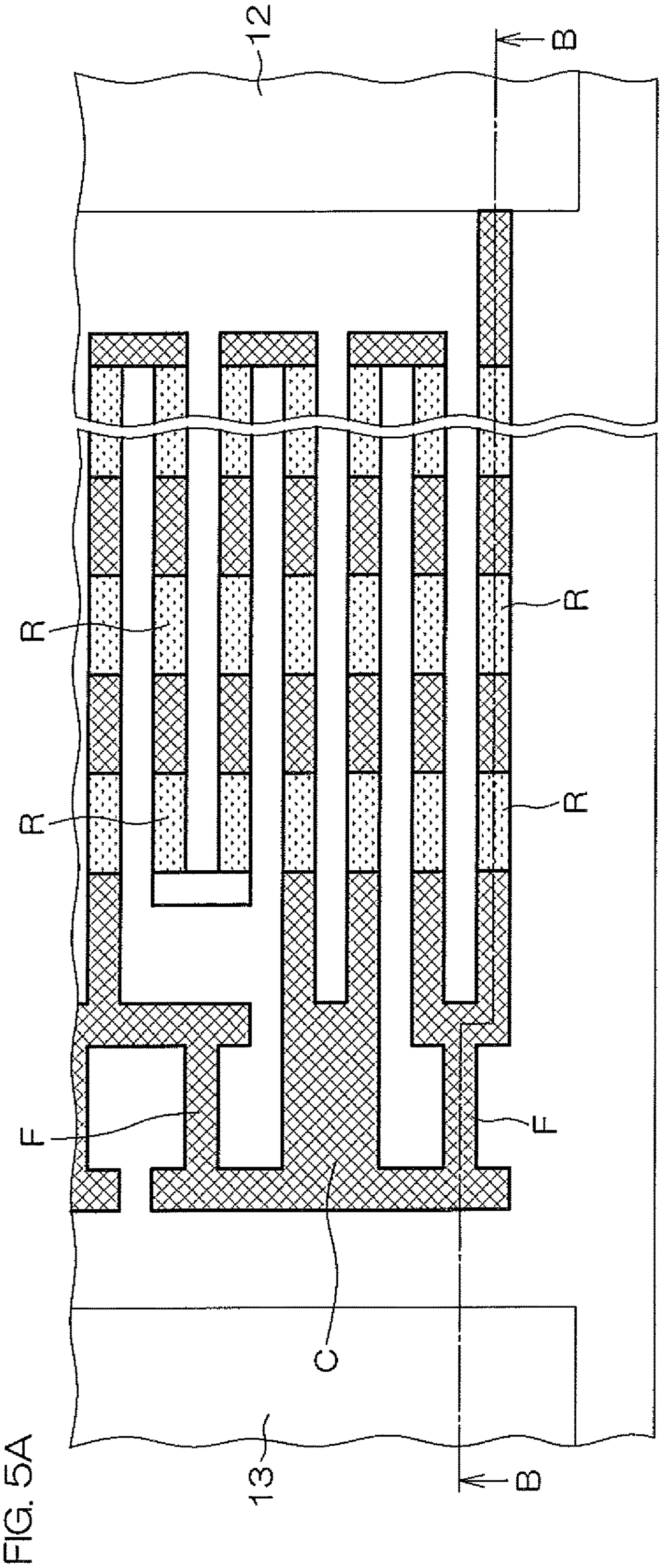
FIG. 5A is partially enlarged plan view of a region including fuse films F drawn by enlarging a portion of the plan view of the chip resistor shown in FIG. 2.

The conductor films 21 laminated on the resistor body film lines 20 form the resistor bodies R and also serve the role of connection conductor films that connect a plurality of resistor bodies R to arrange a resistance unit. FIG. 5A is partially enlarged plan view of a region including the fuse films F drawn by enlarging a portion of the plan view of the chip resistor 10 shown in FIG. 2, and FIG. 5B is a structural sectional view taken along B-B in FIG. 5A.

Figure 5B:
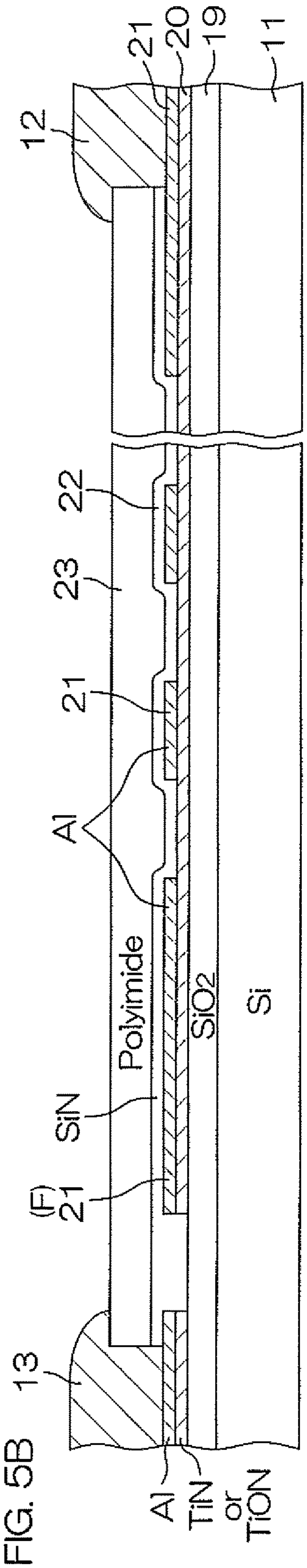
FIG. 5B is a structural sectional view taken along B-B in FIG. 5A.

As shown in FIGS. 5A and 5B, the fuse films F are also formed by the conductor films 21, which are laminated on the resistor body film lines 20 that form the resistor bodies R. That is, the fuse films F are formed of aluminum (Al), which is the same metal material as that of the conductor films 21, on the same layer as the conductor films 21, which are laminated on the resistor body film lines 20 that form the resistor bodies R. As mentioned above, the conductor films 21 are also used as the connection conductor films 21 that electrically connect a plurality of resistor bodies R to form a resistance unit.

That is, on the same layer laminated on the resistor body film 20, the conductor films for forming the resistor bodies R, the connection conductor films for forming the resistance units, the connection conductor films for arranging the resistor network 14, the fuse films, and the conductor films for connecting the resistor network 14 to the first connection electrode 12 and the second connection electrode 13 are formed by the same manufacturing process (for example, a sputtering and photolithography process) using the same metal material (for example, aluminum). The manufacturing process of the chip resistor 10 is thereby simplified and also, various types of conductor films can be formed at the same time using a mask in common. Further, the property of alignment with respect to the resistor body film 20 is also improved.

Figure 6:
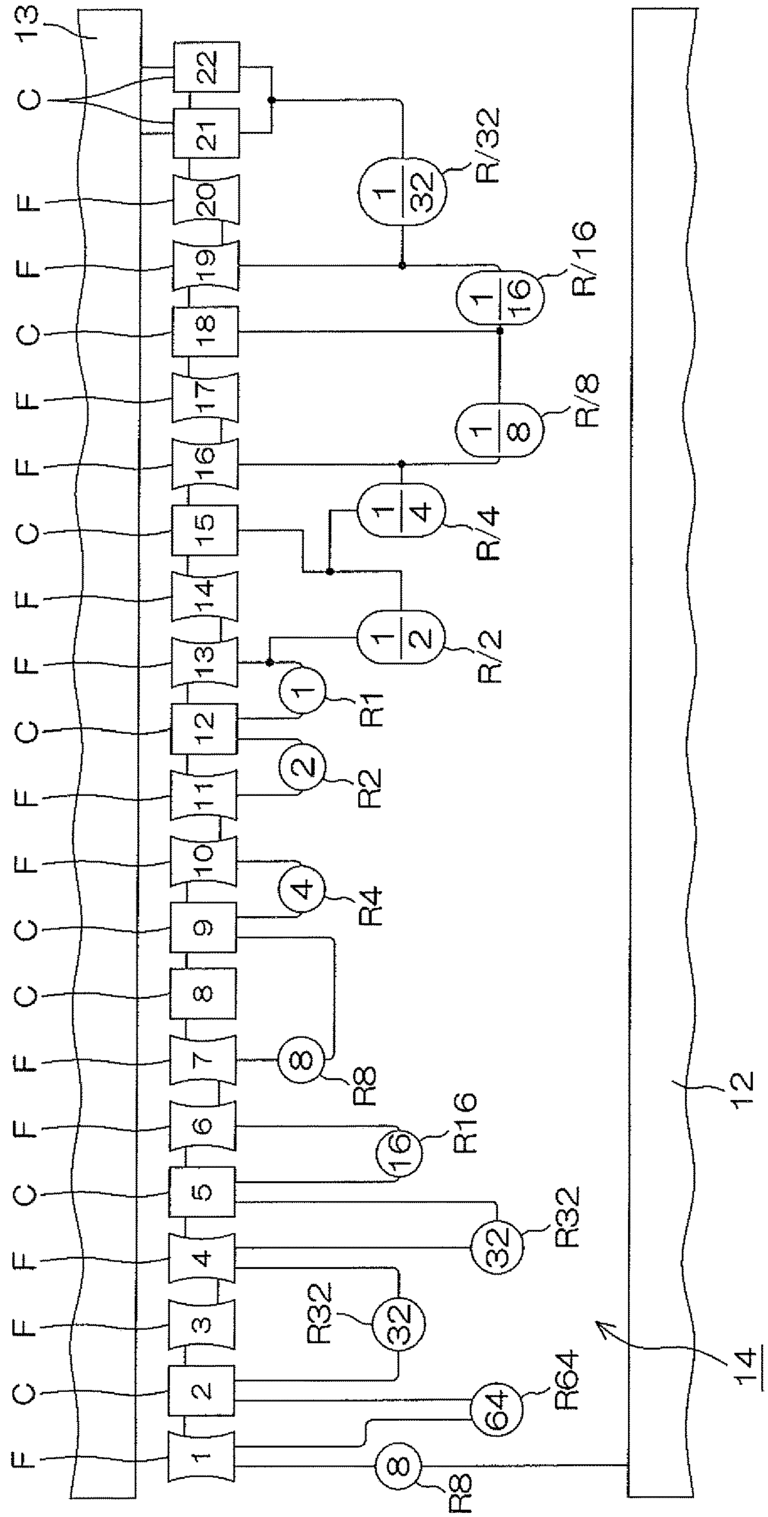
FIG. 6 is an illustrative diagram of the array relationships of connection conductor films C and fuse films F connecting a plurality of types of resistance units in the resistor network 14 shown in FIG. 2 and the connection relationships of the plurality of types of resistance units connected to the connection conductor films C and fuse films F.

FIG. 6 is an illustrative diagram of the array relationships of the connection conductor films C and the fuse films F connecting a plurality of types of resistance units in the resistor network 14 shown in FIG. 2 and the connection relationships of the plurality of types of resistance units connected to the connection conductor films C and fuse films F. With reference to FIG. 6, one end of a reference resistance unit R8, included in the resistor network 14, is connected to the first connection electrode 12. The reference resistance unit R8 is formed by a serial connection of 8 resistor bodies R and the other end thereof is connected to a fuse film F1. One end and the other end of a resistance unit R64, formed by a serial connection of 64 resistor bodies R, are connected to the fuse film F1 and a connection conductor film C2. One end and the other end of a resistance unit R32, formed by a serial connection of 32 resistor bodies R, are connected to the connection conductor film C2 and a fuse film F4. One end and the other end of a resistance unit R32, formed by a serial connection of 32 resistor bodies R, are connected to the fuse film F4 and a connection conductor film C5. One end and the other end of a resistance unit R16, formed by a serial connection of 16 resistor bodies R, are connected to the connection conductor film C5 and a fuse film F6. One end and the other end of a resistance unit R8, formed by a serial connection of 8 resistor bodies R, are connected to a fuse film F7 and a connection conductor film C9. One end and the other end of a resistance unit R4, formed by a serial connection of 4 resistor bodies R, are connected to the connection conductor film C9 and a fuse film F10. One end and the other end of a resistance unit R2, formed by a serial connection of 2 resistor bodies R, are connected to a fuse film F11 and a connection conductor film C12. One end and the other end of a resistance unit R1, formed of a single resistor body R, are connected to the connection conductor film C12 and a fuse film F13. One end and the other end of a resistance unit R/2, formed by a parallel connection of 2 resistor bodies R, are connected to the fuse film F13 and a connection conductor film C15. One end and the other end of a resistance unit R/4, formed by a parallel connection of 4 resistor bodies R, are connected to the connection conductor film C15 and a fuse film F16. One end and the other end of a resistance unit R/8, formed by a parallel connection of 8 resistor bodies R, are connected to the fuse film F16 and a connection conductor film C18. One end and the other end of a resistance unit R/16, formed by a parallel connection of 16 resistor bodies R, are connected to the connection conductor film C18 and a fuse film F19. A resistance unit R/32, formed by a parallel connection of 32 resistor bodies R, are connected to the fuse film F19 and a connection conductor film C22.

With the plurality of fuse films F and connection conductor films C, the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, a fuse film F14, the connection conductor film C15, the fuse film F16, the fuse film F17, the connection conductor film C18, the fuse film F19, the fuse film F20, the connection conductor film C21, and the connection conductor film C22 are disposed rectilinearly and connected in series. With this arrangement, when a fuse film F is fused, the electrical connection with the connection conductor film C connected adjacently to the fuse film F is interrupted.

Figure 7:
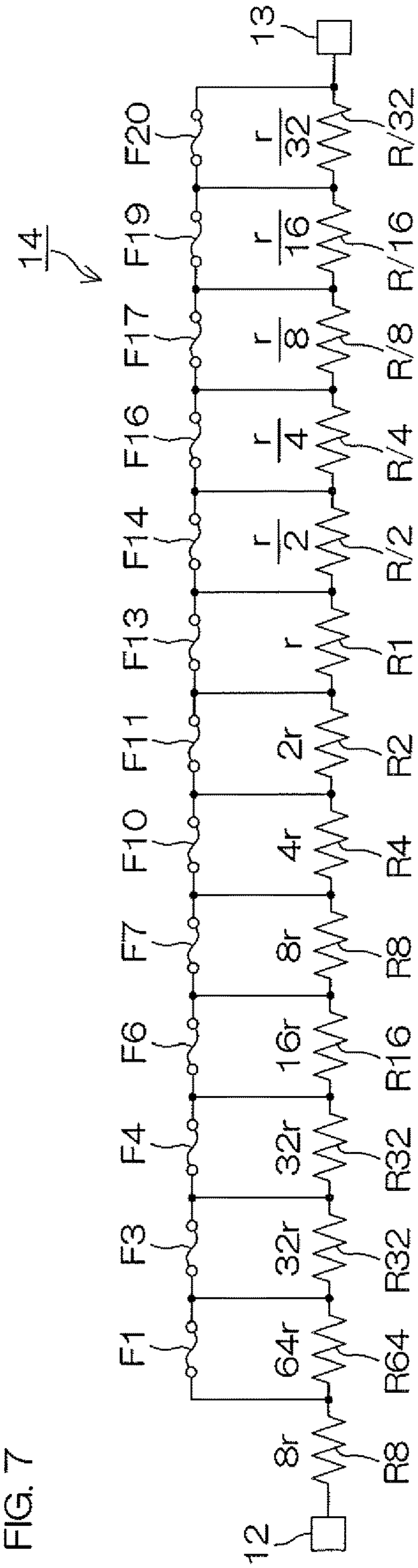
FIG. 7 is an electric circuit diagram of the resistor network 14.

This arrangement is illustrated in the form of an electric circuit diagram in FIG. 7. That is, in a state where none of the fuse films F is fused, the resistor network 14 forms a resistor circuit of the reference resistance unit R8 (resistance value: 8r), formed by the serial connection of the 8 resistor bodies R provided between the first connection electrode 12 and the second connection electrode 13. For example, if the resistance value r of a single resistor body R is r=80Ω, the chip resistor 10 is arranged with the first connection electrode 12 and the second connection electrode 13 being connected by a resistor circuit of 8r=64Ω.

With each of the plurality of types of resistance units besides the reference resistance unit R8, a fuse film F is connected in parallel, and these plurality of types of resistance units are put in short-circuited states by the respective fuse films F. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the resistor network 14.

With the chip resistor 10 according to the present preferred embodiment, a fuse film F is selectively fused, for example, by laser light in accordance with the required resistance value. The resistance unit with which the fuse film F connected in parallel is fused is thereby incorporated into the resistor network 14. The resistor network 14 can thus be made a resistor network with the overall resistance value being the resistance value resulting from serially connecting and incorporating the resistance units corresponding to the fused fuse films F.

In other words, with the chip resistor 10 according to the present preferred embodiment, by selectively fusing the fuse films corresponding to a plurality of types of resistance units, the plurality of types of resistance units (for example, the serial connection of the resistance units R64, R32, and R1 in the case of fusing F1, F4, and F13) can be incorporated into the resistor network. The respective resistances of the plurality of types of resistance units are predetermined, and the chip resistor 10 can thus be made to have the required resistance value by adjusting the resistance value of the resistor network 14 in a so to speak digital manner.

Also, the plurality of types of resistance units include the plurality of types of serial resistance units, with which the resistor bodies R having an equal resistance value are connected in series with the number of resistor bodies R being increased in geometric progression as 1, 2, 4, 8, 16, 32, and 64, and the plurality of types of parallel resistance units, with which the resistor bodies R having an equal resistance value are connected in parallel with the number of resistor bodies R being increased in geometric progression as 2, 4, 8, 16, and 32, and these are connected in series in states of being short-circuited by the fuse films F and therefore by selectively fusing the fuse films F, the resistance value of the resistor network 14 as a whole can be set to an arbitrary resistance value within a wide range from a small resistance value to a large resistance value.

Figure 8:
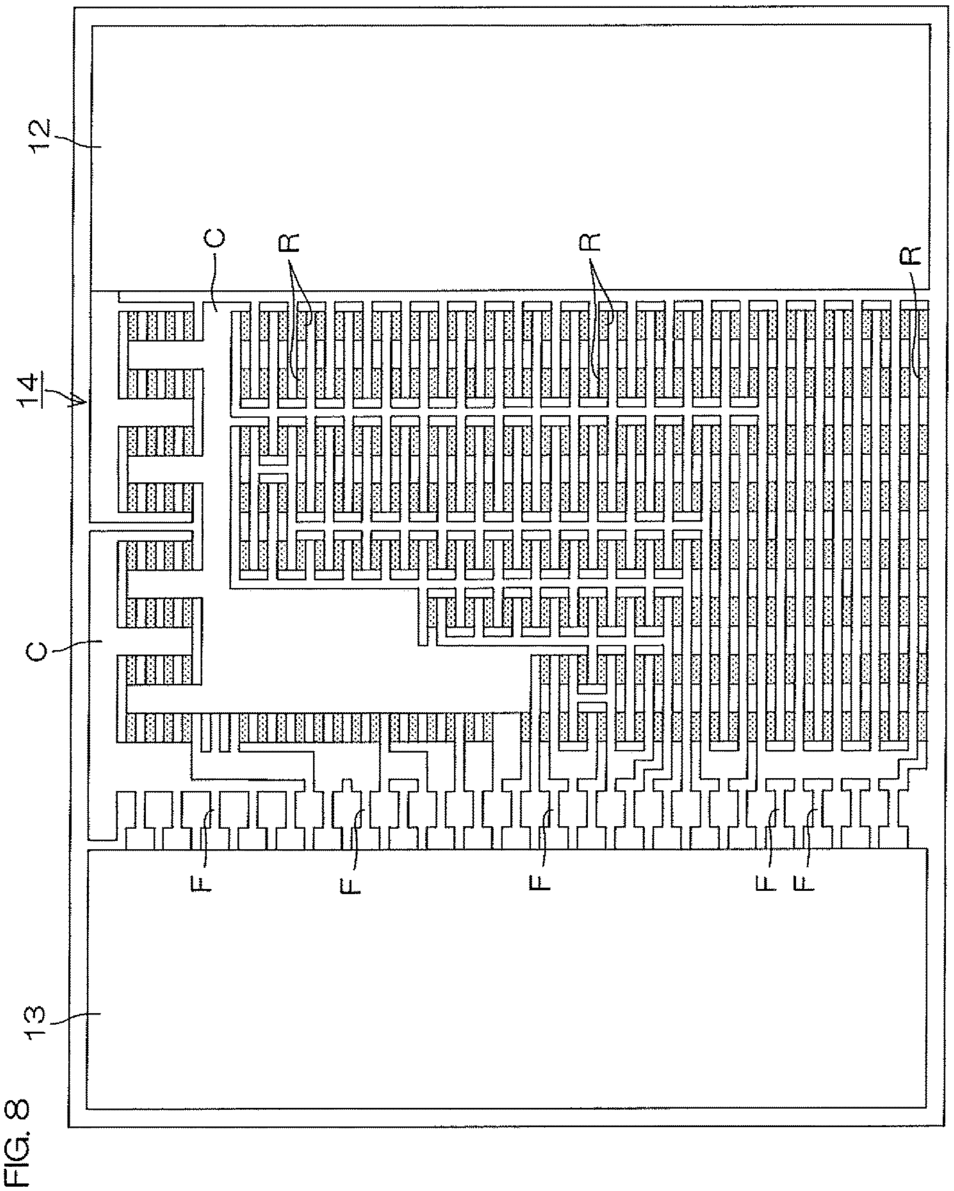
FIG. 8 is a plan view of a chip resistor 30 showing the positional relationships of the first connection electrode 12, the second connection electrode 13, and the resistor network 14 and showing the arrangement in a plan view of the resistor network 14.

FIG. 8 is a plan view of a chip resistor 30 according to another preferred embodiment of the present invention and shows the positional relationships of the first connection electrode 12, the second connection electrode 13, and the resistor network 14 and shows the arrangement in a plan view of the resistor network 14. The chip resistor 30 differs from the chip resistor 10 described above in the mode of connection of the resistor bodies R in the resistor network 14. That is, the resistor network 14 of the chip resistor 30 has a plurality of resistor bodies R having an equal resistance value and being arrayed in a matrix on the substrate (the arrangement of FIG. 8 is an arrangement with a total of 352 resistor bodies R with 8 resistor bodies R being arrayed along the row direction (length direction of the substrate) and 44 resistor bodies R being arrayed along the column direction (width direction of the substrate)). One to 128 of the plurality of resistor bodies R are electrically connected to form a plurality of types of resistance units. The plurality of types of resistance units thus formed are connected in parallel modes by conductor films as network connection means and by the fuse films F. The plurality of fuse films F are arrayed along the inner side of the second connection electrode 13 so that the positioning region thereof is rectilinear, and when a fuse film F is fused, the resistance unit connected to the fuse film is electrically separated from the resistor network 14.

Figure 9:
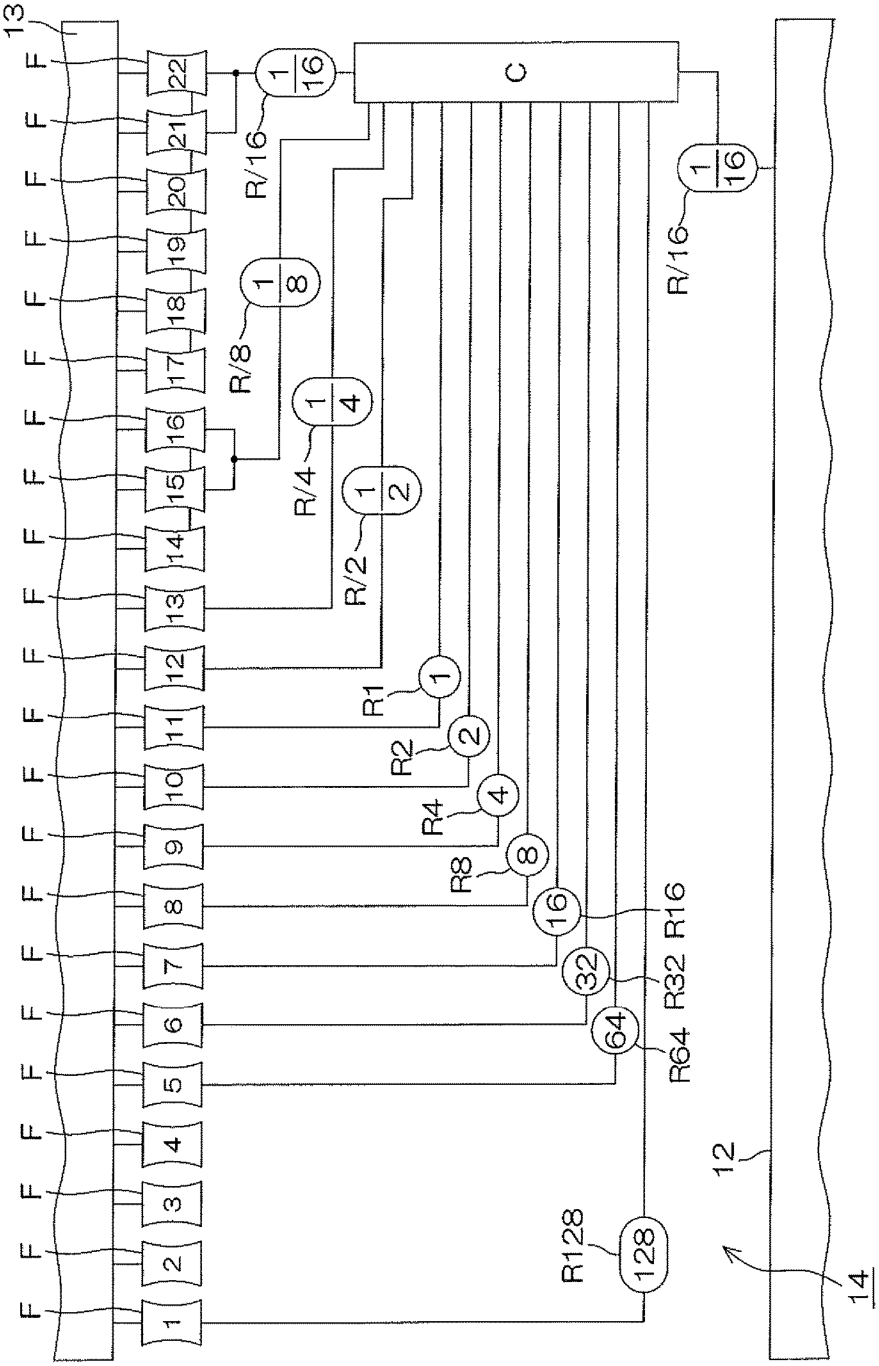
FIG. 9 is an illustrative diagram of the positional relationships of the connection conductor films C and the fuse films F connecting the plurality of types of resistance units in the resistor network 14 shown in FIG. 8 and the connection relationships of the plurality of types of resistance units connected to the connection conductor films C and fuse films F.

The structure of the plurality of resistor bodies R forming the resistor network 14, and the structures of the connection conductor films and fuse films F are the same as the structures of the corresponding portions in the chip resistor 10 and description of these shall thus be omitted here. FIG. 9 is an illustrative diagram of the connection modes of the plurality of types of resistance units in the resistor network shown in FIG. 8, the array relationships of the fuse films F connecting the resistance units, and the connection relationships of the plurality of types of resistance units connected to the fuse films F.

Referring to FIG. 9, one end of a reference resistance unit R/16, included in the resistor network 14, is connected to the first connection electrode 12. The reference resistance unit R/16 is formed by a parallel connection of 16 resistor bodies R and the other end thereof is connected to the connection conductor film C, to which the remaining resistance units are connected. One end and the other end of a resistance unit R128, formed by a serial connection of 128 resistor bodies R, are connected to the fuse film F1 and the connection conductor film C. One end and the other end of the resistance unit R64, formed by a serial connection of 64 resistor bodies R, are connected to the fuse film F5 and the connection conductor film C. One end and the other end of the resistance unit R32, formed by a serial connection of 32 resistor bodies R, are connected to the fuse film F6 and the connection conductor film C. One end and the other end of the resistance unit R16, formed by a serial connection of 16 resistor bodies R, are connected to the fuse film F7 and the connection conductor film C. One end and the other end of the resistance unit R8, formed by a serial connection of 8 resistor bodies R, are connected to the fuse film F8 and the connection conductor film C. One end and the other end of the resistance unit R4, formed by a serial connection of 4 resistor bodies R, are connected to the fuse film F9 and the connection conductor film C. One end and the other end of a resistance unit R2, formed by a serial connection of 2 resistor bodies R, are connected to the fuse film F10 and the connection conductor film C. One end and the other end of the resistance unit R1, formed by a serial connection of a single resistor body R, are connected to the fuse film F11 and the connection conductor film C. One end and the other end of the resistance unit R/2, formed by a parallel connection of 2 resistor bodies R, are connected to the fuse film F12 and the connection conductor film C. One end and the other end of the resistance unit R/4, formed by a parallel connection of 4 resistor bodies R, are connected to the fuse film F13 and the connection conductor film C. The fuse films F14, F15, and F16 are electrically connected, and one end and the other end of the resistance unit R/8, formed by a parallel connection of 8 resistor bodies R, are connected to the fuse films F14, F15, and F16 and the connection conductor film C. The fuse films F17, F18, F19, F20, and F21 are electrically connected, and one end and the other end of the resistance unit R/16, formed by connecting 16 resistor bodies R in parallel, are connected to the fuse films F17 to F21 and the connection conductor film C.

The 21 fuse films F of fuse films F1 to F21 are provided and all of these are connected to the second connection electrode 13. By this arrangement, when a fuse film F, to which one end of a resistance unit is connected, is fused, the resistance unit having one end connected to the fuse film F is electrically disconnected from the resistor network 14.

Figure 10:
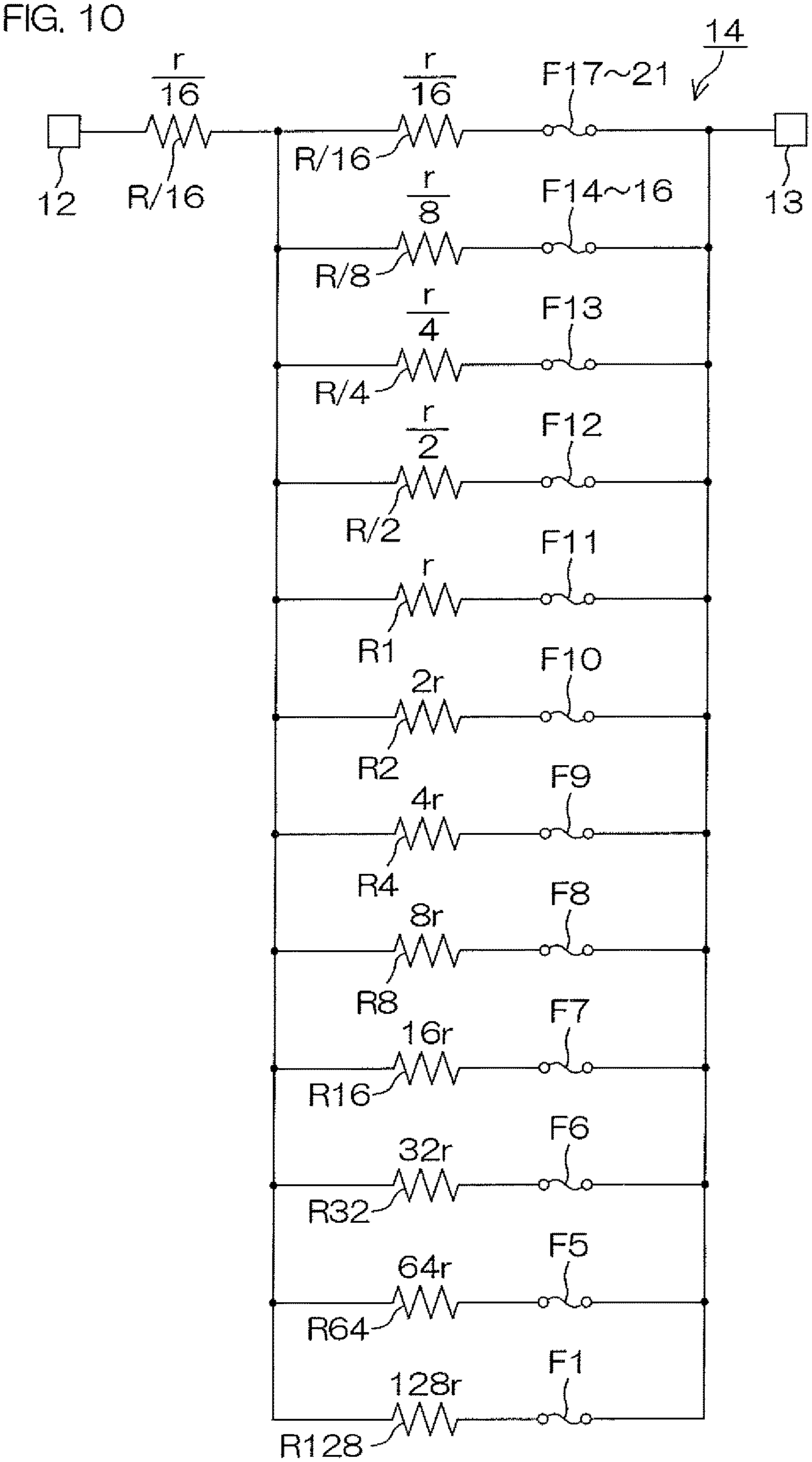
FIG. 10 is an electric circuit diagram of the resistor network 14.

The arrangement of FIG. 9, that is, the arrangement of the resistor network 14 included in the chip resistor 30, is illustrated in the form of an electric circuit diagram in FIG. 10. In a state where none of the fuse films F is fused, the resistor network 14 forms, between the first connection electrode 12 and the second connection electrode 13, a serial connection circuit of the reference resistance unit R/16 and the parallel connection circuit of the 12 types of resistance units R/16, R/8, R/4, R/2, R1, R2, R4, R8, R16, R32, R64, and R128.

A fuse film F is serially connected to each of the 12 types of resistance units besides the reference resistance unit R/16. Therefore with the chip resistor 30 having the resistor network 14, by selectively fusing a fuse film F, for example, by laser light in accordance with the required resistance value, the resistance unit corresponding to the fused fuse film F (the resistance unit connected in series to the fuse film F) is electrically separated from the resistor network 14 and the resistance value of the chip resistor 10 can thereby be adjusted.

In other words, with the chip resistor 30 according to the present preferred embodiment, by selectively fusing the fuse films corresponding to a plurality of types of resistance units, the plurality of types of resistance units can be electrically separated from the resistor network. The respective resistance values of the plurality of types of resistance units are predetermined, and the chip resistor 30 can thus be made to have the required resistance value by adjusting the resistance value of the resistor network 14 in a so to speak digital manner.

Also, the plurality of types of resistance units include the plurality of types of serial resistance units, with which the resistor bodies R having an equal resistance value are connected in series with the number of resistor bodies R being increased in geometric progression as 1, 2, 4, 8, 16, 32, 64, and 128, and the plurality of types of parallel resistance units, with which the resistor bodies R having an equal resistance value are connected in parallel with the number of resistor bodies R being increased in geometric progression as 2, 4, 8, and 16, and therefore by selectively fusing the fuse films F, the resistance value of the resistor network 14 as a whole can be set to an arbitrary resistance value finely and digitally.

Figures 11A, 11B:
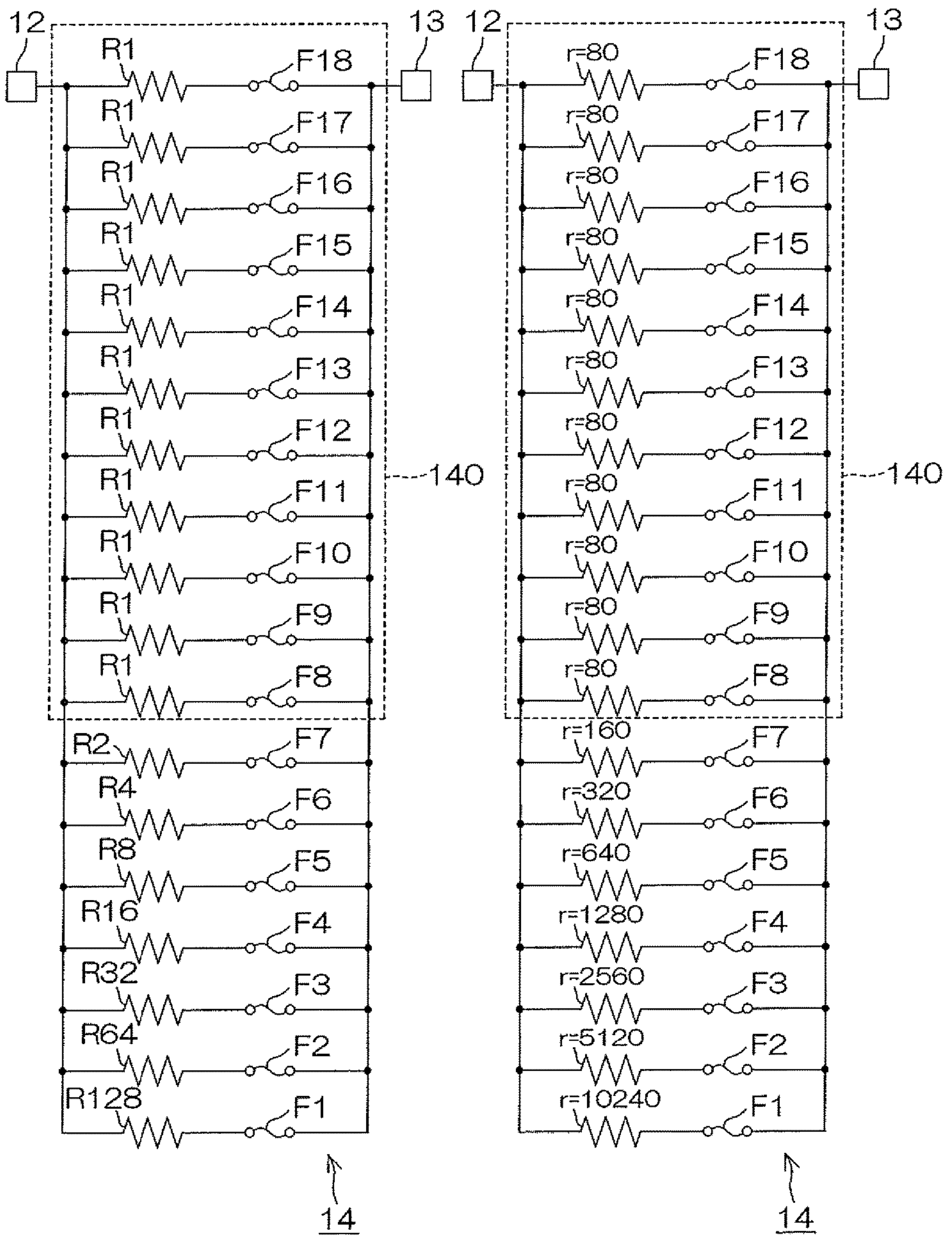
FIG. 11A is an electric circuit diagram of modification examples of the electric circuit shown in FIG. 10.
FIG. 11B is an electric circuit diagram of modification examples of the electric circuit shown in FIG. 10.

With the electric circuit shown in FIG. 10, there is a tendency for an overcurrent to flow through the reference resistance unit R/16 and the resistance units of low resistance value among the parallel connection resistance units, and the rated current that can be made to flow through the resistances must be designed to be large in setting the resistances. Therefore to disperse the current, the connection structure of the resistor network may be changed to change the electric circuit shown in FIG. 10 to that shown in FIG. 11A. That is, the reference resistance unit R/16 is eliminated and the circuit is changed to include an arrangement 140, with which the resistance units that are connected in parallel have a minimum resistance value of r and a plurality of resistance units R1 with the resistance value r are connected in parallel. FIG. 11B is an electric circuit diagram in which specific resistance values are indicated and shows a circuit that includes the arrangement 140 where a plurality of sets of serial connection of a resistance unit of 80Ω and a fuse film F are connected in parallel. Dispersion of the current that flows can thereby be achieved.

Figure 12:
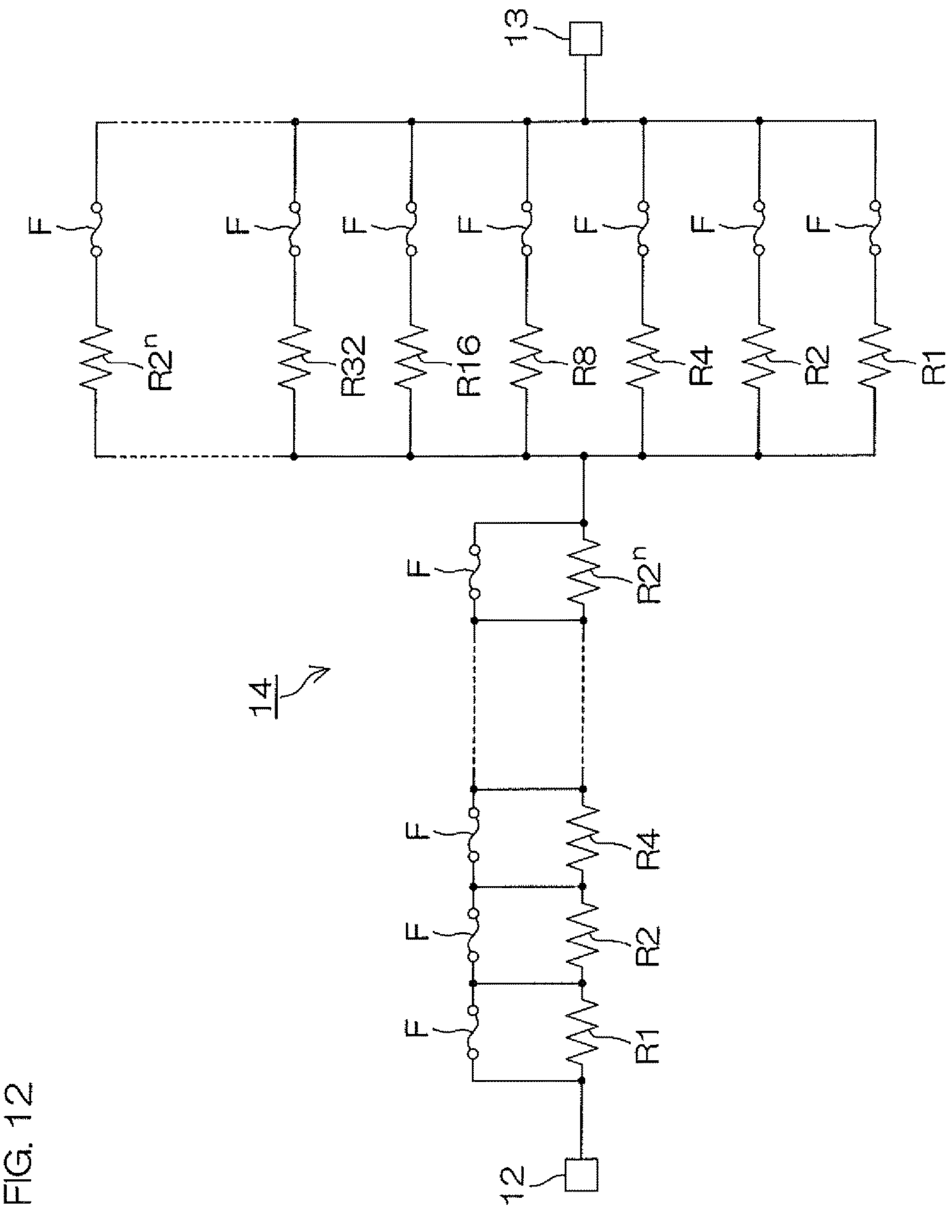
FIG. 12 is an electric circuit diagram of the resistor network 14 according to yet another preferred embodiment of the present invention.

FIG. 12 is an electric circuit diagram of the circuit arrangement of the resistor network 14 included in a chip resistor according to yet another preferred embodiment of the present invention. A feature of the resistor network 14 shown in FIG. 12 is that it has the circuit arrangement where a serial connection of a plurality of types of resistance units and a parallel connection of a plurality of types of resistance units are connected in series. As in a preferred embodiment described above, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fuse film F is electrically incorporated into the resistor network 14.

On the other hand, a fuse film F is connected in series to each of the plurality of types of resistance units that are connected in parallel. Therefore by fusing a fuse film F, the resistance unit connected in series to the fuse film F can be electrically disconnected from the parallel connection of resistance units. With this arrangement, for example, a low resistance of not more than 1 kΩ can be formed at the parallel connection side, and a resistor circuit of not less than 1 kΩ can be formed at the serial connection side. Resistor circuits of a wide range, from a low resistance of several Ω to a high resistance of several MΩ, can thereby be formed using the resistor networks 14 arranged with equal basic designs.

Figure 13:
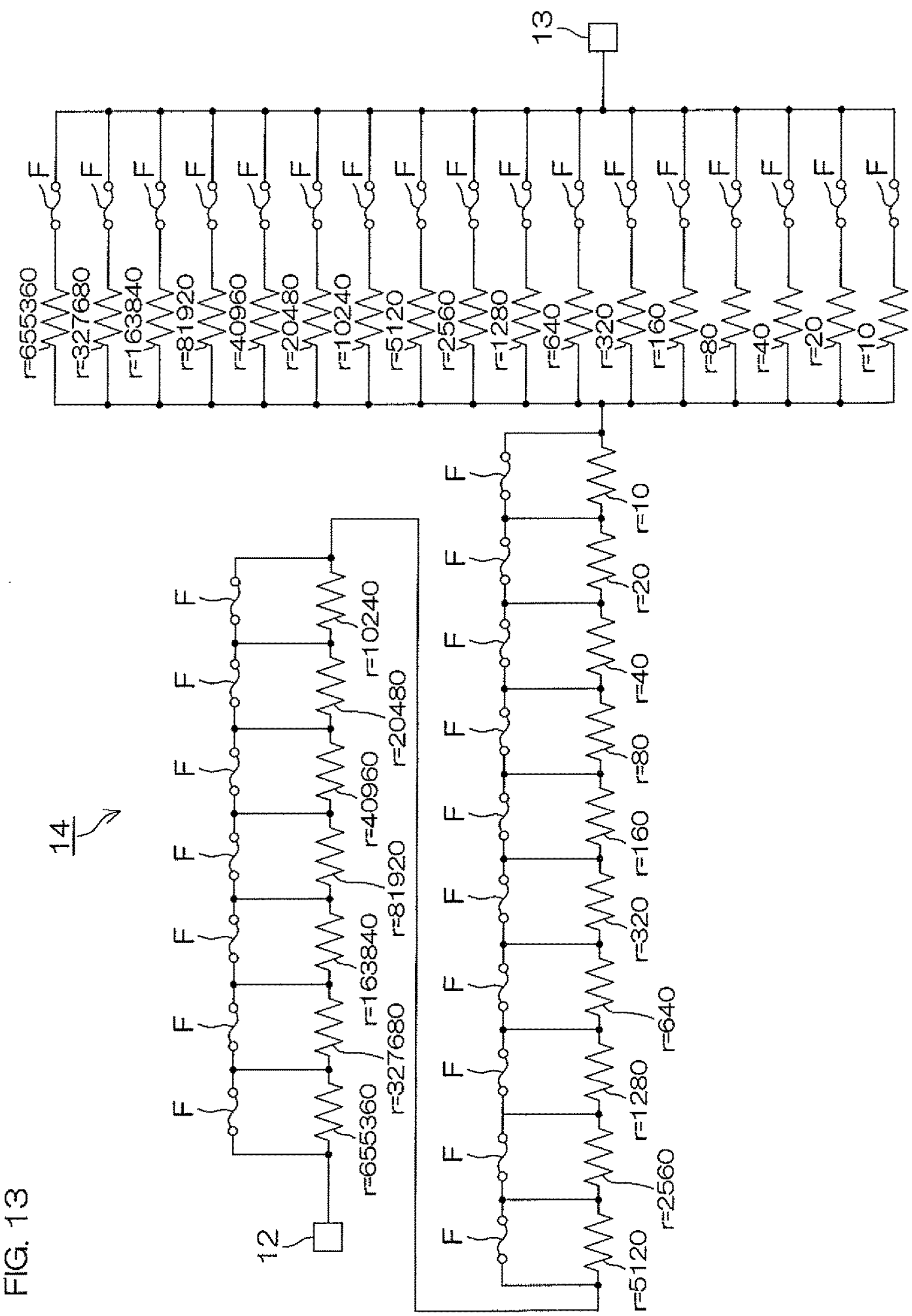
FIG. 13 is an electric circuit diagram of an arrangement example of a resistor network in a chip resistor with specific resistance values indicated.

Also if the resistance value is to be set more precisely, the fuse film of a serial connection side resistor circuit that is close in resistance value to the required resistance value can be cut in advance and the resistance value can be finely adjusted by fusing the fuse films of the resistor circuits at the parallel connection side to improve the precision of adjustment to the desired resistance value. FIG. 13 is an electric circuit diagram of a specific arrangement example of the resistor network 14 in a chip resistor having a resistance value in the range of 10Ω to 1 MΩ.

The resistor network 14 shown in FIG. 13 also has the circuit arrangement in which a serial connection of a plurality of types of resistance units short-circuited by the fuse films F and a parallel connection of a plurality of types of resistance units serially connected to the fuse films F are connected in series. With the resistor circuit of FIG. 13, an arbitrary resistance value of 10 to 1 kΩ can be set within a precision of 1% at the parallel connection side. Also, an arbitrary resistance value of 1 k to 1 MΩ can be set within a precision of 1% at the serial connection side circuit. When the serial connection side circuit is used, the merit of being able to set the resistance value with higher precision is provided by fusing in advance the fuse film F of the resistance unit close to the desired resistance value and then adjusting to the desired resistance value.

Figure 14:
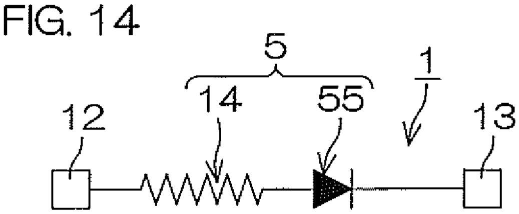
FIG. 14 is a circuit diagram of an electronic device 1 according to a preferred embodiment of the present invention.

Although only cases where the same layer is used for the fuse films F as that used for the connection conductor films C have been described, the connection conductor film C portions may have another conductor film laminated further thereon to decrease the resistance value of the conductor films. Even in this case, the fusing property of the fuse films F is not degraded as long as the conductor film is not laminated on the fuse films F. FIG. 14 is a diagram of the circuit arrangement of an electronic device 1 in which another circuit is incorporated in the chip resistor described above.

In the electronic device 1, for example, a diode 55 and the resistor network 14 are connected in series. This electronic device 1 is a chip type electronic device that includes the diode 55. The present invention may be applied as an electronic device that includes the resistor network 14 described above without restriction to a chip type as in the present example. The present invention is not restricted to the preferred embodiments described above and various design changes may be applied within the scope of matters described in the claims. <Invention according to a first reference example> (1) Features of the invention according to the first reference example. For example, the features of the invention according to the first reference example are the following A1 to A11.

(A1) A chip part including a substrate of substantially rectangular parallelepiped shape having an element forming surface and a plurality of side surfaces orthogonal thereto, an element formed on the element forming surface of the substrate, wiring films connected to the element, and external connection electrodes formed on the element forming surface of the substrate, and where corner portions at which the plurality of side surfaces intersect are shaped to round shapes.

With this arrangement, the corner portions of the chip part have round shapes, and occurrence of chipping can thus be prevented to improve productivity.

(A2) The chip part according to A1, further including a protective film formed on the substrate so as to cover the element and the wiring films and where the corner portions of the protective film have round shapes. With this arrangement, the element and the wiring films can be protected by the protective film and occurrence of chipping of the corner portions of the protective film can be prevented.

(A3) The chip part according to A2, where the element includes a resistance formed as a thin film resistor body formed on the substrate and the wiring films form wiring connected to the resistance.

The chip part can thereby be arranged as a chip resistor.

(A4) The chip part according to A3, where portions of the thin film resistor body and the wiring films are used as a fuse element. By fusing the fuse element, a resistance of a desired value can be formed in the chip resistor.

(A5) The chip part according to any one of A2 to A4, where the protective film also covers a side surface of the substrate.

In this case, a side surface is covered by the protective film and formation of a short circuit path at the side surface can be prevented.

(A6) The chip part according to any one of A2 to A5, further including a resin film covering an upper surface of the protective film.

(A7) The chip part according to A6, where the external connection electrodes are connected to the wiring films via penetrating holes penetrating through the resin film and the protective film.

(A8) The chip part according to A6 or A7, where the resin film is made of a sheet and protrudes beyond the protective film at the side surfaces.

With this arrangement, when the chip part contacts an object in the surroundings, an overhanging portion of the resin film that protrudes beyond the protective film contacts the object in the surroundings first and relaxes the impact due to the contact to prevent the impact from being applied to the element, etc.

(A9) The chip part according to any one of A1 to A8, where a recess or a projection is formed on at least one of the side surfaces.

In this case, the outer shape of the chip part can be made asymmetrical by the recess or the projection, thereby enabling a chip direction of the chip part (the orientation of the chip part when it is to be mounted on a wiring substrate) to be recognized by the outer shape and enabling the chip direction to be ascertained from the outer appearance of the chip part.

(A10) A method for manufacturing a chip part including a step of forming an element on an element forming surface of a substrate and a step of using plasma etching to form, on the substrate, a plurality of side surfaces that are orthogonal to the element forming surface and shape corner portions at which the plurality of side surfaces intersect to round shapes.

By this method, the chip part, with which the corner portions are shaped to round shapes, can be manufactured.

(A11) A method for manufacturing a chip part including a step of forming an element on an element forming surface of a substrate and a step of forming, on the substrate, a plurality of side surfaces that are orthogonal to the element forming surface and shaping corner portions at which the plurality of side surfaces intersect to round shapes.

The chip part, with which the corner portions are shaped to round shapes, can be manufactured by this method as well. (2) Preferred embodiments of the invention related to the first reference example. Preferred embodiments of the first reference example shall now be described in detail with reference to the attached drawings. The symbols in FIG. 16 to FIG. 30 are effective only for these drawings and, even if used in other preferred embodiments, do not indicate the same elements as the symbols in the other preferred embodiments.

Figure 16A:
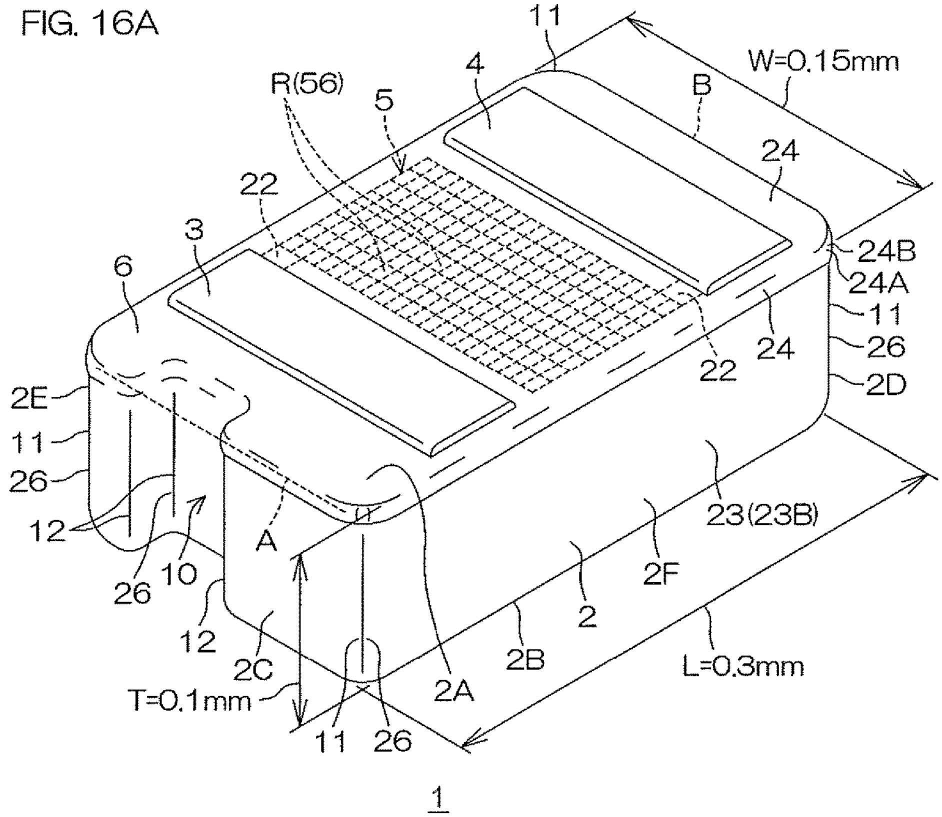
FIG. 16A is a schematic perspective view for describing the arrangement of an electronic device according to a preferred embodiment of a first reference example.
Figure 16B:
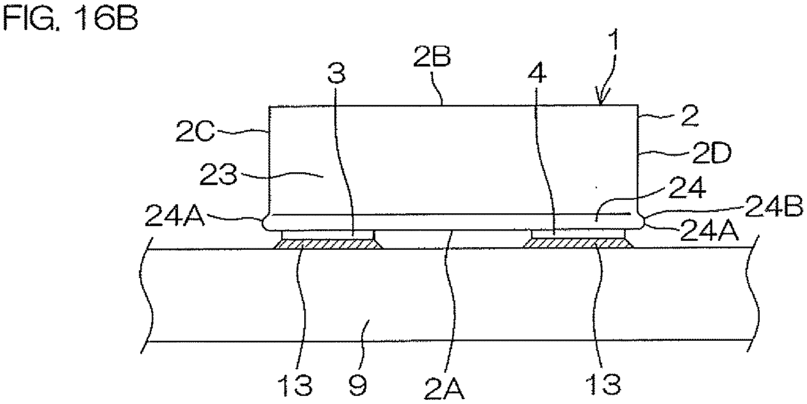
FIG. 16B is a schematic side view of a state where the electronic device is mounted on a circuit substrate.

FIG. 16A is a schematic perspective view for describing the arrangement of an electronic device according to a preferred embodiment of the first reference example and FIG. 16B is a schematic side view of a state where the electronic device is mounted on a circuit substrate. The electronic device 1 is a minute chip part and, as shown in FIG. 16A, has a rectangular parallelepiped shape. In regard to the dimensions of the electronic device 1, the length L in the long side direction is approximately 0.3 mm, the width W in the short side direction is approximately 0.15 mm, and the thickness T is approximately 0.1 mm.

The electronic device 1 is obtained by forming several electronic devices 1 in a lattice on a wafer and then cutting the wafer to separate it into the individual electronic devices 1. The electronic device 1 mainly includes a substrate 2, a first connection electrode 3 and a second connection electrode 4 that are to be external connection electrodes, and an element 5. The first connection electrode 3, the second connection electrode 4, and the element 5 are formed on the substrate 2 by using, for example, a semiconductor manufacturing process. A semiconductor substrate (semiconductor wafer), such as a silicon substrate (silicon wafer), etc., may thus be used as the substrate 2. The substrate 2 may also be another type of substrate, such as an insulating substrate, etc.

The substrate 2 has a substantially rectangular parallelepiped chip shape. With the substrate 2, the upper surface in FIG. 16A is an element forming surface 2A. The element forming surface 2A is the top surface of the substrate 2 and has a substantially rectangular shape. The surface at the opposite side of the element forming surface 2A in the thickness direction of the substrate 2 is a rear surface 2B. The element forming surface 2A and the rear surface 2B are substantially the same in shape. Besides the element forming surface 2A and the rear surface 2B, the substrate 2 has a side surface 2C, a side surface 2D, a side surface 2E, and a side surface 2F that extend orthogonally with respect to these surfaces.

The side surface 2C is constructed between edges at one end in the long direction (the edges at the front left side in FIG. 16A) of the element forming surface 2A and the rear surface 2B, and the side surface 2D is constructed between edges at the other end in the long direction (the edges at the inner right side in FIG. 16A) of the element forming surface 2A and the rear surface 2B. The side surfaces 2C and 2D are the respective end surfaces of the substrate 2 in the long direction. The side surface 2E is constructed between edges at one end in the short direction (the edges at the inner left side in FIG. 16A) of the element forming surface 2A and the rear surface 2B, and the side surface 2F is constructed between edges at the other end in the short direction (the edges at the front right side in FIG. 16A) of the element forming surface 2A and the rear surface 2B. The side surfaces 2E and 2F are the respective end surfaces of the substrate 2 in the short direction.

With the substrate 2, the element forming surface 2A, the side surface 2C, the side surface 2D, the side surface 2E, and the side surface 2F are covered by a protective film 23. Thus to be exact, the element forming surface 2A, the side surface 2C, the side surface 2D, the side surface 2E, and the side surface 2F in FIG. 16A are positioned at the inner sides (rear sides) of the protective film 23 and are not exposed to the exterior. Further, the protective film 23 on the element forming surface 2A is covered by a resin film 24. The resin film 24 protrudes from the element forming surface 2A to respective end portions at the element forming surface 2A side (upper end portions in FIG. 16A) of the side surface 2C, the side surface 2D, the side surface 2E, and the side surface 2F. The protective film 23 and the resin film 24 shall be described in detail later.

With the substrate 2, a recess 10, by which the substrate 2 is notched in the thickness direction, is formed in a portion corresponding to a side A (one of the side surfaces 2C, 2D, 2E, and 2F, and in the present case, the side surface 2C, as shall be described later) of the element forming surface 2A of substantially rectangular shape. The side A is also a side of the electronic device 1 in a plan view. The recess 10 in FIG. 16A is formed in the side surface 2C and is recessed toward the side surface 2D side while extending in the thickness direction of the substrate 2. The recess 10 penetrates through the substrate 2 in the thickness direction, and end portions of the recess 10 in the thickness direction are exposed from the element forming surface 2A and the rear surface 2B, respectively. The recess 10 is smaller than the side surface 2C in the direction of extension of the side surface 2C (the short direction). The shape of the recess 10 in a plan view of viewing the substrate 2 in the thickness direction (which is also the thickness direction of the electronic device 1) is an oblong shape (rectangular shape) that is long in the short direction. The shape of the recess 10 in the plan view may be a trapezoidal shape that becomes narrow toward the direction in which the recess 10 is recessed (toward the side surface 2D side), or may be a triangular shape that becomes thin toward the recessing direction, or may be a U-like shape (a shape recessed in the shape of the letter U). In any case, the recess 10 can be formed easily as long as it has such a simple shape. Although the recess 10 is formed in the side surface 2C here, it may be formed in at least one of the side surface 2C to 2F instead of being formed in the side surface 2C.

The recess 10 indicates the orientation (chip direction) of the electronic device 1 when the electronic device 1 is mounted on a circuit substrate 9 (see FIG. 16B). The outline of the electronic device 1 (to be accurate, the substrate 2) in a plan view is a rectangle having the recess 10 at one side A and is therefore an asymmetrical outer shape in the long direction. That is, the asymmetrical outer shape has the recess 10 indicating the chip direction at a side (side A) among the side surfaces 2C, 2D, 2E, and 2F, and with the electronic device 1, that the recess side in the long direction is the chip direction is indicated by the asymmetrical outer shape. The chip direction of the electronic device 1 can thus be recognized by simply making the outer shape of the substrate 2 of the electronic device 1 asymmetrical in a plan view. That is, the chip direction can be recognized by the outer shape of the electronic device 1 even without a marking step. In particular, the asymmetrical outer shape of the electronic device 1 is a rectangle having the recess 10, indicating the chip direction, at the side A, and the recess 10 side in the long direction joining the side A and a side B at the opposite side can thus be made the chip direction with the electronic device 1. Therefore, for example, by enabling the electronic device 1 be mounted correctly on the circuit substrate 9 when the side A is positioned at the left end when the long direction of the electronic device 1 in a plan view is matched with the right/left direction, that the orientation of the electronic device 1 must be set so that the side A is positioned at the left end in a plan view in the mounting process can be ascertained from the outer appearance of the electronic device 1 by the recess 10.

With the rectangular parallelepiped substrate 2, corner portions 11 that form the boundaries between mutually adjacent side surfaces (the portions 11 of intersection of the mutually adjacent side surfaces) among the side surface 2C, side surface 2D, side surface 2E, and side surface 2F are shaped (rounded) to chamfered round shapes. Also with the substrate 2, corner portions 12 that form the boundaries between the recess 10 and the side surface 2C in the periphery of the recess 10 (the corner portions 12 at the recess 10 in the side surface 2C) are also shaped to chamfered round shapes. Here, the corner portions 12 are present not only at the boundaries of the recess 10 and the side surface 2C at the periphery of the recess 10 (portions besides the recess 10) but are also present at the innermost sides of the recess 10 and are thus present at four locations in a plan view.

All of the bent portions (corner portions 11 and 12) of the outline of the substrate 2 in a plan view thus have round shapes. The occurrence of chipping can thus be prevented at the corner portions 11 and 12 of the round shapes. Improvement of yield (improvement of productivity) can thereby be achieved in the manufacture of the electronic device 1. The first connection electrode 3 and the second connection electrode 4 are formed on the element forming surface 2A of the substrate 2 and are partially exposed from the resin film 24. Each of the first connection electrode 3 and the second connection electrode 4 is formed by laminating, for example, Ni (nickel), Pd (palladium), and Au (gold) in that order on the element forming surface 2A. The first connection electrode 3 and the second connection electrode 4 are disposed across an interval in the long direction of the element forming surface 2A and are long in the short direction of the element forming surface 2A. In FIG. 16A, the first connection electrode 3 is provided at a position of the element forming surface 2A close to the side surface 2C and the second connection electrode 4 is provided at a position close to the side surface 2D. The recess 10 in the side surface 2C is recessed to a depth that does not interfere with the first connection electrode 3. However, depending on the case, the first connection electrode 3 may also be provided with a recess (that becomes a portion of the recess 10) in accordance with the recess 10.

The element 5 is a circuit element, is formed in a region of the element forming surface 2A of the substrate 2 between the first connection electrode 3 and the second connection electrode 4, and is covered from above by the protective film 23 and the resin film 24. The element 5 of the present preferred embodiment is a resistor 56 arranged by a circuit network in which a plurality of thin-film-like resistor bodies (thin film resistor bodies) R, made of TiN (titanium nitride) or TiON (titanium oxide nitride), are arrayed in a matrix on the element forming surface 2A. The element 5 is connected to wiring films 22, to be described below, and is connected to the first connection electrode 3 and the second connection electrode 4 via the wiring films 22. A resistor circuit is thus formed by the element 5 between the first connection electrode 3 and the second connection electrode 4 in the electronic device 1. Therefore in the present preferred embodiment, the electronic device 1 is a chip resistor.

The electronic device 1 can be flip-chip connected to the circuit substrate 9 by making the first connection electrode 3 and the second connection electrode 4 face the circuit substrate 9 and electrically and mechanically connecting the electrodes to circuits (not shown) of the circuit substrate 9 by solders 13 as shown in FIG. 16B. The first connection electrode 3 and the second connection electrode 4 that function as the external connection electrodes are preferably formed of gold (Au) or has gold plating applied on the surfaces thereof to improve solder wettability and improve reliability.

Figure 17:
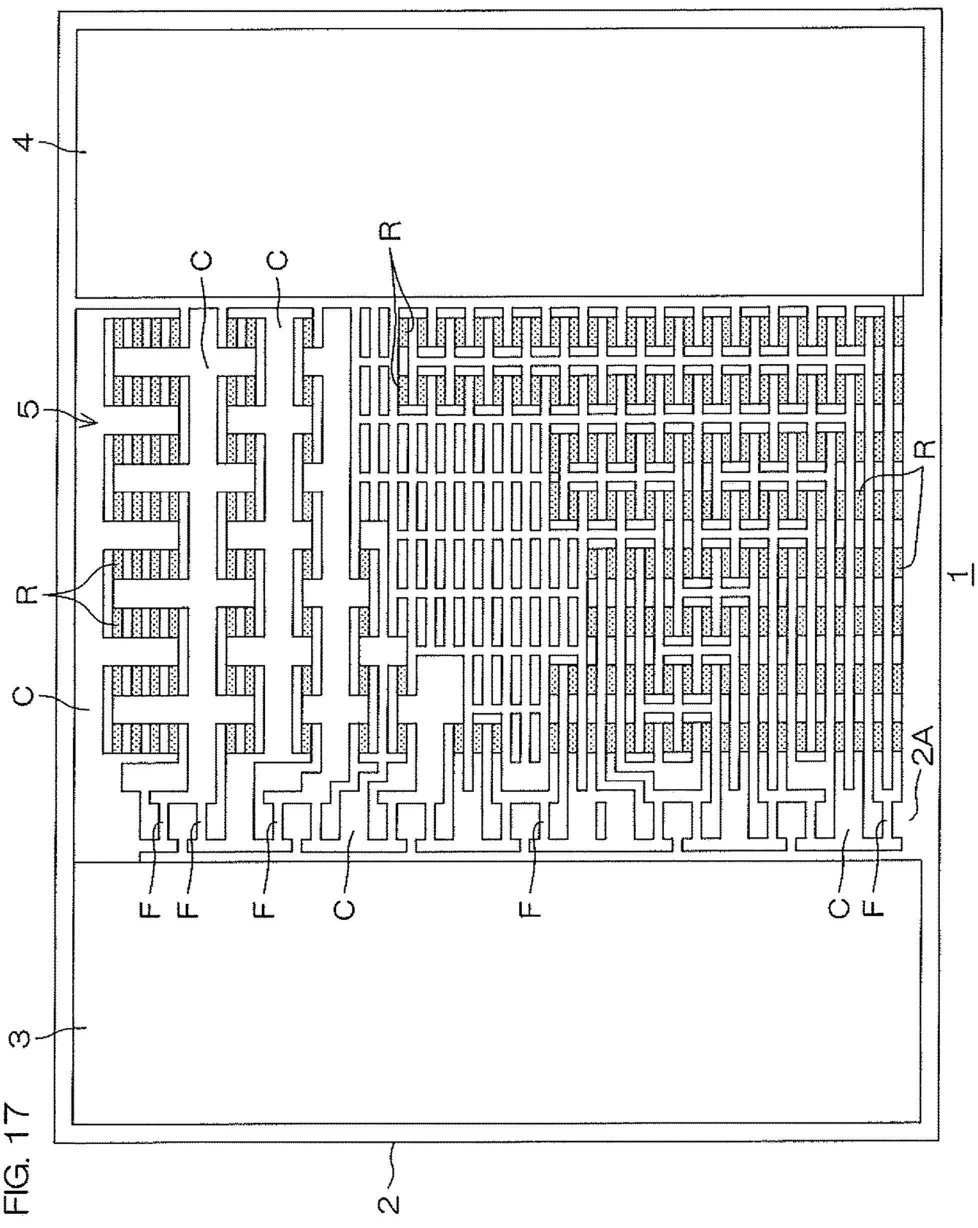
FIG. 17 is a plan view of the electronic device showing the positional relationships of a first connection electrode, a second connection electrode, and an element and showing the arrangement in a plan view of the element.

FIG. 17 is a plan view of the electronic device and shows the positional relationships of the first connection electrode, the second connection electrode, and the element and shows the arrangement in a plan view of the element. With reference to FIG. 17, the element 5 that is a resistor network has, for example, a total of 352 resistor bodies R arranged from 8 resistor bodies R being arrayed along the row direction (length direction of the substrate 2) and 44 resistor bodies R being arrayed along the column direction (width direction of the substrate 2). The respective resistor bodies R have an equal resistance value.

The plurality of resistor bodies R are electrically connected in groups of predetermined numbers of 1 to 64 to form a plurality of types of resistance units (unit resistors). The plurality of types of resistance units thus formed are connected in predetermined modes via connection conductor films C. Further, on the element forming surface 2A of the substrate 2, a plurality of fuse films F are provided that electrically incorporate resistance units into the element 5 or are capable of being fused to electrically separate resistance units from the element 5. The plurality of fuse films F and the connection conductor films C are arrayed along the inner side of the second connection electrode 4 so that the positioning regions thereof are rectilinear. More specifically, the plurality of fuse films F and the connection conductor films C are disposed rectilinearly.

Figure 18A:
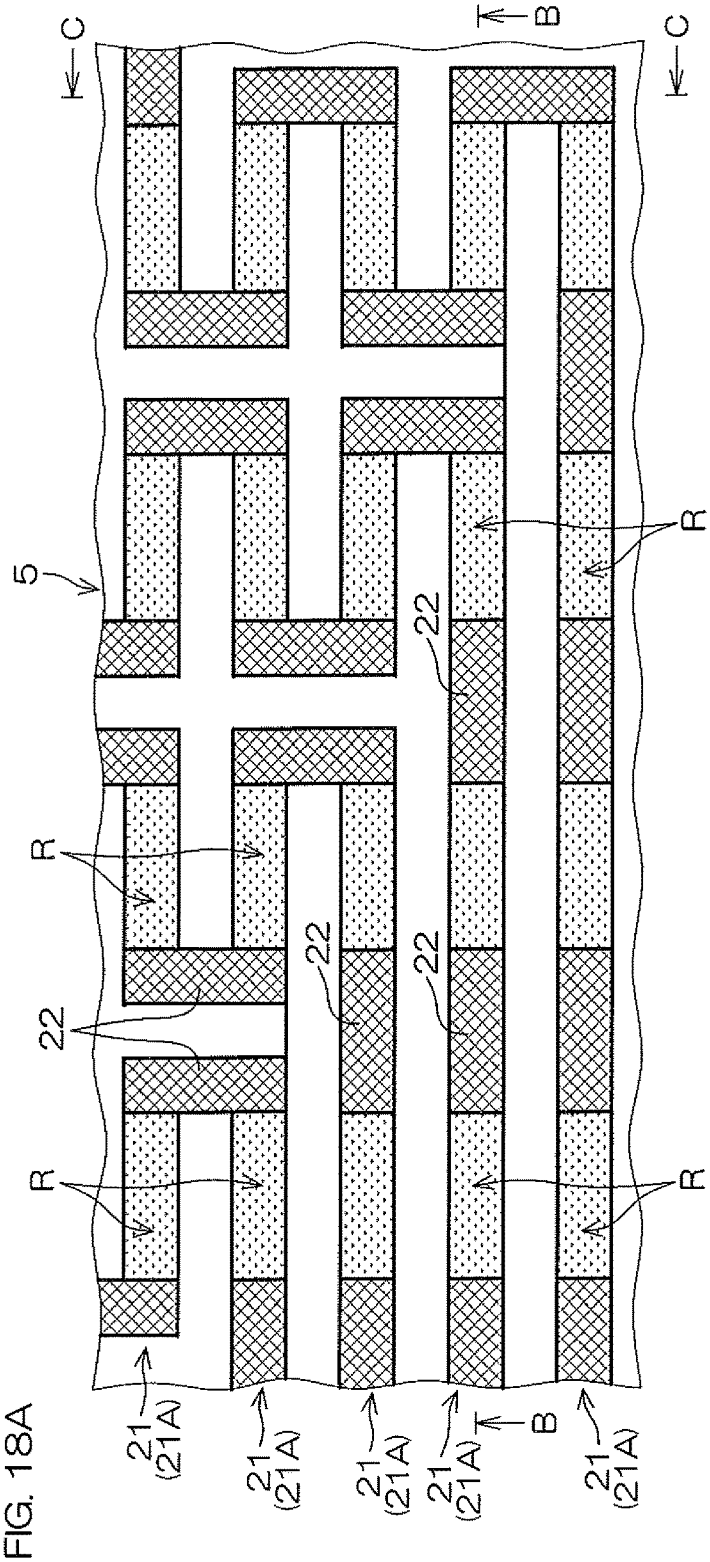
FIG. 18A is partially enlarged plan view of the element shown in FIG. 17.
Figure 18B:
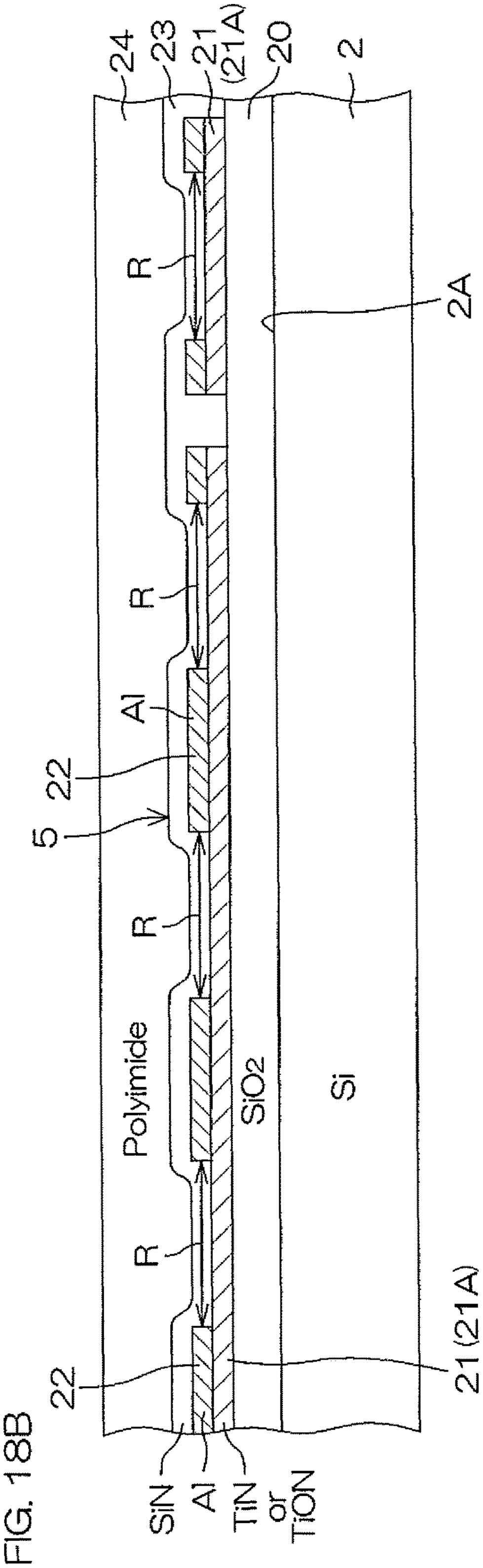
FIG. 18B is a vertical sectional view in the length direction taken along B-B of FIG. 18A for describing the arrangement of resistor bodies in the element.
Figure 18C:
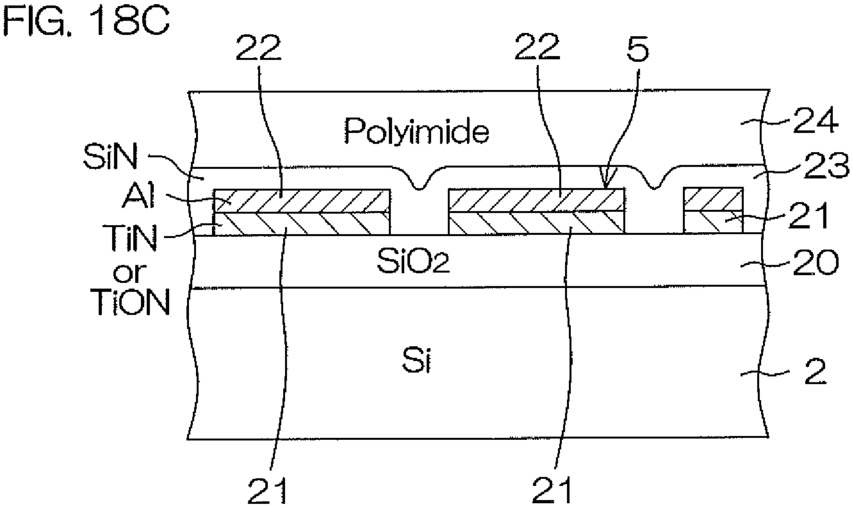
FIG. 18C is a vertical sectional view in the width direction taken along C-C of FIG. 18A for describing the arrangement of the resistor bodies in the element.

FIG. 18A is partially enlarged plan view of the element shown in FIG. 17. FIG. 18B is a vertical sectional view in the length direction taken along B-B of FIG. 18A for describing the arrangement of resistor bodies in the element. FIG. 18C is a vertical sectional view in the width direction taken along C-C of FIG. 18A for describing the arrangement of the resistor bodies in the element. The arrangement of the resistor bodies R shall now be described with reference to FIG. 18A, FIG. 18B, and FIG. 18C.

Besides the wiring films 22, the protective film 23, and the resin film 24, the electronic device 1 further includes an insulating film 20 and resistor body films 21 (see FIG. 18B and FIG. 18C). The insulating film 20, the resistor body films 21, the wiring films 22, the protective film 23, and the resin film 24 are formed on the substrate 2 (element forming surface 2A). The insulating film 20 is made of $SiO_2$ (silicon oxide). The insulating film 20 covers the entirety of the element forming surface 2A of the substrate 2. The thickness of the insulating film 20 is approximately 10000 Å.

The resistor body films 21 make up the resistor bodies R. The resistor body films 21 are formed of TiN or TiON and are laminated on the top surface of the insulating film 20. The thickness of each resistor body film 21 is approximately 2000 Å. The resistor body films 20 form a plurality of lines (hereinafter referred to as "resistor body film lines 21A") extending as lines between the first connection electrode 3 and the second connection electrode 4, and there are cases where a resistor body film line 21A is cut at predetermined positions in the line direction (see FIG. 18A).

Figure 19A:
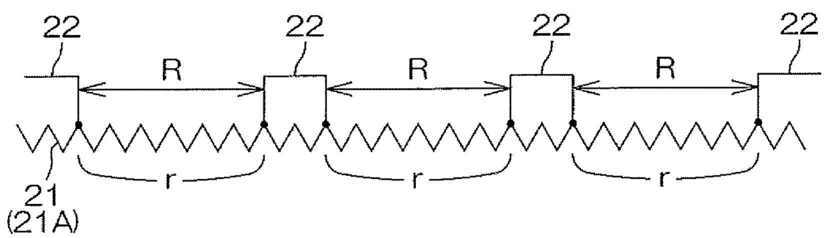
FIG. 19A is a diagram showing the electrical features of resistor body film lines and conductor films in the form of circuit symbols and an electric circuit diagram.

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A while being spaced apart by fixed intervals R in the line direction. The electrical features of the resistor body film lines 21A and the wiring films 22 are indicated in the form of circuit symbols in FIGS. 19A, 19B, and 19C. That is, as shown in FIG. 19A, each of the resistor body film line 21A portions in regions of the predetermined interval R forms a resistor body R with a fixed resistance value r.

Figure 19B:
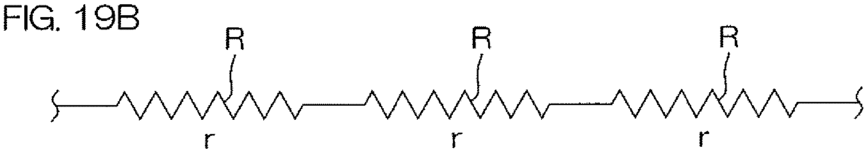
FIG. 19B is a diagram showing the electrical features of resistor body film lines and conductor films in the form of circuit symbols and an electric circuit diagram.
Figure 19C:
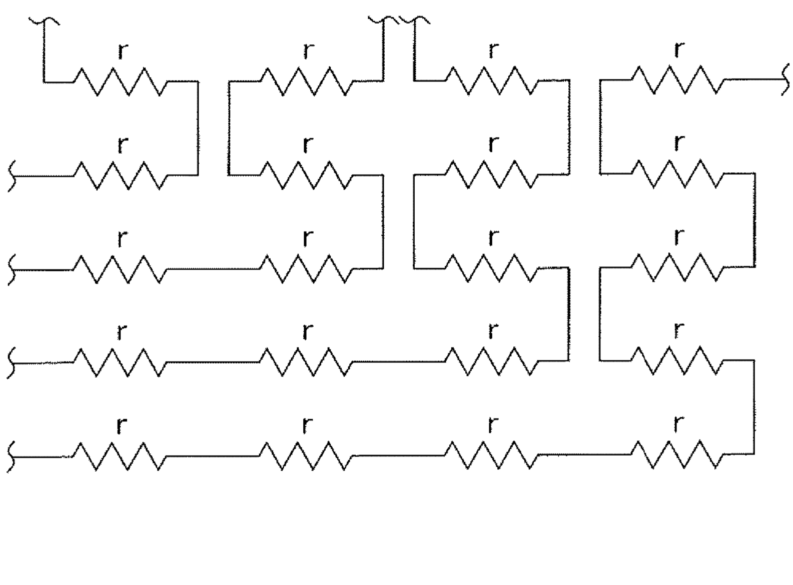
FIG. 19C is a diagram showing the electrical features of resistor body film lines and conductor films in the form of circuit symbols and an electric circuit diagram.

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 19B. Also, adjacent resistor body film lines 21A are connected to each other by the resistor body films 21 and wiring films 22, and the resistor network of the element 5 shown in FIG. 18A forms the resistor circuit (made up of the unit resistors of resistor bodies R) shown in FIG. 19C.

Here, based on the characteristic that resistor body films 21 of the same shape with the same size that are formed on the substrate 2 are substantially the same in value, the plurality of resistor bodies R arrayed in a matrix on the substrate 2 have an equal resistance value. Also, the wiring films 22 laminated on the resistor body film lines 21A form the resistor bodies R and also serve the role of connection conductor films that connect a plurality of resistor bodies R to arrange a resistance unit.

Figure 20A:
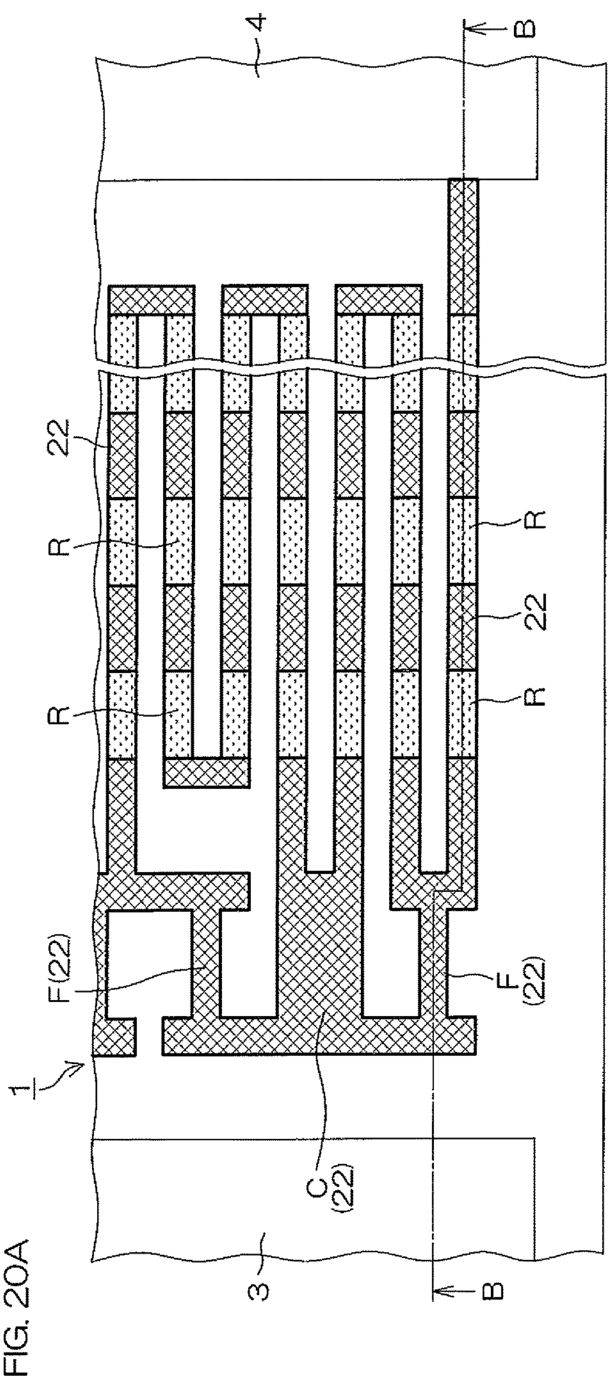
FIG. 20A is a partially enlarged plan view of a region including fuse films drawn by enlarging a portion of the plan view of the electronic device shown in FIG. 17.
Figure 20B:
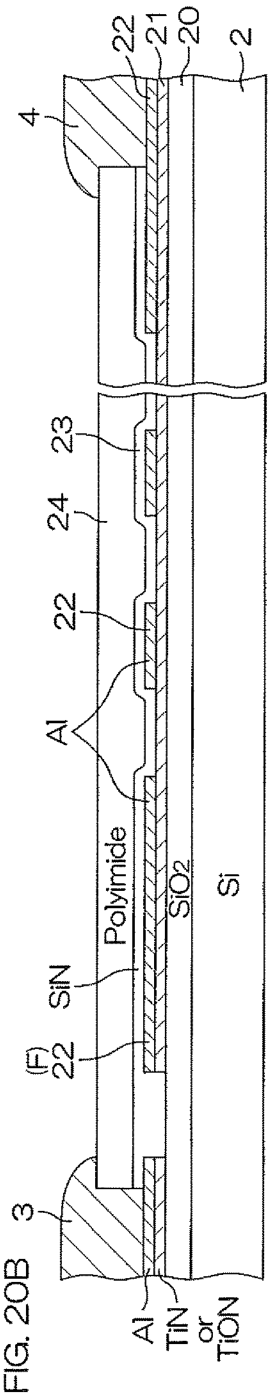
FIG. 20B is a structural sectional view taken along B-B in FIG. 20A.

FIG. 20A is partially enlarged plan view of a region including the fuse films drawn by enlarging a portion of the plan view of the electronic device shown in FIG. 17, and FIG. 20B is a structural sectional view taken along B-B in FIG. 20A. As shown in FIGS. 20A and 20B, the fuse films F and the connection conductor films C are also formed by the wiring films 22, which are laminated on the resistor body films 21 that form the resistor bodies R. That is, the fuse films F and the connection conductor films C are formed of Al or AlCu alloy, which is the same metal material as that of the wiring films 22, on the same layer as the wiring films 22, which are laminated on the resistor body film lines 21A that form the resistor bodies R.

That is, on the same layer laminated on the resistor body films 20, the wiring films for forming the resistor bodies R, the fuse films F, the connection conductor films C, and the wiring films for connecting the element 5 to the first connection electrode 3 and the second connection electrode 4 are formed as the wiring films 22 by the same manufacturing process (the sputtering and photolithography process to be described below) using the same metal material (Al or AlCu alloy).

The fuse film F may refer not only to a portion of the wiring films 22 but may also refer to an assembly (fuse element) of a portion of a resistor body R (resistor body film 21) and a portion of the wiring film 22 on the resistor body film 21. Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

Figure 21:
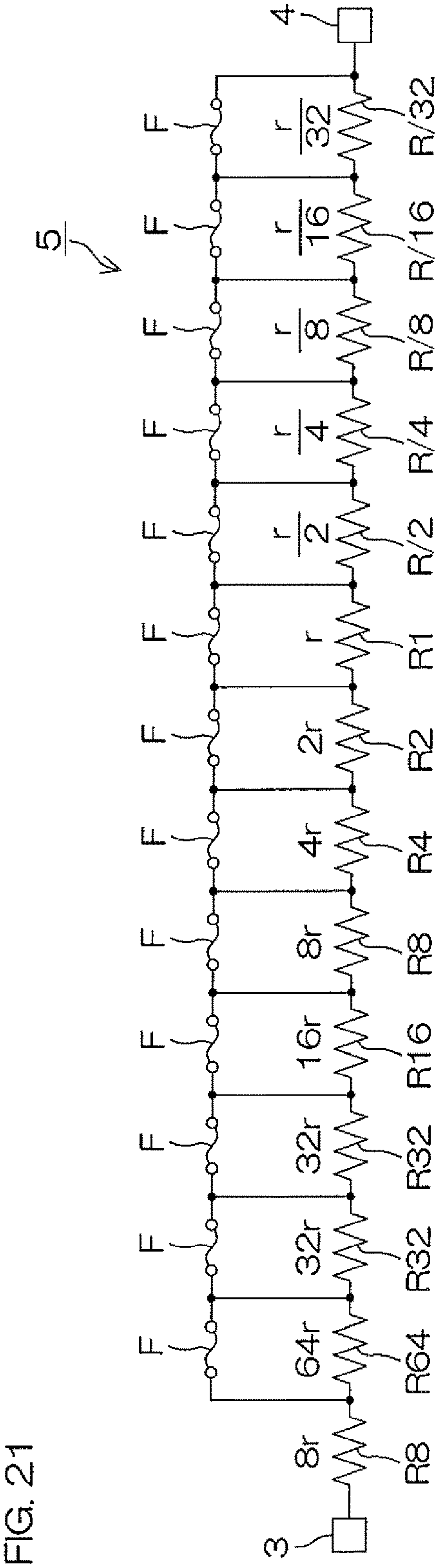
FIG. 21 is an electric circuit diagram of the element according to the preferred embodiment of the first reference example.

FIG. 21 is an electric circuit diagram of the element according to the preferred embodiment of the first reference example. Referring to FIG. 21, the element 5 is arranged by serially connecting a reference resistance unit R8, a resistance unit R64, two resistance units R32, a resistance unit R16, a resistance unit R8, a resistance unit R4, a resistance unit R2, a resistance unit R1, a resistance unit R/2, a resistance unit R/4, a resistance unit R/8, a resistance unit R/16, and a resistance unit R/32 in that order from the first connection electrode 3. Each of the reference resistance unit R8 and resistance units R64 to R2 is arranged by serially connecting the same number of resistor bodies R as the number at the end of its symbol ("64" in the case of R64). The resistance unit R1 is arranged from a single resistor body R. Each of the resistance units R/2 to R/32 is arranged by connecting the same number of resistor bodies R as the number at the end of its symbol ("32" in the case of R/32) in parallel. The meaning of the number at the end of the symbol of the resistance unit is the same in FIG. 22 and FIG. 23 to be described below.

One fuse film F is connected in parallel to each of the resistance unit R64 to resistance unit R/32, besides the reference resistance unit R8. The fuse films F are mutually connected in series directly or via the connection conductor film C (see FIG. 20A). In a state where none of the fuse films F is fused as shown in FIG. 21, the element 5 forms a resistor circuit of the reference resistance unit R8 (resistance value: 8r), formed by the serial connection of the 8 resistor bodies R provided between the first connection electrode 3 and the second connection electrode 4. For example, if the resistance value r of a single resistor body R is r=80Ω, the chip resistor (electronic device 1) is arranged with the first connection electrode 3 and the second connection electrode 4 being connected by a resistor circuit of 8r=64Ω.

Also in the state where none of the fuse films F is fused, the plurality of types of resistance units besides the reference resistance unit R8 are put in short-circuited states. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the element 5.

With the electronic device 1 according to the present preferred embodiment, a fuse film F is selectively fused, for example, by laser light in accordance with the required resistance value. The resistance unit with which the fuse film F connected in parallel is fused is thereby incorporated into the element 5. The overall resistance value of the element 5 can thus be set to the resistance value resulting from serially connecting and incorporating the resistance units corresponding to the fused fuse films F.

In particular, the plurality of types of resistance units include the plurality of types of serial resistance units, with which the resistor bodies R having the equal resistance value are connected in series with the number of resistor bodies R being increased in geometric progression as 1, 2, 4, 8, 16, 32, . . . , and the plurality of types of parallel resistance units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the element 5 (resistor 56) as a whole can be adjusted finely and digitally to an arbitrary resistance value to enable a resistance of a desired value to be formed in the electronic device 1.

Figure 22:
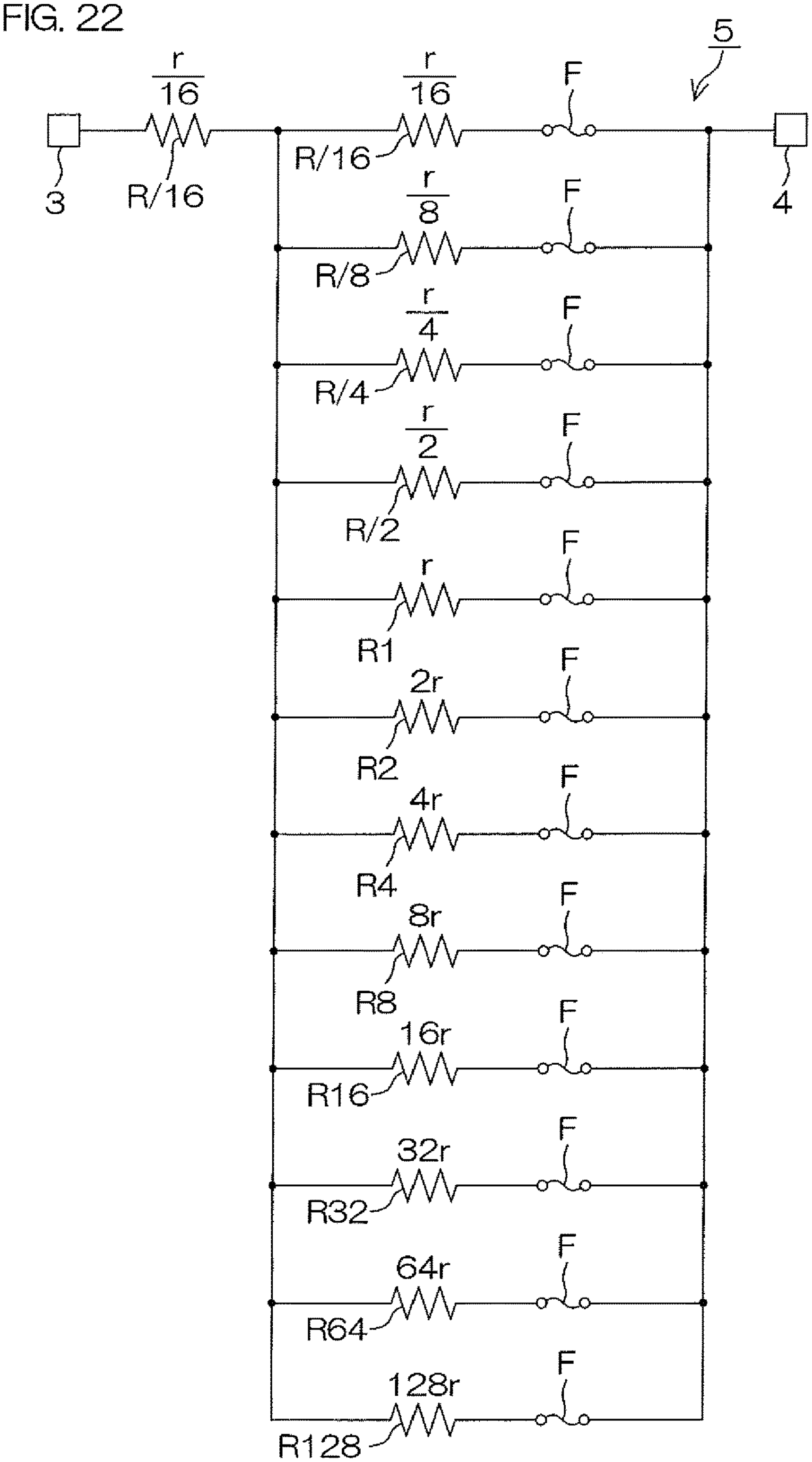
FIG. 22 is an electric circuit diagram of an element according to another preferred embodiment of the first reference example.

FIG. 22 is an electric circuit diagram of an element according to another preferred embodiment of the first reference example. Instead of arranging the element 5 by serially connecting the reference resistance unit R8 and the resistance unit R64 to the resistance unit R/32 as described above, the element 5 may be arranged as shown in FIG. 22. To be detailed, the element 5 may be arranged, between the first connection electrode 3 and the second connection electrode 4, as a serial connection circuit of the reference resistance unit R/16 and the parallel connection circuit of the 12 types of resistance units R/16, R/8, R/4, R/2, R1, R2, R4, R8, R16, R32, R64, and R128.

In this case, a fuse film F is serially connected to each of the 12 types of resistance units besides the reference resistance unit R/16. In a state where none of the fuse films F is fused, the respective resistance units are electrically incorporated in the element 5. By selectively fusing a fuse film F, for example, by laser light in accordance with the required resistance value, the resistance unit corresponding to the fused fuse film F (the resistance unit connected in series to the fuse film F) is electrically separated from the element 5 and the resistance value of the electronic device 1 as a whole can thereby be adjusted.

Figure 23:
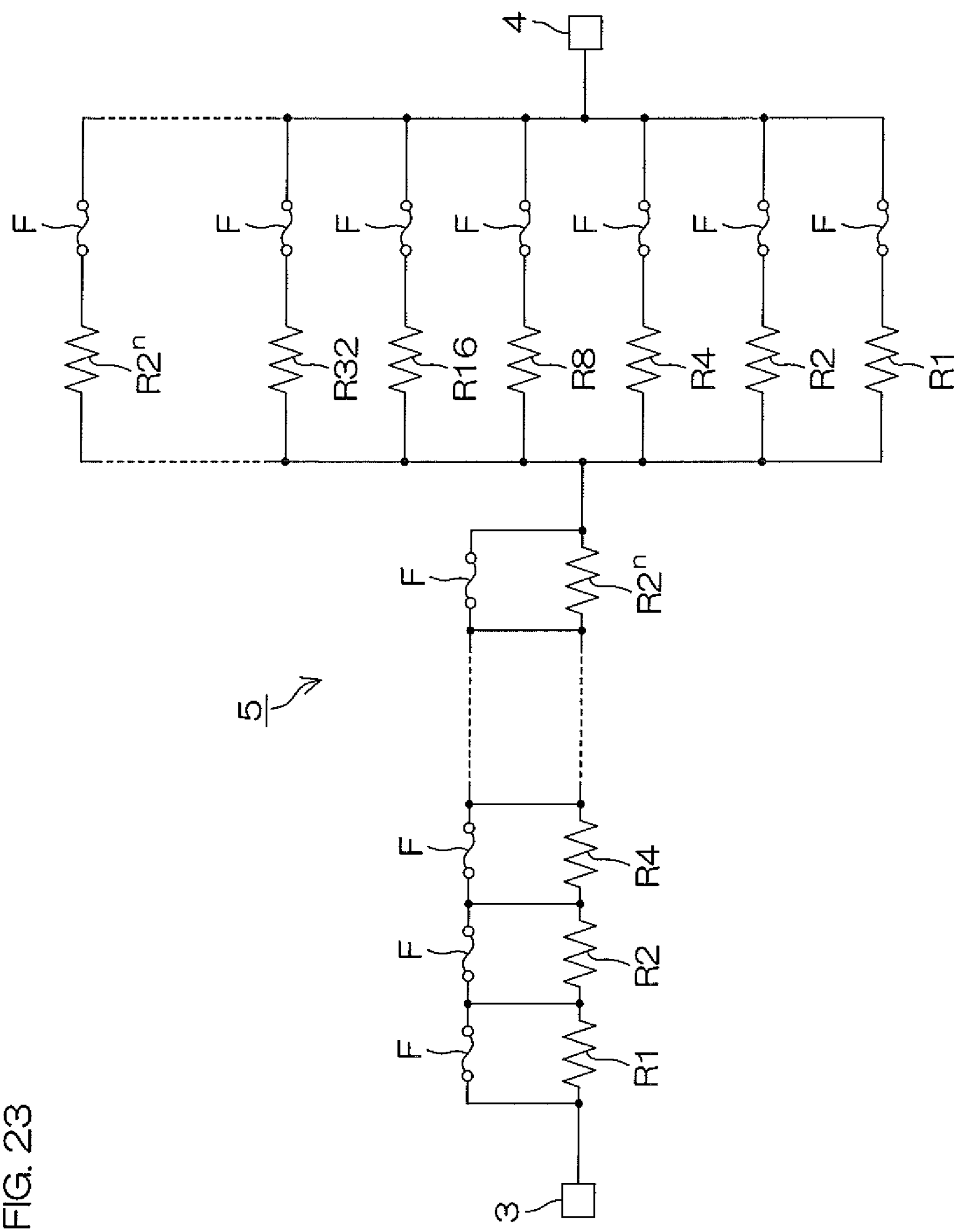
FIG. 23 is an electric circuit diagram of an element according to yet another preferred embodiment of the first reference example.

FIG. 23 is an electric circuit diagram of an element according to yet another preferred embodiment of the first reference example. A feature of the element 5 shown in FIG. 23 is that it has the circuit arrangement where a serial connection of a plurality of types of resistance units and a parallel connection of a plurality of types of resistance units are connected in series. As in a previous preferred embodiment, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fused fuse film F is electrically incorporated into the element 5.

On the other hand, a fuse film F is connected in series to each of the plurality of types of resistance units that are connected in parallel. Therefore by fusing a fuse film F, the resistance unit connected in series to the fused fuse film F can be electrically disconnected from the parallel connection of resistance units. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

Figure 24:
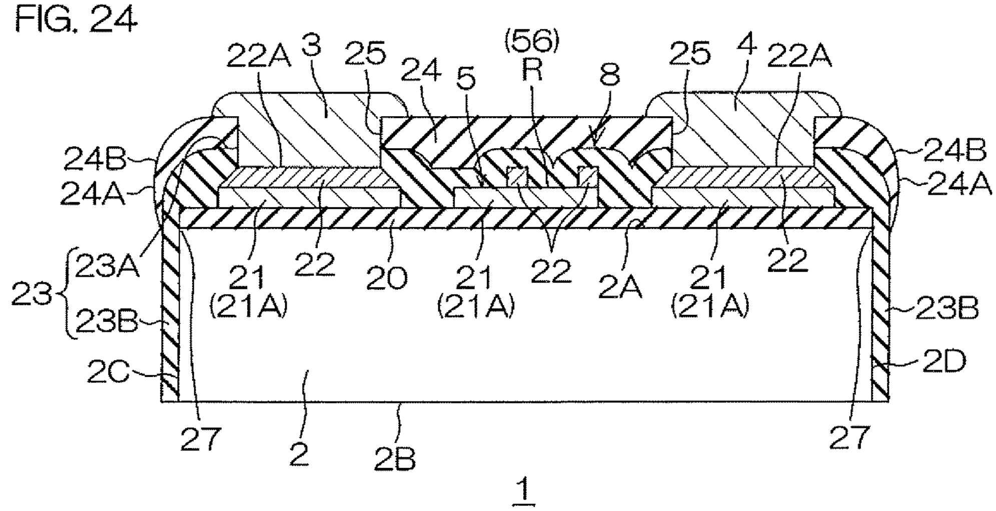
FIG. 24 is a schematic sectional view of the electronic device.

FIG. 24 is a schematic sectional view of the electronic device. The electronic device 1 shall now be described in further detail with reference to FIG. 24. For the sake of description, the element 5 is illustrated in a simplified form and hatching is applied to respective elements besides the substrate 2 in FIG. 24. Here, the protective film 23 and the resin film 24 shall be described.

The protective film 23 is made, for example, from SiN (silicon nitride) and the thickness thereof is approximately 3000 Å. The protective film 23 integrally includes an element covering portion 23A, provided across the entirety of the element forming surface 2A and covering the resistor body films 21 and the respective wiring films 22 on the resistor body films 21 (in other words, the element 5) from the top surface (upper side in FIG. 24) (that is, covering the upper surfaces of the respective resistor bodies R in the element 5), and a side surface covering portion 23B, covering the respective entireties of the four side surfaces 2C to 2F (see FIG. 16A) of the substrate 2. The element covering portion 23A and the side surface covering portion 23B are actually substantially the same in thickness and are mutually continuous. Therefore, as a whole, the protective film 23 covers the upper surfaces of the resistor bodies R and the side surfaces 2C to 2F of the substrate 2 continuously with substantially the same thickness.

Short-circuiting across the resistor bodies R (short-circuiting across adjacent resistor body film lines 21A) at portions besides the wiring films 22 is prevented by the element covering portion 23A. The side surface covering portion 23B not only covers the respective entireties of the side surfaces 2C to 2F but also covers portions of the insulating film 20 that are exposed to the side surfaces 2C to 2F. At the side surface 2C, the side surface covering portion 23B covers the entirety including the portion at which the recess 10 is formed (see FIG. 16A). Short-circuiting at the respective side surfaces 2C to 2F (forming of a short circuit path at any of the side surfaces) is prevented by the side surface covering portion 23B.

Referring to FIG. 16A, the protective film 23 continuously covers the element forming surface 2A and the four side surfaces 2C to 2F of the substrate 2 and therefore has corner portions 26 of round shapes along the corner portions 11 and 12 of the substrate 2. In this case, the element 5 and the wiring films 22 can be protected by the protective film 23 and occurrence of chipping at the corner portions 26 of the protective film 23 can be prevented.

Returning to FIG. 24, the resin film 24, together with the protective film 23, protects the electronic device 1 and is made of a resin, such as polyimide, etc. The thickness of the resin film 24 is approximately 5 μm. The resin film 24 covers the top surface of the element covering portion 23A (upper surface of the protective film 23) across its entirety and covers end portions at the element forming surface 2A side (upper end portions in FIG. 24) of the side surface covering portion 23B on the four side surfaces 2C to 2F of the substrate 2. That is, with the side surface covering portion 23B on the four side surfaces 2C to 2F, at least a portion at the side (lower side in FIG. 24) opposite to the element forming surface 2A is left exposed from the resin film 24.

With such a resin film 24, the portion coinciding with the four side surfaces 2C to 2F in a plan view is an arcuate overhanging portion 24A that overhangs further to the sides (outward) than the side surface covering portion 23B on the side surfaces. That is, the resin film 24 (overhanging portion 24A) protrudes beyond the side surface covering portion 23B (protective film 23) at the side surfaces 2C to 2F. Such a resin film 24 has side surfaces 24B of round shapes that project to the sides at the arcuate overhanging portion 24A. The overhanging portion 24A covers corner portions 27 forming the boundaries between the element forming surface 2A and the respective side surfaces 2C to 2F. Therefore, when the electronic device 1 contacts an object in the surroundings, the overhanging portion 24A contacts the object in the surroundings first and relaxes the impact due to the contact to prevent the impact from being applied to the element 5, etc., and prevent chipping at the corner portions 27. In particular, the overhanging portion 24A has side surfaces 24B with round shapes and can thus relax the impact due to contact smoothly.

An arrangement where the resin film 24 does not cover the side surface covering portion 23B at all (an arrangement where the entire side surface covering portion 23B is exposed) is also possible. In the resin film 24, openings 25 are formed, one at each of two positions that are separated in a plan view. Each opening 25 is a penetrating hole penetrating continuously through each of the resin film 24 and the protective film 23 (element covering portion 23A) in the thickness direction. The openings 25 are thus formed not only in the resin film 24 but also in the protective film 23. Portions of wiring films 22 are exposed at the respective openings 25. The portions of the wiring films 22 exposed at the respective openings 25 are pad regions 22A for external connection.

Of the two openings 25, one opening 25 is completely filled by the first connection electrode 3 and the other opening 25 is completely filled by the second connection electrode 4. A portion of each of the first connection electrode 3 and the second connection electrode 4 protrudes from the opening 25 at the top surface of the resin film 24. The first connection electrode 3 is electrically connected via the one opening 25 to the wiring film 22 at the pad region 22A in this opening 25. The second connection electrode 4 is electrically connected via the other opening 25 to the wiring film 22 at the pad region 22A in this opening 25. The first connection electrode 3 and the second connection electrode 4 are thereby electrically connected to the element 5. Here, the wiring films 22 form wirings that are respectively connected to groups of resistor bodies R (resistor 56) and the first connection electrode 3 and the second connection electrode 4.

The resin film 24 and the protective film 23, in which the openings 25 are formed, are thus formed so that the first connection electrode 3 and the second connection electrode 4 are exposed from the openings 25. Electrical connection between the electronic device 1 and the circuit substrate 9 can thus be achieved via the first connection electrode 3 and the second connection electrode 4 protruding from the openings 25 at the top surface of the resin film 24 (see FIG. 16B).

Figure 25A:
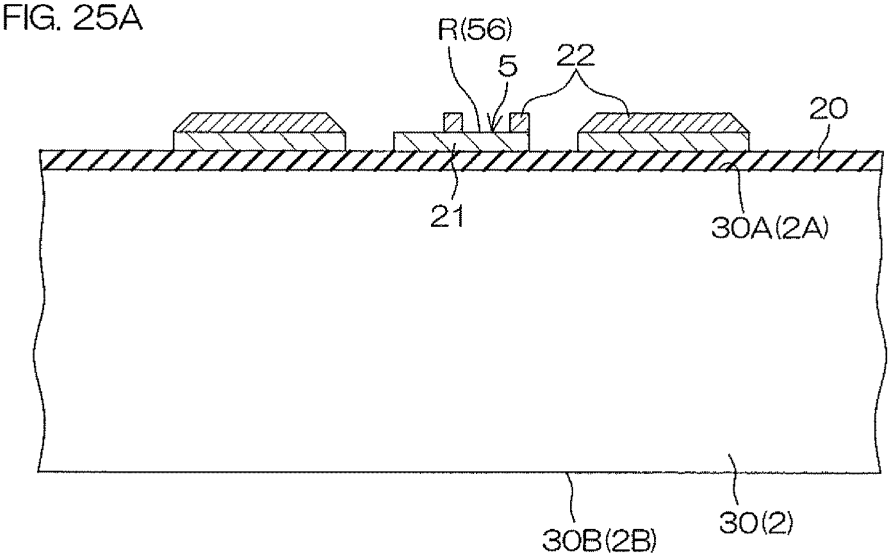
FIG. 25A is an illustrative sectional view of a method for manufacturing the electronic device shown in FIG. 24.

FIG. 25A to FIG. 25F are illustrative sectional views of a method for manufacturing the electronic device shown in FIG. 24. First, as shown in FIG. 25A, a wafer 30 is prepared. The wafer 30 is the base for the substrate 2. A top surface 30A of the wafer 30 is thus the element forming surface 2A of the substrate 2 and a rear surface 30B of the wafer 30 is the rear surface 2B of the substrate 2.

The insulating film 20, made of $SiO_2$, etc., is then formed on the top surface 30A of the wafer 30, and the element 5 (the resistor bodies R and the wiring films 22) is formed on the insulating film 20. Specifically, first, the resistor body film 21 of TiN or TiON is formed by sputtering on the entire surface of the insulating film 20 and further, the wiring film 22 of aluminum (Al) is laminated on the resistor body film 21. Thereafter, a photolithography process is used and, for example, dry etching is performed to selectively remove the resistor body film 21 and the wiring film 22 to obtain the arrangement where, as shown in FIG. 18A, the resistor body film lines 21A of fixed width, at which the resistor body film 21 is laminated, are arrayed in the column direction while being spaced apart by fixed intervals in a plan view. Regions at which the resistor body film lines 21A and the wiring films 22 are interrupted are also formed at this point. The wiring films 22 laminated on the resistor body film lines 20 are then removed selectively. The element 5 of the arrangement where the wiring films 22 are laminated on the resistor body film lines 21A while being spaced apart by the fixed intervals R is consequently obtained.

With reference to FIG. 25A, the elements 5 are formed on a plurality of locations on the top surface 30A of the wafer 30 in accordance with the number of electronic devices 1 to be formed on the single wafer 30.

Figure 25B:
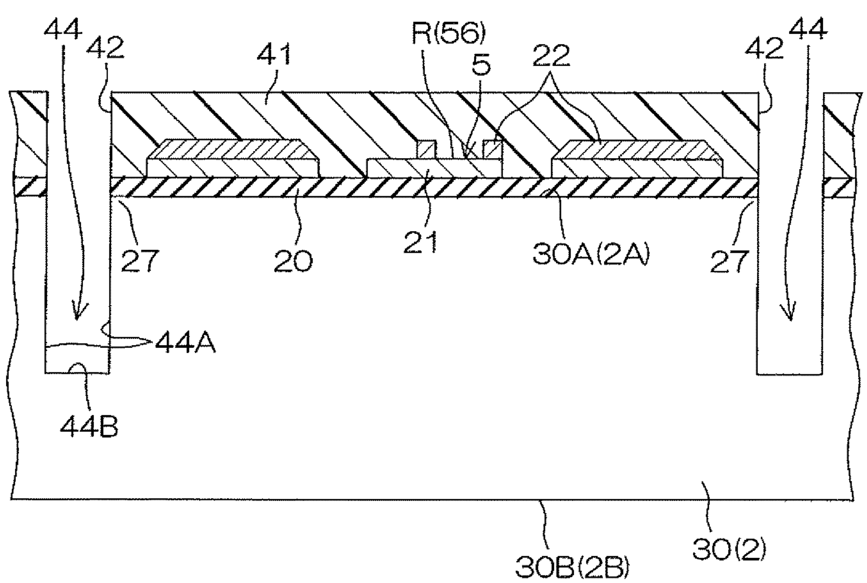
FIG. 25B is an illustrative sectional view of a step subsequent to that of FIG. 25A.

Then, as shown in FIG. 25B, a resist pattern 41 is formed across the entirety of the top surface 30A of the wafer 30 so as to cover all of the elements 5 on the insulating film 20. An opening 42 is formed in the resist pattern 41.

Figure 26:
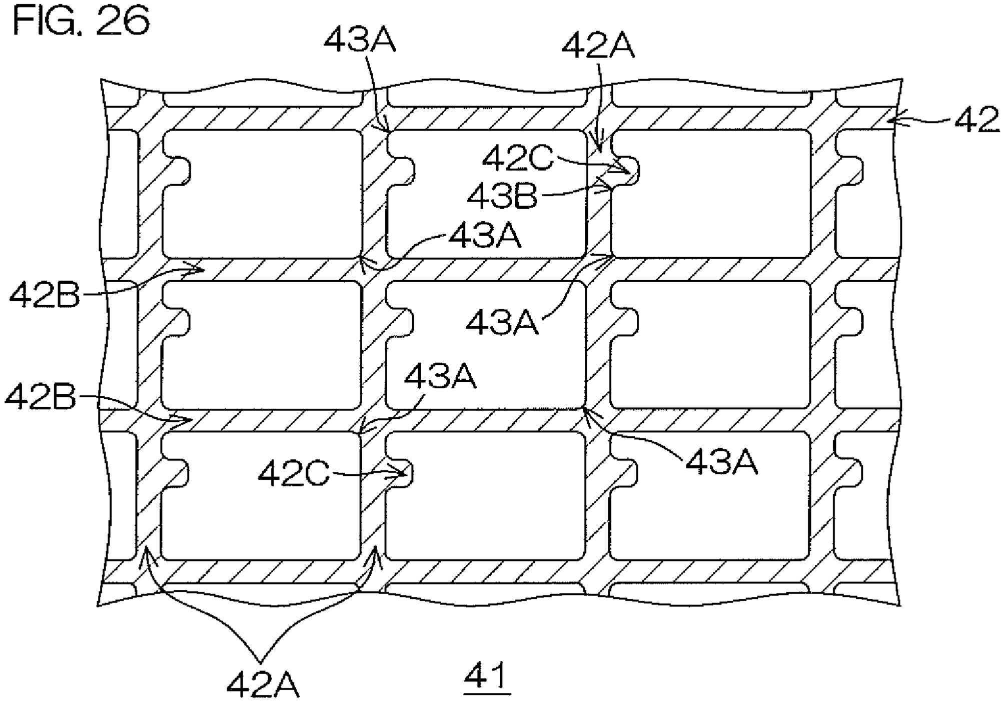
FIG. 26 is a schematic plan view of a portion of a resist pattern used for forming a groove in the step of FIG. 25B.

FIG. 26 is a schematic plan view of a portion of the resist pattern used for forming a groove in the step of FIG. 25B. The opening 42 of the resist pattern 41 coincides with regions (hatched portions in FIG. 26) between outlines of mutually adjacent electronic devices 1 in a plan view in a case where a plurality of electronic devices 1 are disposed in an array (that is also a lattice). The overall shape of the opening 42 is thus a lattice having a plurality of mutually orthogonal rectilinear portions 42A and 42B. Also, in either of the rectilinear portions 42A and 42B (the rectilinear portions 42A in the present example), projecting portions 42C, projecting orthogonally from the rectilinear portions 42A, are provided in continuous form in correspondence to the recesses 10 of the electronic devices 1 (see FIG. 16A).

Here, with each electronic device 1, the corner portions 11 and 12 have round shapes (see FIG. 16A). Accordingly, the mutually orthogonal rectilinear portions 42A and 42B in the opening 42 are curvingly connected to each other. The mutually orthogonal rectilinear portions 42A and projecting portions 42C are also curvingly connected to each other. Intersection portions 43A of the rectilinear portions 42A and 42B and intersection portions 43B of the rectilinear portions 42A and projecting portions 42C thus have round shapes with rounded corners. Also, in each projecting portion 42C, corners besides the intersection portion 43B are also rounded.

Referring to FIG. 25B, the insulating film 20 and the wafer 30 are respectively removed selectively by plasma etching using the resist pattern 41 as a mask. A groove 44, penetrating through the insulating film 20 and reaching the middle of the thickness of the wafer 30, is thereby formed at positions coinciding with the opening 42 of the resist pattern 41 in a plan view. The groove 44 has mutually facing side surfaces 44A and a bottom surface 44B joining the lower ends (ends at the rear surface 30B side of the wafer 30) of the facing side surfaces 44A. The depth of the groove 44 on the basis of the top surface 30A of the wafer 30 is approximately 100 μm and the width of the groove 44 (interval between facing side surfaces 44A) is approximately 20 μm.

Figure 27A:
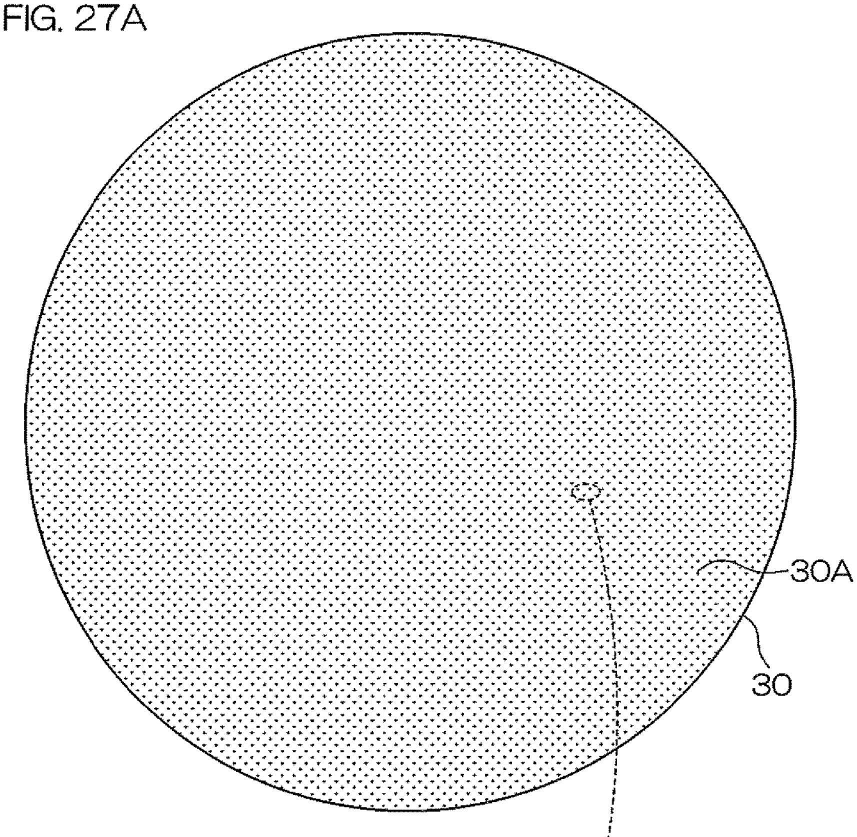
FIG. 27A is a schematic plan view of a wafer after the groove has been formed in the step of FIG. 25B.
Figure 27B:
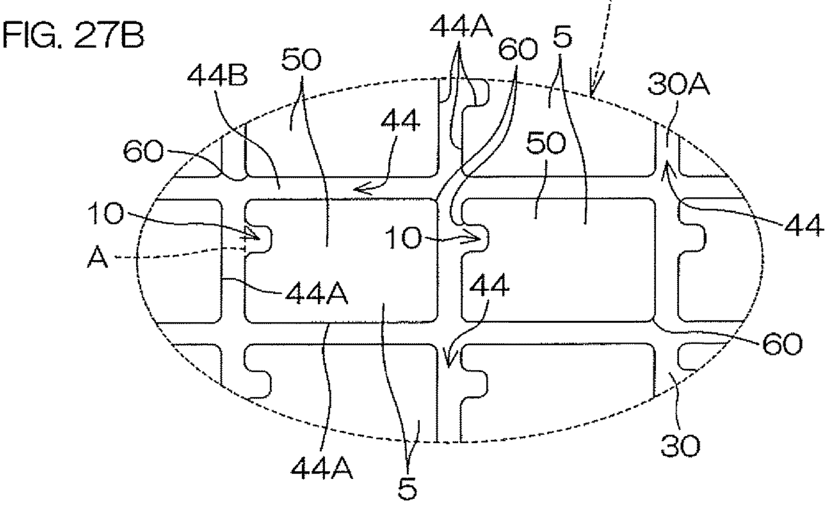
FIG. 27B is an enlarged view of a portion in FIG. 27A.

FIG. 27A is a schematic plan view of the wafer after the groove has been formed in the step of FIG. 25B, and FIG. 27B is an enlarged view of a portion in FIG. 27A. Referring to FIG. 27B, the overall shape of the groove 44 is a lattice that coincides with the opening 42 (see FIG. 26) of the resist pattern 41 in a plan view. At the top surface 30A of the wafer 30, rectangular frame portions of the groove 44 surround the regions in which the respective elements 5 are formed. In the wafer 30, each portion in which the element 5 is formed is a semi-finished product 50 of the electronic device 1. At the top surface 30A of the wafer 30, one semi-finished product 50 is positioned in each region surrounded by the groove 44, and these semi-finished products 50 are arrayed and disposed in an array.

Also, at each portion corresponding to the projecting portion 42C (see FIG. 26) in the opening 42 of the resist pattern 41, the groove 44 is formed so as to delve into a middle portion of a side A of the semi-finished product 50, and the recess 10 (see FIG. 16A) is thereby formed in the semi-finished product 50. Corner portions 60 (to become the corner portions 11 and 12 of the electronic device 1) of the semi-finished product 50 in a plan view are shaped to round shapes in accordance with the intersection portions 43A and 43B (see FIG. 26) with round shapes in the opening 42 of the resist pattern 41. Although these round shapes are formed by using a plasma etch, a silicon etch (an ordinary etch using a chemical solution) may be used in place of the plasma etch.

By thus etching the wafer 30, the outer shape of the semi-finished product 50 (in other words, the electronic device 1 in its final form) can be set to any shape and can be set, as in the present preferred embodiment, to an asymmetrical rectangle with corner portions 60 (corner portions 11 and 12) with round shapes and having the recess 10 at the side A (see also FIG. 16A). In this case, the electronic device 1, with which the chip direction can be recognized, can be manufactured without a marking step (a step of marking a mark, etc., indicating the chip direction by a laser, etc.).

Figure 25C:
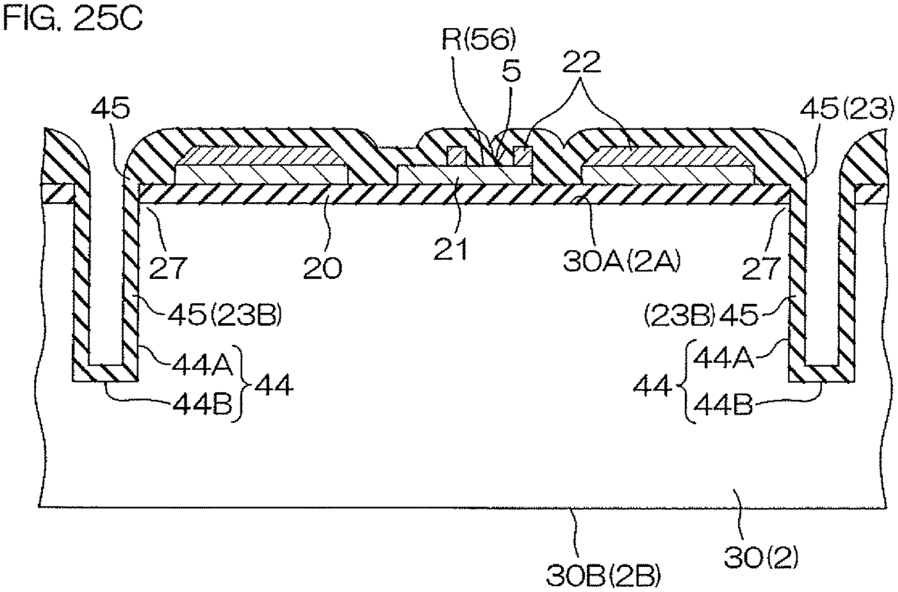
FIG. 25C is an illustrative sectional view of a step subsequent to that of FIG. 25B.

After the groove 44 has been formed, the resist pattern 41 is removed and the protective film (SiN) film 45 made of SiN is formed on the top surfaces of the elements 5 by CVD (chemical vapor deposition) method as shown in FIG. 25C. The SiN film 45 has a thickness of approximately 3000 Å. The SiN film 45 is formed so as to cover not only the entireties of the top surfaces of the elements 5 but also the inner surfaces (side surfaces 44A and bottom surface 44B) of the groove 44. The SiN film 45 is a thin film that is formed to a substantially fixed thickness on the side surfaces 44A and bottom surface 44B and therefore does not fill the groove 44 completely. Also, in the groove 44, the SiN film 45 suffices to be formed on the entireties of the side surfaces 44A and does not have to be formed on the bottom surface 44B.

Figure 25D:
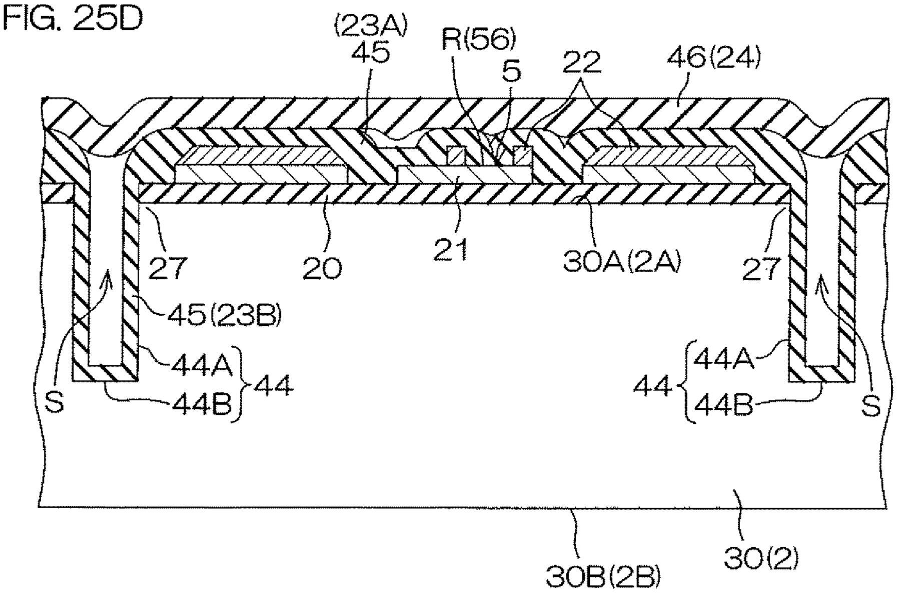
FIG. 25D is an illustrative sectional view of a step subsequent to that of FIG. 25C.
Figure 28A:
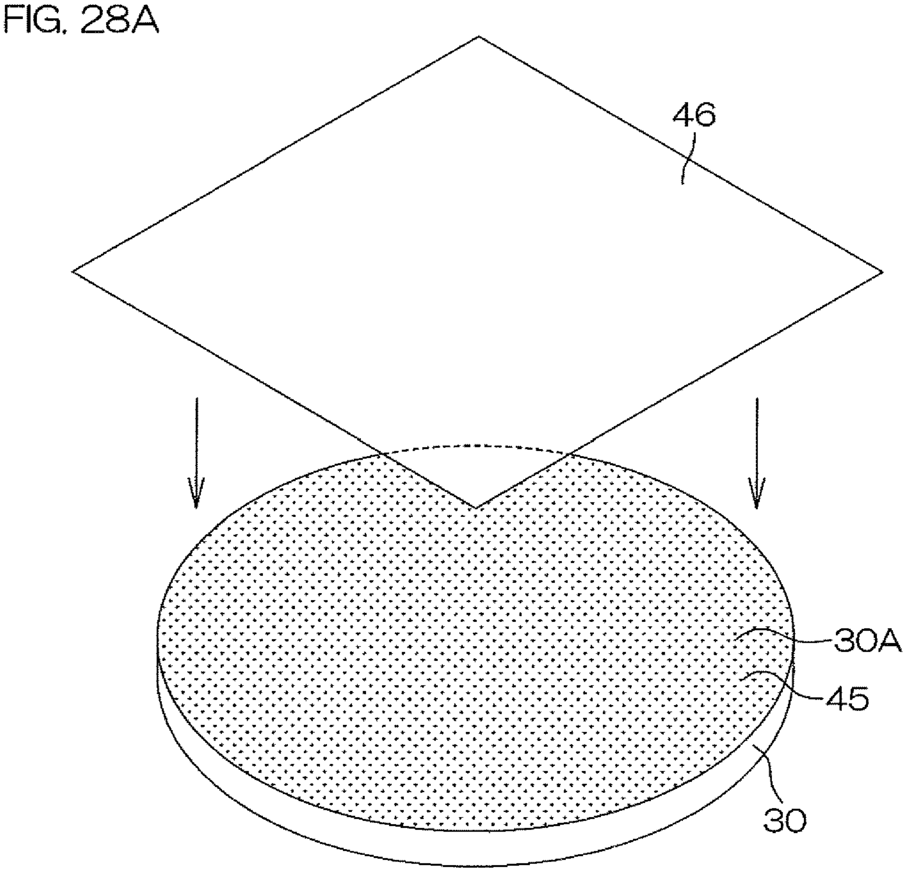
FIG. 28A is an illustrative perspective view of states of adhering a polyimide sheet onto the wafer in the step of FIG. 25D.
Figure 28B:
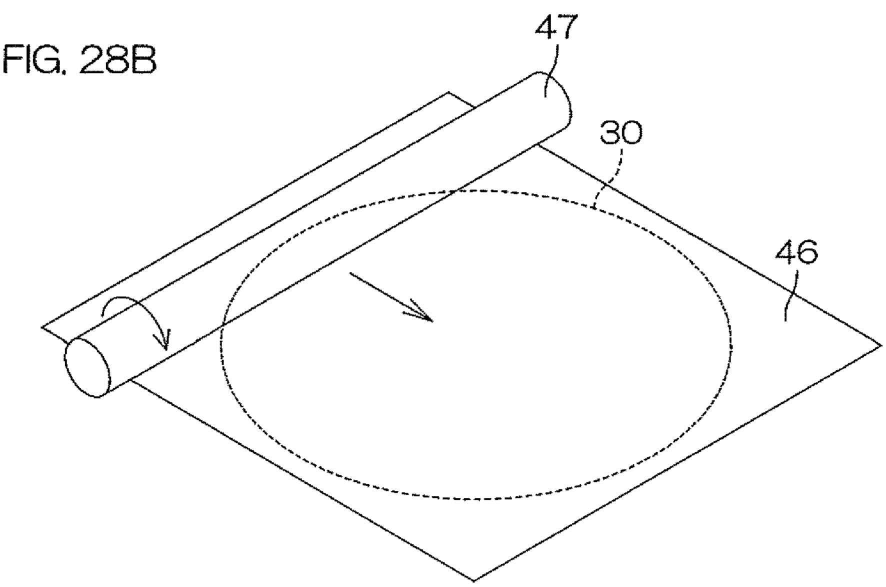
FIG. 28B is an illustrative perspective view of states of adhering a polyimide sheet onto the wafer in the step of FIG. 25D.

Thereafter, a photosensitive resin sheet 46, made of polyimide, is adhered onto the wafer 30 from above the SiN film 45 at portions besides the groove 44 as shown in FIG. 25D. FIGS. 28A and 28B are illustrative perspective views of states of adhering the polyimide sheet onto the wafer in the step of FIG. 25D. Specifically, after covering the wafer 30 (to be accurate, the SiN film 45 on the wafer 30) with the polyimide sheet 46 from the top surface 30A side as shown in FIG. 28A, the sheet 46 is pressed against the wafer 30 by a rotating roller 47 as shown in FIG. 28B.

When the sheet 46 has been adhered on the entirety of the top surface of the SiN film 45 at portions besides the groove 44 as shown in FIG. 25D, although portions of the sheet 46 are slightly indented toward the groove 44 side, only portions at the element 5 side (top surface 30A side) of the SiN film 45 on the side surfaces 44A of the groove 44 are covered and the sheet 46 does not reach the bottom surface 44B of the groove 44. A space S of substantially the same size as the groove 44 is thus formed inside the groove 44 between the sheet 46 and the bottom surface 44B of the groove 44. The thickness of the sheet 46 in this state is 10 μm to 30 μm.

Figure 25E:
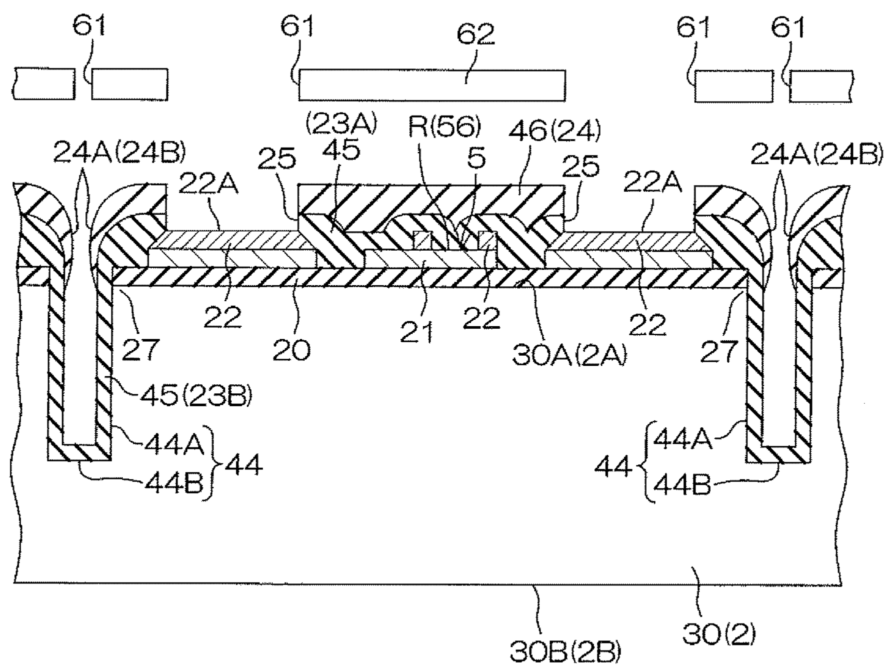
FIG. 25E is an illustrative sectional view of a step subsequent to that of FIG. 25D.

Thereafter, a heat treatment is applied to the sheet 46. The thickness of the sheet 46 is thereby thermally contracted to approximately 5 μm. Thereafter, as shown in FIG. 25E, the sheet 46 is patterned and portions of the sheet 46 coinciding with the groove 44 and the respective pad regions 22A of the wiring films 22 in a plan view are selectively removed. Specifically, a mask 62, having formed therein openings 61 of a pattern matching (coinciding with) the groove 44 and the respective pad regions 22A in a plan view, is used and the sheet 46 is exposed and developed with this pattern. The sheet 46 is thereby separated at portions above the groove 44 and the respective pad regions 22A and separated edge portions of the sheet 46 droop slightly toward the groove 44 to overlap with the SiN film 45 on the side surfaces 44A of the groove 44 so that the overhanging portion 24A (having the side surfaces 24B of round shapes) is formed naturally at the edge portions.

By then performing etching using the sheet 46 that has been separated in the above manner as a mask, the portions of the SiN film 45 coinciding with the respective pad regions 22A in a plan view are removed. The openings 25 are thereby formed. The SiN film 45 is thereby formed so as to expose the respective pad regions 22A. Ni/Pd/Au laminated films, arranged by laminating Ni, Pd, and Au, are then formed by electroless plating on the pad regions 22A in the respective openings 25. In this process, the Ni/Pd/Au laminated films are formed so as to protrude onto the top surface of the sheet 46 from the openings 25. The Ni/Pd/Au laminated films inside the respective openings 25 thus become the first connection electrode 3 and the second connection electrode 4 shown in FIG. 25F.

Then after performing a conduction test across the first connection electrode 3 and the second connection electrode 4, the wafer 30 is ground from the rear surface 30B. Here, the entirety of the portions of the wafer 30 forming the side surfaces 44A of the groove 44 is covered by the SiN film 45 so that formation of microcracks, etc., in those portions during the grinding of the wafer 30 is prevented, and even if a microcrack forms, the microcrack can be embedded by the SiN film 45 to suppress expansion of the microcrack.

When the wafer 30 has been thinned by grinding to the bottom surface 44B of the groove 44 (to be accurate, the SiN film 45 on the bottom surface 44B), portions joining mutually adjacent semi-finished products 50 are no longer present and the wafer 30 is thus divided with the groove 44 as boundaries and the semi-finished products 50 are separated individually as electronic devices 1. The electronic devices 1 (see FIG. 24) are thereby completed. With each electronic device 1, each portion that formed a side surface 44A of the groove 44 becomes one of the side surfaces 2C to 2F of the substrate 2. The SiN film 45 becomes the protective film 23. Also, the separated sheet 46 becomes the resin film 24.

Even if the electronic devices 1 are small in chip size, the electronic devices 1 can be separated into individual chips by thus forming the groove 44 in advance and then grinding the wafer 30 from the rear surface 30B. Therefore in comparison to the conventional case where the wafer 30 is diced using a dicing saw to separate the electronic devices 1 into individual chips, the dicing step can be eliminated to promote cost reduction and time savings and achieve improvement of yield.

With the above, when in manufacturing the electronic devices 1, the plurality of elements 5 are formed on the top surface 30A (element forming surface 2A) of the wafer 30 and the groove 44 for dividing the electronic devices 1 one by one is formed at the boundaries of the elements 5 in the top surface 30A, the side surfaces 44A of the groove 44 become the side surfaces 2C to 2F of the respective electronic devices 1 after the division. The SiN film 45 (protective film 23) is formed on the side surfaces 44A of the groove 44 and the top surface 30A of the wafer 30 before division into the electronic devices 1. Here, as shown in FIG. 25C, the protective film (CVD protective film) 23 of substantially the same thickness of CVD is formed continuously by the CVD method on the upper surfaces of the resistor bodies R and the inner surfaces (side surfaces 44A and bottom surface 44B) of the groove 44. In this case, the CVD protective film 23 (SiN film 45) is formed under a reduced pressure environment in the process of CVD, and therefore the CVD protective film 23 can be deposited as the side surface covering portion 23B on the entireties of the side surfaces 2C to 2F of the substrate 2 (side surfaces 44A of the groove 44). The protective film 23 can thus be formed uniformly on the side surfaces 44A of the groove 44 during manufacture of the electronic device 1.

Then after forming the protective film 23, the resin film 24 is formed by the sheet 46 covering the SiN film 45 (the portion of the protective film 23 to be the element covering portion 23A) on the element forming surface 2A as shown in FIG. 25D. With the SiN film 45 on the side surfaces 44A of the groove 44 (the portion to become the side surface covering portion 23B of the protective film 23), at least the side (the bottom surface 44B side of the groove 44) opposite to the element forming surface 2A is left exposed from the resin film 24 so that the groove 44 can be prevented from being filled with the resin film 24 from the bottom surface 44B side during the forming of the resin film 24 (during the manufacture of the electronic device 1).

Figure 25F:
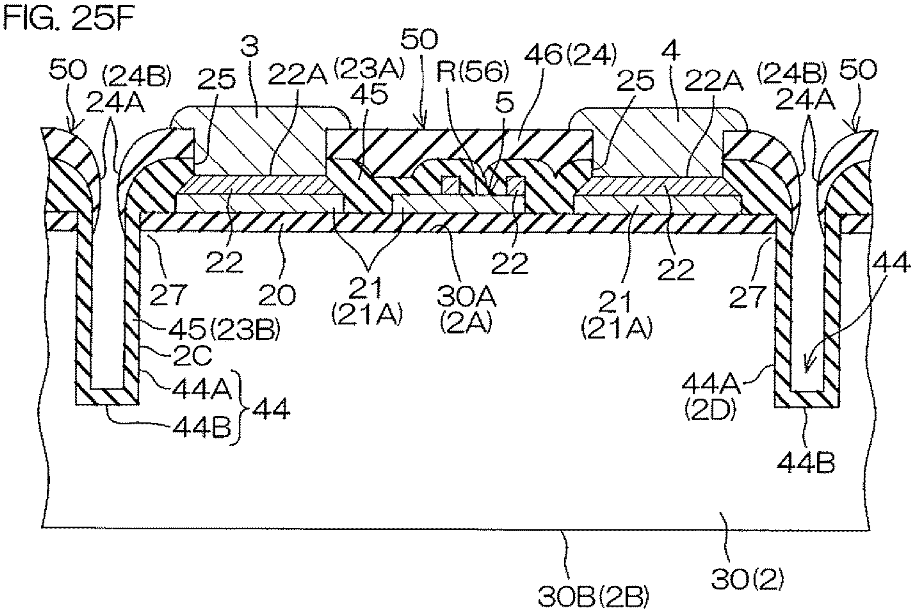
FIG. 25F is an illustrative sectional view of a step subsequent to that of FIG. 25E.

Specifically, the resin film 24 is formed by adhering the sheet 46 from above the protective film 23. In this case, the groove 44 will not be filled with the sheet 46 from the bottom surface 44B side. Therefore by thinning the substrate 2 until the bottom surface 44B of the groove 44 is reached as shown in FIG. 25F, the substrate 2 can be divided into the individual electronic devices 1 at the groove 44. Although a preferred embodiment of the first reference example has been described above, the first reference example may be implemented in yet other modes.

For example, in dividing the wafer 30 into the individual electronic devices 1, the wafer 30 is ground to the bottom surface 44B of the groove 44 from the rear surface 30B side (see FIG. 25F). Instead, the wafer 30 may be divided into the individual electronic devices 1 by removing the portions of the SiN film 45 covering the bottom surface 44B and portions of the wafer 30 coinciding with the groove 44 in a plan view by selectively etching from the rear surface 30B.

Figure 29A:
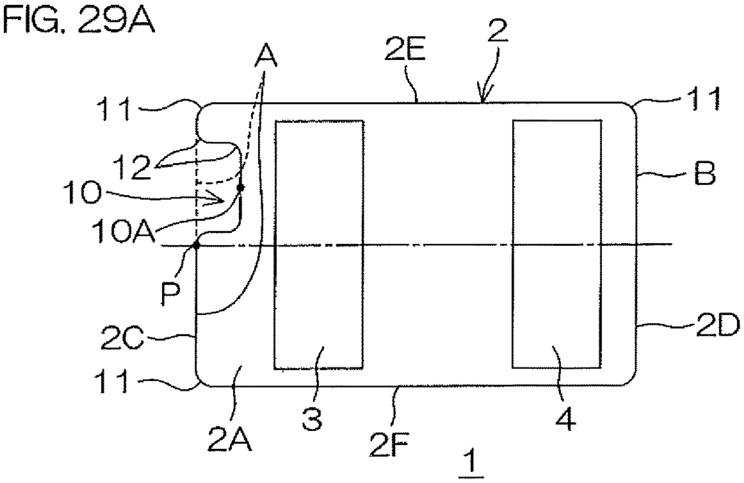
FIG. 29A is a plan view of an electronic device.
Figure 29B:
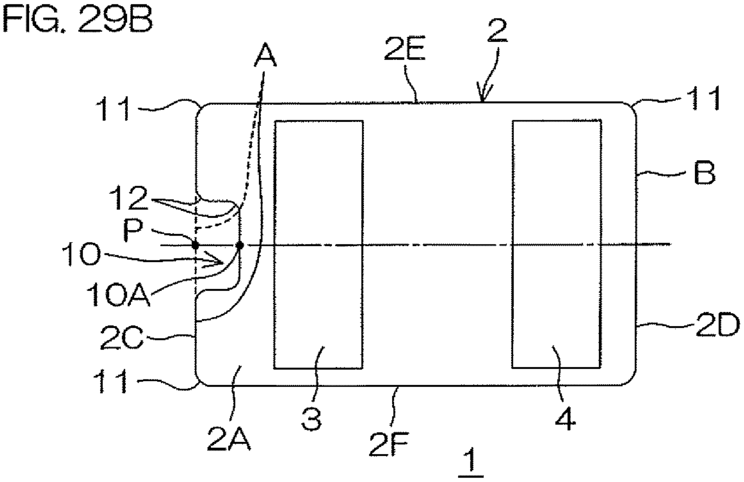
FIG. 29B is a plan view of an electronic device according to a first modification example.
Figure 29C:
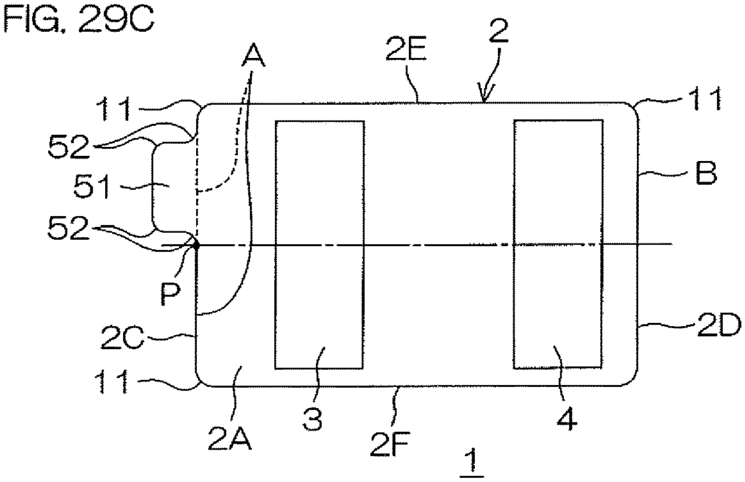
FIG. 29C is a plan view of an electronic device according to a second modification example.

FIG. 29A is a plan view of an electronic device, FIG. 29B is a plan view of an electronic device according to a first modification example, and FIG. 29C is a plan view of an electronic device according to a second modification example. In each of FIGS. 29A to 29C, illustration of the element 5, the protective film 23, and the resin film 24 is omitted for the sake of description. Also, as shown in FIG. 29A, the recess 10 is provided at a position of the side A of the electronic device 1 that is shifted from the midpoint P of the side A. When the recess 10 is shifted from the midpoint P, the center 10A of the recess 10 and the midpoint P do not coincide in the direction of extension of the side A. With this arrangement, not only the recess 10 side in the direction joining the side A and the side B at the opposite side of the side A (the long direction) but the recess 10 side in the direction of extension of the side A (short direction) can also be made the chip direction. For example, the electronic device 1 is arranged to be mounted correctly on the circuit substrate 9 when, in a plan view as viewed from the element forming surface 2A side, the short direction of the electronic device 1 and the front/rear direction (up/down direction in FIG. 29) are matched, the long direction of the electronic device 1 and the right/left direction are matched, and the recess 10 is positioned so as to be biased to the front left (upper left in FIG. 29) in this state. That the orientation of the electronic device 1 must be set so that the recess 10 is positioned so as to be biased to the front left in a plan view (to the front right when the electronic device 1 is viewed from the rear surface 2B of the substrate 2) in the mounting process can thus be ascertained from the outer appearance of the electronic device 1. That is, that the orientation of the electronic device 1 must be matched in both the long direction and the short direction can be ascertained from the outer appearance of the electronic device 1.

Obviously, the recess 10 may be provided at a position of the side A that coincides with the midpoint P (position at which the center 10A of the recess 10 coincides with the midpoint P in the short direction) as shown in FIG. 29B. Also, in place of the recess 10, an outwardly projecting projection 51 may be provided as shown in FIG. 29C. The projection 51 may have a rectangular shape, a U-like shape (a shape that bulges in the shape of the letter U), or a triangular shape in a plan view. Obviously at the side surface 2C, corner portions (the four corner portions in a plan view including those at the tip side and root side of the projection 51) 52 of the projection 51 have chamfered round shapes like those of the other corner portions 11. Here, as in the case of the recess 10, the side surface covering portion 23B (see FIG. 16A) covers the entirety of the side surface 2C, including the portion at which the projection 51 is formed. Also, the depth of the recess 10 and the height (projection amount) of the projection 51 are preferably not more than 20 μm (not more than approximately one-fifth the width of the first connecting electrode 3 and the second connection electrode 4). Also the chamfer amount of each of the corner portions 11, corner portions 12, and corner portions 52, is preferably such that the distance at one side is not more than approximately 20 μm.

Figure 30A:
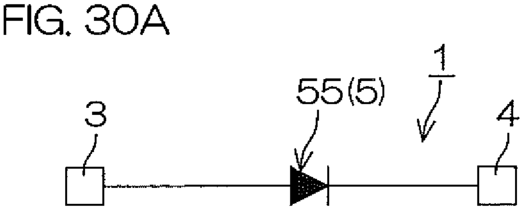
FIG. 30A is a diagram of the circuit arrangement of an element according to another preferred embodiment of the electronic device.
Figure 30B:
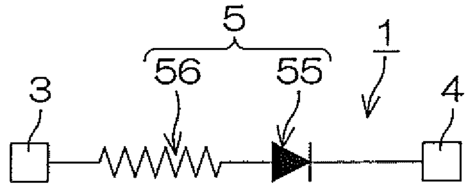
FIG. 30B is a diagram of the circuit arrangement of an element according to yet another preferred embodiment of the electronic device.

FIG. 30A is a diagram of the circuit arrangement of an element according to another preferred embodiment of the electronic device, and FIG. 30B is a diagram of the circuit arrangement of an element according to yet another preferred embodiment of the electronic device. Although with the preferred embodiment described above, the electronic device 1 is a chip resistor and the element 5 between the first connection electrode 3 and the second connection electrode 4 is thus the resistor 56, it may instead be a diode 55, shown in FIG. 30A, or an element with which the diode 55 and the resistor 56 are connected in series as shown in FIG. 30B. By having the diode 55, the electronic device 1 becomes a chip diode, a polarity is present in the first connection electrode 3 and the second connection electrode 4, and the chip direction is a direction that is in accordance with the polarity. The polarity of the first connection electrode 3 and the second connection electrode 4 can thereby be indicated by the chip direction and the polarity can thus be ascertained from the outer appearance of the electronic device 1. That is, which side in the chip direction (that is, which of the first connection electrode 3 and the second connection electrode 4) is the positive or negative pole side can be ascertained. The electronic device 1 can thus be mounted correctly on the circuit substrate 9 (see FIG. 16B) so that the side at which the recess 10 or the projection 51 (see FIG. 29) is provided is set at the corresponding pole side.

Obviously, the first reference example may be applied to an element device, having any of various elements, such as a chip capacitor, which uses a capacitor in place of the diode 55 in the element 5, a chip inductor, etc., formed on the chip-sized substrate 2. <Invention according to a second reference example> (1) Features of the invention according to the second reference example. For example, the features of the invention according to the second reference example are the following B1 to B13.

(B1) A chip resistor including a substrate, a first connection electrode and a second connection electrode formed on the substrate, and a resistor network formed on the substrate and having one end side connected to the first connection electrode and another end side connected to the second connection electrode, and where the resistor network includes a plurality of resistor body films arrayed in a matrix on the substrate and having an equal resistance value, connection wiring films electrically connecting the resistor body films, a plurality of types of resistance units each arranged from one or a plurality of the connection films being connected electrically by the connection wiring films, network connection wiring films connecting the plurality of types of resistance units in predetermined modes, and a plurality of fuse films respectively provided in correspondence to each individual resistance unit, the plurality of fuse films electrically incorporating a resistance unit into the resistor network or being capable of being fused to electrically separate a resistance unit from the resistor network, and at least a portion of the wiring films has a laminated wiring structure including a first wiring layer laminated on the resistor body film and a second wiring layer laminated on the first wiring film.

With this arrangement, the resistor network can be formed on the substrate and a plurality of chip resistors of high quality can be manufactured in a single manufacturing process. Also, miniaturization of the resistor network can be achieved and the chip resistor can be made more compact than conventionally because the resistor network is formed. Further, the resistor network includes the plurality of resistor body films that are arrayed in a matrix and have an equal resistance value, and a change of the required resistance value can be accommodated readily by changing the mode of connection of the plurality of resistor body films.

Further, a change of the required resistance can also be accommodated by changing the mode of connection of the plurality of types of resistance units. Yet further, any fuse film among the plurality of fuse films may be fused to electrically incorporate a resistance unit into the resistor network or electrically separate the resistance unit from the resistor network to enable the resistance value of the resistor network to be adjusted and enable the resistance value of the chip resistor to match any of a plurality of types of required resistance values without changing the basic design. Chip resistors of the same basic design that are chip resistors with which the resistance values are set to the required resistance values can thereby be provided.

In addition, at least a portion of the wiring films included in the resistor network, for example, the portion of the wiring films in a region in which a plurality of resistor body films are connected in parallel in comb-like manner has the laminated wiring structure that includes the first wiring layer and the second wiring layer, laminated on the first wiring layer. The wiring films in this region are thus made low in resistance value by the laminated structure and the resistance values of the wiring films do not influence the resistance values of the resistor bodies. Consequently, the overall resistance value and the resistance ratios, etc., of the plurality of types of resistance units do not change and a resistor network of high precision can be realized.

(B2) The chip resistor according to B1, where the resistor body films include a resistor body film line extending on the substrate and the wiring films laminated on the resistor body film line while being spaced apart by predetermined intervals in the line direction, and a single resistor body film is arranged from the resistor body film line of the fixed interval portion on which the wiring film is not laminated.

With this arrangement, the plurality of resistor body films, arrayed in a matrix and having an equal resistance value, respectively include the resistor body film line and the wiring films laminated on the resistor body film line while being spaced apart by the fixed interval in the line direction. The resistor body film region on which the wiring film is not laminated thus functions as a single resistor body film. The resistor body film regions can be made to have the same shape with the same size by making the intervals of the laminated wiring films fixed intervals. By using the characteristic that the resistance values of the resistor bodies (resistor body films) of the same shape with the same size formed on the substrate are substantially equal, a plurality of resistor body films can be formed easily using a layout pattern in common.

(B3) The chip resistor according to B2, where the wiring films partitioning the resistor body films, the connection wiring films included in the resistance units, the network connection wiring films, and the fuse films include metal films of the same material formed on the same layer.

With this arrangement, the wiring films partitioning the resistor body films, the connection wiring films included in the resistance units, the connection wiring films included in the network connection means, and the fuse films can be formed easily at once in comparatively few processes as a plurality of types of metal films (wiring films) by forming a metal film on the same layer and removing unnecessary portions of the metal film by etching, etc.

(B4) The chip resistor according to any of B1 to B3, where the resistance units include a resistance unit with which a plurality of the resistor body films are connected in series.

With this arrangement, a resistance unit is formed by connecting a plurality of the resistor body films in series and therefore a resistance unit with a large resistance value can be arranged.

(B5) The chip resistor according to any one of B1 to B3, where the resistance units include a resistance unit with which a plurality of the resistor body films are connected in parallel. With this arrangement, a resistance unit is formed by connecting a plurality of the resistor body films in parallel and therefore resistance units with small resistance values and low error among resistance values can be arranged.

(B6) The chip resistor according to B5, where the parallel connection of resistor body films include a comb-shaped portion, with which the wiring films take on a comb-like form, and the comb-shaped portion has the laminated wiring structure.

With this arrangement, although at the comb-shaped portion, the connection wiring films related to the parallel connection of plurality of resistor body films are narrow in width and the resistance values of the wiring films tend to increase, the wiring films have the laminated wiring structure at the comb-shaped portion and the resistance values of the wiring films thus do not have adverse influences on the resistor network.

(B7) The chip resistor according to any one of B1 to B6, where, with the plurality of types of resistance units, the numbers of resistor body films connected are set and the resistance values form a geometric progression with respect to each other.

With this arrangement, the resistance values of the resistance units form a geometric progression with respect to each other and the resistance values of the resistance units can thus be set to several types from a relatively small resistance value to a relatively large resistance value. Therefore, even when the required resistance values required of the chip resistors are wide in range, the connection modes of the resistance units enable accommodation with the same design contents.

(B8) The chip resistor according to any one of B1 to B7, where the network connection wiring films include connection wiring films connecting the plurality of types of resistance units in series.

With this arrangement, a chip resistor with a large resistance value can be arranged by connecting the resistance units in series.

(B9) The chip resistor according to any one of B1 to B8, where the network connection wiring films include connection wiring films connecting the plurality of types of resistance units in parallel. With this arrangement, a chip resistor can be provided with which any of various required resistance values can be accommodated by finely adjusting the resistance value of the chip resistor by connecting the resistance units in parallel.

(B10) The chip resistor according to B9, where the network connection wiring films connecting the plurality of types of resistance units in parallel include a comb-shaped portion and the comb-shaped portion has the laminated wiring structure.

With this arrangement, in cases where the resistance units are connected in parallel, several resistor bodies may be connected in parallel in comb-like form by the connection wiring films and the resistance values of the wiring films may be non-negligible because the resistance value of the resistor bodies as a whole is small. The wiring films are thus made to have the laminated wiring structure at this portion to decrease the resistance values of the wiring films and thereby provide an arrangement where the resistance values of the wiring films do not have influences, etc., on the resistor network as whole.

(B11) An electronic device including a substrate, a first connection electrode and a second connection electrode formed on the substrate, and a resistor network formed on the substrate, the resistor network having a plurality of resistor bodies connected each other by a wiring film which has one end side connected to the first connection electrode and another end side connected to the second connection electrode, and a plurality of fuse films electrically incorporating the resistor bodies into the resistor network or being capable of being fused to electrically separate the resistor bodies from the resistor network, and where at least a portion of the wiring films includes a first wiring layer laminated on the resistor body film and a second wiring layer laminated on the first wiring film, and the fuse films have a laminated wiring structure made of only the first wiring film or only the second wiring film.

(B12) The electronic device according to B11, where the resistor bodies are made of TiON or TiSiON.

(B13) The electronic device according to B11 or B12, where the resistor bodies and the wiring films are patterned collectively.

With the arrangements of B11 to B13, by fusing any fuse film among the plurality of fuse films, a resistor body can be electrically incorporated in the resistor network or electrically separated from the resistor network to enable the resistance value of the resistor network to be adjusted and made to match any of a plurality of types of required resistance values without changing the basic design. Electronic devices, having resistor networks of the same basic design with the resistance values being set to the required resistance values, can thereby be provided.

In addition, at least a portion of the wiring films included in the resistor network, for example, the portion of the wiring films in a region in which a plurality of resistor bodies are connected in parallel in comb-like manner has the laminated wiring structure that includes the first wiring layer and the second wiring layer, laminated on the first wiring layer. The wiring films in this region are thus made low in resistance value by the laminated structure and the resistance values of the wiring films do not influence the resistance values of the resistor bodies. Consequently, a resistor network of high precision can be realized. (2) Preferred embodiments of the invention related to the second reference example. Preferred embodiments of the second reference example shall now be described in detail with reference to the attached drawings. The symbols in FIG. 31 to FIG. 46 are effective only for these drawings and, even if used in other preferred embodiments, do not indicate the same elements as the symbols in the other preferred embodiments.

Figure 31A:
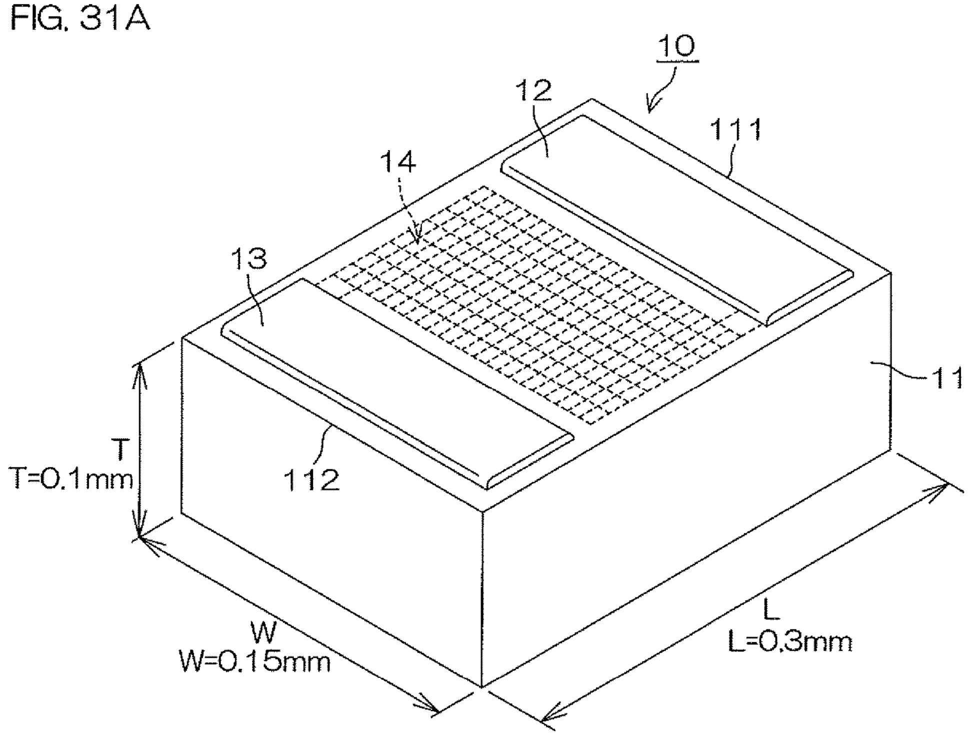
FIG. 31A is an illustrative perspective view of the external arrangement of a chip resistor 10 according to a preferred embodiment of a second reference example.
Figure 31B:
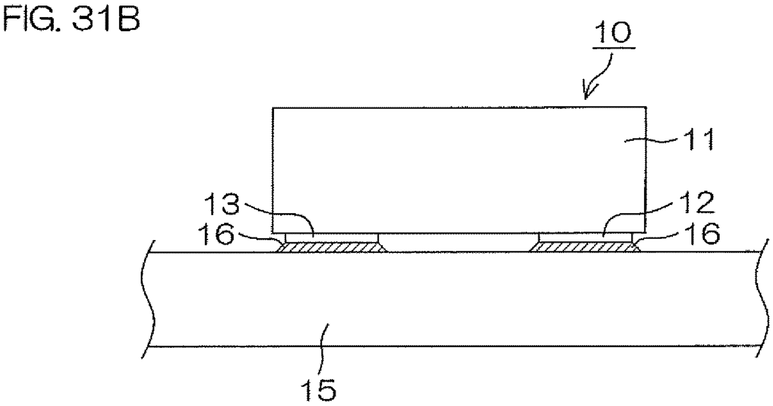
FIG. 31B is a side view of a state where the chip resistor 10 is mounted on a substrate.

FIG. 31A is an illustrative perspective view of the external arrangement of a chip resistor 10 according to a preferred embodiment of a second reference example and FIG. 31B is a side view of a state where the chip resistor 10 is mounted on a substrate. With reference to FIG. 31A, the chip resistor 10 according to the preferred embodiment of the second reference example includes a first connection electrode 12, a second connection electrode 13, and a resistor network 14 that are formed on the substrate 11 as the substrate. The substrate 11 has a rectangular parallelepiped shape with a substantially rectangular shape in a plan view and is a minute chip with, for example, the length in the long side direction being L=0.3 mm, the width in the short side direction being W=0.15 mm, and the thickness of the substrate 11 being T=0.1 mm, approximately.

Figure 46:
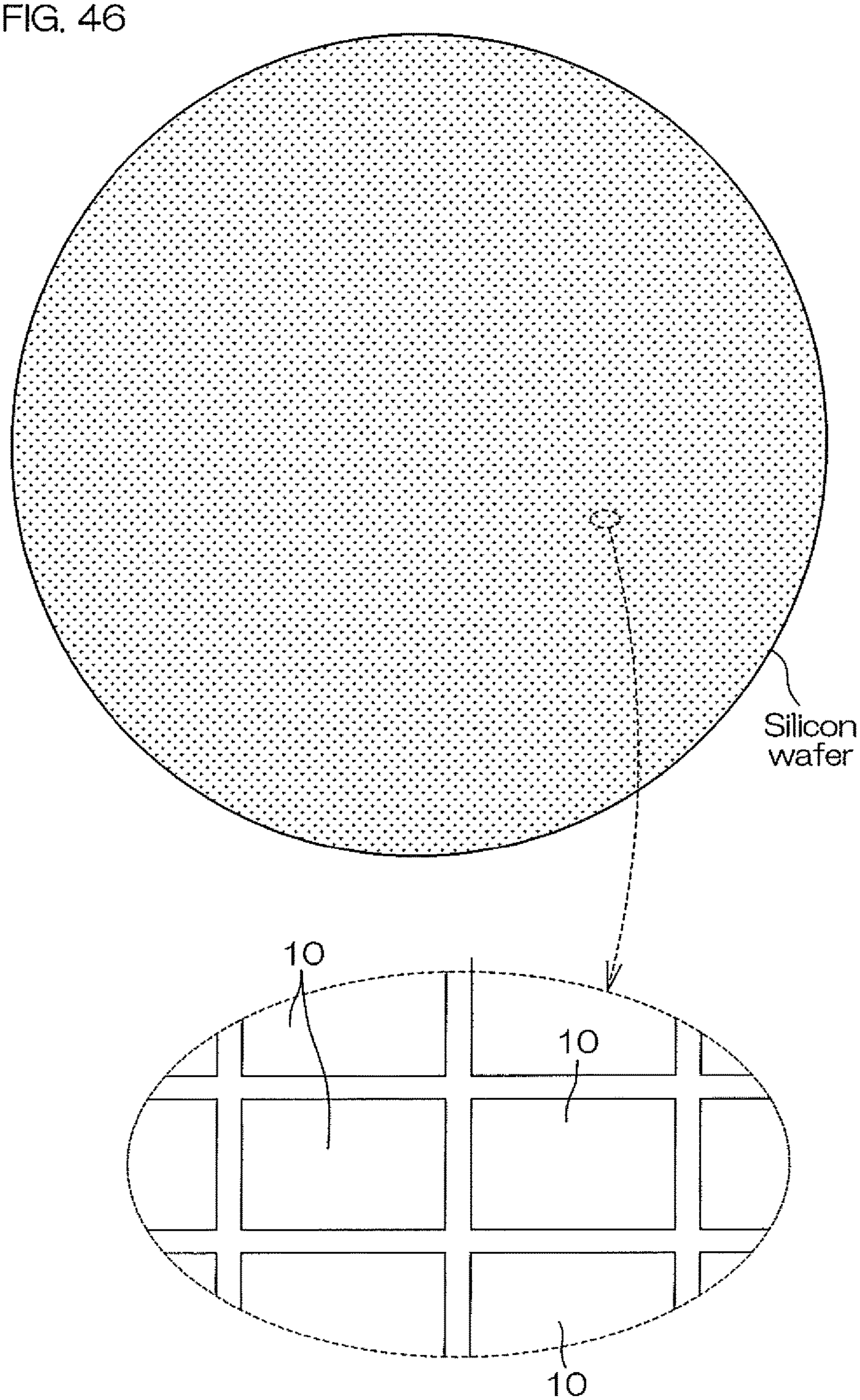
FIG. 46 is an illustrative view for describing the cutting out of a chip resistor from a wafer.

The chip resistor 10 is obtained by forming several chip resistors 10 in a lattice on a wafer as shown in FIG. 46 and cutting the wafer to separate it into individual chip resistors 10. On the substrate 11, the first connection electrode 12 is a rectangular electrode that is disposed along one short side 111 of the substrate 11 and is long in the short side 111 direction. The second connection electrode 13 is a rectangular electrode that is disposed on the substrate 11 along the other short side 112 and is long in the short side 112 direction. The resistor network 14 is provided in a central region on the substrate 11 sandwiched by the first connection electrode 12 and the second connection electrode 13. One end side of the resistor network 14 is electrically connected to the first connection electrode 12 and another end side of the resistor network 14 is electrically connected to the second connection electrode 13. As shall be described later, the first connection electrode 12, the second connection electrode 13, and the resistor network 14 are provided on the substrate 11 by using, for example, a semiconductor manufacturing process. A semiconductor substrate (semiconductor wafer), such as a silicon substrate (silicon wafer), etc., may thus be used as the substrate 11. The substrate 11 may also be another type of substrate, such as an insulating substrate, etc.

The first connection electrode 12 and the second connection electrode 13 respectively function as external connection electrodes. In a state where the chip resistor 10 is mounted on a circuit substrate 15, the first connection electrode 12 and the second connection electrode 13 are respectively connected electrically and mechanically by solder to circuits (not shown) of the circuit substrate 15 as shown in FIG. 31B. The first connection electrode 12 and the second connection electrode 13 that function as external connection electrodes are preferably formed of gold (Au) or has gold plating applied on the surfaces thereof to improve solder wettability and improve reliability.

Figure 32:
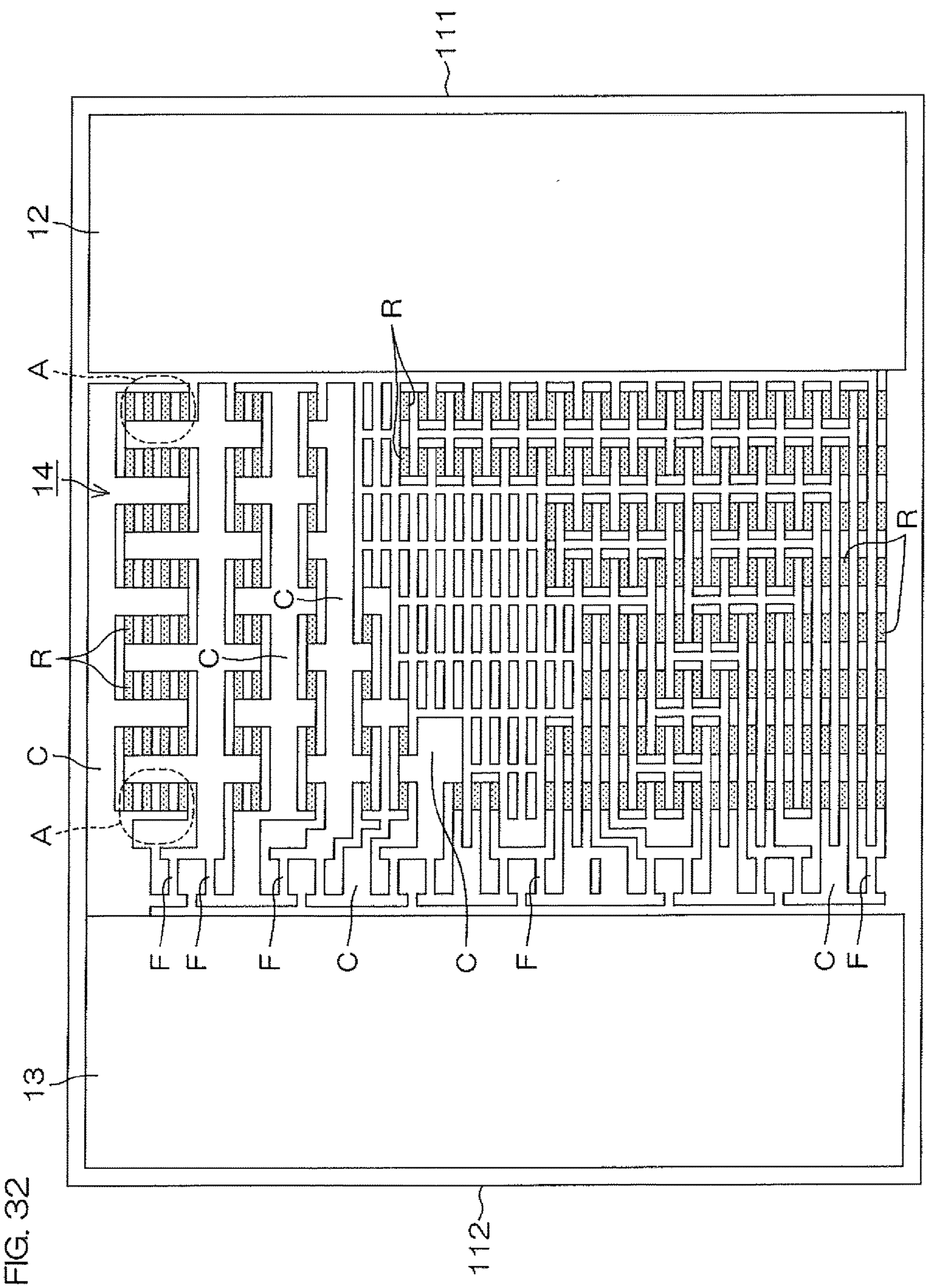
FIG. 32 is a plan view of the chip resistor 10 showing the positional relationships of a first connection electrode 12, a second connection electrode 13, and a resistor network 14 and showing the arrangement in a plan view of the resistor network 14.

FIG. 32 is a plan view of the chip resistor 10 showing the positional relationships of the first connection electrode 12, the second connection electrode 13, and the resistor network 14 and shows the arrangement in a plan view of the resistor network 14. With reference to FIG. 32, the chip resistor 10 includes the first connection electrode 12, disposed along the one short side 111 of the substrate upper surface and having the substantially rectangular shape in a plan view that is long in the width direction, the second connection electrode 13, disposed along the other short side 112 of the substrate upper surface and having the substantially rectangular shape in a plan view that is long in the width direction, and the resistor network 14 provided in the region of substantially rectangular shape in a plan view between the first connection electrode 12 and the second connection electrode 13.

The resistor network 14 has a plurality of resistor body films R having an equal resistance value and being arrayed in a matrix on the substrate 11 (the example of FIG. 32 has an arrangement with a total of 352 resistor body films R with 8 resistor body films R being arrayed along the row direction (length direction of the substrate) and 44 resistor body films being arrayed along the column direction (width direction of the substrate)). One to 64 of the plurality of resistor body films R are electrically connected to form a plurality of types of resistance units. The plurality of types of resistance units thus formed are connected in predetermined modes by connection wiring films as network connection means. Further, a plurality of fuse films F are provided that electrically incorporate resistance units into the resistor network 14 or are capable of being fused to electrically separate resistance units from the resistor network 14. The plurality of fuse films F are arrayed along the inner side of the second connection electrode 13 so that the positioning region thereof is rectilinear. More specifically, the plurality of fuse films F and the connection wiring films C are disposed rectilinearly.

Figure 33A:
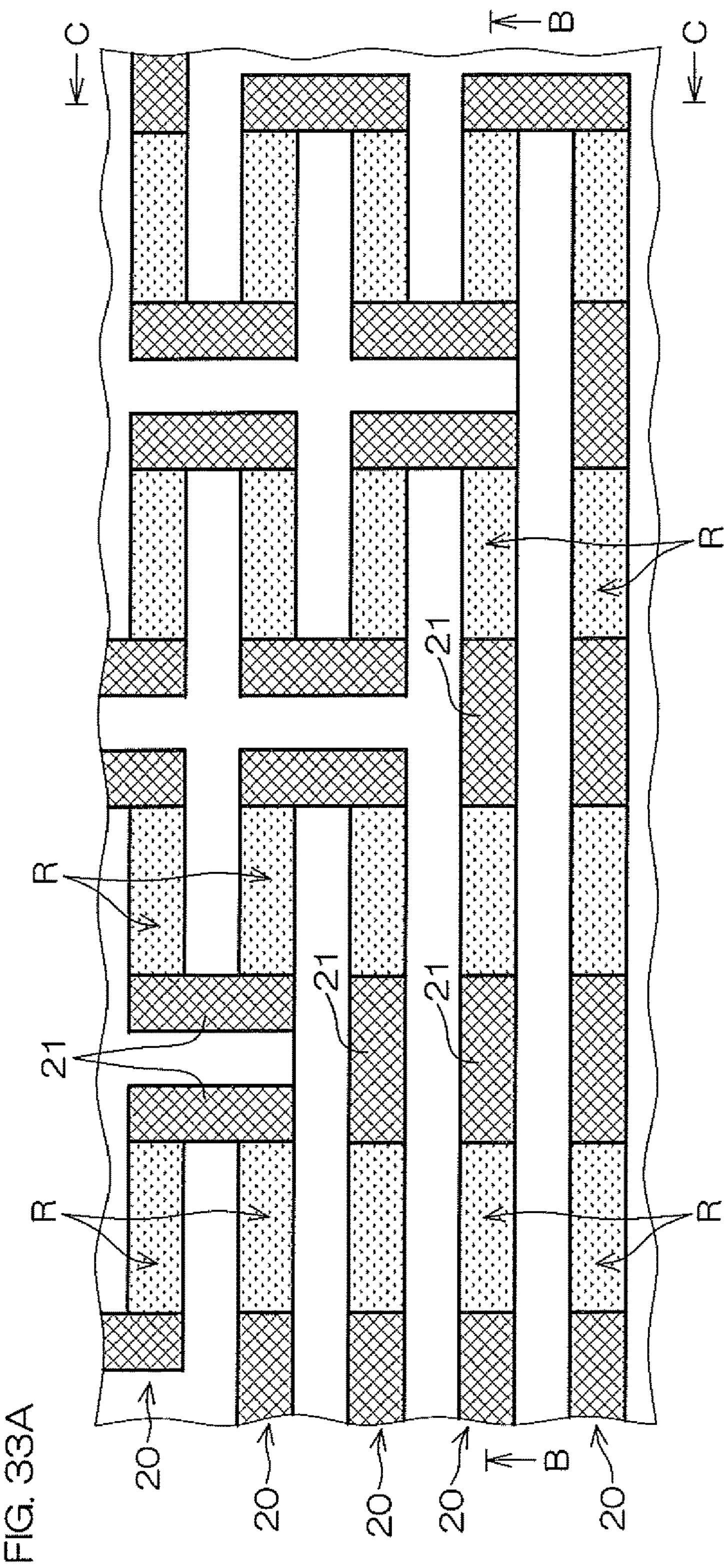
FIG. 33A is an enlarged plan view of a portion of the resistor network 14 shown in FIG. 32.
Figure 33B:
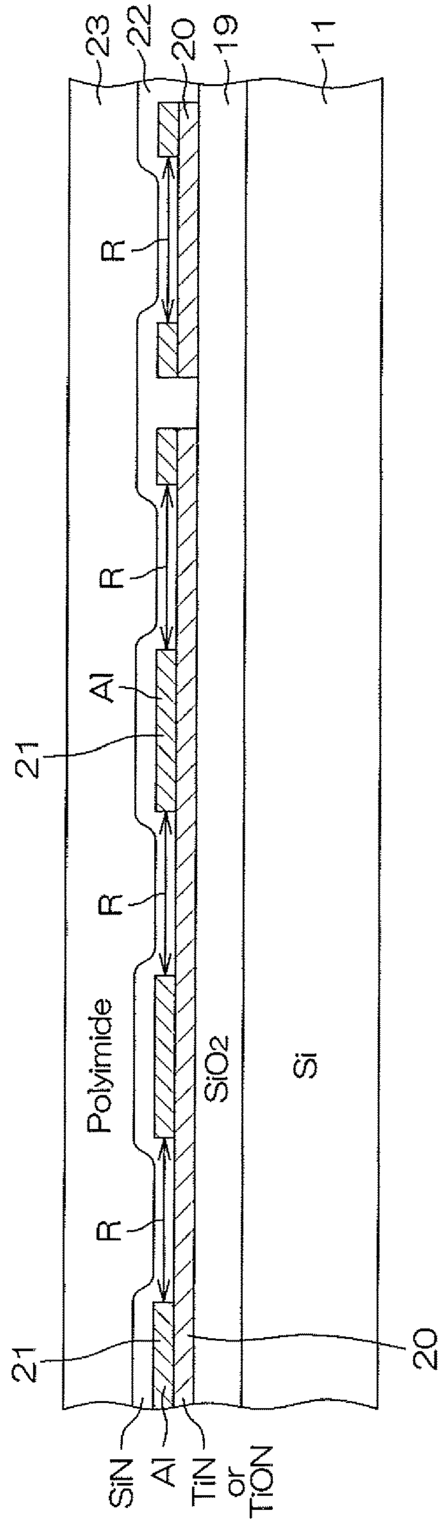
FIG. 33B is a vertical sectional view in the length direction for describing the arrangement of resistor bodies R in the resistor network 14.
Figure 33C:
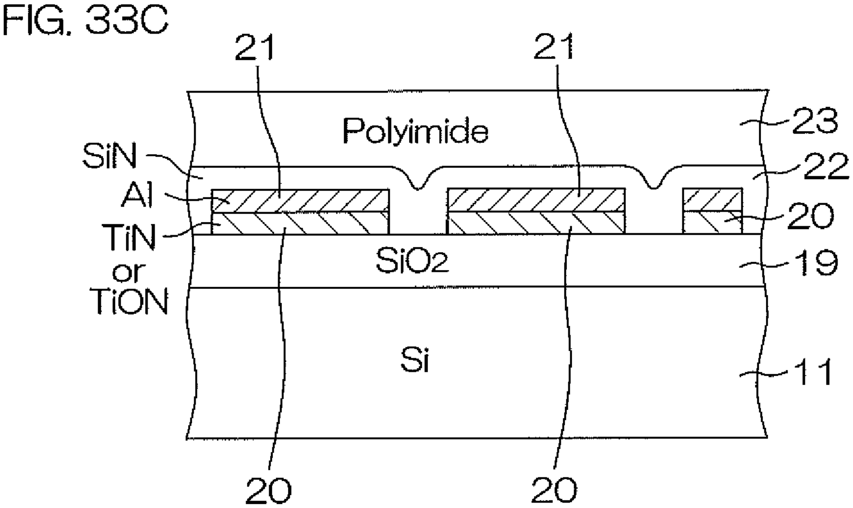
FIG. 33C is a vertical sectional view in the width direction for describing the arrangement of the resistor bodies R in the resistor network 14.

FIG. 33A is an enlarged plan view of a portion of the resistor network 14 shown in FIG. 32, and FIG. 33B and FIG. 33C are a vertical sectional view in the length direction and a vertical sectional view in the width direction, respectively, for describing the structure of the resistor bodies R in the resistor network 14. The arrangement of the resistor body films R shall now be described with reference to FIG. 33A, FIG. 33B, and FIG. 33C.

On an upper surface of the substrate 11 as the substrate, an insulating layer ($SiO_2$) 19 is formed, and resistor body films 20, which make up the resistor body films R, are disposed on the insulating film 19. The resistor body films 20 are formed of TiN or TiON. The resistor body films 20 are arranged as a plurality of resistor body films (hereinafter referred to as "resistor body film lines") extending as lines between the first connection electrode 12 and the second connection electrode 13, and there are cases where a resistor body film line 20 is cut at predetermined positions in the line direction. Aluminum films are laminated as wiring films 21 on the resistor body film lines 21. The wiring films 21 are laminated on the resistor body film lines 20 while being spaced apart by fixed intervals R in the line direction.

Figure 34A:
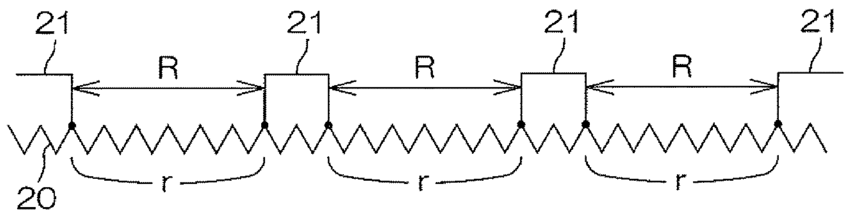
FIG. 34A is a diagram showing the electrical features of resistive film lines 20 and conductor films 21 in the form of circuit symbols and an electric circuit diagram.
Figure 34B:
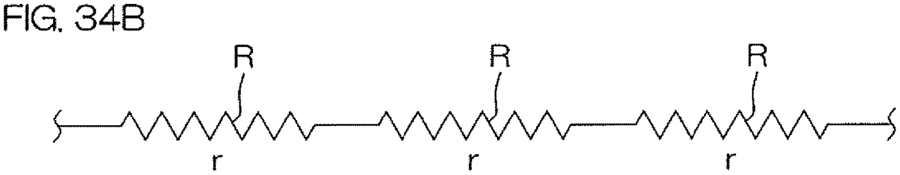
FIG. 34B is a diagram showing the electrical features of resistive film lines 20 and conductor films 21 in the form of circuit symbols and an electric circuit diagram.
Figure 34C:
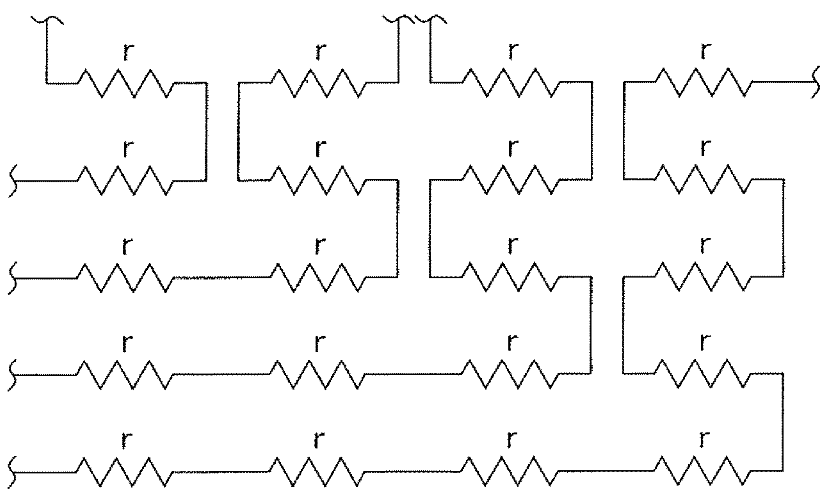
FIG. 34C is a diagram showing the electrical features of resistive film lines 20 and conductor films 21 in the form of circuit symbols and an electric circuit diagram.

The electrical features of the resistor body film lines 20 and the wiring films 21 are indicated in the form of circuit symbols in FIGS. 34A, 34B, and 34C. That is, as shown in FIG. 34A, each of the resistor body film line 20 portions in regions of the predetermined interval R forms a resistor body film R with a fixed resistance value r. In each region at which a wiring film 21 is laminated, the resistor body film line 20 is short-circuited by the wiring film 21. A resistor circuit, made up of serial connections of resistor body films R of resistance r, is thus formed as shown in FIG. 34B.

Also, adjacent resistor body film lines 20 are connected to each other by the resistor body films 20 and wiring films 21 and therefore the resistor network shown in FIG. 33A forms the resistor circuit shown in FIG. 34C. The manufacturing process of the resistor network 14 shall now be described briefly. (1) The top surface of the substrate 11 is thermally oxidized to form a silicon dioxide ($SiO_2$) layer as the insulating layer 19. (2) Then by sputtering, the resistor body film 20 of TiN, TION, or TiSiON is formed on the entire surface of the insulating layer 19. (3) Further by sputtering, the wiring film 21 of aluminum (Al) is laminated on the resistor body film 20. (4) Thereafter, a photolithography process is used and, for example, dry etching is performed to selectively remove the wiring film 21 and the resistor body film 20 to obtain the arrangement where, as shown in FIG. 33A, the resistor body film lines 20 and the wiring films 21 of fixed width are arrayed in the column direction while being spaced apart by fixed intervals in a plan view. Regions at which the resistor body film lines 20 and the wiring films 21 are interrupted are also formed at this point. (5) The wiring films 21 laminated on the resistor body film lines 20 are then removed selectively. The arrangement where the wiring films 21 are laminated on the resistor body film lines 20 while being spaced apart by the fixed intervals R is consequently obtained. (6) Thereafter, an SiN film 22 is deposited as a protective film and further, a polyimide layer 23, which is a protective layer, is laminated thereon.

In the present preferred embodiment, the resistor body films R, included in the resistor network 14 formed on the substrate 11, include the resistor body film lines 20 and the wiring films 21 that are laminated on the resistor body film lines 20 while being spaced apart by the fixed intervals in the line direction, and a single resistor body film R is arranged from the resistor body film line 20 at the fixed interval R portion on which the wiring film 21 is not laminated. The resistor body film lines 20 making up the resistor body films R are all equal in shape and size. Therefore based on the characteristic that resistor body films of the same shape with the same size that are formed on a substrate are substantially the same in value, the plurality of resistor body films R arrayed in a matrix on the substrate 11 have an equal resistance value.

Figure 35A:
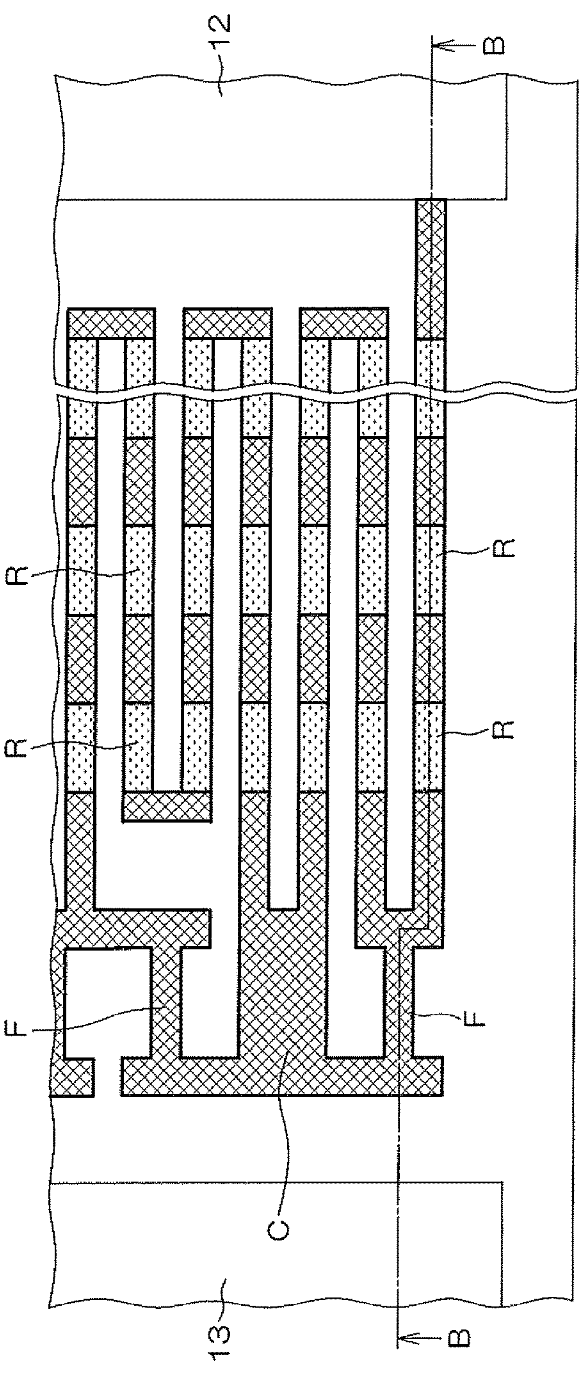
FIG. 35A is partially enlarged plan view of a region including fuse films F drawn by enlarging a portion of the plan view of the chip resistor shown in FIG. 32.

The wiring films 21 laminated on the resistor body film lines 20 partition the resistor body films R and also serve the role of connection wiring films that connect a plurality of resistor bodies R to arrange a resistance unit. FIG. 35A is partially enlarged plan view of a region including the fuse films F drawn by enlarging a portion of the plan view of the chip resistor 10 shown in FIG. 32, and FIG. 35B is a structural sectional view taken along B-B in FIG. 35A.

Figure 35B:
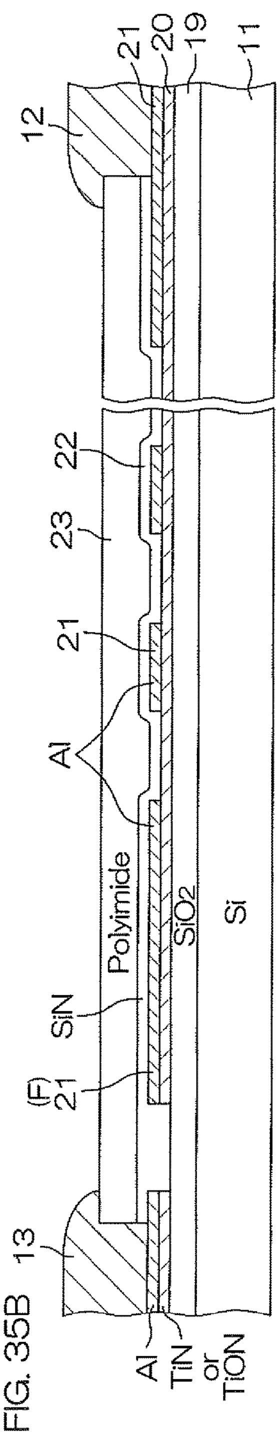
FIG. 35B is a structural sectional view taken along B-B in FIG. 35A.

As shown in FIGS. 35A and 35B, the fuse films F are also formed by the wiring films 21, which are laminated on the resistor body film lines 20. That is, the fuse films F are formed of aluminum (Al), which is the same metal material as that of the wiring films 21, on the same layer as the wiring films 21, which are laminated on the resistor body film lines 20. As mentioned above, the wiring films 21 are also used as the connection wiring films 21 that electrically connect a plurality of resistor body films R to form a resistance unit.

That is, on the same layer laminated on the resistor body film 20, the wiring films for partitioning the resistor body films R, the connection wiring films for forming the resistance units, the connection wiring films for arranging the resistor network 14, the fuse films, and the wiring films for connecting the resistor network 14 to the first connection electrode 12 and the second connection electrode 13 are formed by the same manufacturing process (for example, a sputtering and photolithography process) using the same metal material (for example, aluminum). The manufacturing process of the chip resistor 10 is thereby simplified and also, various types of wiring films can be formed at the same time using a mask in common. Further, the property of alignment with respect to the resistor body film 20 is also improved.

Figure 36:
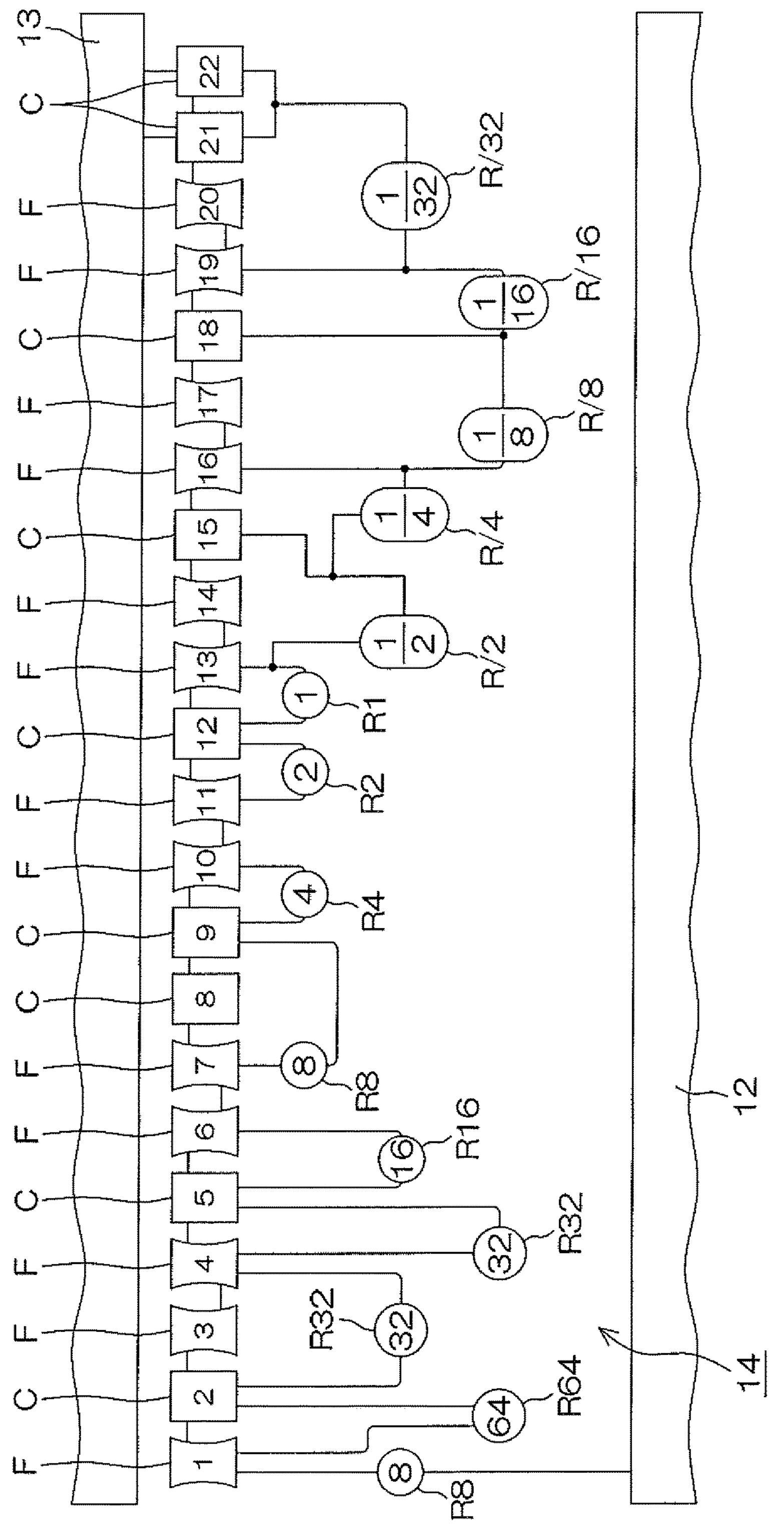
FIG. 36 is an illustrative diagram of the array relationships of the connection conductor films C and fuse films F connecting a plurality of types of resistance units in the resistor network 14 shown in FIG. 32 and the connection relationships of the plurality of types of resistance units connected to the connection conductor films C and fuse films F.

FIG. 36 is an illustrative diagram of the array relationships of the connection wiring films C and the fuse films F connecting a plurality of types of resistance units in the resistor network 14 shown in FIG. 32 and the connection relationships of the plurality of types of resistance units connected to the connection wiring films C and fuse films F. With reference to FIG. 36, one end of a reference resistance unit R8, included in the resistor network 14, is connected to the first connection electrode 12. The reference resistance unit R8 is formed by a serial connection of 8 resistor body films R and the other end thereof is connected to a fuse film F1. One end and the other end of a resistance unit R64, formed by a serial connection of 64 resistor body films R, are connected to the fuse film F1 and a connection wiring film C2. One end and the other end of a resistance unit R32, formed by a serial connection of 32 resistor body films R, are connected to the connection wiring film C2 and a fuse film F4. One end and the other end of a resistance unit R32, formed by a serial connection of 32 resistor body films R, are connected to the fuse film F4 and a connection wiring film C5. One end and the other end of a resistance unit R16, formed by a serial connection of 16 resistor body films R, are connected to the connection wiring film C5 and a fuse film F6. One end and the other end of a resistance unit R8, formed by a serial connection of 8 resistor body films R, are connected to a fuse film F7 and a connection wiring film C9. One end and the other end of a resistance unit R4, formed by a serial connection of 4 resistor body films R, are connected to the connection wiring film C9 and a fuse film F10. One end and the other end of a resistance unit R2, formed by a serial connection of 2 resistor body films R, are connected to a fuse film F11 and a connection wiring film C12. One end and the other end of a resistance unit R1, formed of a single resistor body film R, are connected to the connection wiring film C12 and a fuse film F13. One end and the other end of a resistance unit R/2, formed by a parallel connection of 2 resistor body films R, are connected to the fuse film F13 and a connection wiring film C15. One end and the other end of a resistance unit R/4, formed by a parallel connection of 4 resistor body films R, are connected to the connection wiring film C15 and a fuse film F16. One end and the other end of a resistance unit R/8, formed by a parallel connection of 8 resistor body films R, are connected to the fuse film F16 and a connection wiring film C18. One end and the other end of a resistance unit R/16, formed by a parallel connection of 16 resistor body films R, are connected to the connection wiring film C18 and a fuse film F19. A resistance unit R/32, formed by a parallel connection of 32 resistor body films R, are connected to the fuse film F19 and a connection wiring film C22.

With the plurality of fuse films F and connection wiring films C, the fuse film F1, the connection wiring film C2, the fuse film F3, the fuse film F4, the connection wiring film C5, the fuse film F6, the fuse film F7, the connection wiring film C8, the connection wiring film C9, the fuse film F10, the fuse film F11, the connection wiring film C12, the fuse film F13, a fuse film F14, the connection wiring film C15, the fuse film F16, the fuse film F17, the connection wiring film C18, the fuse film F19, the fuse film F20, the connection wiring film C21, and the connection wiring film C22 are disposed rectilinearly and connected in series. With this arrangement, when a fuse film F is fused, the electrical connection with the connection wiring film C connected adjacently to the fuse film F is interrupted.

Figure 37:
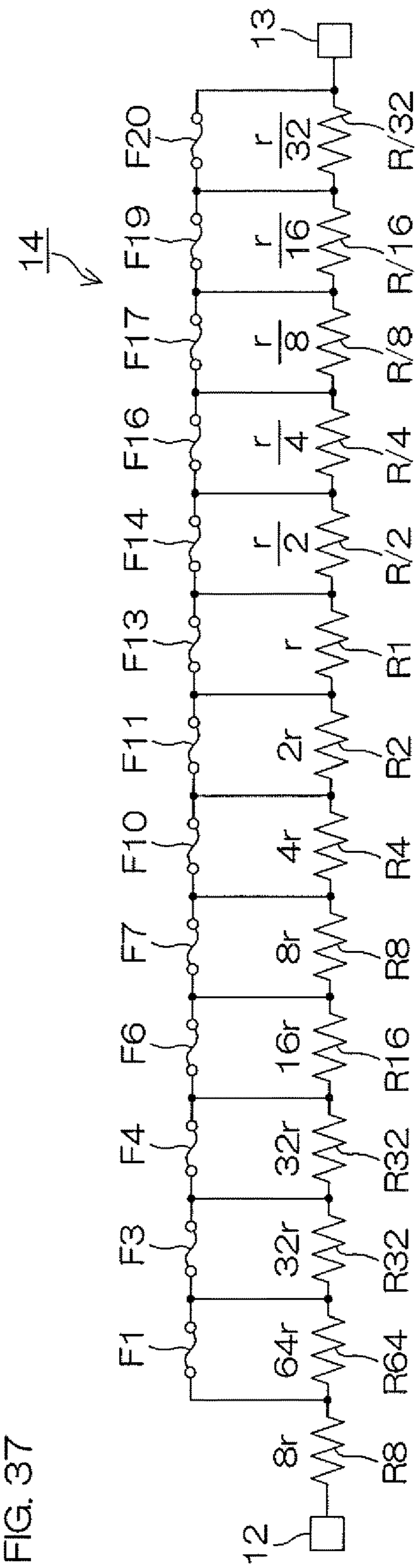
FIG. 37 is an electric circuit diagram of the resistor network 14.

This arrangement is illustrated in the form of an electric circuit diagram in FIG. 37. That is, in a state where none of the fuse films F is fused, the resistor network 14 forms a resistor circuit of the reference resistance unit R8 (resistance value: 8r), formed by the serial connection of the 8 resistor bodies R provided between the first connection electrode 12 and the second connection electrode 13. For example, if the resistance value r of a single resistor body R is r=80Ω, the chip resistor 10 is arranged with the first connection electrode 12 and the second connection electrode 13 being connected by a resistor circuit of 8r=640Ω.

With each of the plurality of types of resistance units besides the reference resistance unit R8, a fuse film F is connected in parallel, and these plurality of types of resistance units are put in short-circuited states by the respective fuse films F. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the resistor network 14.

With the chip resistor 10 according to the present preferred embodiment, a fuse film F is selectively fused, for example, by laser light in accordance with the required resistance value. The resistance unit with which the fuse film F connected in parallel is fused is thereby incorporated into the resistor network 14. The resistor network 14 can thus be made a resistor network with the overall resistance value being the resistance value resulting from serially connecting and incorporating the resistance units corresponding to the fused fuse films F.

In other words, with the chip resistor 10 according to the present preferred embodiment, by selectively fusing the fuse films corresponding to a plurality of types of resistance units, the plurality of types of resistance units (for example, the serial connection of the resistance units R64, R32, and R1 in the case of fusing F1, F4, and F13) can be incorporated into the resistor network. The respective resistance values of the plurality of types of resistance units are predetermined, and the chip resistor 10 can thus be made to have the required resistance value by adjusting the resistance value of the resistor network 14 in a so to speak digital manner.

Also, the plurality of types of resistance units include the plurality of types of serial resistance units, with which the resistor body films R having an equal resistance value are connected in series with the number of resistor body films R being increased in geometric progression as 1, 2, 4, 8, 16, 32, and 64, and the plurality of types of parallel resistance units, with which the resistor body films R having an equal resistance value are connected in parallel with the number of resistor body films R being increased in geometric progression as 2, 4, 8, 16, and 32, and these are connected in series in states of being short-circuited by the fuse films F and therefore by selectively fusing the fuse films F, the resistance value of the resistor network 14 as a whole can be set to an arbitrary resistance value within a wide range from a small resistance value to a large resistance value.

Figure 38:
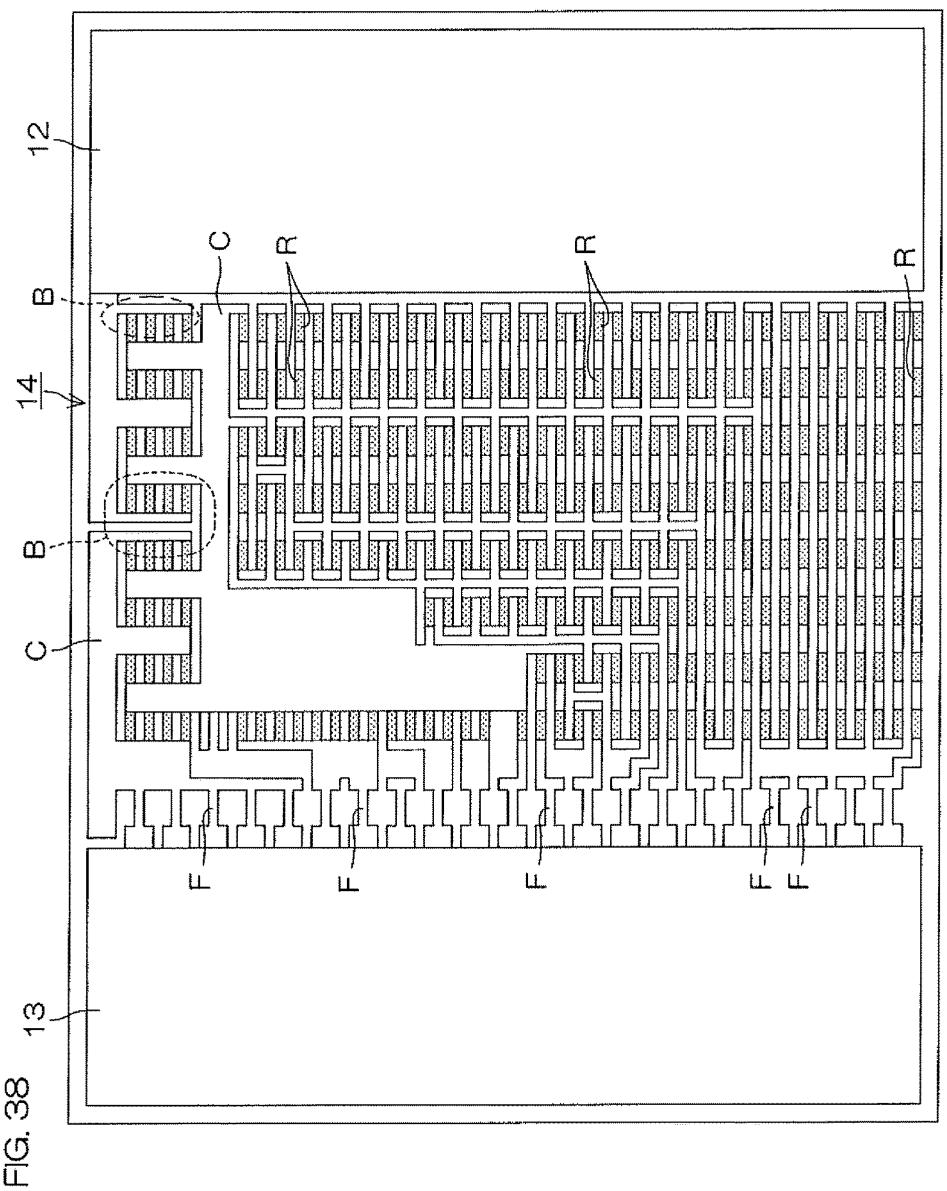
FIG. 38 is a plan view of a chip resistor 30 showing the positional relationships of the first connection electrode 12, the second connection electrode 13, and the resistor network 14 and showing the arrangement in a plan view of the resistor network 14.

FIG. 38 is a plan view of a chip resistor 30 according to another preferred embodiment of the second reference example and shows the positional relationships of the first connection electrode 12, the second connection electrode 13, and the resistor network 14 and shows the arrangement in a plan view of the resistor network 14. The chip resistor 30 differs from the chip resistor 10 described above in the mode of connection of the resistor body films R in the resistor network 14. That is, the resistor network 14 of the chip resistor 30 has a plurality of resistor body films R having an equal resistance value and being arrayed in a matrix on the substrate (the arrangement of FIG. 38 is an arrangement with a total of 352 resistor body films R with 8 resistor body films R being arrayed along the row direction (length direction of the substrate) and 44 resistor body films R being arrayed along the column direction (width direction of the substrate)). One to 128 of the plurality of resistor body films R are electrically connected to form a plurality of types of resistance units. The plurality of types of resistance units thus formed are connected in parallel modes by wiring films as network connection means and by the fuse films F. The plurality of fuse films F are arrayed along the inner side of the second connection electrode 13 so that the positioning region thereof is rectilinear, and when a fuse film F is fused, the resistance unit connected to the fuse film F is electrically separated from the resistor network 14.

Figure 39:
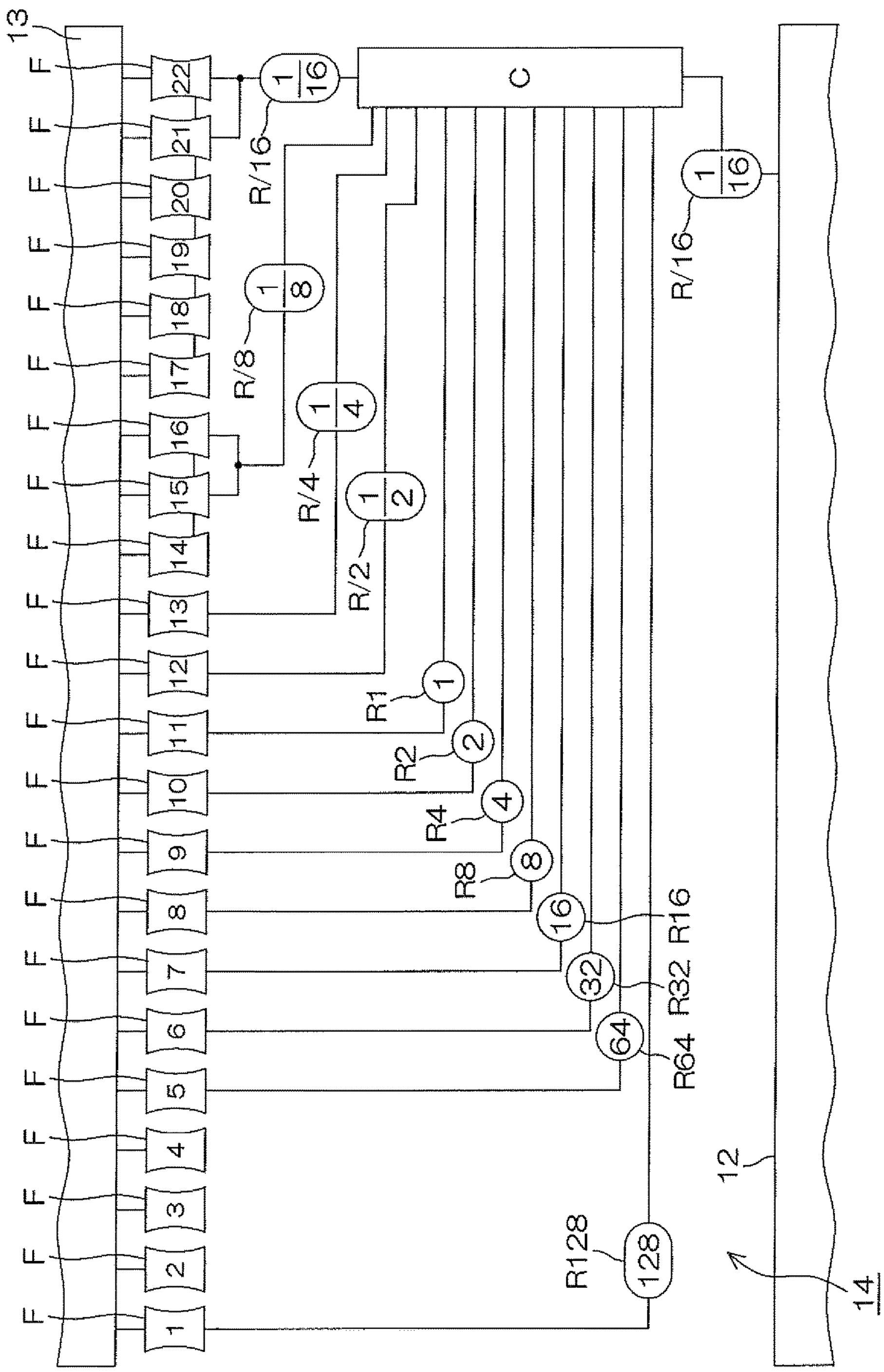
FIG. 39 is an illustrative diagram of the positional relationships of the connection conductor films C and the fuse films F connecting the plurality of types of resistance units in the resistor network 14 shown in FIG. 38 and the connection relationships of the plurality of types of resistance units connected to the connection conductor films C and fuse films F.

The structure of the plurality of resistor body films R forming the resistor network 14, and the structures of the connection wiring films and fuse films F are the same as the structures of the corresponding portions in the chip resistor 10 and description of these shall thus be omitted here. FIG. 39 is an illustrative diagram of the connection modes of the plurality of types of resistance units in the resistor network shown in FIG. 38, the array relationships of the fuse films F connecting the resistance units, and the connection relationships of the plurality of types of resistance units connected to the fuse films F.

Referring to FIG. 39, one end of a reference resistance unit R/16, included in the resistor network 14, is connected to the first connection electrode 12. The reference resistance unit R/16 is formed by a parallel connection of 16 resistor body films R and the other end thereof is connected to the connection wiring film C, to which the remaining resistance units are connected. One end and the other end of a resistance unit R128, formed by a serial connection of 128 resistor body films R, are connected to the fuse film F1 and the connection wiring film C. One end and the other end of the resistance unit R64, formed by a serial connection of 64 resistor body films R, are connected to the fuse film F5 and the connection wiring film C. One end and the other end of the resistance unit R32, formed by a serial connection of 32 resistor body films R, are connected to the fuse film F6 and the connection wiring film C. One end and the other end of the resistance unit R16, formed by a serial connection of 16 resistor body films R, are connected to the fuse film F7 and the connection wiring film C. One end and the other end of the resistance unit R8, formed by a serial connection of 8 resistor body films R, are connected to the fuse film F8 and the connection wiring film C. One end and the other end of the resistance unit R4, formed by a serial connection of 4 resistor body films R, are connected to the fuse film F9 and the connection wiring film C. One end and the other end of a resistance unit R2, formed by a serial connection of 2 resistor body films R, are connected to the fuse film F10 and the connection wiring film C. One end and the other end of the resistance unit R1, formed of a single resistor body film R, are connected to the fuse film F11 and the connection wiring film C. One end and the other end of the resistance unit R/2, formed by a parallel connection of 2 resistor body films R, are connected to the fuse film F12 and the connection wiring film C. One end and the other end of the resistance unit R/4, formed by a parallel connection of 4 resistor body films R, are connected to the fuse film F13 and the connection wiring film C. The fuse films F14, F15, and F16 are electrically connected, and one end and the other end of the resistance unit R/8, formed by a parallel connection of 8 resistor body films R, are connected to the fuse films F14, F15, and F16 and the connection wiring film C. The fuse films F17, F18, F19, F20, and F21 are electrically connected, and one end and the other end of the resistance unit R/16, formed by connecting 16 resistor body films R in parallel, are connected to the fuse films F17 to F21 and the connection wiring film C.

The 21 fuse films F of fuse films F1 to F21 are provided and all of these are connected to the second connection electrode 13. By this arrangement, when a fuse film F, to which one end of a resistance unit is connected, is fused, the resistance unit having one end connected to the fuse film F is electrically disconnected from the resistor network 14.

Figure 40:
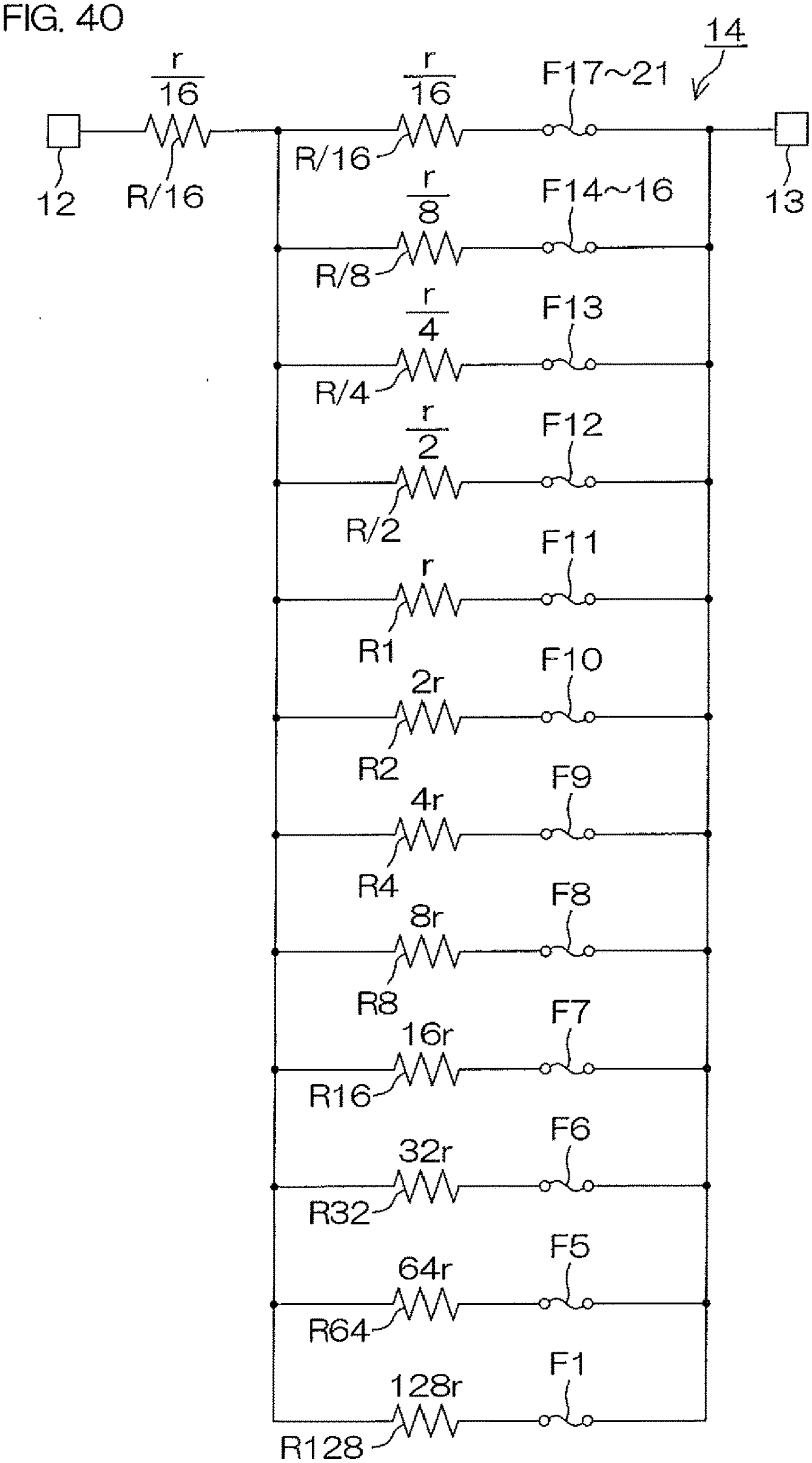
FIG. 40 is an electric circuit diagram of the resistor network 14.
Figure 41:
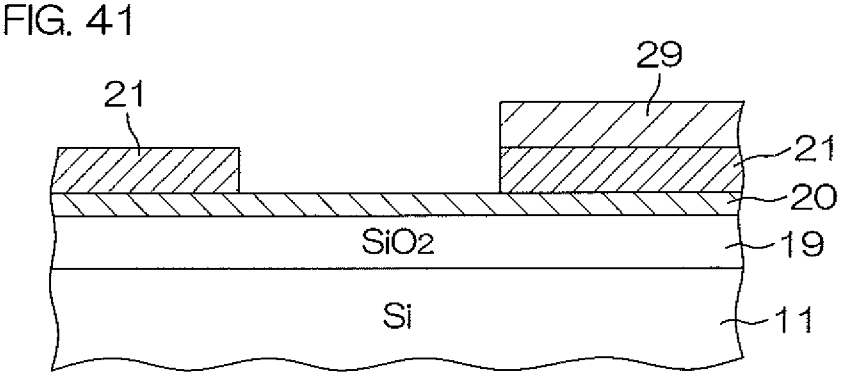
FIG. 41 is a sectional structural diagram of an arrangement example of arranging a wiring film in an arbitrary region in the resistor network 14 as a laminated two-layer structure.

The arrangement of FIG. 39, that is, the arrangement of the resistor network 14 included in the chip resistor 30, is illustrated in the form of an electric circuit diagram in FIG. 40. In a state where none of the fuse films F is fused, the resistor network 14 forms, between the first connection electrode 12 and the second connection electrode 13, a serial connection circuit of the reference resistance unit R8 and the parallel connection circuit of the 12 types of resistance units R/16, R/8, R/4, R/2, R1, R2, R4, R8, R16, R32, R64, and R128.

A fuse film F is serially connected to each of the 12 types of resistance units besides the reference resistance unit R/16. Therefore with the chip resistor 30 having the resistor network 14, by selectively fusing a fuse film F, for example, by laser light in accordance with the required resistance value, the resistance unit corresponding to the fused fuse film F (the resistance unit connected in series to the fuse film F) is electrically separated from the resistor network 14 and the resistance value of the chip resistor 10 can thereby be adjusted.

In other words, with the chip resistor 30 according to the present preferred embodiment, by selectively fusing the fuse films corresponding to a plurality of types of resistance units, the plurality of types of resistance units can be electrically separated from the resistor network. The respective resistance values of the plurality of types of resistance units are predetermined, and the chip resistor 30 can thus be made to have the required resistance value by adjusting the resistance value of the resistor network 14 in a so to speak digital manner.

Also, the plurality of types of resistance units include the plurality of types of serial resistance units, with which the resistor body films R having an equal resistance value are connected in series with the number of resistor body films R being increased in geometric progression as 1, 2, 4, 8, 16, 32, 64, and 128, and the plurality of types of parallel resistance units, with which the resistor body films R having an equal resistance value are connected in parallel with the number of resistor body films R being increased in geometric progression as 2, 4, 8, and 16, and therefore by selectively fusing the fuse films F, the resistance value of the resistor network 14 as a whole can be set to an arbitrary resistance value finely and digitally.

In a region A surrounded by broken lines in the chip resistor 10 shown in FIG. 32 and also in a region B surrounded by broken lines in the chip resistor 30 shown in FIG. 38, the wiring films and the resistor body films R are in a so-called comb-shaped connection mode. When several resistor body films R are thus connected in parallel in comb-like manner to the connection wiring films, the resistance value of the resistor body films R as a whole becomes low and the influence of the resistance value of the wiring films per se becomes non-negligible. Therefore in such regions, each wiring film 21 is made to have a laminated two-layer structure (a structure in which a wiring film 29 is laminated on the wiring film 21) to decrease the resistance value of the wiring films 21 and 29 at that portion to provide an arrangement where the resistance value of the wiring films 21 and 29 at that portion does not have an influence, etc., on the resistor circuit as a whole.

If the entirety of the connection wiring films is made to have the laminated two-layer structure, the portions of the fuse films F will also have the two-layer structure so that the fuse films F will be increased in thickness and it may be difficult to fuse the fuse films F by a laser. The connection wiring films may thus be arranged to have the laminated two-layer structure and be lowered in resistance value at all regions excluding at least the fuse films F. At the regions of the fuse films F, the wiring films 21 have a single-layer structure, and therefore as a manufacturing process, after laminating the aluminum wiring film 21 on the resistor body film 20 and using the photolithography process to arrange the wiring films 21 and the resistor body films 20 in a predetermined pattern, the metal wiring films of the second layer may be formed by lamination on the wiring films 21 by sputtering while masking the regions at which the patterned fuse films F are to be arranged.

Or, after the resistor network 14 has been formed by patterning, the conductor films (wiring films 29) of the second layer may be laminated just on the wiring films at desired regions (for example, the comb-shaped portions). In arranging the laminated wiring structure, the wiring material of the first layer (lower layer) 21 may, for example, be Al and the wiring material of the second layer (upper layer) 29 may be the same wiring material of A1 as the first layer 21 or may be a different wiring material (for example, Cu).

Figure 42A:
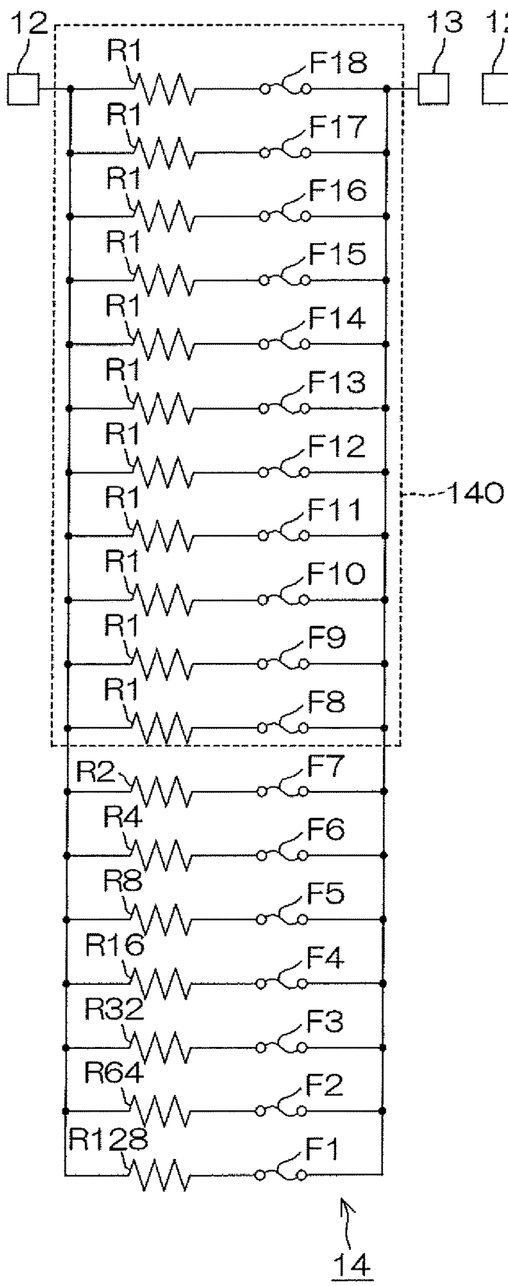
FIG. 42A is an electric circuit diagram of modification examples of the electric circuit shown in FIG. 40.
Figure 42B:
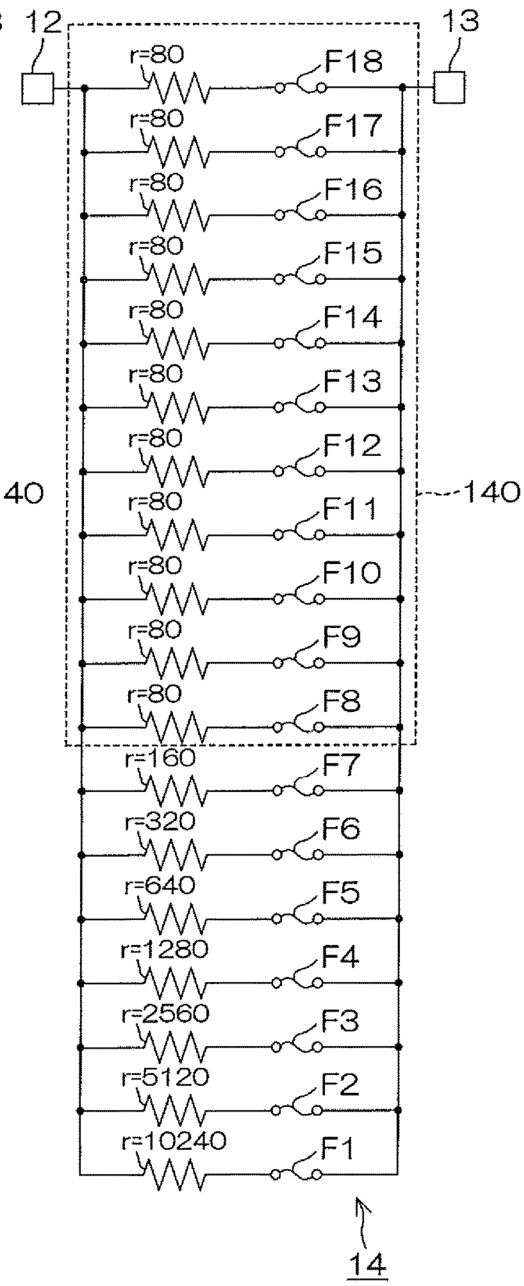
FIG. 42B is an electric circuit diagram of modification examples of the electric circuit shown in FIG. 40.

With the electric circuit shown in FIG. 40, there is a tendency for an overcurrent to flow through the reference resistance unit R/16 and the resistance units of low resistance value among the parallel connection resistance units, and the rated current that can be made to flow through the resistances must be designed to be large in setting the resistances. Therefore to disperse the current, the connection structure of the resistor network may be changed to change the electric circuit shown in FIG. 40 to that shown in FIG. 42A. That is, the reference resistance unit R/16 is eliminated and the circuit is changed to include an arrangement 140, with which the resistance units that are connected in parallel have a minimum resistance value of r and a plurality of resistance units R1 with the resistance value r are connected in parallel. FIG. 42B is an electric circuit diagram in which specific resistance values are indicated and shows a circuit that includes the arrangement 140 where a plurality of sets of serial connection of a resistance unit of 80Ω and a fuse film F are connected in parallel. Dispersion of the current that flows can thereby be achieved.

Figure 43:
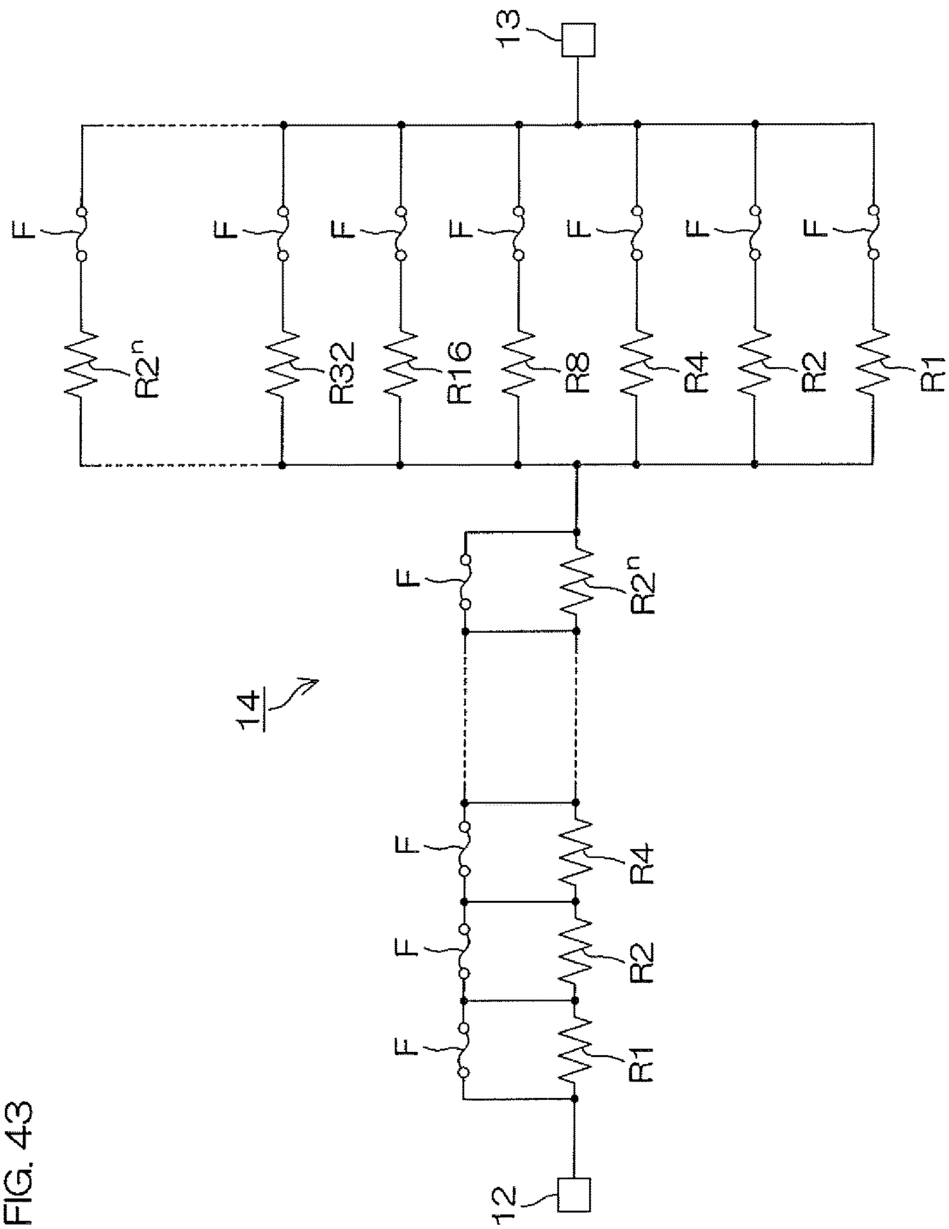
FIG. 43 is an electric circuit diagram of the resistor network 14 according to yet another preferred embodiment of the second reference example.

FIG. 43 is an electric circuit diagram of the circuit arrangement of the resistor network 14 included in a chip resistor according to yet another preferred embodiment of the second reference example. A feature of the resistor network 14 shown in FIG. 43 is that it has the circuit arrangement where a serial connection of a plurality of types of resistance units and a parallel connection of a plurality of types of resistance units are connected in series. As in a preferred embodiment described above, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fuse film F is electrically incorporated into the resistor network 14.

On the other hand, a fuse film F is connected in series to each of the plurality of types of resistance units that are connected in parallel. Therefore by fusing a fuse film F, the resistance unit connected in series to the fuse film F can be electrically disconnected from the parallel connection of resistance units. With this arrangement, for example, a low resistance of not more than 1 kΩ can be formed at the parallel connection side, and a resistor circuit of not less than 1 kΩ can be formed at the serial connection side. Resistor circuits of a wide range, from a low resistance of several Ω to a high resistance of several MΩ, can thereby be formed using the resistor networks 14 arranged with equal basic designs.

Figure 44:
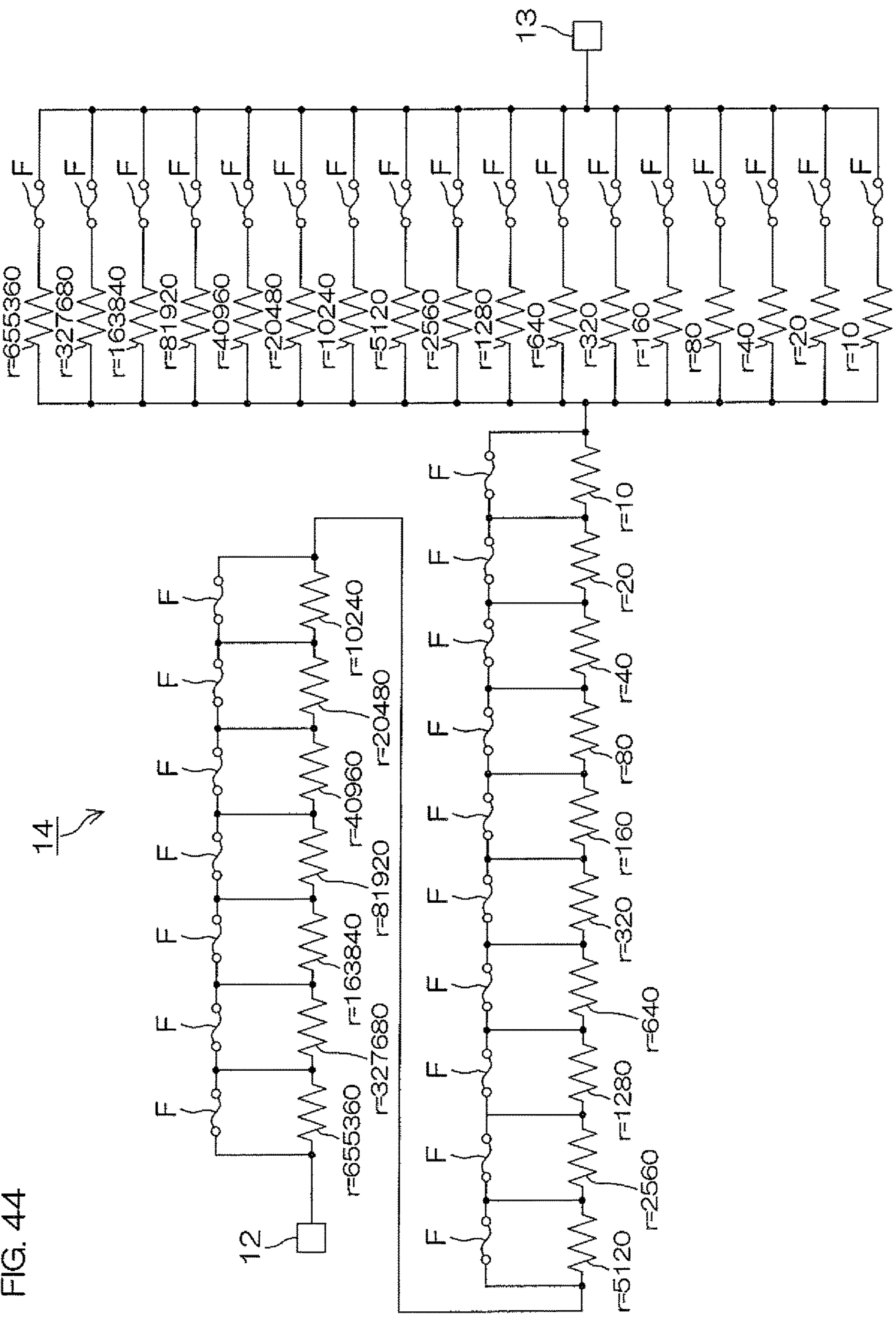
FIG. 44 is an electric circuit diagram of an arrangement example of a resistor network in a chip resistor with specific resistance values indicated.

Also if the resistance value is to be set more precisely, the fuse film of a serial connection side resistor circuit that is close in resistance value to the required resistance value can be cut in advance and the resistance value can be finely adjusted by fusing the fuse films of the resistor circuits at the parallel connection side to improve the precision of adjustment to the desired resistance value. FIG. 44 is an electric circuit diagram of a specific arrangement example of the resistor network 14 in a chip resistor having a resistance value in the range of 10Ω to 1MΩ.

The resistor network 14 shown in FIG. 44 also has the circuit arrangement in which a serial connection of a plurality of types of resistance units short-circuited by the fuse films F and a parallel connection of a plurality of types of resistance units serially connected to the fuse films F are connected in series. With the resistor circuit of FIG. 44, an arbitrary resistance value of 10 to 1 kΩ can be set within a precision of 1% at the parallel connection side. Also, an arbitrary resistance value of 1 k to 1MΩ can be set within a precision of 1% at the serial connection side circuit. When the serial connection side circuit is used, the merit of being able to set the resistance value with higher precision is provided by fusing in advance the fuse film F of the resistance unit close to the desired resistance value and then adjusting to the desired resistance value.

Figure 45:
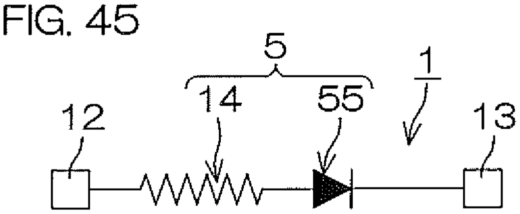
FIG. 45 is a circuit diagram of an electronic device 1 according to a preferred embodiment of the second reference example.

FIG. 45 is a diagram of the circuit arrangement of an electronic device 1 in which another circuit is incorporated in the chip resistor described above. In the electronic device 1, for example, a diode 55 and the resistor network 14 are connected in series. This electronic device 1 is a chip type electronic device that includes the diode 55. The second reference example may be applied as an electronic device that includes the resistor network 14 described above without restriction to a chip type as in the present example. <Invention according to a third reference example> (1) Features of the invention according to the third reference example. For example, the features of the invention according to the first reference example are the following C1 to C11.

(C1) A chip part including a substrate having an element forming surface and a plurality of side surfaces orthogonal thereto, a circuit element formed on the substrate, and external connection electrodes formed on the substrate, and where the substrate has an asymmetrical outer shape that indicates a chip direction in a plan view.

With this arrangement, the chip direction of the chip part can be recognized by simply making the outer shape of the substrate of the chip part asymmetrical in a plan view. That is, the chip direction can be recognized by the outer shape of the chip part even without a marking step.

(C2) The chip part according to C1, where the asymmetrical outer shape has a recess or a projection indicating the chip direction at one side among the side surfaces.

With this arrangement, the chip direction can be set to the recess side or projection side in the direction joining the one side having the recess or projection and the side opposite to this side.

(C3) The chip part according to C2, where the recess or the projection is disposed at a position that is shifted from the midpoint of the one side. With this arrangement, the recess side or projection side in the direction of extension of the one side can also be made the chip direction.

(C4) The chip part according to C2 or C3, where the recess or the projection has a rectangular shape or U-like shape.

A recess or projection with a simple shape, such as a rectangular shape or a U-like shape, can be formed easily.

(C5) The chip part according to any one of C2 to C4, further including a protective film covering the element forming surface and the plurality of side surfaces.

(C6) The chip part according to C5, where the protective film also covers the portion of the side surface at which the recess or projection is formed.

(C7) The chip part according to any one of C2 to C6, where the corner portions in the recess or projection at the side surface are chamfered.

With this arrangement, occurrence of chipping (fragmenting) at the corner portions can be prevented.

(C8) The chip part according to any one of C1 to C7, where the chip direction is a direction that is in accordance with the polarity of the external connection electrodes. With this arrangement, the polarity of the external connection electrodes can be indicated by the chip direction and the polarity can thus be ascertained from the outer appearance of the chip part.

(C9) The chip part according to C8, where the circuit element includes a diode or a capacitor.

(C10) A method for manufacturing a chip part including a step of forming a circuit element on an element forming surface of a substrate, and a step of using plasma etching to form, on the substrate, a plurality of side surfaces that are orthogonal to the element forming surface and form a recess or a projection, indicating the chip direction, at one side among the plurality of side surfaces.

With this method, the outer shape of the substrate can be made an asymmetrical shape that indicates the chip direction by means of the recess or the projection, and the chip part, with which the chip direction can be recognized, can thus be manufactured without a marking step.

(C11) A method for manufacturing a chip part including a step of forming a circuit element on an element forming surface of a substrate and a step of forming, on the substrate, a plurality of side surfaces that are orthogonal to the element forming surface and forming a recess or a projection, indicating the chip direction, at one side among the plurality of side surfaces.

With this method, the outer shape of the substrate can be made an asymmetrical shape that indicates the chip direction by means of the recess or the projection, and the chip part, with which the chip direction can be recognized, can thus be manufactured without a marking step. (2) Preferred embodiments of the invention related to the third reference example. Preferred embodiments of the third reference example shall now be described in detail with reference to the attached drawings. The symbols in FIG. 47 to FIG. 61 are effective only for these drawings and, even if used in other preferred embodiments, do not indicate the same elements as the symbols in the other preferred embodiments.

Figure 47A:
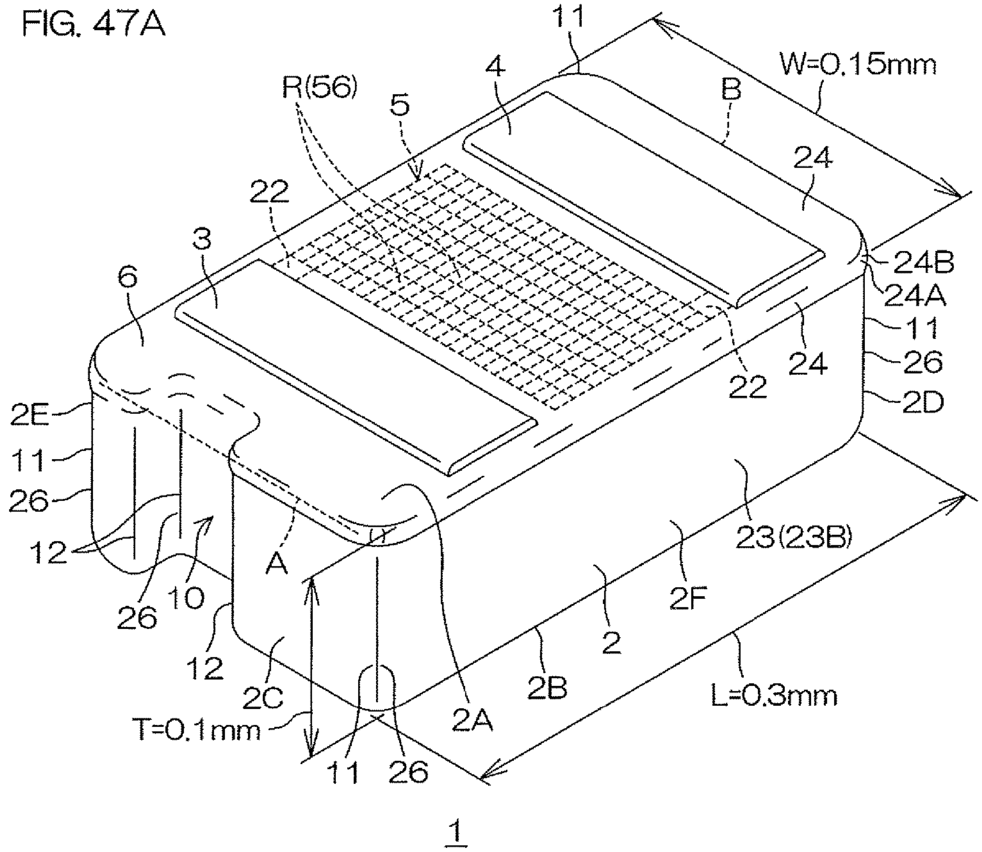
FIG. 47A is a schematic perspective view for describing the arrangement of an electronic device according to a preferred embodiment of a third reference example.
Figure 47B:
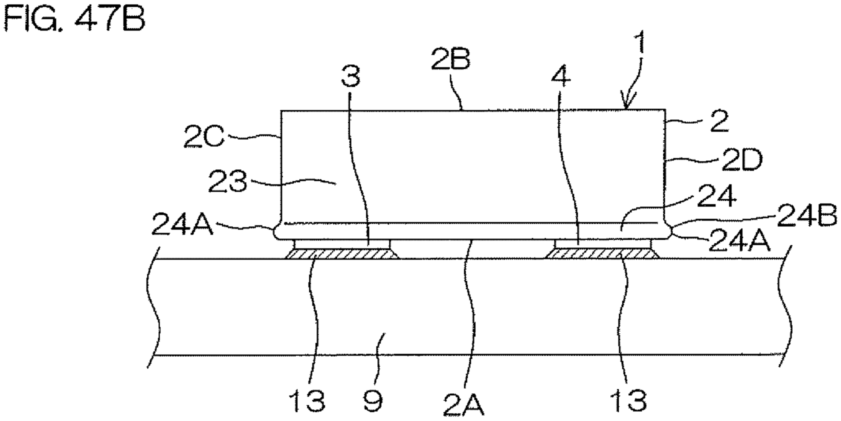
FIG. 47B is a schematic side view of a state where the electronic device is mounted on a circuit substrate.

FIG. 47A is a schematic perspective view for describing the arrangement of an electronic device according to a preferred embodiment of the third reference example and FIG. 47B is a schematic side view of a state where the electronic device is mounted on a circuit substrate. The electronic device 1 is a minute chip part and, as shown in FIG. 47A, has a rectangular parallelepiped shape. In regard to the dimensions of the electronic device 1, the length L in the long side direction is approximately 0.3 mm, the width W in the short side direction is approximately 0.15 mm, and the thickness T is approximately 0.1 mm.

The electronic device 1 is obtained by forming several electronic devices 1 in a lattice on a wafer and then cutting the wafer to separate it into the individual electronic devices 1. The electronic device 1 mainly includes a substrate 2, a first connection electrode 3 and a second connection electrode 4 that are to be external connection electrodes, and an element 5. The first connection electrode 3, the second connection electrode 4, and the element 5 are formed on the substrate 2 by using, for example, a semiconductor manufacturing process. A semiconductor substrate (semiconductor wafer), such as a silicon substrate (silicon wafer), etc., may thus be used as the substrate 2. The substrate 2 may also be another type of substrate, such as an insulating substrate, etc.

The substrate 2 has a substantially rectangular parallelepiped chip shape. With the substrate 2, the upper surface in FIG. 47A is an element forming surface 2A. The element forming surface 2A is the top surface of the substrate 2 and has a substantially rectangular shape. The surface at the opposite side of the element forming surface 2A in the thickness direction of the substrate 2 is a rear surface 2B. The element forming surface 2A and the rear surface 2B are substantially the same in shape. Besides the element forming surface 2A and the rear surface 2B, the substrate 2 has a side surface 2C, a side surface 2D, a side surface 2E, and a side surface 2F that extend orthogonally with respect to these surfaces.

The side surface 2C is constructed between edges at one end in the long direction (the edges at the front left side in FIG. 47A) of the element forming surface 2A and the rear surface 2B, and the side surface 2D is constructed between edges at the other end in the long direction (the edges at the inner right side in FIG. 47A) of the element forming surface 2A and the rear surface 2B. The side surfaces 2C and 2D are the respective end surfaces of the substrate 2 in the long direction. The side surface 2E is constructed between edges at one end in the short direction (the edges at the inner left side in FIG. 47A) of the element forming surface 2A and the rear surface 2B, and the side surface 2F is constructed between edges at the other end in the short direction (the edges at the front right side in FIG. 47A) of the element forming surface 2A and the rear surface 2B. The side surfaces 2E and 2F are the respective end surfaces of the substrate 2 in the short direction.

With the substrate 2, the element forming surface 2A, the side surface 2C, the side surface 2D, the side surface 2E, and the side surface 2F are covered by a protective film 23. Thus to be exact, the element forming surface 2A, the side surface 2C, the side surface 2D, the side surface 2E, and the side surface 2F in FIG. 47A are positioned at the inner sides (rear sides) of the protective film 23 and are not exposed to the exterior. Further, the protective film 23 on the element forming surface 2A is covered by a resin film 24. The resin film 24 protrudes from the element forming surface 2A to respective end portions at the element forming surface 2A side (upper end portions in FIG. 47A) of the side surface 2C, the side surface 2D, the side surface 2E, and the side surface 2F. The protective film 23 and the resin film 24 shall be described in detail later.

With the substrate 2, a recess 10, by which the substrate 2 is notched in the thickness direction, is formed in a portion corresponding to a side A (one of the side surfaces 2C, 2D, 2E, and 2F, and in the present case, the side surface 2C, as shall be described later) of the element forming surface 2A of substantially rectangular shape. The side A is also a side of the electronic device 1 in a plan view. The recess 10 in FIG. 47A is formed in the side surface 2C and is recessed toward the side surface 2D side while extending in the thickness direction of the substrate 2. The recess 10 penetrates through the substrate 2 in the thickness direction, and end portions of the recess 10 in the thickness direction are exposed from the element forming surface 2A and the rear surface 2B, respectively. The recess 10 is smaller than the side surface 2C in the direction of extension of the side surface 2C (the short direction). The shape of the recess 10 in a plan view of viewing the substrate 2 in the thickness direction (which is also the thickness direction of the electronic device 1) is an oblong shape (rectangular shape) that is long in the short direction. The shape of the recess 10 in the plan view may be a trapezoidal shape that becomes narrow toward the direction in which the recess 10 is recessed (toward the side surface 2D side), or may be a triangular shape that becomes thin toward the recessing direction, or may be a U-like shape (a shape recessed in the shape of the letter U). In any case, the recess 10 can be formed easily as long as it has such a simple shape. Although the recess 10 is formed in the side surface 2C here, it may be formed in at least one of the side surface 2C to 2F instead of being formed in the side surface 2C.

The recess 10 indicates the orientation (chip direction) of the electronic device 1 when the electronic device 1 is mounted on a circuit substrate 9 (see FIG. 47B). The outline of the electronic device 1 (to be accurate, the substrate 2) in a plan view is a rectangle having the recess 10 at one side A and is therefore an asymmetrical outer shape in the long direction. That is, the asymmetrical outer shape has the recess 10 indicating the chip direction at a side (side A) among the side surfaces 2C, 2D, 2E, and 2F, and with the electronic device 1, that the recess side in the long direction is the chip direction is indicated by the asymmetrical outer shape. The chip direction of the electronic device 1 can thus be recognized by simply making the outer shape of the substrate 2 of the electronic device 1 asymmetrical in a plan view. That is, the chip direction can be recognized by the outer shape of the electronic device 1 even without a marking step. In particular, the asymmetrical outer shape of the electronic device 1 is a rectangle having the recess 10, indicating the chip direction, at the side A, and the recess 10 side in the long direction joining the side A and a side B at the opposite side can thus be made the chip direction with the electronic device 1. Therefore, for example, by enabling the electronic device 1 to be mounted correctly on the circuit substrate 9 when the side A is positioned at the left end when the long direction of the electronic device 1 in a plan view is matched with the right/left direction, that the orientation of the electronic device 1 must be set so that the side A is positioned at the left end in a plan view in the mounting process can be ascertained from the outer appearance of the electronic device 1 by the recess 10.

With the rectangular parallelepiped substrate 2, corner portions 11 that form the boundaries between mutually adjacent side surfaces (the portions 11 of intersection of the mutually adjacent side surfaces) among the side surface 2C, side surface 2D, side surface 2E, and side surface 2F are shaped (rounded) to chamfered round shapes. Also with the substrate 2, corner portions 12 that form the boundaries between the recess 10 and the side surface 2C in the periphery of the recess 10 (the corner portions 12 at the recess 10C in the side surface 2C) are also shaped to chamfered round shapes. Here, the corner portions 12 are present not only at the boundaries of the recess 10 and the side surface 2C at the periphery of the recess 10 (portions besides the recess 10) but are also present at the innermost sides of the recess 10 and are thus present at four locations in a plan view.

All of the bent portions (corner portions 11 and 12) of the outline of the substrate 2 in a plan view thus have round shapes. The occurrence of chipping can thus be prevented at the corner portions 11 and 12 of the round shapes. Improvement of yield (improvement of productivity) can thereby be achieved in the manufacture of the electronic device 1. The first connection electrode 3 and the second connection electrode 4 are formed on the element forming surface 2A of the substrate 2 and are partially exposed from the resin film 24. Each of the first connection electrode 3 and the second connection electrode 4 is formed by laminating, for example, Ni (nickel), Pd (palladium), and Au (gold) in that order on the element forming surface 2A. The first connection electrode 3 and the second connection electrode 4 are disposed across an interval in the long direction of the element forming surface 2A and are long in the short direction of the element forming surface 2A. In FIG. 47A, the first connection electrode 3 is provided at a position of the element forming surface 2A close to the side surface 2C and the second connection electrode 4 is provided at a position close to the side surface 2D. The recess 10 in the side surface 2C is recessed to a depth that does not interfere with the first connection electrode 3. However, depending on the case, the first connection electrode 3 may also be provided with a recess (that becomes a portion of the recess 10) in accordance with the recess 10.

The element 5 is a circuit element, is formed in a region of the element forming surface 2A of the substrate 2 between the first connection electrode 3 and the second connection electrode 4, and is covered from above by the protective film 23 and the resin film 24. The element 5 of the present preferred embodiment is a resistor 56 arranged by a circuit network in which a plurality of thin-film-like resistor bodies (thin film resistor bodies) R, made of TiN (titanium nitride) or TiON (titanium oxide nitride), are arrayed in a matrix on the element forming surface 2A. The element 5 is connected to wiring films 22, to be described below, and is connected to the first connection electrode 3 and the second connection electrode 4 via the wiring films 22. A resistor circuit is thus formed by the element 5 between the first connection electrode 3 and the second connection electrode 4 in the electronic device 1. Therefore in the present preferred embodiment, the electronic device 1 is a chip resistor.

The electronic device 1 can be flip-chip connected to the circuit substrate 9 by making the first connection electrode 3 and the second connection electrode 4 face the circuit substrate 9 and electrically and mechanically connecting the electrodes to circuits (not shown) of the circuit substrate 9 by solders 13 as shown in FIG. 47B. The first connection electrode 3 and the second connection electrode 4 that function as the external connection electrodes are preferably formed of gold (Au) or has gold plating applied on the surfaces thereof to improve solder wettability and improve reliability.

Figure 48:
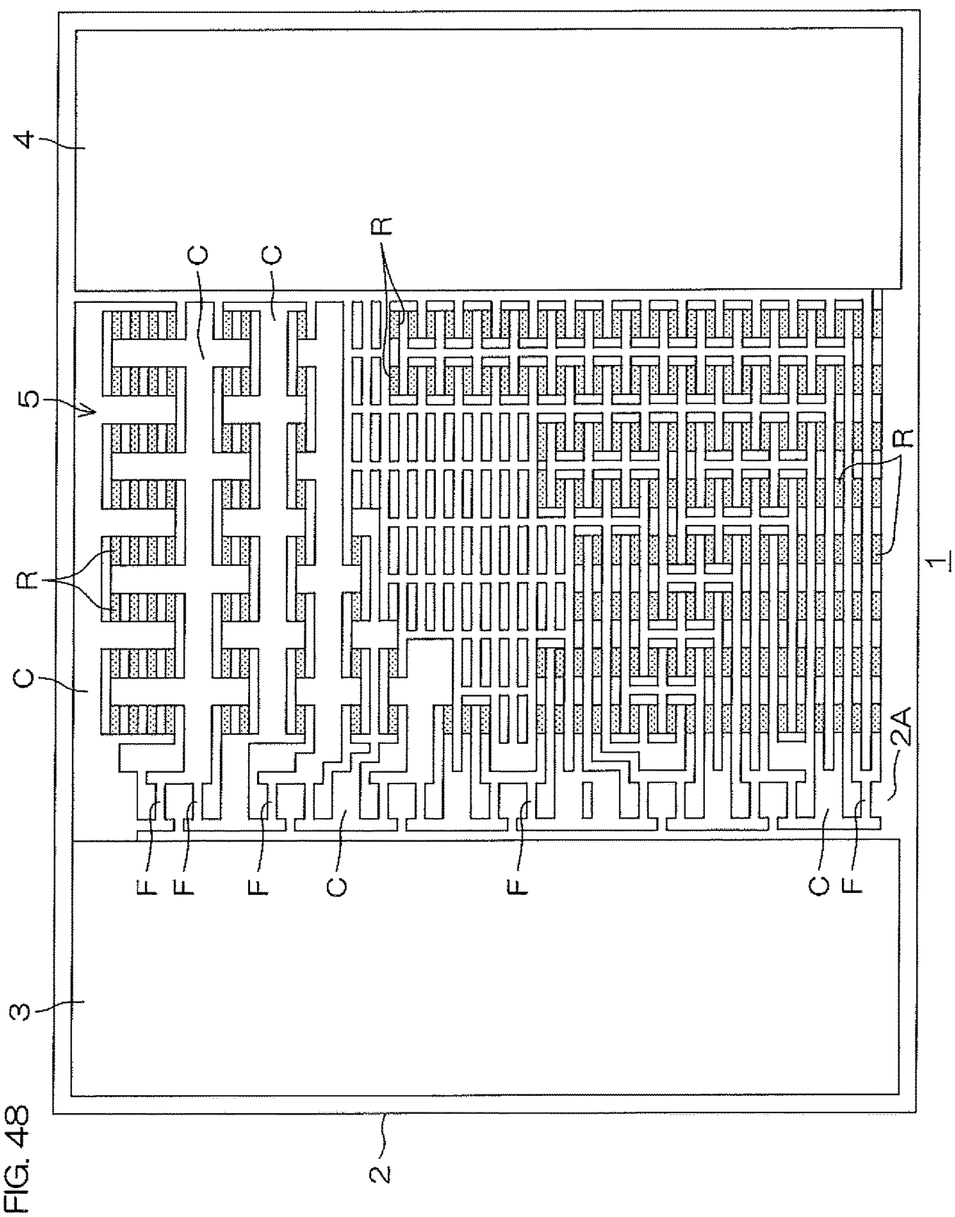
FIG. 48 is a plan view of the electronic device showing the positional relationships of a first connection electrode, a second connection electrode, and an element and showing the arrangement in a plan view of the element.

FIG. 48 is a plan view of the electronic device and shows the positional relationships of the first connection electrode, the second connection electrode, and the element and shows the arrangement in a plan view of the element. With reference to FIG. 48, the element 5 that is a resistor network has, for example, a total of 352 resistor bodies R arranged from 8 resistor bodies R being arrayed along the row direction (length direction of the substrate 2) and 44 resistor bodies R being arrayed along the column direction (width direction of the substrate 2). The respective resistor bodies R have an equal resistance value.

The plurality of resistor bodies R are electrically connected in groups of predetermined numbers of 1 to 64 to form a plurality of types of resistance units (unit resistors). The plurality of types of resistance units thus formed are connected in predetermined modes via connection conductor films C. Further, on the element forming surface 2A of the substrate 2, a plurality of fuse films F are provided that electrically incorporate resistance units into the element 5 or are capable of being fused to electrically separate resistance units from the element 5. The plurality of fuse films F and the connection conductor films C are arrayed along the inner side of the second connection electrode 4 so that the positioning regions thereof are rectilinear. More specifically, the plurality of fuse films F and the connection conductor films C are disposed rectilinearly.

Figure 49A:
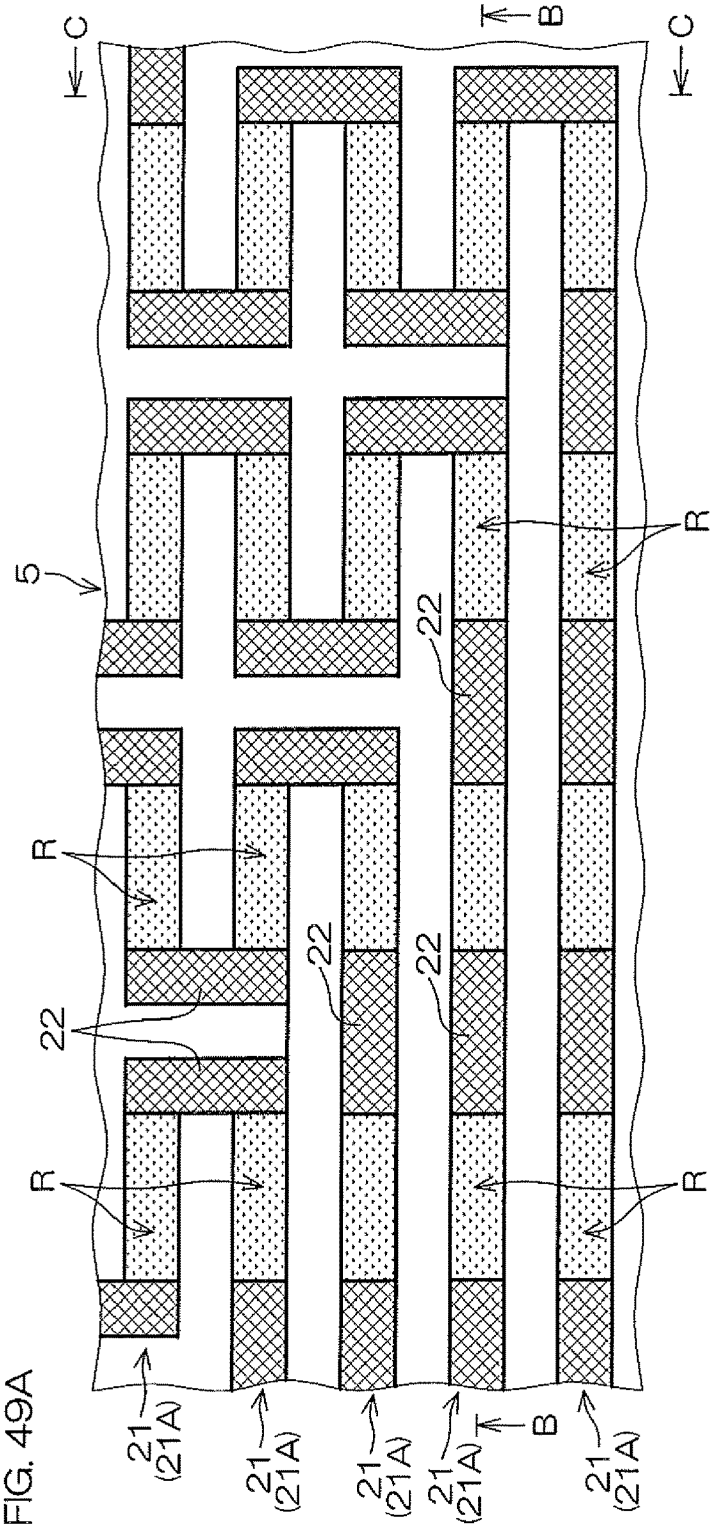
FIG. 49A is partially enlarged plan view of the element shown in FIG. 48.
Figure 49B:
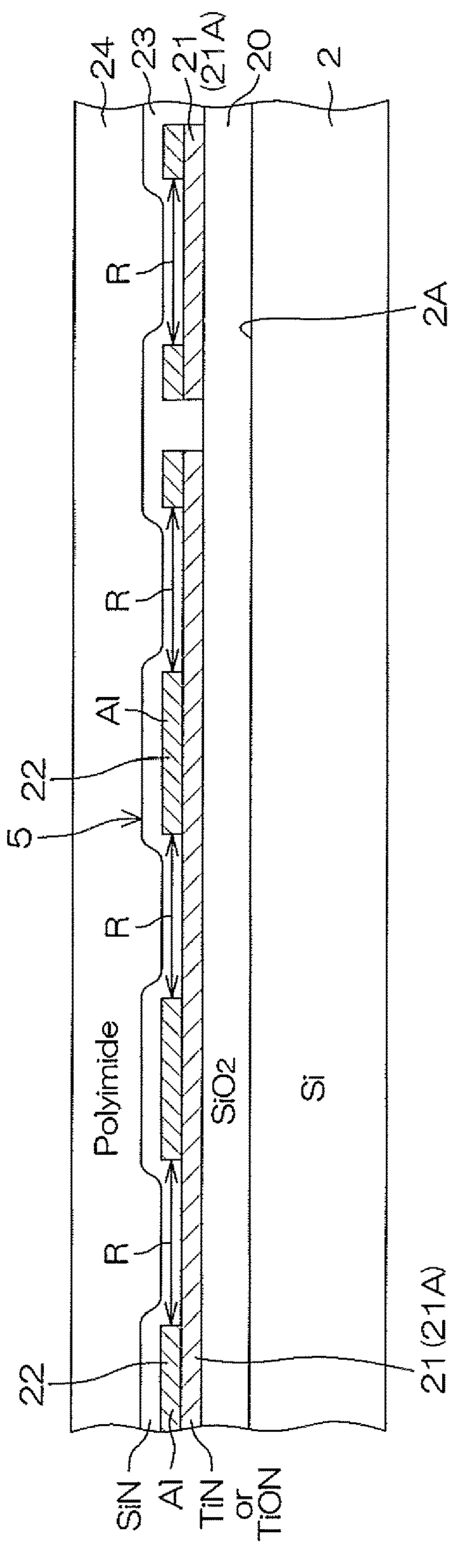
FIG. 49B is a vertical sectional view in the length direction taken along B-B of FIG. 49A for describing the arrangement of resistor bodies in the element.
Figure 49C:
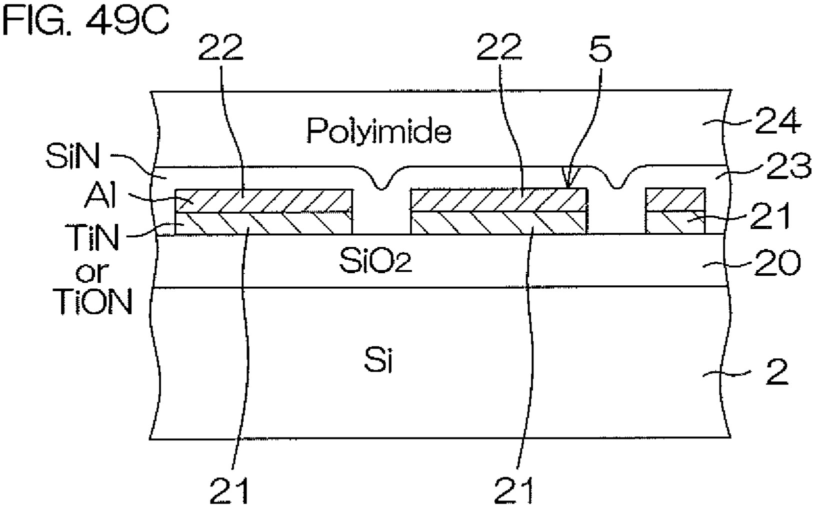
FIG. 49C is a vertical sectional view in the width direction taken along C-C of FIG. 49A for describing the arrangement of the resistor bodies in the element.

FIG. 49A is partially enlarged plan view of the element shown in FIG. 48. FIG. 49B is a vertical sectional view in the length direction taken along B-B of FIG. 49A for describing the arrangement of resistor bodies in the element. FIG. 49C is a vertical sectional view in the width direction taken along C-C of FIG. 49A for describing the arrangement of the resistor bodies in the element. The arrangement of the resistor bodies R shall now be described with reference to FIG. 49A, FIG. 49B, and FIG. 49C.

Besides the wiring films 22, the protective film 23, and the resin film 24, the electronic device 1 further includes an insulating film 20 and resistor body films 21 (see FIG. 49B and FIG. 49C). The insulating film 20, the resistor body films 21, the wiring films 22, the protective film 23, and the resin film 24 are formed on the substrate 2 (element forming surface 2A). The insulating film 20 is made of $SiO_2$ (silicon oxide). The insulating film 20 covers the entirety of the element forming surface 2A of the substrate 2. The thickness of the insulating film 20 is approximately 10000 Å.

The resistor body films 21 make up the resistor bodies R. The resistor body films 21 are formed of TiN or TiON and are laminated on the top surface of the insulating film 20. The thickness of each resistor body film 21 is approximately 2000 Å. The resistor body films 21 form a plurality of lines (hereinafter referred to as "resistor body film lines 21A") extending as lines between the first connection electrode 3 and the second connection electrode 4, and there are cases where a resistor body film line 21A is cut at predetermined positions in the line direction (see FIG. 49A).

Figure 50A:
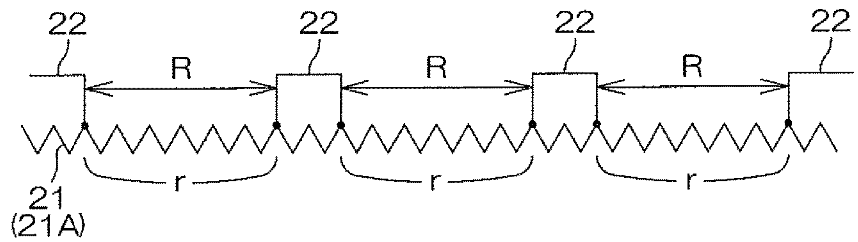
FIG. 50A is a diagram showing the electrical features of resistor body film lines and conductor films in the form of circuit symbols and an electric circuit diagram.

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A while being spaced apart by fixed intervals R in the line direction. The electrical features of the resistor body film lines 21A and the wiring films 22 are indicated in the form of circuit symbols in FIGS. 50A, 50B, and 50C. That is, as shown in FIG. 50A, each of the resistor body film line 21A portions in regions of the predetermined interval R forms a resistor body R with a fixed resistance value r.

Figure 50B:
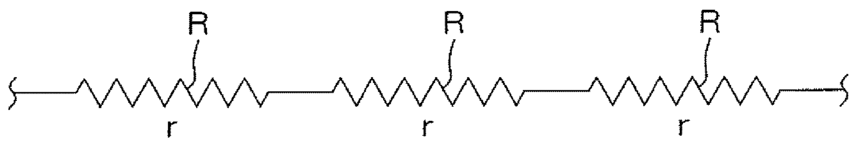
FIG. 50B is a diagram showing the electrical features of resistor body film lines and conductor films in the form of circuit symbols and an electric circuit diagram.
Figure 50C:
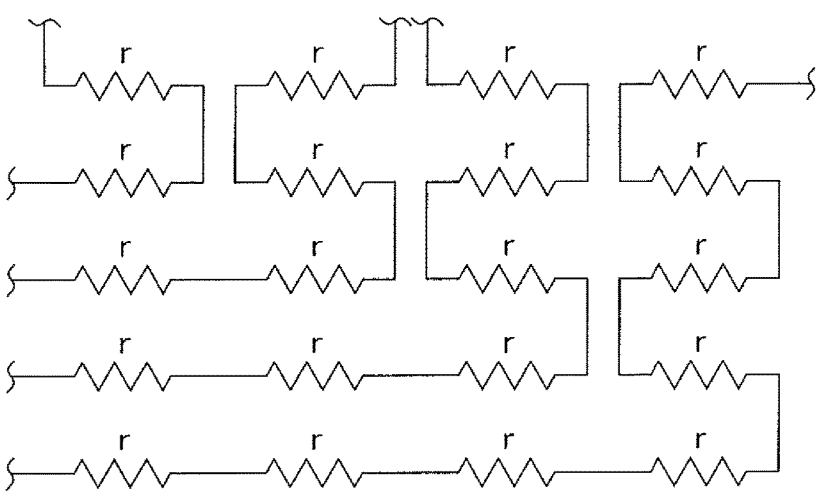
FIG. 50C is a diagram showing the electrical features of resistor body film lines and conductor films in the form of circuit symbols and an electric circuit diagram.

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 50B. Also, adjacent resistor body film lines 21A are connected to each other by the resistor body films 21 and wiring films 22, and the resistor network of the element 5 shown in FIG. 49A forms the resistor circuit (made up of the unit resistors of resistor bodies R) shown in FIG. 50C.

Here, based on the characteristic that resistor body films 21 of the same shape with the same size that are formed on the substrate 2 are substantially the same in value, the plurality of resistor bodies R arrayed in a matrix on the substrate 2 have an equal resistance value. Also, the wiring films 22 laminated on the resistor body film lines 21A form the resistor bodies R and also serve the role of connection wiring films that connect a plurality of resistor bodies R to arrange a resistance unit.

Figures 51A, 51B:
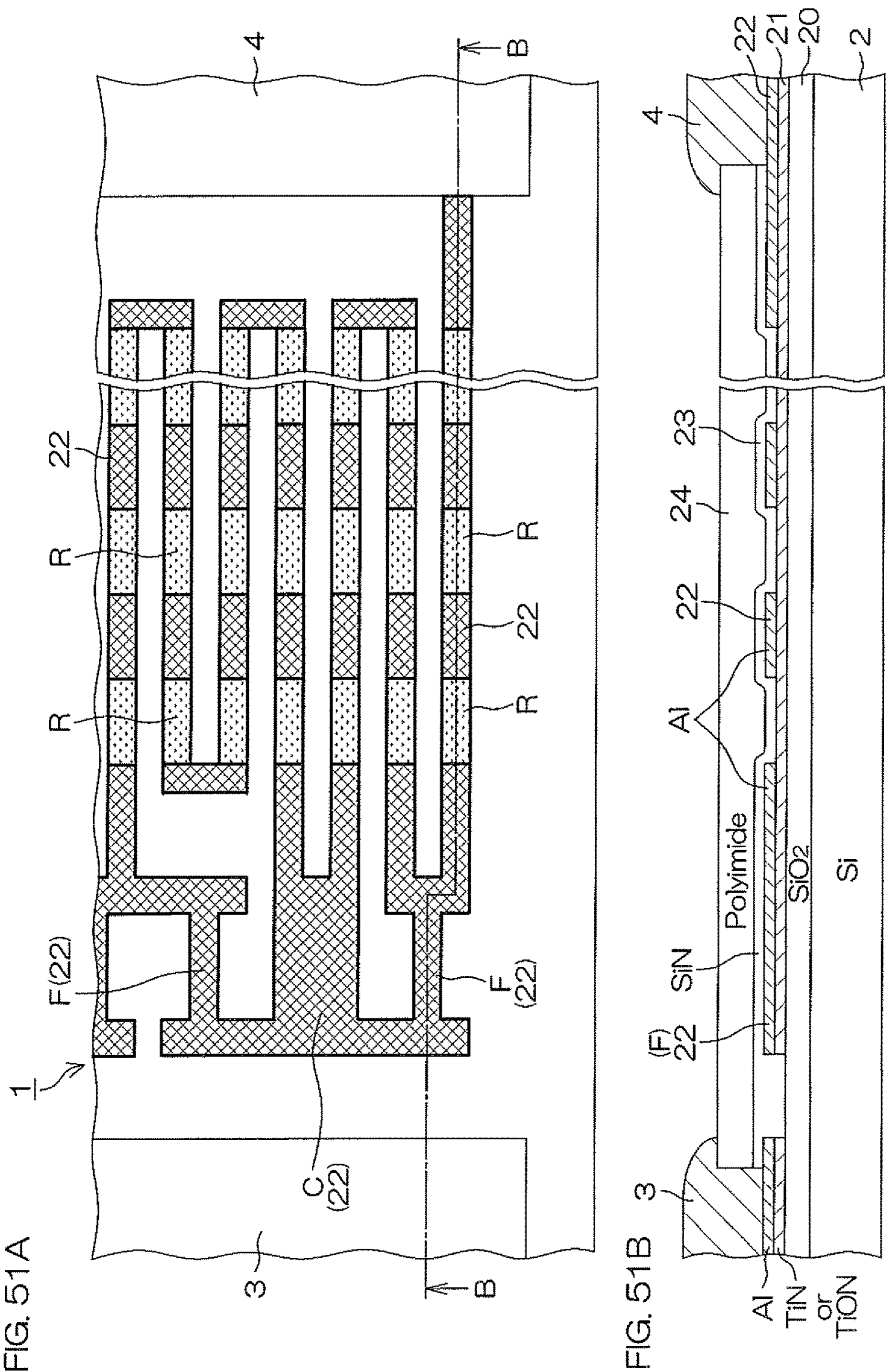
FIG. 51A is a partially enlarged plan view of a region including fuse films drawn by enlarging a portion of the plan view of the electronic device shown in FIG. 48.
FIG. 51B is a structural sectional view taken along B-B in FIG. 51A.

FIG. 51A is partially enlarged plan view of a region including the fuse films drawn by enlarging a portion of the plan view of the electronic device shown in FIG. 48, and FIG. 51B is a structural sectional view taken along B-B in FIG. 51A. As shown in FIGS. 51A and 51B, the fuse films F and the connection conductor films C are also formed by the wiring films 22, which are laminated on the resistor body films 21 that form the resistor bodies R. That is, the fuse films F and the connection conductor films C are formed of Al or AlCu alloy, which is the same metal material as that of the wiring films 22, on the same layer as the wiring films 22, which are laminated on the resistor body film lines 21A that form the resistor bodies R.

That is, on the same layer laminated on the resistor body films 21, the wiring films for forming the resistor bodies R, the fuse films F, the connection conductor films C, and the wiring films for connecting the element 5 to the first connection electrode 3 and the second connection electrode 4 are formed as the wiring films 22 by the same manufacturing process (the sputtering and photolithography process to be described below) using the same metal material (Al or AlCu alloy).

The fuse film F may refer not only to a portion of the wiring films 22 but may also refer to an assembly (fuse element) of a portion of a resistor body R (resistor body film 21) and a portion of the wiring film 22 on the resistor body film 21. Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

Figure 52:
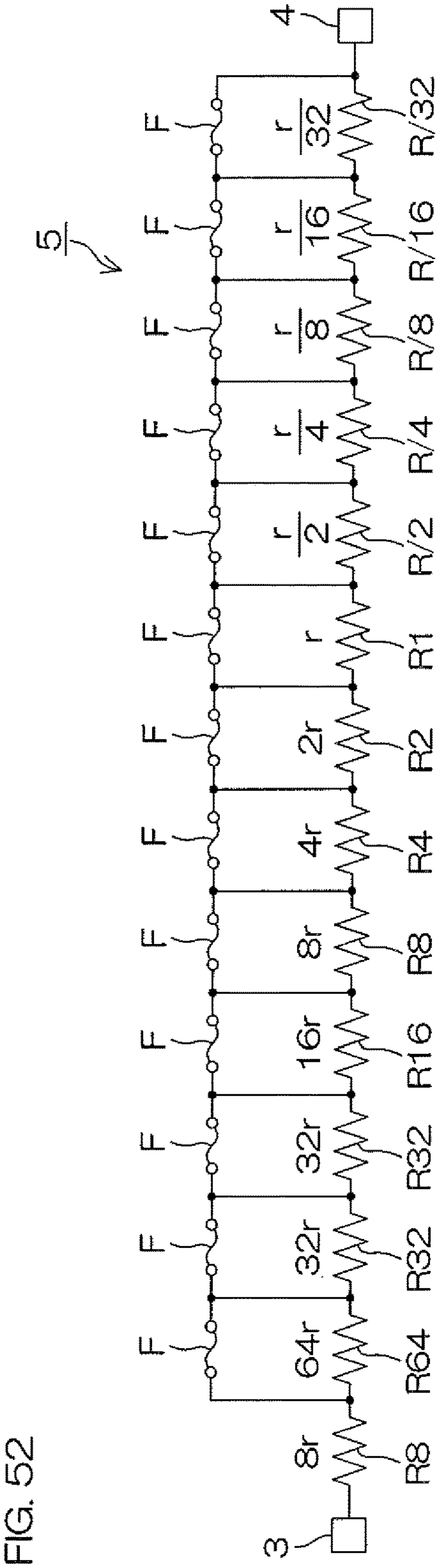
FIG. 52 is an electric circuit diagram of the element according to the preferred embodiment of the third reference example.

FIG. 52 is an electric circuit diagram of the element according to the preferred embodiment of the third reference example. Referring to FIG. 52, the element 5 is arranged by serially connecting a reference resistance unit R8, a resistance unit R64, two resistance units R32, a resistance unit R16, a resistance unit R8, a resistance unit R4, a resistance unit R2, a resistance unit R1, a resistance unit R/2, a resistance unit R/4, a resistance unit R/8, a resistance unit R/16, and a resistance unit R/32 in that order from the first connection electrode 3. Each of the reference resistance unit R8 and resistance units R64 to R2 is arranged by serially connecting the same number of resistor bodies R as the number at the end of its symbol ("64" in the case of R64). The resistance unit R1 is arranged from a single resistor body R. Each of the resistance units R/2 to R/32 is arranged by connecting the same number of resistor bodies R as the number at the end of its symbol ("32" in the case of R/32) in parallel. The meaning of the number at the end of the symbol of the resistance unit is the same in FIG. 53 and FIG. 54 to be described below.

One fuse film F is connected in parallel to each of the resistance unit R64 to resistance unit R/32, besides the reference resistance unit R8. The fuse films F are mutually connected in series directly or via the connection conductor film C (see FIG. 51A). In a state where none of the fuse films F is fused as shown in FIG. 52, the element 5 forms a resistor circuit of the reference resistance unit R8 (resistance value: 8r), formed by the serial connection of the 8 resistor bodies R provided between the first connection electrode 3 and the second connection electrode 4. For example, if the resistance value r of a single resistor body R is r=80Ω, the chip resistor (electronic device 1) is arranged with the first connection electrode 3 and the second connection electrode 4 being connected by a resistor circuit of 8r=64Ω.

Also in the state where none of the fuse films F is fused, the plurality of types of resistance units besides the reference resistance unit R8 are put in short-circuited states. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the element 5.

With the electronic device 1 according to the present preferred embodiment, a fuse film F is selectively fused, for example, by laser light in accordance with the required resistance value. The resistance unit with which the fuse film F connected in parallel is fused is thereby incorporated into the element 5. The overall resistance value of the element 5 can thus be set to the resistance value resulting from serially connecting and incorporating the resistance units corresponding to the fused fuse films F.

In particular, the plurality of types of resistance units include the plurality of types of serial resistance units, with which the resistor bodies R having the equal resistance value are connected in series with the number of resistor bodies R being increased in geometric progression as 1, 2, 4, 8, 16, 32, . . . , and the plurality of types of parallel resistance units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the element 5 (resistor 56) as a whole can be adjusted finely and digitally to an arbitrary resistance value to enable a resistance of a desired value to be formed in the electronic device 1.

Figure 53:
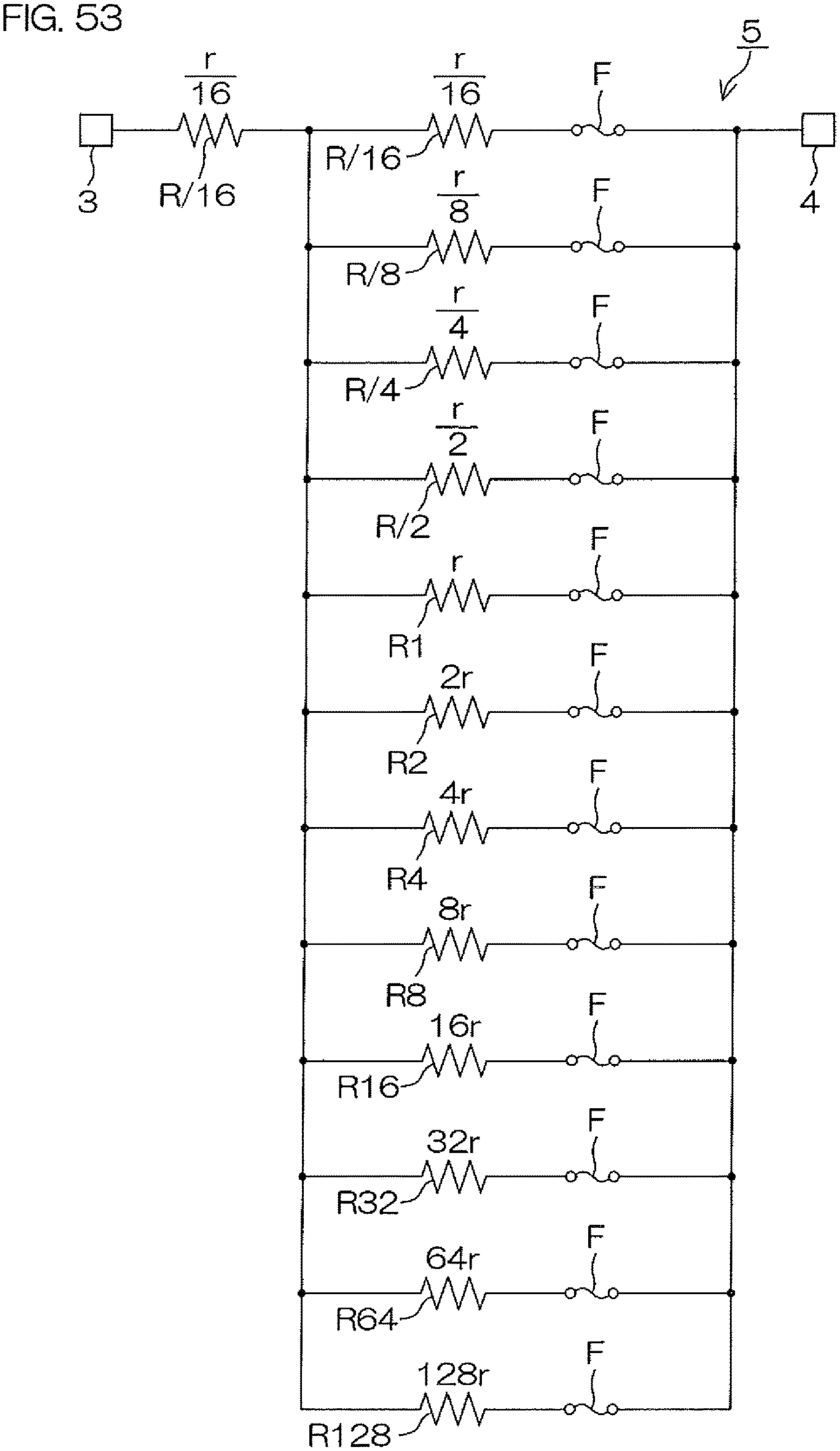
FIG. 53 is an electric circuit diagram of an element according to another preferred embodiment of the third reference example.

FIG. 53 is an electric circuit diagram of an element according to another preferred embodiment of the third reference example. Instead of arranging the element 5 by serially connecting the reference resistance unit R8 and the resistance unit R64 to the resistance unit R/32 as described above, the element 5 may be arranged as shown in FIG. 53. To be detailed, the element 5 may be arranged, between the first connection electrode 3 and the second connection electrode 4, as a serial connection circuit of the reference resistance unit R/16 and the parallel connection circuit of the 12 types of resistance units R/16, R/8, R/4, R/2, R1, R2, R4, R8, R16, R32, R64, and R128.

In this case, a fuse film F is serially connected to each of the 12 types of resistance units besides the reference resistance unit R/16. In a state where none of the fuse films F is fused, the respective resistance units are electrically incorporated in the element 5. By selectively fusing a fuse film F, for example, by laser light in accordance with the required resistance value, the resistance unit corresponding to the fused fuse film F (the resistance unit connected in series to the fuse film F) is electrically separated from the element 5 and the resistance value of the electronic device 1 as a whole can thereby be adjusted.

Figure 54:
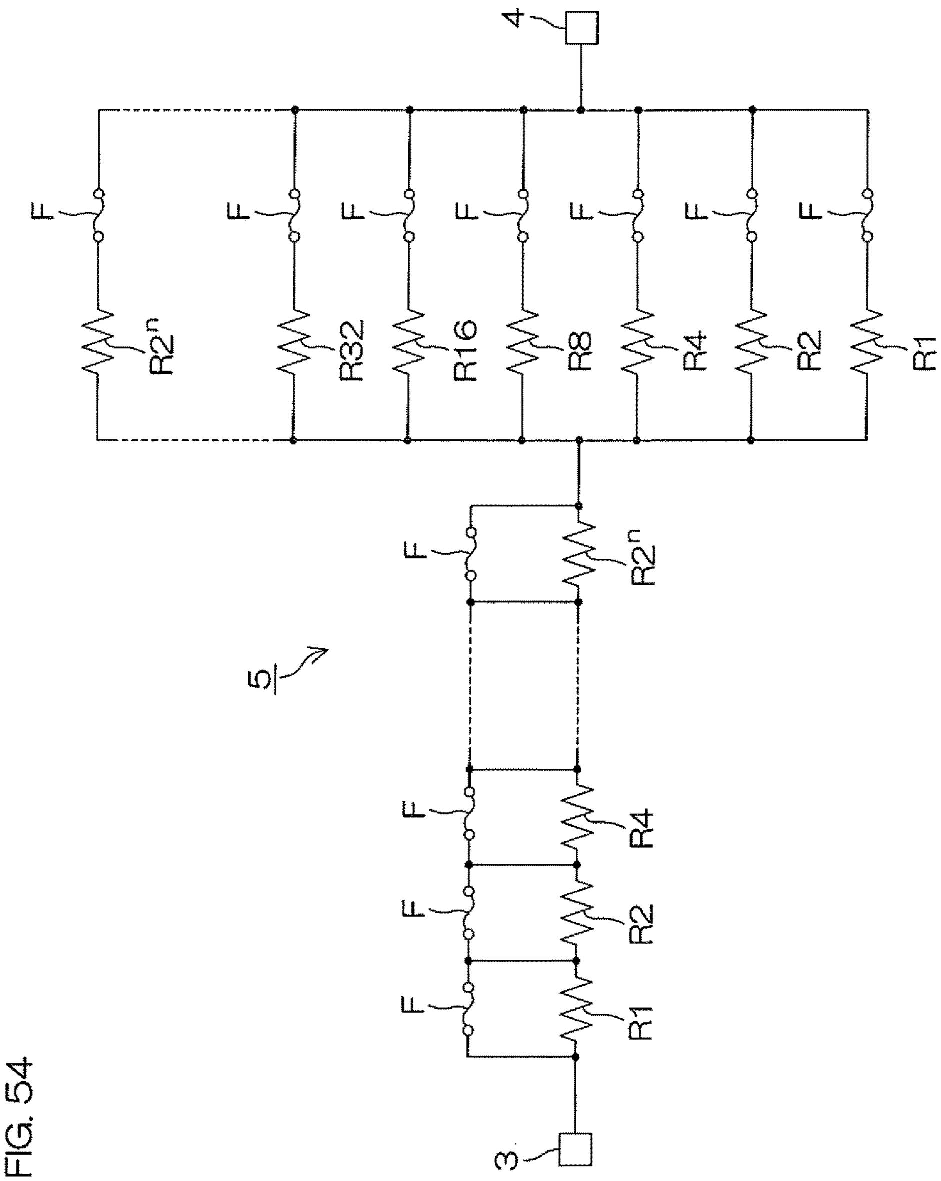
FIG. 54 is an electric circuit diagram of an element according to yet another preferred embodiment of the third reference example.

FIG. 54 is an electric circuit diagram of an element according to yet another preferred embodiment of the third reference example. A feature of the element 5 shown in FIG. 54 is that it has the circuit arrangement where a serial connection of a plurality of types of resistance units and a parallel connection of a plurality of types of resistance units are connected in series. As in a previous preferred embodiment, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fused fuse film F is electrically incorporated into the element 5.

On the other hand, a fuse film F is connected in series to each of the plurality of types of resistance units that are connected in parallel. Therefore by fusing a fuse film F, the resistance unit connected in series to the fused fuse film F can be electrically disconnected from the parallel connection of resistance units. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

Figure 55:
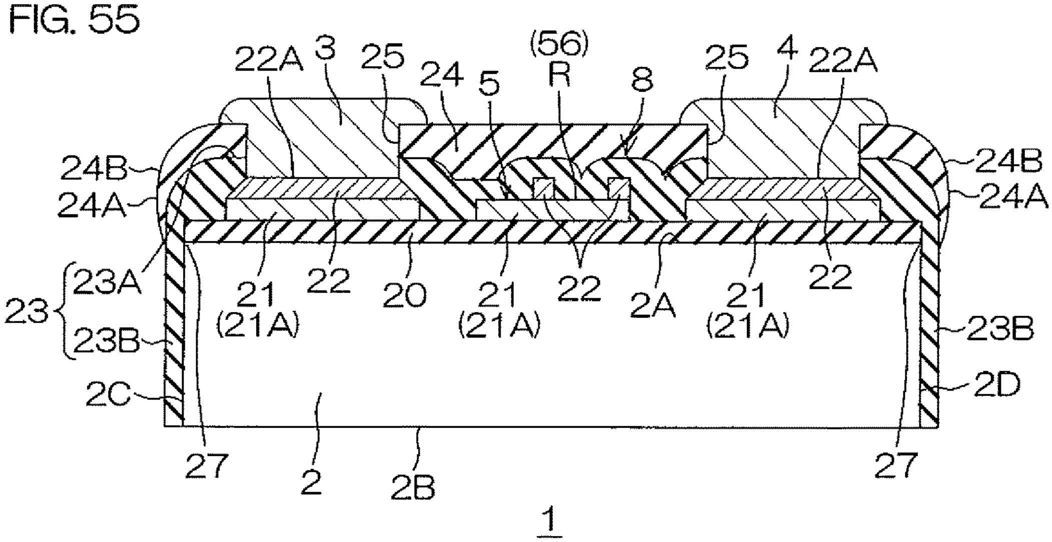
FIG. 55 is a schematic sectional view of the electronic device.

FIG. 55 is a schematic sectional view of the electronic device. The electronic device 1 shall now be described in further detail with reference to FIG. 55. For the sake of description, the element 5 is illustrated in a simplified form and hatching is applied to respective elements besides the substrate 2 in FIG. 55. Here, the protective film 23 and the resin film 24 shall be described.

The protective film 23 is made, for example, from SiN (silicon nitride) and the thickness thereof is approximately 3000 Å. The protective film 23 integrally includes an element covering portion 23A, provided across the entirety of the element forming surface 2A and covering the resistor body films 21 and the respective wiring films 22 on the resistor body films 21 (that is, the element 5) from the top surface (upper side in FIG. 55) (that is, covering the upper surfaces of the respective resistor bodies R in the element 5), and a side surface covering portion 23B, covering the respective entireties of the four side surfaces 2C to 2F (see FIG. 47A) of the substrate 2. The element covering portion 23A and the side surface covering portion 23B are actually substantially the same in thickness and are mutually continuous. Therefore, as a whole, the protective film 23 covers the upper surfaces of the resistor bodies R and the side surfaces 2C to 2F of the substrate 2 continuously with substantially the same thickness.

Short-circuiting across the resistor bodies R (short-circuiting across adjacent resistor body film lines 21A) at portions besides the wiring films 22 is prevented by the element covering portion 23A. The side surface covering portion 23B not only covers the respective entireties of the side surfaces 2C to 2F but also covers portions of the insulating film 20 that are exposed to the side surfaces 2C to 2F. At the side surface 2C, the side surface covering portion 23B covers the entirety including the portion at which the recess 10 is formed (see FIG. 47A). Short-circuiting at the respective side surfaces 2C to 2F (forming of a short circuit path at any of the side surfaces) is prevented by the side surface covering portion 23B.

Referring to FIG. 47A, the protective film 23 continuously covers the element forming surface 2A and the four side surfaces 2C to 2F of the substrate 2 and therefore has corner portions 26 of round shapes along the corner portions 11 and 12 of the substrate 2. In this case, the element 5 and the wiring films 22 can be protected by the protective film 23 and occurrence of chipping at the corner portions 26 of the protective film 23 can be prevented.

Returning to FIG. 55, the resin film 24, together with the protective film 23, protects the electronic device 1 and is made of a resin, such as polyimide, etc. The thickness of the resin film 24 is approximately 5 μm. The resin film 24 covers the top surface of the element covering portion 23A (upper surface of the protective film 23) across its entirety and covers end portions at the element forming surface 2A side (upper end portions in FIG. 55) of the side surface covering portion 23B on the four side surfaces 2C to 2F of the substrate 2. That is, with the side surface covering portion 23B on the four side surfaces 2C to 2F, at least a portion at the side (lower side in FIG. 55) opposite to the element forming surface 2A is left exposed from the resin film 24.

With such a resin film 24, the portion coinciding with the four side surfaces 2C to 2F in a plan view is an arcuate overhanging portion 24A that overhangs further to the sides (outward) than the side surface covering portion 23B on the side surfaces. That is, the resin film 24 (overhanging portion 24A) protrudes beyond the side surface covering portion 23B (protective film 23) at the side surfaces 2C to 2F. Such a resin film 24 has side surfaces 24B of round shapes that project to the sides at the arcuate overhanging portion 24A. The overhanging portion 24A covers corner portions 27 forming the boundaries between the element forming surface 2A and the respective side surfaces 2C to 2F. Therefore, when the electronic device 1 contacts an object in the surroundings, the overhanging portion 24A contacts the object in the surroundings first and relaxes the impact due to the contact to prevent the impact from being applied to the element 5, etc., and prevent chipping at the corner portions 27. In particular, the overhanging portion 24A has side surfaces 24B with round shapes and can thus relax the impact due to contact smoothly.

An arrangement where the resin film 24 does not cover the side surface covering portion 23B at all (an arrangement where the entire side surface covering portion 23B is exposed) is also possible. In the resin film 24, openings 25 are formed, one at each of two positions that are separated in a plan view. Each opening 25 is a penetrating hole penetrating continuously through each of the resin film 24 and the protective film 23 (element covering portion 23A) in the thickness direction. The openings 25 are thus formed not only in the resin film 24 but also in the protective film 23. Portions of wiring films 22 are exposed at the respective openings 25. The portions of the wiring films 22 exposed at the respective openings 25 are pad regions 22A for external connection.

Of the two openings 25, one opening 25 is completely filled by the first connection electrode 3 and the other opening 25 is completely filled by the second connection electrode 4. A portion of each of the first connection electrode 3 and the second connection electrode 4 protrudes from the opening 25 at the top surface of the resin film 24. The first connection electrode 3 is electrically connected via the one opening 25 to the wiring film 22 at the pad region 22A in this opening 25. The second connection electrode 4 is electrically connected via the other opening 25 to the wiring film 22 at the pad region 22A in this opening 25. The first connection electrode 3 and the second connection electrode 4 are thereby electrically connected to the element 5. Here, the wiring films 22 form wirings that are respectively connected to groups of resistor bodies R (resistor 56) and the first connection electrode 3 and the second connection electrode 4.

The resin film 24 and the protective film 23, in which the openings 25 are formed, are thus formed so that the first connection electrode 3 and the second connection electrode 4 are exposed from the openings 25. Electrical connection between the electronic device 1 and the circuit substrate 9 can thus be achieved via the first connection electrode 3 and the second connection electrode 4 protruding from the openings 25 at the top surface of the resin film 24 (see FIG. 47B).

Figure 56A:
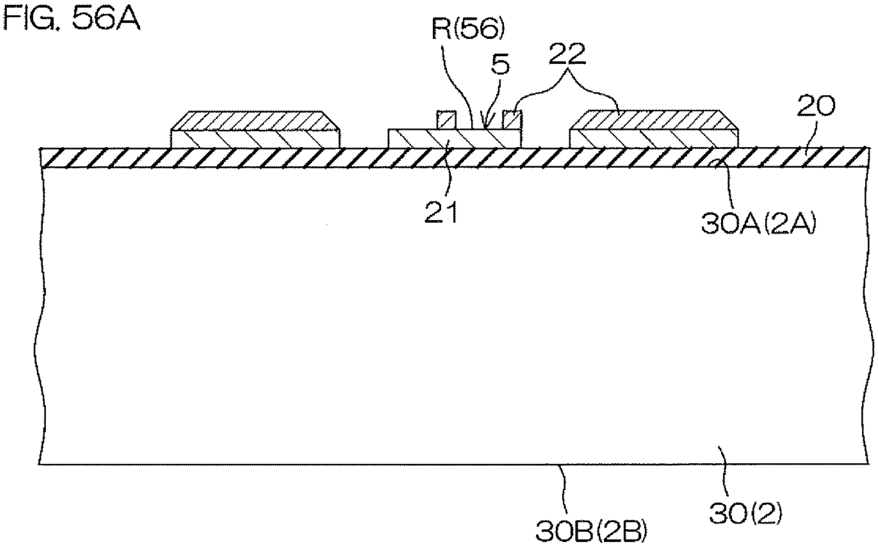
FIG. 56A is an illustrative sectional view of a method for manufacturing the electronic device shown in FIG. 55.

FIG. 56A to FIG. 56F are illustrative sectional views of a method for manufacturing the electronic device shown in FIG. 55. First, as shown in FIG. 56A, a wafer 30, made of Si, is prepared. The wafer 30 is the base for the substrate 2. A top surface 30A of the wafer 30 is thus the element forming surface 2A of the substrate 2 and a rear surface 30B of the wafer 30 is the rear surface 2B of the substrate 2.

The insulating film 20, made of $SiO_2$, etc., is then formed on the top surface 30A of the wafer 30, and the element 5 (the resistor bodies R and the wiring films 22) is formed on the insulating film 20. Specifically, first, the resistor body film 21 of TiN or TiON is formed by sputtering on the entire surface of the insulating film 20 and further, the wiring film 22 of aluminum (Al) is laminated on the resistor body film 21. Thereafter, a photolithography process is used and, for example, dry etching is performed to selectively remove the resistor body film 21 and the wiring film 22 to obtain the arrangement where, as shown in FIG. 49A, the resistor body film lines 21A of fixed width, at which the resistor body film 21 is laminated, are arrayed in the column direction while being spaced apart by fixed intervals in a plan view. Regions at which the resistor body film lines 21A and the wiring films 22 are interrupted are also formed at this point. The wiring films 22 laminated on the resistor body film lines 20 are then removed selectively. The element 5 of the arrangement where the wiring films 22 are laminated on the resistor body film lines 21A while being spaced apart by the fixed intervals R is consequently obtained.

Figure 56B:
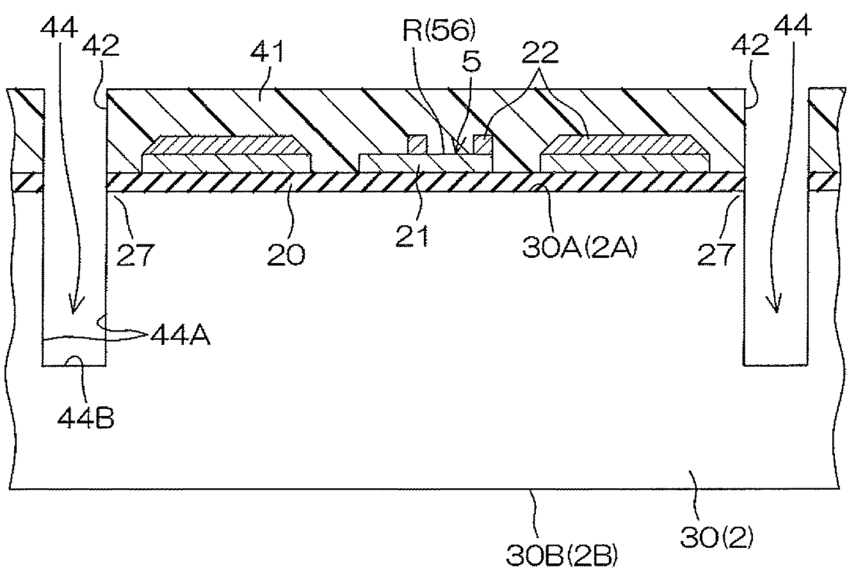
FIG. 56B is an illustrative sectional view of a step subsequent to that of FIG. 56A.

With reference to FIG. 56A, the elements 5 are formed on a plurality of locations on the top surface 30A of the wafer 30 in accordance with the number of electronic devices 1 to be formed on the single wafer 30. Then as shown in FIG. 56B, a resist pattern 41 is formed across the entirety of the top surface 30A of the wafer 30 so as to cover all of the elements 5 on the insulating film 20. An opening 42 is formed in the resist pattern 41.

Figure 57:
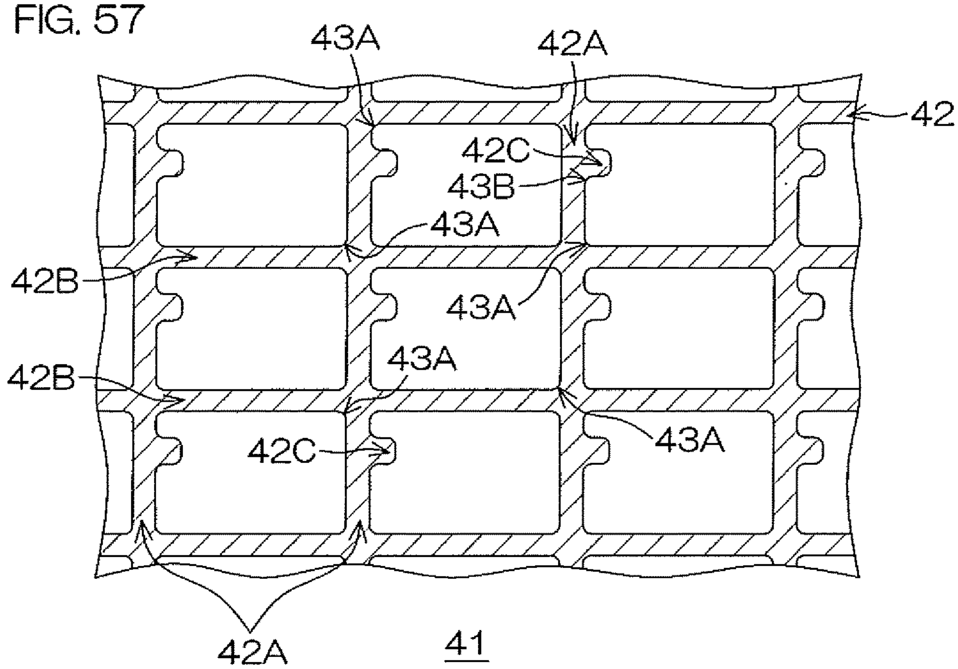
FIG. 57 is a schematic plan view of a portion of a resist pattern used for forming a groove in the step of FIG. 56B.

FIG. 57 is a schematic plan view of a portion of the resist pattern used for forming a groove in the step of FIG. 56B. The opening 42 of the resist pattern 41 coincides with regions (hatched portions in FIG. 57) between outlines of mutually adjacent electronic devices 1 in a plan view in a case where a plurality of electronic devices 1 are disposed in an array (that is also a lattice). The overall shape of the opening 42 is thus a lattice having a plurality of mutually orthogonal rectilinear portions 42A and 42B. Also, in either of the rectilinear portions 42A and 42B (the rectilinear portions 42A in the present example), projecting portions 42C, projecting orthogonally from the rectilinear portions 42A, are provided in continuous form in correspondence to the recesses 10 of the electronic devices 1 (see FIG. 47A).

Here, with each electronic device 1, the corner portions 11 and 12 have round shapes (see FIG. 47A). Accordingly, the mutually orthogonal rectilinear portions 42A and 42B in the opening 42 are curvingly connected to each other. The mutually orthogonal rectilinear portions 42A and projecting portions 42C are also curvingly connected to each other. Intersection portions 43A of the rectilinear portions 42A and 42B and intersection portions 43B of the rectilinear portions 42A and projecting portions 42C thus have round shapes with rounded corners. Also, in each projecting portion 42C, corners besides the intersection portion 43B are also rounded.

Referring to FIG. 56B, the insulating film 20 and the wafer 30 are respectively removed selectively by plasma etching using the resist pattern 41 as a mask. A groove 44, penetrating through the insulating film 20 and reaching the middle of the thickness of the wafer 30, is thereby formed at positions coinciding with the opening 42 of the resist pattern 41 in a plan view. The groove 44 has mutually facing side surfaces 44A and a bottom surface 44B joining the lower ends (ends at the rear surface 30B side of the wafer 30) of the facing side surfaces 44A. The depth of the groove 44 on the basis of the top surface 30A of the wafer 30 is approximately 100 μm and the width of the groove 44 (interval between facing side surfaces 44A) is approximately 20 μm.

Figure 58A:
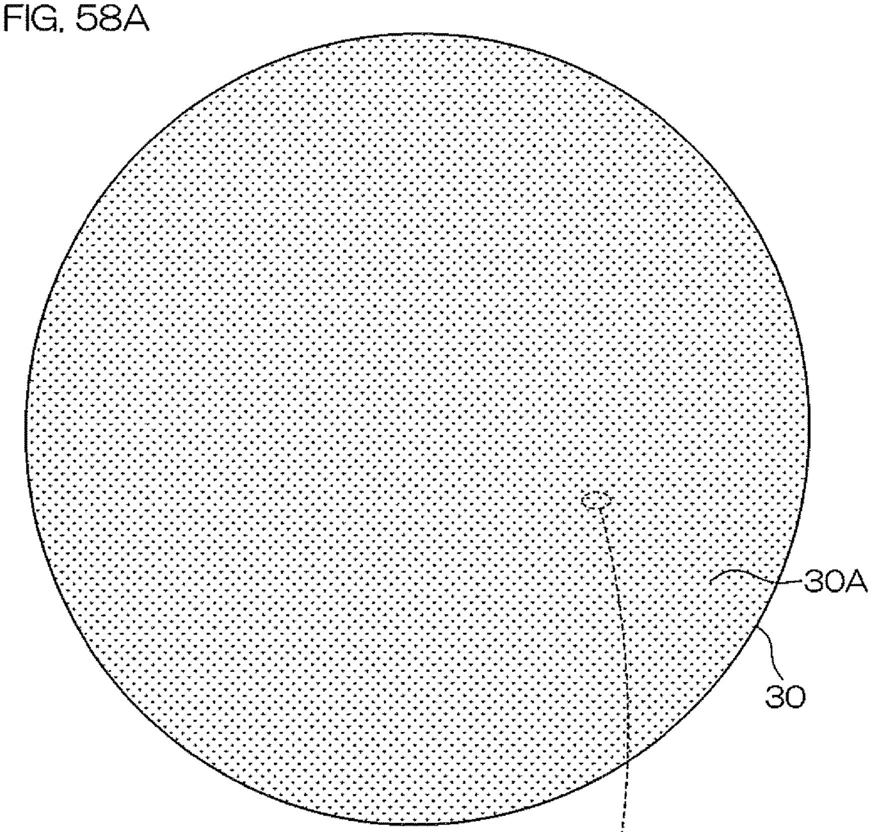
FIG. 58A is a schematic plan view of a wafer after the groove has been formed in the step of FIG. 56B.
Figure 58B:
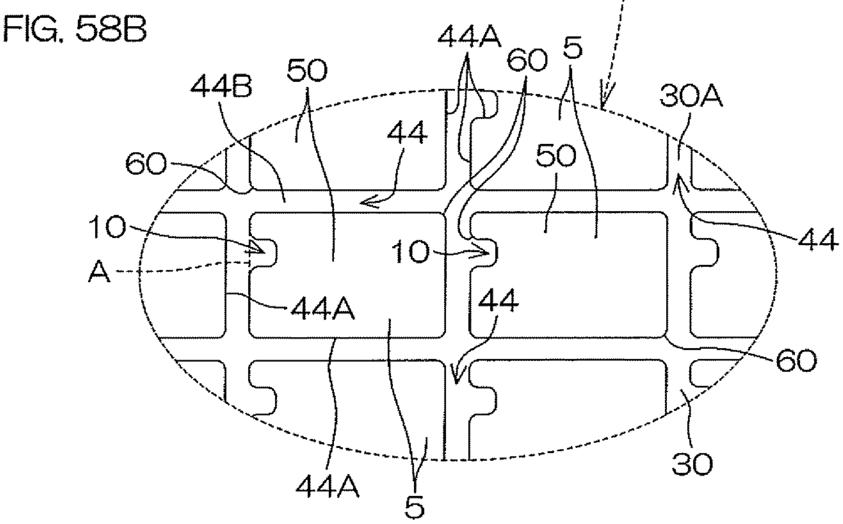
FIG. 58B is an enlarged view of a portion in FIG. 58A.

FIG. 58A is a schematic plan view of the wafer after the groove has been formed in the step of FIG. 56B, and FIG. 58B is an enlarged view of a portion in FIG. 58A. Referring to FIG. 58B, the overall shape of the groove 44 is a lattice that coincides with the opening 42 (see FIG. 57) of the resist pattern 41 in a plan view. At the top surface 30A of the wafer 30, rectangular frame portions of the groove 44 surround the regions in which the respective elements 5 are formed. In the wafer 30, each portion in which the element 5 is formed is a semi-finished product 50 of the electronic device 1. At the top surface 30A of the wafer 30, one semi-finished product 50 is positioned in each region surrounded by the groove 44, and these semi-finished products 50 are arrayed and disposed in an array.

Also, at each portion corresponding to the projecting portion 42C (see FIG. 57) in the opening 42 of the resist pattern 41, the groove 44 is formed so as to delve into a middle portion of a side A of the semi-finished product 50, and the recess 10 (see FIG. 47A) is thereby formed in the semi-finished product 50. Corner portions 60 (to become the corner portions 11 and 12 of the electronic device 1) of the semi-finished product 50 in a plan view are shaped to round shapes in accordance with the intersection portions 43A and 43B (see FIG. 57) with round shapes in the opening 42 of the resist pattern 41. Although these round shapes are formed by using a plasma etch, a silicon etch (an ordinary etch using a chemical solution) may be used in place of the plasma etch.

By thus etching the wafer 30, the outer shape of the semi-finished product 50 (in other words, the electronic device 1 in its final form) can be set to any shape and can be set, as in the present preferred embodiment, to an asymmetrical rectangle with corner portions 60 (corner portions 11 and 12) with round shapes and having the recess 10 at the side A (see also FIG. 47A). In this case, the electronic device 1, with which the chip direction can be recognized, can be manufactured without a marking step (a step of marking a mark, etc., indicating the chip direction by a laser, etc.).

Figure 56C:
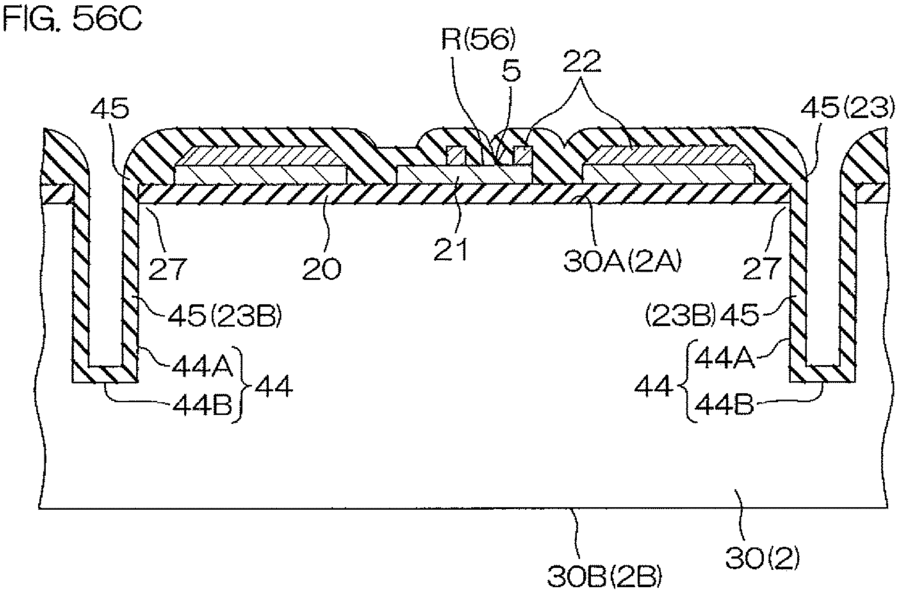
FIG. 56C is an illustrative sectional view of a step subsequent to that of FIG. 56B.

After the groove 44 has been formed, the resist pattern 41 is removed and the protective film (SiN) film 45 made of SiN is formed on the top surfaces of the elements 5 by CVD (chemical vapor deposition) method as shown in FIG. 56C. The SiN film 45 has a thickness of approximately 3000 Å. The SiN film 45 is formed so as to cover not only the entireties of the top surfaces of the elements 5 but also the inner surfaces (side surfaces 44A and bottom surface 44B) of the groove 44. The SiN film 45 is a thin film that is formed to a substantially fixed thickness on the side surfaces 44A and bottom surface 44B and therefore does not fill the groove 44 completely. Also, in the groove 44, the SiN film 45 suffices to be formed on the entireties of the side surfaces 44A and does not have to be formed on the bottom surface 44B.

Figure 56D:
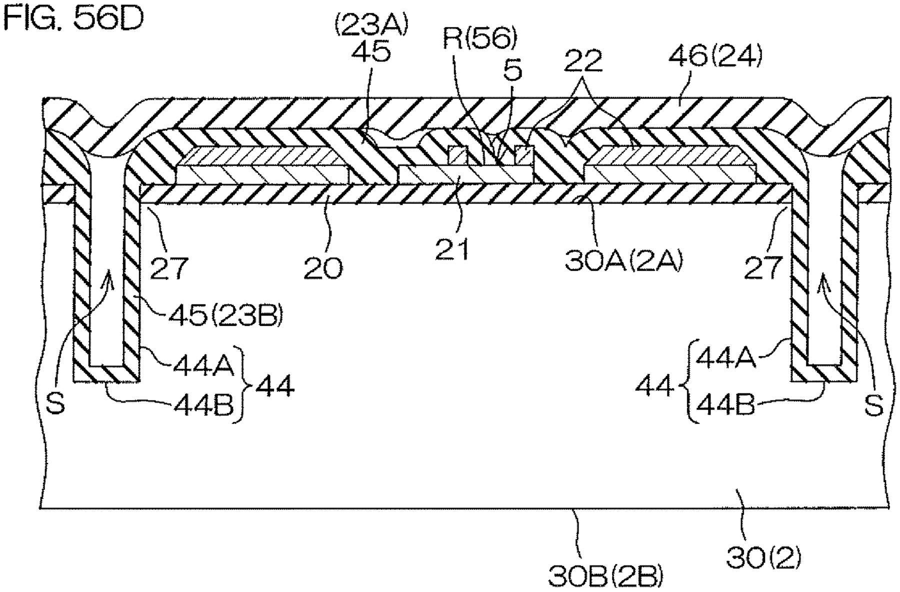
FIG. 56D is an illustrative sectional view of a step subsequent to that of FIG. 56C.
Figure 59A:
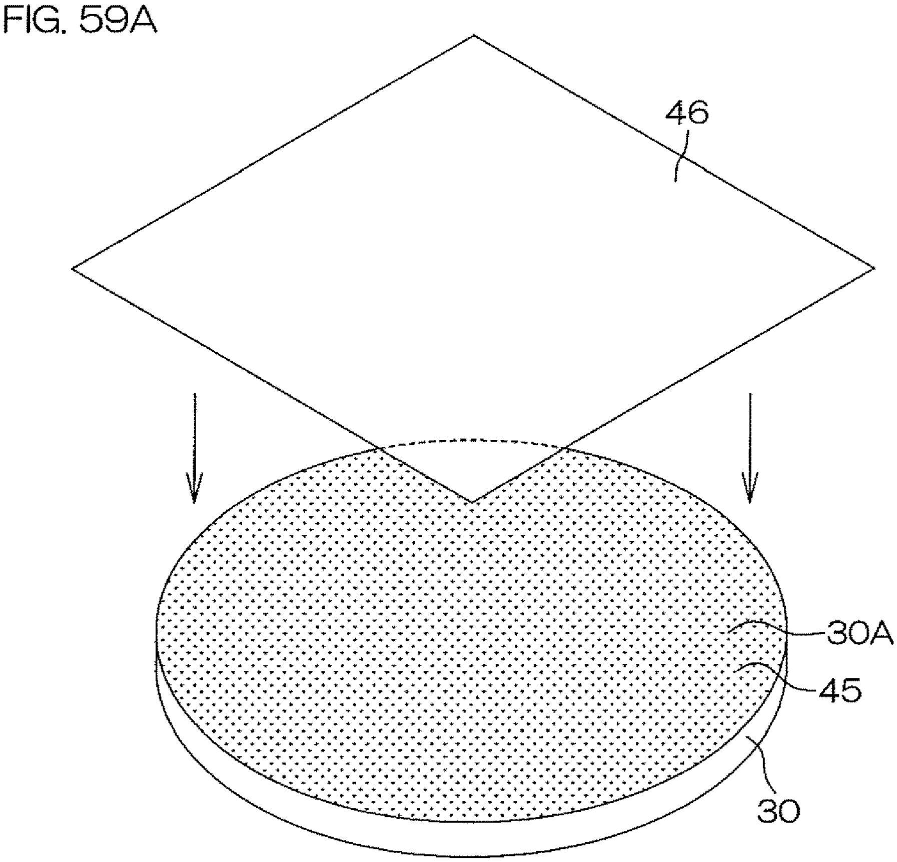
FIG. 59A is an illustrative perspective view of states of adhering a polyimide sheet onto the wafer in the step of FIG. 56D.
Figure 59B:
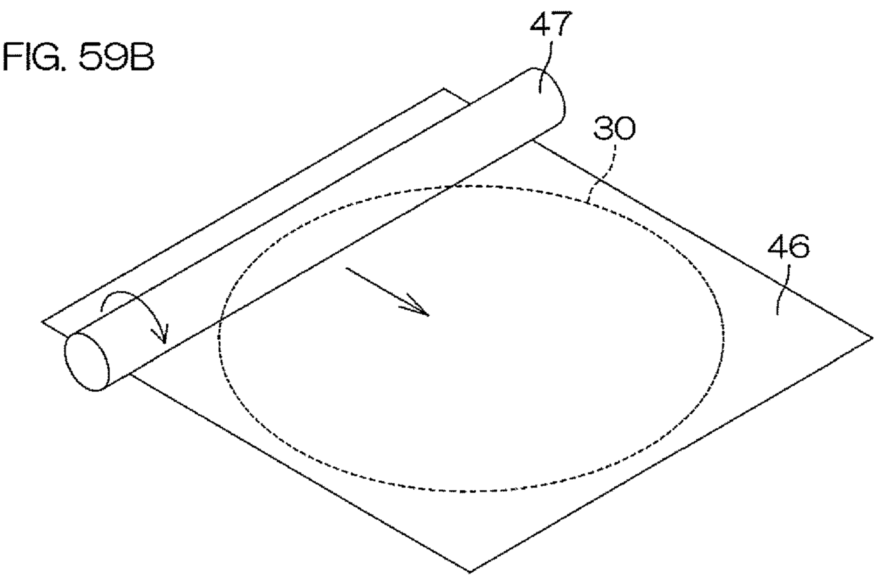
FIG. 59B is an illustrative perspective view of states of adhering a polyimide sheet onto the wafer in the step of FIG. 56D.

Thereafter, a photosensitive resin sheet 46, made of polyimide, is adhered onto the wafer 30 from above the SiN film 45 at portions besides the groove 44 as shown in FIG. 56D. FIGS. 59A and 59B are illustrative perspective views of states of adhering the polyimide sheet onto the wafer in the step of FIG. 56D. Specifically, after covering the wafer 30 (to be accurate, the SiN film 45 on the wafer 30) with the polyimide sheet 46 from the top surface 30A side as shown in FIG. 59A, the sheet 46 is pressed against the wafer 30 by a rotating roller 47 as shown in FIG. 59B.

When the sheet 46 has been adhered on the entirety of the top surface of the SiN film 45 at portions besides the groove 44 as shown in FIG. 56D, although portions of the sheet 46 are slightly indented toward the groove 44 side, only portions at the element 5 side (top surface 30A side) of the SiN film 45 on the side surfaces 44A of the groove 44 are covered and the sheet 46 does not reach the bottom surface 44B of the groove 44. A space S of substantially the same size as the groove 44 is thus formed inside the groove 44 between the sheet 46 and the bottom surface 44B of the groove 44. The thickness of the sheet 46 in this state is 10 μm to 30 μm.

Figure 56E:
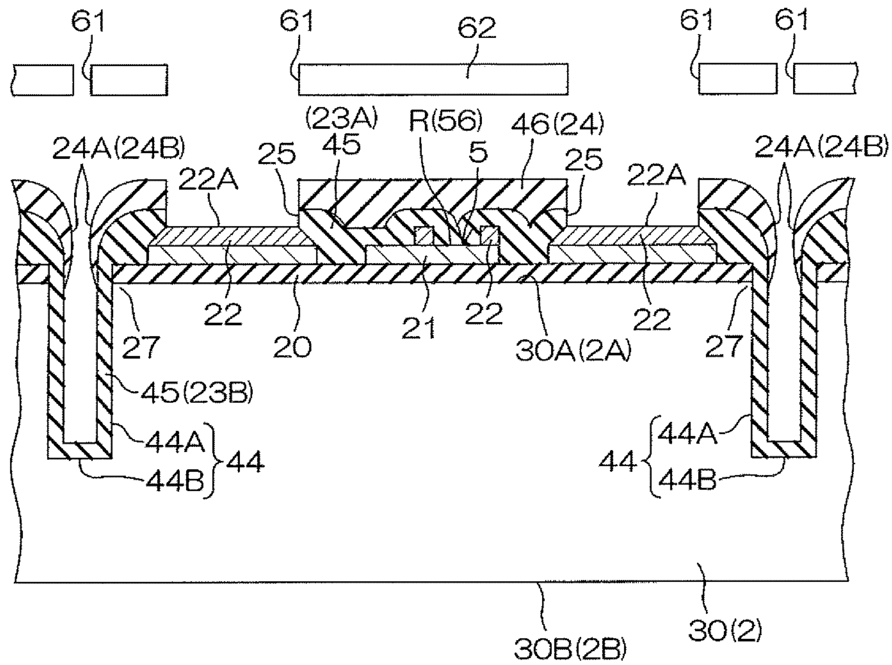
FIG. 56E is an illustrative sectional view of a step subsequent to that of FIG. 56D.

Thereafter, a heat treatment is applied to the sheet 46. The thickness of the sheet 46 is thereby thermally contracted to approximately 5 μm. Thereafter, as shown in FIG. 56E, the sheet 46 is patterned and portions of the sheet 46 coinciding with the groove 44 and the respective pad regions 22A of the wiring films 22 in a plan view are selectively removed. Specifically, a mask 62, having formed therein openings 61 of a pattern matching (coinciding with) the groove 44 and the respective pad regions 22A in a plan view, is used and the sheet 46 is exposed and developed with this pattern. The sheet 46 is thereby separated at portions above the groove 44 and the respective pad regions 22A and separated edge portions of the sheet 46 droop slightly toward the groove 44 to overlap with the SiN film 45 on the side surfaces 44A of the groove 44 so that the overhanging portion 24A (having the side surfaces 24B of round shapes) is formed naturally at the edge portions.

By then performing etching using the sheet 46 that has been separated in the above manner as a mask, the portions of the SiN film 45 coinciding with the respective pad regions 22A in a plan view are removed. The openings 25 are thereby formed. The SiN film 45 is thereby formed so as to expose the respective pad regions 22A. Ni/Pd/Au laminated films, arranged by laminating Ni, Pd, and Au, are then formed by electroless plating on the pad regions 22A in the respective openings 25. In this process, the Ni/Pd/Au laminated films are formed so as to protrude onto the top surface of the sheet 46 from the openings 25. The Ni/Pd/Au laminated films inside the respective openings 25 thus become the first connection electrode 3 and the second connection electrode 4 shown in FIG. 56F.

Then after performing a conduction test across the first connection electrode 3 and the second connection electrode 4, the wafer 30 is ground from the rear surface 30B. Here, the entirety of the portions of the wafer 30 forming the side surfaces 44A of the groove 44 is covered by the SiN film 45 so that formation of microcracks, etc., in those portions during the grinding of the wafer 30 is prevented, and even if a microcrack forms, the microcrack can be embedded by the SiN film 45 to suppress expansion of the microcrack.

When the wafer 30 has been thinned by grinding to the bottom surface 44B of the groove 44 (to be accurate, the SiN film 45 on the bottom surface 44B), portions joining mutually adjacent semi-finished products 50 are no longer present and the wafer 30 is thus divided with the groove 44 as boundaries and the semi-finished products 50 are separated individually as electronic devices 1. The electronic devices 1 (see FIG. 55) are thereby completed. With each electronic device 1, each portion that formed a side surface 44A of the groove 44 becomes one of the side surfaces 2C to 2F of the substrate 2. The SiN film 45 becomes the protective film 23. Also, the separated sheet 46 becomes the resin film 24.

Even if the electronic devices 1 are small in chip size, the electronic devices 1 can be separated into individual chips by thus forming the groove 44 in advance and then grinding the wafer 30 from the rear surface 30B. Therefore in comparison to the conventional case where the wafer 30 is diced using a dicing saw to separate the electronic devices 1 into individual chips, the dicing step can be eliminated to promote cost reduction and time savings and achieve improvement of yield.

With the above, when in manufacturing the electronic devices 1, the plurality of elements 5 are formed on the top surface 30A (element forming surface 2A) of the wafer 30 and the groove 44 for dividing the electronic devices 1 one by one is formed at the boundaries of the elements 5 in the top surface 30A, the side surfaces 44A of the groove 44 become the side surfaces 2C to 2F of the respective electronic devices 1 after the division. The SiN film 45 (protective film 23) is formed on the side surfaces 44A of the groove 44 and the top surface 30A of the wafer 30 before division into the electronic devices 1. Here, as shown in FIG. 56C, the protective film (CVD protective film) 23 of substantially the same thickness of CVD is formed continuously by the CVD method on the upper surfaces of the resistor bodies R and the inner surfaces (side surfaces 44A and bottom surface 44B) of the groove 44. In this case, the CVD protective film 23 (SiN film 45) is formed under a reduced pressure environment in the process of CVD, and therefore the CVD protective film 23 can be deposited as the side surface covering portion 23B on the entireties of the side surfaces 2C to 2F of the substrate 2 (side surfaces 44A of the groove 44). The protective film 23 can thus be formed uniformly on the side surfaces 44A of the groove 44 during manufacture of the electronic device 1.

Then after forming the protective film 23, the resin film 24 is formed by the sheet 46 covering the SiN film 45 (the portion of the protective film 23 to be the element covering portion 23A) on the element forming surface 2A as shown in FIG. 56D. With the SiN film 45 on the side surfaces 44A of the groove 44 (the portion to become the side surface covering portion 23B of the protective film 23), at least the side (the bottom surface 44B side of the groove 44) opposite to the element forming surface 2A is left exposed from the resin film 24 so that the groove 44 can be prevented from being filled with the resin film 24 from the bottom surface 44B side during the forming of the resin film 24 (during the manufacture of the electronic device 1).

Figure 56F:
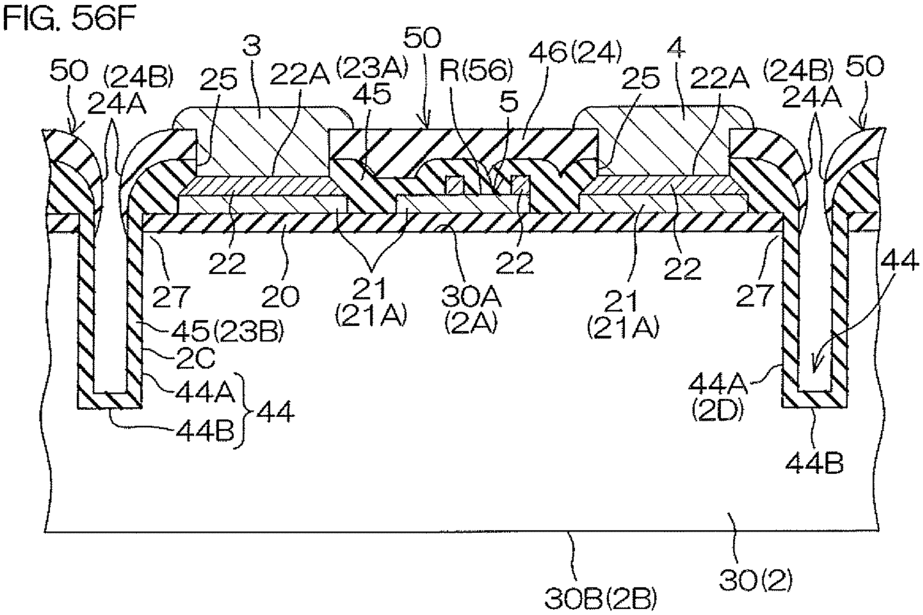
FIG. 56F is an illustrative sectional view of a step subsequent to that of FIG. 56E.

Specifically, the resin film 24 is formed by adhering the sheet 46 from above the protective film 23. In this case, the groove 44 will not be filled with the sheet 46 from the bottom surface 44B side. Therefore by thinning the substrate 2 until the bottom surface 44B of the groove 44 is reached as shown in FIG. 56F, the substrate 2 can be divided into the individual electronic devices 1 at the groove 44. Although a preferred embodiment of the third reference example has been described above, the third reference example may be implemented in yet other modes.

For example, in dividing the wafer 30 into the individual electronic devices 1, the wafer 30 is ground to the bottom surface 44B of the groove 44 from the rear surface 30B side (see FIG. 56F). Instead, the wafer 30 may be divided into the individual electronic devices 1 by removing the portions of the SiN film 45 covering the bottom surface 44B and portions of the wafer 30 coinciding with the groove 44 in a plan view by selectively etching from the rear surface 30B.

Figure 60A:
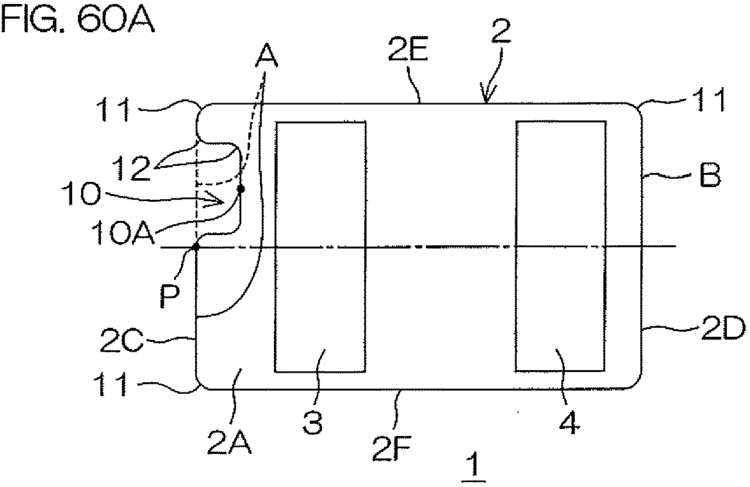
FIG. 60A is a plan view of an electronic device.
Figure 60B:
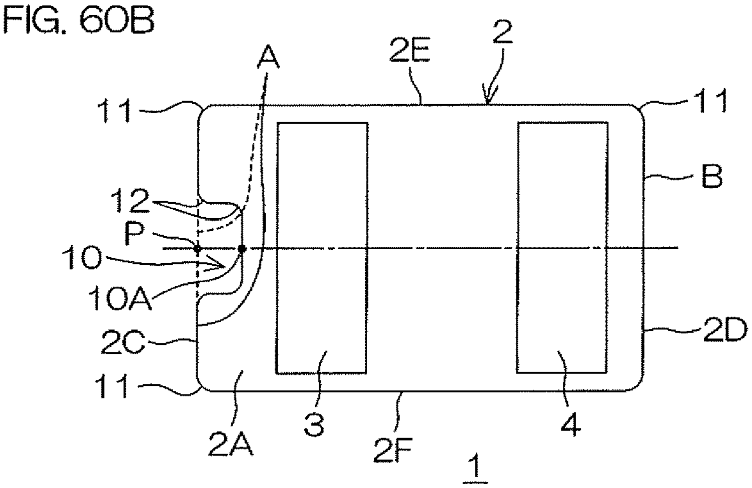
FIG. 60B is a plan view of an electronic device according to a first modification example.
Figure 60C:
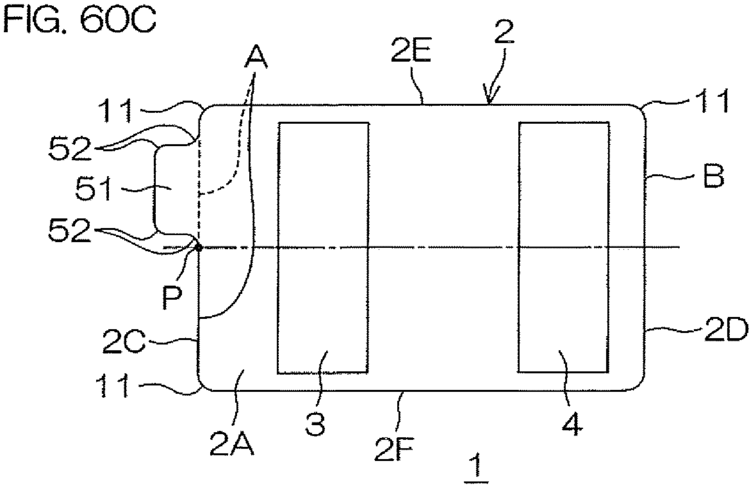
FIG. 60C is a plan view of an electronic device according to a second modification example.

FIG. 60A is a plan view of an electronic device, FIG. 60B is a plan view of an electronic device according to a first modification example, and FIG. 60C is a plan view of an electronic device according to a second modification example. In each of FIGS. 60A to 60C, illustration of the element 5, the protective film 23, and the resin film 24 is omitted for the sake of description. Also, as shown in FIG. 60A, the recess 10 is provided at a position of the side A of the electronic device 1 that is shifted from the midpoint P of the side A. When the recess 10 is shifted from the midpoint P, the center 10A of the recess 10 and the midpoint P do not coincide in the direction of extension of the side A. With this arrangement, not only the recess 10 side in the direction joining the side A and the side B at the opposite side of the side A (the long direction) but the recess 10 side in the direction of extension of the side A (short direction) can also be made the chip direction. For example, the electronic device 1 is arranged to be mounted correctly on the circuit substrate 9 when, in a plan view as viewed from the element forming surface 2A side, the short direction of the electronic device 1 and the front/rear direction (up/down direction in FIG. 60) are matched, the long direction of the electronic device 1 and the right/left direction are matched, and the recess 10 is positioned so as to be biased to the front left (upper left in FIG. 60) in this state. That the orientation of the electronic device 1 must be set so that the recess 10 is positioned so as to be biased to the front left in a plan view (to the front right when the electronic device 1 is viewed from the rear surface 2B of the substrate 2) in the mounting process can thus be ascertained from the outer appearance of the electronic device 1. That is, that the orientation of the electronic device 1 must be matched in both the long direction and the short direction can be ascertained from the outer appearance of the electronic device 1.

Obviously, the recess 10 may be provided at a position of the side A that coincides with the midpoint P (position at which the center 10A of the recess 10 coincides with the midpoint P in the short direction) as shown in FIG. 60B. Also, in place of the recess 10, an outwardly projecting projection 51 may be provided as shown in FIG. 60C. The projection 51 may have a rectangular shape, a U-like shape (a shape that bulges in the shape of the letter U), or a triangular shape in a plan view. Obviously at the side surface 2C, corner portions (the four corner portions in a plan view including those at the tip side and root side of the projection 51) 52 of the projection 51 have chamfered round shapes like those of the other corner portions 11. Here, as in the case of the recess 10, the side surface covering portion 23B (see FIG. 47A) covers the entirety of the side surface 2C, including the portion at which the projection 51 is formed. Also, the depth of the recess 10 and the height (projection amount) of the projection 51 are preferably not more than 20 μm (not more than approximately one-fifth the width of the first connecting electrode 3 and the second connection electrode 4). Also the chamfer amount of each of the corner portions 11, corner portions 12, and corner portions 52, is preferably such that the distance at one side is not more than approximately 20 μm.

Figure 61A:
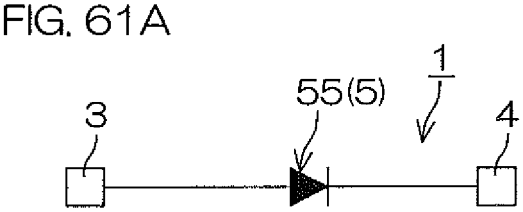
FIG. 61A is a diagram of the circuit arrangement of an element according to another preferred embodiment of the electronic device.
Figure 61B:
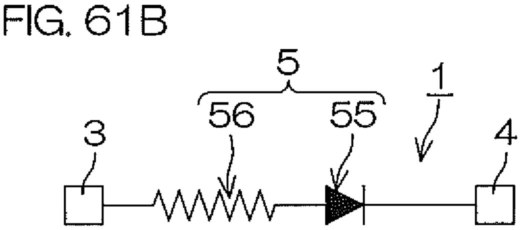
FIG. 61B is a diagram of the circuit arrangement of an element according to yet another preferred embodiment of the electronic device.

FIG. 61A is a diagram of the circuit arrangement of an element according to another preferred embodiment of the electronic device, and FIG. 61B is a diagram of the circuit arrangement of an element according to yet another preferred embodiment of the electronic device. Although with the preferred embodiment described above, the electronic device 1 is a chip resistor and the element 5 between the first connection electrode 3 and the second connection electrode 4 is thus the resistor 56, it may instead be a diode 55, shown in FIG. 61A, or an element with which the diode 55 and the resistor 56 are connected in series as shown in FIG. 61B. By having the diode 55, the electronic device 1 becomes a chip diode, a polarity is present in the first connection electrode 3 and the second connection electrode 4, and the chip direction is a direction that is in accordance with the polarity. The polarity of the first connection electrode 3 and the second connection electrode 4 can thereby be indicated by the chip direction and the polarity can thus be ascertained from the outer appearance of the electronic device 1. That is, which side in the chip direction (that is, which of the first connection electrode 3 and the second connection electrode 4) is the positive or negative pole side can be ascertained. The electronic device 1 can thus be mounted correctly on the circuit substrate 9 (see FIG. 47B) so that the side at which the recess 10 or the projection 51 (see FIG. 60) is provided is set at the corresponding pole side.

Obviously, the third reference example may be applied to an element device, having any of various elements, such as a chip capacitor, which uses a capacitor in place of the diode 55 in the element 5, a chip inductor, etc., formed on the chip-sized substrate 2. <Invention according to a fourth reference example> (1) Features of the invention according to the fourth reference example. For example, the features of the invention according to the fourth reference example are the following D1 to D9.

(D1) A method for manufacturing a chip part including a step of forming a resistor body film on a substrate by performing sputtering of a metal while supplying nitrogen and oxygen, a step of forming a wiring film on the resistor body film, a step of patterning the wiring film and the resistor body film at the same time, and a step of patterning just the wiring film.

With this method, the nitrogen and oxygen that are supplied in the process of forming the resistor body film on the substrate are doped as impurities into resistor body film, thereby enabling the resistance value of the resistor body film formed to be set to a desired value (target value). Also, the wiring film is laminated on the resistor body film and the wiring film laminated on the resistor body film and the resistor body film are patterned at the same time so that the resistor body film and the wiring film are patterned to equal shapes, and thereafter, just the wiring film on the patterned resistor body film is selectively removed by patterning to enable a resistor network having the resistor body film of the desired wiring form to be prepared, consequently enabling refinement of the resistor network and refinement of the chip part to be achieved.

(D2) The method for manufacturing the chip part according to D1, where, in the step of forming the resistor body film, silicon is sputtered at the same time as the metal to dope the metal resistor body film, formed on the substrate, with silicon.

With this method, in the step of forming the resistor body film, silicon is sputtered at the same time as the metal and nitrogen and oxygen are also supplied so that the metal resistor body film is doped with silicon atoms, nitrogen atoms, and oxygen atoms. The resistance value of the resistor body film can thereby be set to the desired resistance value and the temperature coefficient of resistance (TCR) can be adjusted to a desired value.

(D3) The method for manufacturing the chip part according to D1 or D2, where the step of forming the resistor body film includes a step of adjusting a supply flow rate of nitrogen and a supply flow rate of oxygen.

With this method, the amounts of the nitrogen atoms and oxygen atoms doped into the metal resistor body film can be adjusted by adjusting the supply flow rate of nitrogen and the supply flow rate of oxygen to thereby enable the resistance value of the resistor body film to be adjusted over a wide range, for example, of 10Ω/□ to 1000Ω/□.

(D4) The method for manufacturing the chip part according to any one of D1 to D3, where the step of patterning the wiring film and the resistor body film at the same time includes the patterning of the wiring film so that it includes external connection electrodes, resistance unit forming wiring films that form a plurality of types of resistance units by electrically connecting one or a plurality of resistor bodies among a plurality of thin film resistor bodies, resistance unit connection wiring films for connecting the plurality of types of the resistance units in a predetermined mode, and a plurality of fuse films electrically incorporating the plurality of types of resistor units into the resistor network or being capable of being fused to electrically separate the resistor units from the resistor network, and the step of patterning just the wiring film includes the selective removal of the wiring film from portions of the patterned wiring film and resistor body film to make the resistor body film at the lower layer appear as the plurality of thin film resistor bodies.

With this method, the wiring film is laminated on the resistor body film and by patterning the wiring film, the external connection electrodes, the resistance unit forming wiring films that form the resistance units, the resistance unit connection wiring films, and the fuse films can be formed on the same layer at the same time, thereby enabling simplification of the process.

(D5) A chip part including a resistor body film patterned on a substrate, wiring films formed so as to partially overlap with the resistor body film, and a protective film formed on the upper surfaces of the wiring films, and where a resistor circuit arranged from a unit resistor body is formed by the resistor body film and the wiring films.

(D6) The chip part according to D5, where the resistor body film is made of TiON or TiSiON.

(D7) The chip part according to D5 or D6, where the resistor body film and the wiring films are patterned collectively.

(D8) The chip part according to any one of D5 to D7, where the wiring films formed to overlap with the resistive film includes a fuse film, and the chip part includes a chip resistor with which the fuse film is formed to be capable of being fused.

(D9) The chip part according to any one of D5 to D7, where an upper surface of the protective film is covered by a resin film.

With the arrangements according to D5 to D9, a chip part or a chip resistor that includes a resistor circuit that is compact and has a desired resistance value can be provided.

(2) Preferred embodiments of the invention related to the fourth reference example. Preferred embodiments of the fourth reference example shall now be described in detail with reference to the attached drawings. The symbols in FIG. 62 to FIG. 76 are effective only for these drawings and, even if used in other preferred embodiments, do not indicate the same elements as the symbols in the other preferred embodiments.

Figure 62A:
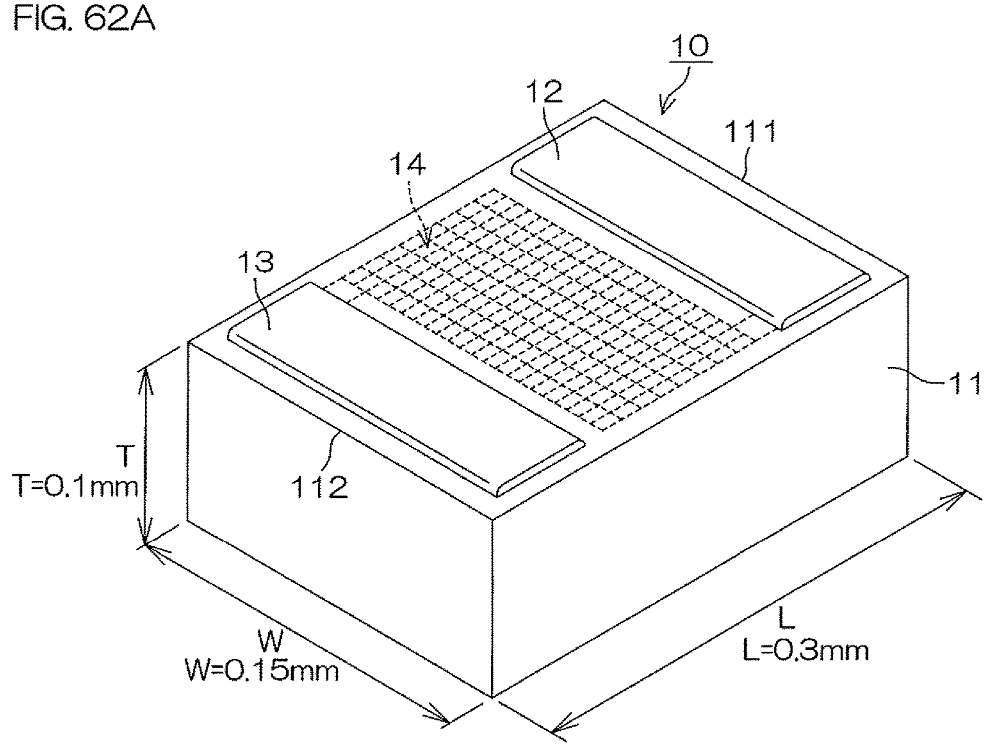
FIG. 62A is an illustrative perspective view of the external arrangement of a chip resistor 10 according to a preferred embodiment of a fourth reference example.
Figure 62B:
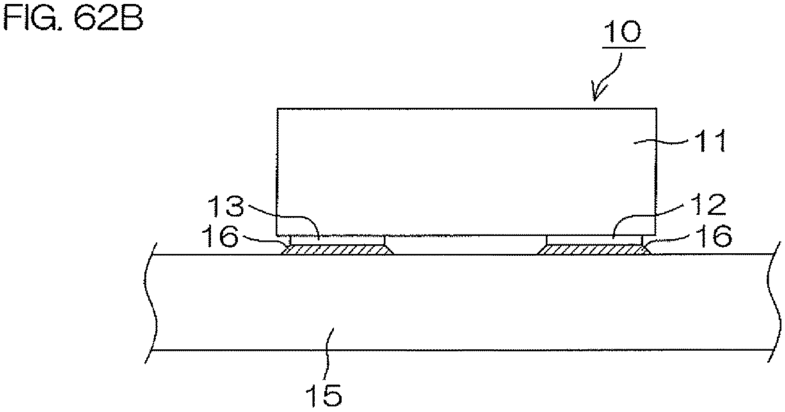
FIG. 62B is a side view of a state where the chip resistor 10 is mounted on a substrate.

FIG. 62A is an illustrative perspective view of the external arrangement of a chip resistor 10 according to a preferred embodiment prepared by a manufacturing method of a fourth reference example and FIG. 62B is a side view of a state where the chip resistor 10 is mounted on a substrate. With reference to FIG. 62A, the chip resistor 10 according to the preferred embodiment of the fourth reference example includes a first connection electrode 12, a second connection electrode 13, and a resistor network 14 that are formed on the substrate 11 as the substrate. The substrate 11 has a rectangular parallelepiped shape with a substantially rectangular shape in a plan view and is a minute chip with, for example, the length in the long side direction being L=0.3 mm, the width in the short side direction being W=0.15 mm, and the thickness of the substrate 11 being T=0.1 mm, approximately.

The chip resistor 10 is obtained by forming several chip resistors 10 in a lattice on a wafer as shown in FIG. 76 and cutting the wafer to separate it into individual chip resistors 10. On the substrate 11, the first connection electrode 12 is a rectangular electrode that is disposed along one short side 111 of the substrate 11 and is long in the short side 111 direction. The second connection electrode 13 is a rectangular electrode that is disposed on the substrate 11 along the other short side 112 and is long in the short side 112 direction. The resistor network 14 is provided in a central region on the substrate 11 sandwiched by the first connection electrode 12 and the second connection electrode 13. One end side of the resistor network 14 is electrically connected to the first connection electrode 12 and another end side of the resistor network 14 is electrically connected to the second connection electrode 13. As shall be described later, the first connection electrode 12, the second connection electrode 13, and the resistor network 14 are provided on the substrate 11 by using, for example, a semiconductor manufacturing process. A semiconductor substrate (semiconductor wafer), such as a silicon substrate (silicon wafer), etc., may thus be used as the substrate 11. The substrate 11 may also be another type of substrate, such as an insulating substrate, etc.

The first connection electrode 12 and the second connection electrode 13 respectively function as external connection electrodes (external connection pads). In a state where the chip resistor 10 is mounted on a circuit substrate 15, the first connection electrode 12 and the second connection electrode 13 are respectively connected electrically and mechanically by solder to circuits (not shown) of the circuit substrate 15 as shown in FIG. 62B. The first connection electrode 12 and the second connection electrode 13 that function as external connection electrodes are preferably formed of gold (Au) or has gold plating applied on the surfaces thereof to improve solder wettability and improve reliability.

Figure 63:
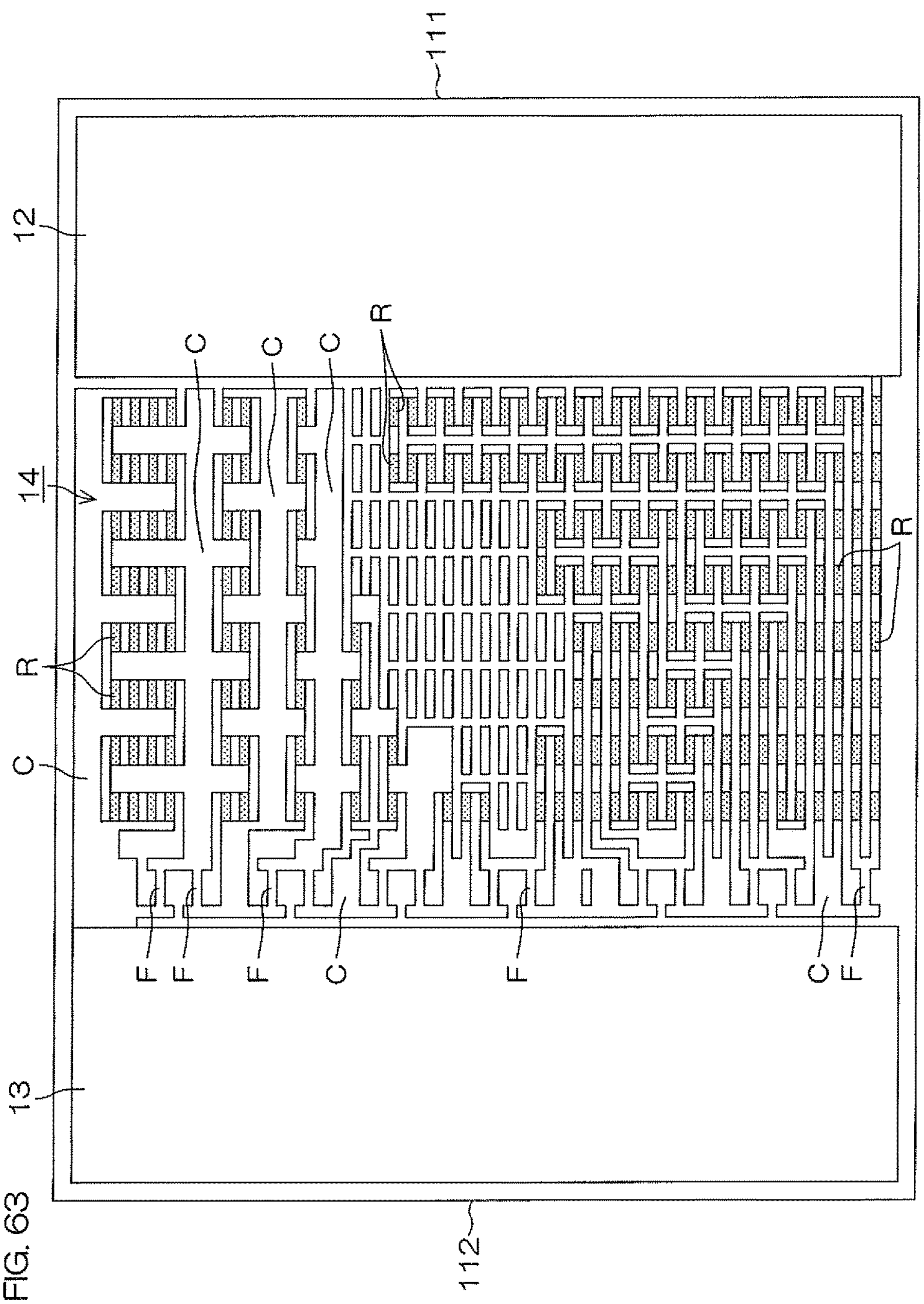
FIG. 63 is a plan view of the chip resistor 10 showing the positional relationships of a first connection electrode 12, a second connection electrode 13, and a resistor network 14 and showing the arrangement in a plan view of the resistor network 14.

FIG. 63 is a plan view of the chip resistor 10 showing the positional relationships of the first connection electrode 12, the second connection electrode 13, and the resistor network 14 and shows the arrangement in a plan view of the resistor network 14. With reference to FIG. 63, the chip resistor 10 includes the first connection electrode 12, disposed along the one short side 111 of the substrate upper surface and having the substantially rectangular shape in a plan view that is long in the width direction, the second connection electrode 13, disposed along the other short side 112 of the substrate upper surface and having the substantially rectangular shape in a plan view that is long in the width direction, and the resistor network 14 provided in the region of rectangular shape in a plan view between the first connection electrode 12 and the second connection electrode 13.

The resistor network 14 has a plurality of resistor bodies R having an equal resistance value and being arrayed in a matrix on the substrate (the example of FIG. 63 has an arrangement with a total of 352 resistor bodies R with 8 resistor bodies R being arrayed along the row direction (length direction of the substrate) and 44 resistor bodies being arrayed along the column direction (width direction of the substrate)). One to 64 of the plurality of resistor bodies R are electrically connected to form a plurality of types of resistance units. The plurality of types of resistance units thus formed are connected in predetermined modes by connection wiring films as network connection means. Further, a plurality of fuse films F are provided that electrically incorporate resistance units into the resistor network 14 or are capable of being fused to electrically separate resistance units from the resistor network 14. The plurality of fuse films F are arrayed along the inner side of the second connection electrode 13 so that the positioning region thereof is rectilinear. More specifically, the plurality of fuse films F and the connection wiring films C are disposed rectilinearly.

Figure 64A:
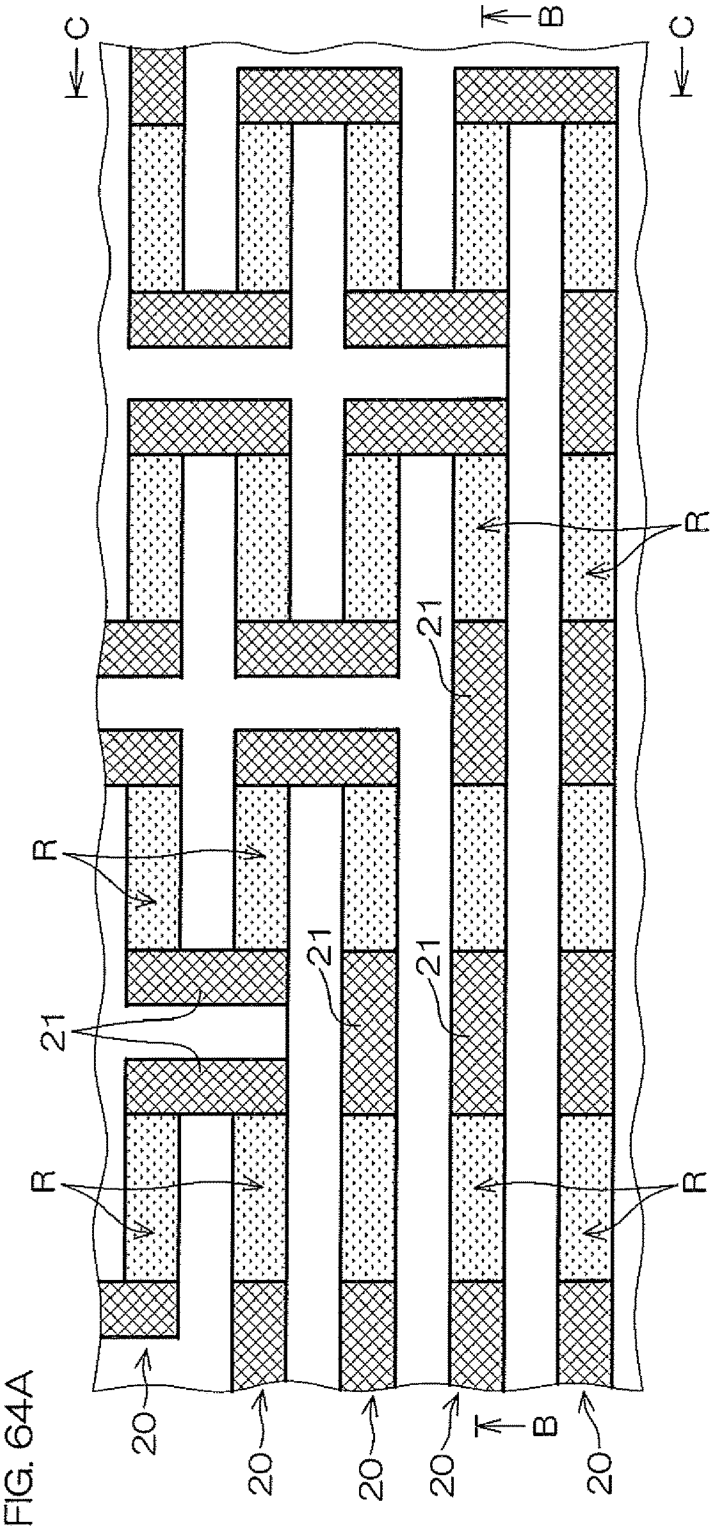
FIG. 64A is an enlarged plan view of a portion of the resistor network 14 shown in FIG. 63.
Figure 64B:
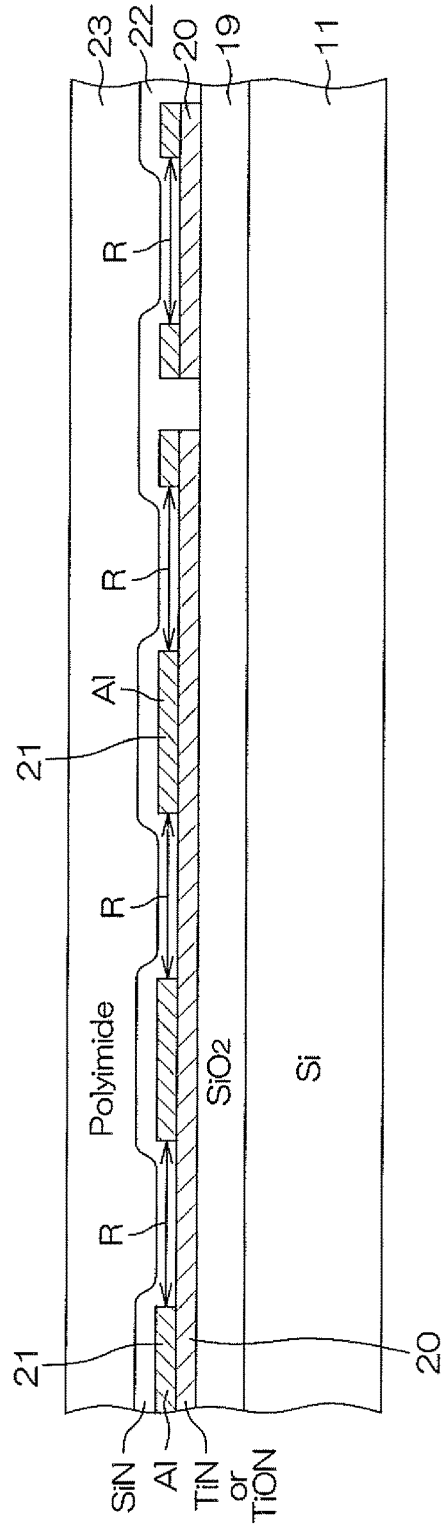
FIG. 64B is a vertical sectional view in the length direction for describing the arrangement of resistor bodies R in the resistor network 14.
Figure 64C:
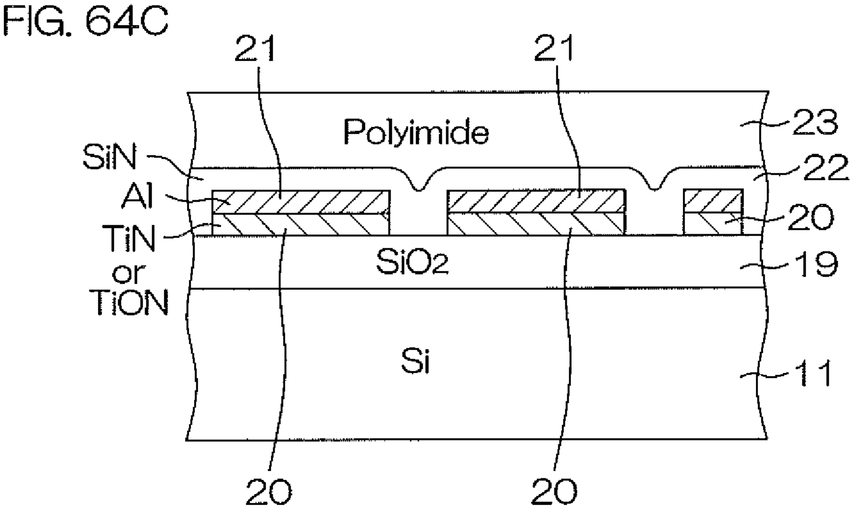
FIG. 64C is a vertical sectional view in the width direction for describing the arrangement of the resistor bodies R in the resistor network 14.

FIG. 64A is an enlarged plan view of a portion of the resistor network 14 shown in FIG. 63, and FIG. 64B and FIG. 64C are a vertical sectional view in the length direction and a vertical sectional view in the width direction, respectively, for describing the structure of the resistor bodies R in the resistor network 14. The arrangement of the resistor bodies R shall now be described with reference to FIG. 64A, FIG. 64B, and FIG. 64C. On an upper surface of the substrate 11 as the substrate, an insulating layer ($SiO_2$) 19 is formed, and resistor body films 20, which make up the resistor bodies R, are disposed on the insulating film 19. The resistor body films 20 are formed of TiN or TiON. The resistor body films 20 are arranged as a plurality of resistor body films (hereinafter referred to as "resistor body film lines") extending as lines between the first connection electrode 12 and the second connection electrode 13, and there are cases where a resistor body film line 20 is cut at predetermined positions in the line direction. Aluminum films are laminated as wiring films 21 on the resistor body film lines 20. The wiring films 21 are laminated on the resistor body film lines 20 while being spaced apart by fixed intervals R in the line direction.

Figure 65A:
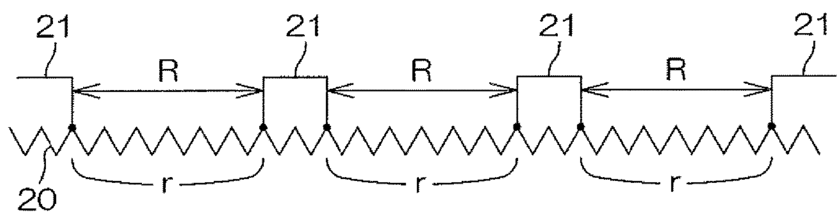
FIG. 65A is a diagram showing the electrical features of resistive film lines 20 and wiring films 21 in the form of circuit symbols and an electric circuit diagram.
Figure 65B:
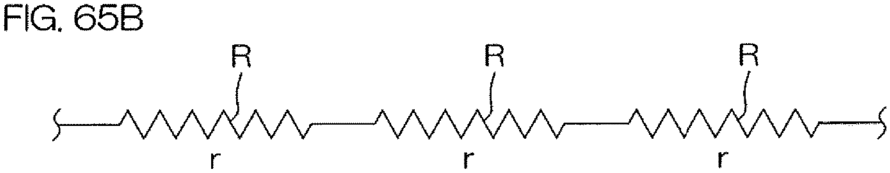
FIG. 65B is a diagram showing the electrical features of resistive film lines 20 and wiring films 21 in the form of circuit symbols and an electric circuit diagram.
Figure 65C:
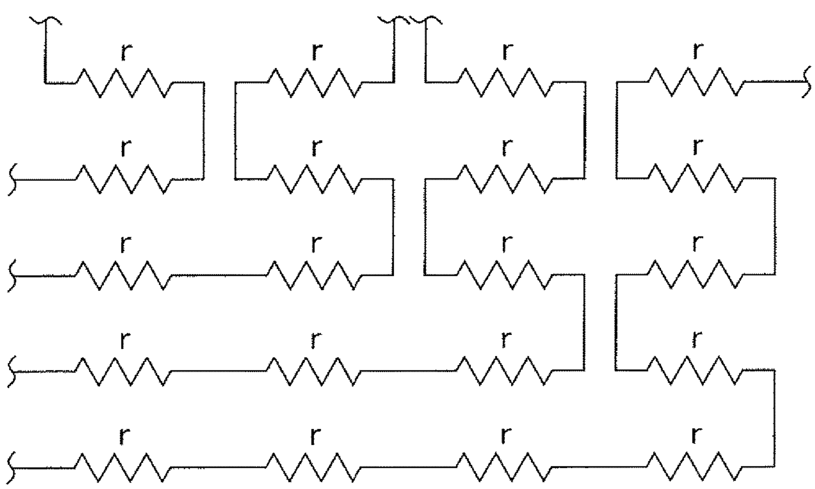
FIG. 65C is a diagram showing the electrical features of resistive film lines 20 and wiring films 21 in the form of circuit symbols and an electric circuit diagram.

The electrical features of the resistor body film lines 20 and the wiring films 21 are indicated in the form of circuit symbols in FIGS. 65A, 65B, and 65C. That is, as shown in FIG. 65A, each of the resistor body film line 20 portions in regions of the predetermined interval R forms a resistor body R with a fixed resistance value r. In each region at which a wiring film 21 is laminated, the resistor body film line 20 is short-circuited by the wiring film 21. A resistor circuit, made up of serial connections of resistor bodies R of resistance r, is thus formed as shown in FIG. 65B.

Figure 66A:
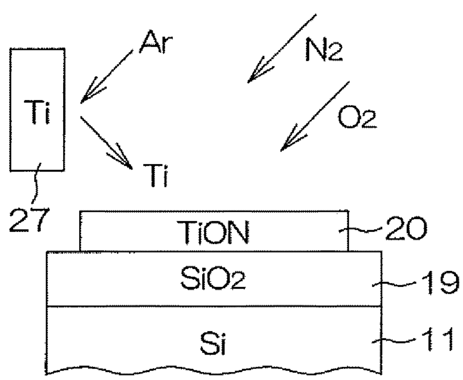
FIG. 66A shows diagrams for describing a manufacturing process (resistor body film forming process) according to a preferred embodiment of the fourth reference example and is an illustratively diagram of an example of sputtering.
Figure 66B:
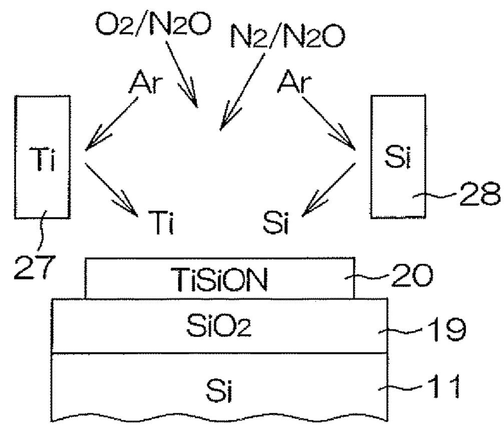
FIG. 66B shows diagrams for describing a manufacturing process (resistor body film forming process) according to a preferred embodiment of the fourth reference example and is an illustratively diagram of another example of sputtering.

Also, adjacent resistor body film lines 20 are connected to each other by the resistor body films 20 and wiring films 21 and therefore the resistor network shown in FIG. 64A forms the resistor circuit shown in FIG. 65C. The manufacturing process of the resistor network 14 shall now be described. (1) The top surface of the substrate 11 is thermally oxidized to form a silicon dioxide ($SiO_2$) layer as the insulating layer 19. (2) The resistor body film 20 of TiN, TiON, or TiSiON is then formed on the entire surface of the insulating layer 19 (step of forming the resistor body film). As illustrated in FIG. 66A and FIG. 66B, the step of forming the resistor body film is performed by sputtering.

That is, for example, as illustrated in FIG. 66A, the substrate 11 with the insulating layer 19 formed thereon and a metal (titanium (Ti) in the present preferred embodiment) plate 27, which is a target, are positioned inside a high vacuum chamber. Argon (Ar) gas is then blown in, and at the same time, nitrogen ($N_2$) and oxygen ($O_2$) are supplied. By application of a negative high voltage to the target 27, the argon gas is put in a plasma state due to the high voltage and positively ionized and the argon ions collide against the target 27. The material element, that is, titanium atoms (Ti) are thus ejected from the target 27 and these are deposited on the insulating film 19 to form the resistor body film 20. By the nitrogen and oxygen being supplied in this process, the resistor body film 20 is doped with nitrogen atoms (N) and oxygen atoms (O), and the resistor body film 20 is thereby formed, for example, of TiON.

As illustrated in FIG. 66B, in the step of forming the resistor body film, a silicon (Si) plate 28 may be positioned together with the titanium (Ti) plate 27 as the target to provide an arrangement where sputtering is performed by collision of the argon ions against the titanium plate 27 and the silicon plate 28. In this case, mixed gases of $O_2/N_2O$ and $N_2/N_2O$ are supplied as the nitrogen and oxygen. Consequently, a film of TiSiON is deposited and formed as the resistor body film 20 on the insulating layer 19.

In the step of forming the resistor body film 20 shown in FIG. 66A, the resistance value of the resistor body film 20 can be adjusted to a desired resistance value by adjusting supply flow rates of nitrogen and oxygen. Also, in the step of forming the resistor body film shown in FIG. 66B, the resistance value of the resistor body film 20 can be adjusted to a desired resistance value and the temperature coefficient of resistance (TCR) of the resistance body film 20 can also be adjusted to a target value by adjusting the supply flow rates of nitrogen and oxygen.

Therefore, by performing the sputtering of silicon at the same time as the sputtering of titanium, which is a metal, in performing the sputtering while supplying nitrogen and oxygen as shown in FIG. 66B, the titanium resistor body film is doped with silicon, nitrogen, and oxygen, thereby enabling a resistor body film of high precision to be manufactured with both the resistance value and the temperature coefficient of resistance (TCR) of the resistor body film 20 being set to desired values. (3) Thereafter, a step of forming the wiring film 21 on the resistor body film 20 is performed. The step of forming the wiring film 21 is performed, for example, by sputtering aluminum (Al). (4) Thereafter, a photolithography process is used and, for example, dry etching is performed to selectively remove the wiring film 21 and the resistor body film 20 to obtain the arrangement where, as shown in FIG. 64A, the resistor body film lines 20 and the wiring films 21 of fixed width are arrayed in the column direction while being spaced apart by fixed intervals in a plan view. Regions at which the resistor body film lines 20 and the wiring films 21 are interrupted are also formed at this point. (5) The wiring films 21 laminated on the resistor body film lines 20 are then removed selectively. The arrangement where the wiring films 21 are laminated on the resistor body film lines 20 while being spaced apart by the fixed intervals R is consequently obtained. (6) Thereafter, an SiN film 22 is deposited as a protective film and further, a polyimide layer 23, which is a protective layer, is laminated thereon.

In the present preferred embodiment, the resistor bodies R, included in the resistor network 14 formed on the substrate 11, include the resistor body film lines 20 and the wiring films 21 that are laminated on the resistor body film lines 20 while being spaced apart by the fixed intervals in the line direction, and a single resistor body R is arranged from the resistor body film line 20 at the fixed interval R portion on which the wiring film 21 is not laminated. The resistor body film lines 20 making up the resistor bodies R are all equal in shape and size. Therefore based on the characteristic that resistor body films of the same shape with the same size that are formed on a substrate are substantially the same in value, the plurality of resistor bodies R arrayed in a matrix on the substrate 11 have an equal resistance value.

Figure 67A:
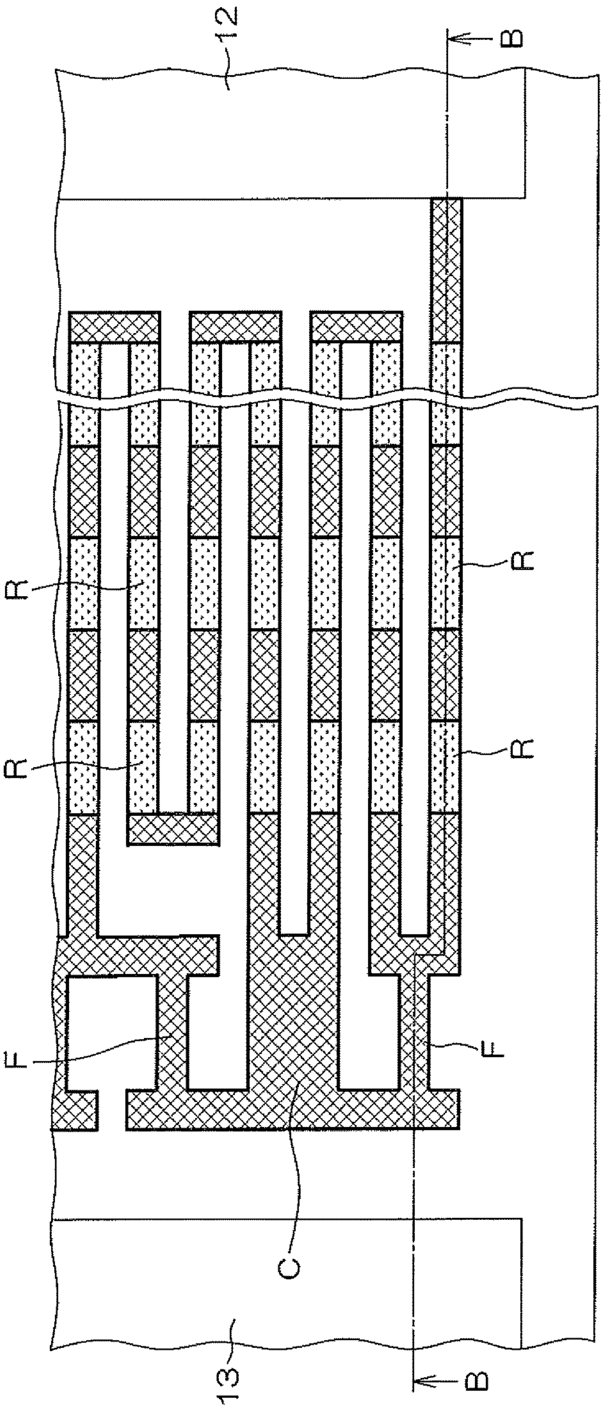
FIG. 67A is partially enlarged plan view of a region including fuse films F drawn by enlarging a portion of the plan view of the chip resistor shown in FIG. 63.

The wiring films 21 laminated on the resistor body film lines 20 form the resistor bodies R and also serve the role of connection wiring films that connect a plurality of resistor bodies R to arrange a resistance unit. FIG. 67A is partially enlarged plan view of a region including the fuse films F drawn by enlarging a portion of the plan view of the chip resistor 10 shown in FIG. 63, and FIG. 67B is a structural sectional view taken along B-B in FIG. 67A.

Figure 67B:
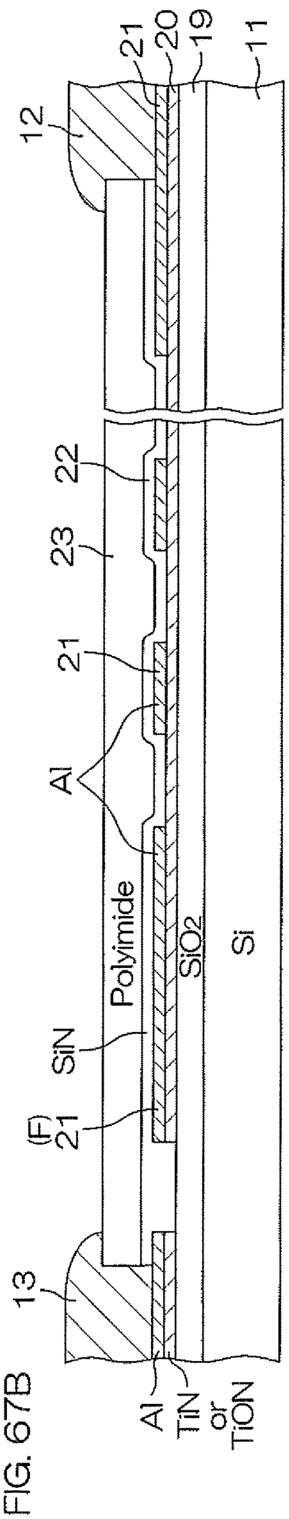
FIG. 67B is a structural sectional view taken along B-B in FIG. 67A.

As shown in FIGS. 67A and 67B, the fuse films F are also formed by the wiring films 21, which are laminated on the resistor body films 20 that form the resistor bodies R. That is, the fuse films F are formed of aluminum (Al), which is the same metal material as that of the wiring films 21, on the same layer as the wiring films 21, which are laminated on the resistor body film lines 20 that form the resistor bodies R. As mentioned above, the wiring films 21 are also used as the connection wiring films 21 that electrically connect a plurality of resistor bodies R to form a resistance unit.

That is, on the same layer laminated on the resistor body film 20, the wiring films for forming the resistor bodies R, the connection wiring films for forming the resistance units, the connection wiring films for arranging the resistor network 14, the fuse films, and the wiring films for connecting the resistor network 14 to the first connection electrode 12 and the second connection electrode 13 are formed by the same manufacturing process (for example, a sputtering and photolithography process) using the same metal material (for example, aluminum). The manufacturing process of the chip resistor 10 is thereby simplified and also, various types of wiring films can be formed at the same time using a mask in common. Further, the property of alignment with respect to the resistor body film 20 is also improved.

Figure 68:
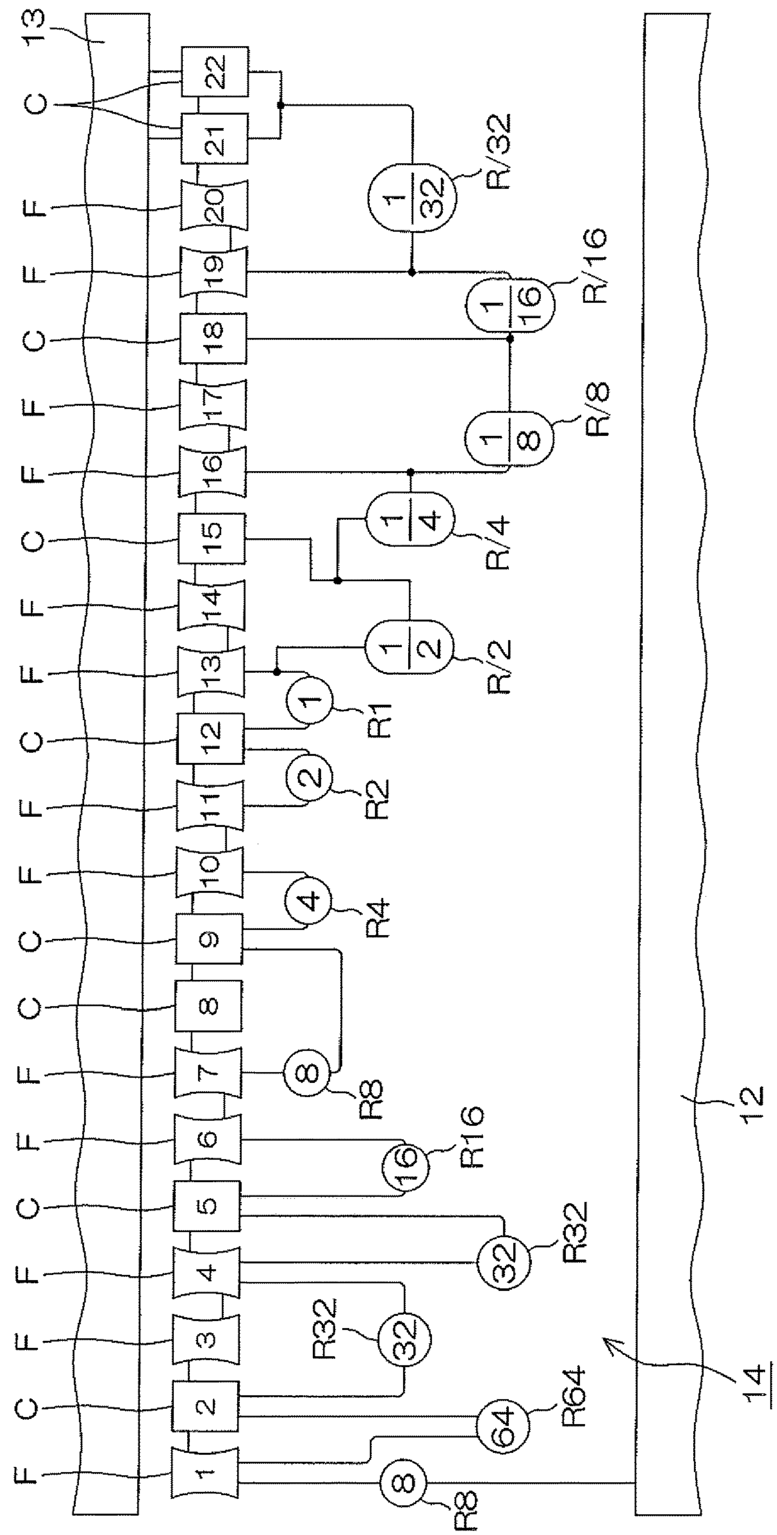

FIG. 68 is an illustrative diagram of the array relationships of the connection wiring films C and the fuse films F connecting a plurality of types of resistance units in the resistor network 14 shown in FIG. 63 and the connection relationships of the plurality of types of resistance units connected to the connection wiring films C and fuse films F. With reference to FIG. 68, one end of a reference resistance unit R8, included in the resistor network 14, is connected to the first connection electrode 12. The reference resistance unit R8 is formed by a serial connection of 8 resistor bodies R and the other end thereof is connected to a fuse film F1. One end and the other end of a resistance unit R64, formed by a serial connection of 64 resistor bodies R, are connected to the fuse film F1 and a connection wiring film C2. One end and the other end of a resistance unit R32, formed by a serial connection of 32 resistor bodies R, are connected to the connection wiring film C2 and a fuse film F4. One end and the other end of a resistance unit R32, formed by a serial connection of 32 resistor bodies R, are connected to the fuse film F4 and a connection wiring film C5. One end and the other end of a resistance unit R16, formed by a serial connection of 16 resistor bodies R, are connected to the connection wiring film C5 and a fuse film F6. One end and the other end of a resistance unit R8, formed by a serial connection of 8 resistor bodies R, are connected to a fuse film F7 and a connection wiring film C9. One end and the other end of a resistance unit R4, formed by a serial connection of 4 resistor bodies R, are connected to the connection wiring film C9 and a fuse film F10. One end and the other end of a resistance unit R2, formed by a serial connection of 2 resistor bodies R, are connected to a fuse film F11 and a connection wiring film C12. One end and the other end of a resistance unit R1, formed of a single resistor body R, are connected to the connection wiring film C12 and a fuse film F13. One end and the other end of a resistance unit R/2, formed by a parallel connection of 2 resistor bodies R, are connected to the fuse film F13 and a connection wiring film C15. One end and the other end of a resistance unit R/4, formed by a parallel connection of 4 resistor bodies R, are connected to the connection wiring film C15 and a fuse film F16. One end and the other end of a resistance unit R/8, formed by a parallel connection of 8 resistor bodies R, are connected to the fuse film F16 and a connection wiring film C18. One end and the other end of a resistance unit R/16, formed by a parallel connection of 16 resistor bodies R, are connected to the connection wiring film C18 and a fuse film F19. A resistance unit R/32, formed by a parallel connection of 32 resistor bodies R, are connected to the fuse film F19 and a connection wiring film C22.

With the plurality of fuse films F and connection wiring films C, the fuse film F1, the connection wiring film C2, the fuse film F3, the fuse film F4, the connection wiring film C5, the fuse film F6, the fuse film F7, the connection wiring film C8, the connection wiring film C9, the fuse film F10, the fuse film F11, the connection wiring film C12, the fuse film F13, a fuse film F14, the connection wiring film C15, the fuse film F16, the fuse film F17, the connection wiring film C18, the fuse film F19, the fuse film F20, the connection wiring film C21, and the connection wiring film C22 are disposed rectilinearly and connected in series. With this arrangement, when a fuse film F is fused, the electrical connection with the connection wiring film C connected adjacently to the fuse film F is interrupted.

Figure 69:
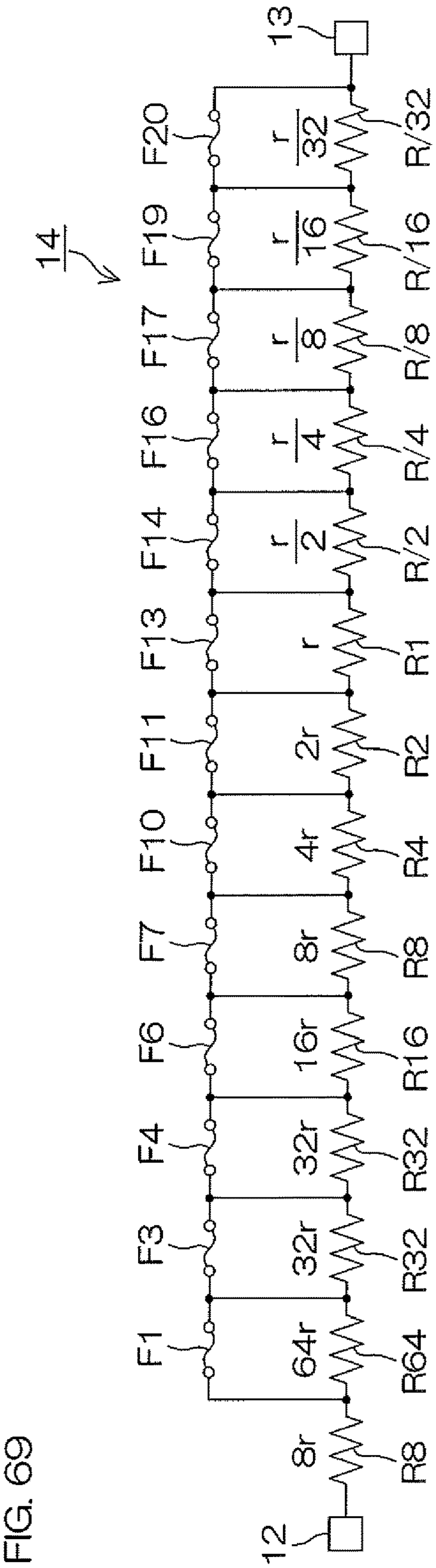

This arrangement is illustrated in the form of an electric circuit diagram in FIG. 69. That is, in a state where none of the fuse films F is fused, the resistor network 14 forms a resistor circuit of the reference resistance unit R8 (resistance value: 8r), formed by the serial connection of the 8 resistor bodies R provided between the first connection electrode 12 and the second connection electrode 13. For example, if the resistance value r of a single resistor body R is r=80Ω, the chip resistor 10 is arranged with the first connection electrode 12 and the second connection electrode 13 being connected by a resistor circuit of 8r=640Ω.

With each of the plurality of types of resistance units besides the reference resistance unit R8, a fuse film F is connected in parallel, and these plurality of types of resistance units are put in short-circuited states by the respective fuse films F. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the resistor network 14.

With the chip resistor 10 according to the present preferred embodiment, a fuse film F is selectively fused, for example, by laser light in accordance with the required resistance value. The resistance unit with which the fuse film F connected in parallel is fused is thereby incorporated into the resistor network 14. The resistor network 14 can thus be made a resistor network with the overall resistance value being the resistance value resulting from serially connecting and incorporating the resistance units corresponding to the fused fuse films F.

In other words, with the chip resistor 10 according to the present preferred embodiment, by selectively fusing the fuse films corresponding to a plurality of types of resistance units, the plurality of types of resistance units (for example, the serial connection of the resistance units R64, R32, and R1 in the case of fusing F1, F4, and F13) can be incorporated into the resistor network. The respective resistance values of the plurality of types of resistance units are predetermined, and the chip resistor 10 can thus be made to have the required resistance value by adjusting the resistance value of the resistor network 14 in a so to speak digital manner.

Also, the plurality of types of resistance units include the plurality of types of serial resistance units, with which the resistor bodies R having an equal resistance value are connected in series with the number of resistor bodies R being increased in geometric progression as 1, 2, 4, 8, 16, 32, and 64, and the plurality of types of parallel resistance units, with which the resistor bodies R having an equal resistance value are connected in parallel with the number of resistor bodies R being increased in geometric progression as 2, 4, 8, 16, and 32, and these are connected in series in states of being short-circuited by the fuse films F and therefore by selectively fusing the fuse films F, the resistance value of the resistor network 14 as a whole can be set to an arbitrary resistance value within a wide range from a small resistance value to a large resistance value.

FIG. 70 is a plan view of a chip resistor 30 according to another preferred embodiment and shows the positional relationships of the first connection electrode 12, the second connection electrode 13, and the resistor network 14 and shows the arrangement in a plan view of the resistor network 14. The chip resistor 30 differs from the chip resistor 10 described above in the mode of connection of the resistor bodies R in the resistor network 14. That is, the resistor network 14 of the chip resistor 30 has a plurality of resistor bodies R having an equal resistance value and being arrayed in a matrix on the substrate (the arrangement of FIG. 70 is an arrangement with a total of 352 resistor bodies R with 8 resistor bodies R being arrayed along the row direction (length direction of the substrate) and 44 resistor bodies R being arrayed along the column direction (width direction of the substrate)). One to 128 of the plurality of resistor bodies R are electrically connected to form a plurality of types of resistance units. The plurality of types of resistance units thus formed are connected in parallel modes by wiring films as network connection means and by the fuse films F. The plurality of fuse films F are arrayed along the inner side of the second connection electrode 13 so that the positioning region thereof is rectilinear, and when a fuse film F is fused, the resistance unit connected to the fuse film is electrically separated from the resistor network 14.

The structure of the plurality of resistor bodies R forming the resistor network 14, and the structures of the connection wiring films and fuse films F are the same as the structures of the corresponding portions in the chip resistor 10 and description of these shall thus be omitted here. FIG. 71 is an illustrative diagram of the connection modes of the plurality of types of resistance units in the resistor network shown in FIG. 70, the positional relationships of the fuse films F connecting the resistance units, and the connection relationships of the plurality of types of resistance units connected to the fuse films F.

Referring to FIG. 71, one end of a reference resistance unit R/16, included in the resistor network 14, is connected to the first connection electrode 12. The reference resistance unit R/16 is formed by a parallel connection of 16 resistor bodies R and the other end thereof is connected to the connection wiring film C, to which the remaining resistance units are connected. One end and the other end of a resistance unit R128, formed by a serial connection of 128 resistor bodies R, are connected to the fuse film F1 and the connection wiring film C. One end and the other end of the resistance unit R64, formed by a serial connection of 64 resistor bodies R, are connected to the fuse film F5 and the connection wiring film C. One end and the other end of the resistance unit R32, formed by a serial connection of 32 resistor bodies R, are connected to the fuse film F6 and the connection wiring film C. One end and the other end of the resistance unit R16, formed by a serial connection of 16 resistor bodies R, are connected to the fuse film F7 and the connection wiring film C. One end and the other end of the resistance unit R8, formed by a serial connection of 8 resistor bodies R, are connected to the fuse film F8 and the connection wiring film C. One end and the other end of the resistance unit R4, formed by a serial connection of 4 resistor bodies R, are connected to the fuse film F9 and the connection wiring film C. One end and the other end of a resistance unit R2, formed by a serial connection of 2 resistor bodies R, are connected to the fuse film F10 and the connection wiring film C. One end and the other end of the resistance unit R1, formed of a single resistor body R, are connected to the fuse film F11 and the connection wiring film C. One end and the other end of the resistance unit R/2, formed by a parallel connection of 2 resistor bodies R, are connected to the fuse film F12 and the connection wiring film C. One end and the other end of the resistance unit R/4, formed by a parallel connection of 4 resistor bodies R, are connected to the fuse film F13 and the connection wiring film C. The fuse films F14, F15, and F16 are electrically connected, and one end and the other end of the resistance unit R/8, formed by a parallel connection of 8 resistor bodies R, are connected to the fuse films F14, F15, and F16 and the connection wiring film C. The fuse films F17, F18, F19, F20, and F21 are electrically connected, and one end and the other end of the resistance unit R/16, formed by connecting 16 resistor bodies R in parallel, are connected to the fuse films F17 to F21 and the connection wiring film C.

The 21 fuse films F of fuse films F1 to F21 are provided and all of these are connected to the second connection electrode 13. By this arrangement, when a fuse film F, to which one end of a resistance unit is connected, is fused, the resistance unit having one end connected to the fuse film F is electrically disconnected from the resistor network 14.

The arrangement of FIG. 71, that is, the arrangement of the resistor network 14 included in the chip resistor 30, is illustrated in the form of an electric circuit diagram in FIG. 72. In a state where none of the fuse films F is fused, the resistor network 14 forms, between the first connection electrode 12 and the second connection electrode 13, a serial connection circuit of the reference resistance unit R/16 and the parallel connection circuit of the 12 types of resistance units R/16, R/8, R/4, R/2, R1, R2, R4, R8, R16, R32, R64, and R128.

A fuse film F is serially connected to each of the 12 types of resistance units besides the reference resistance unit R/16. Therefore with the chip resistor 30 having the resistor network 14, by selectively fusing a fuse film F, for example, by laser light in accordance with the required resistance value, the resistance unit corresponding to the fused fuse film F (the resistance unit connected in series to the fuse film F) is electrically separated from the resistor network 14 and the resistance value of the chip resistor 10 can thereby be adjusted.

In other words, with the chip resistor 30 according to the present preferred embodiment, by selectively fusing the fuse films corresponding to a plurality of types of resistance units, the plurality of types of resistance units can be electrically separated from the resistor network. The respective resistance values of the plurality of types of resistance units are predetermined, and the chip resistor 30 can thus be made to have the required resistance value by adjusting the resistance value of the resistor network 14 in a so to speak digital manner.

Also, the plurality of types of resistance units include the plurality of types of serial resistance units, with which the resistor bodies R having an equal resistance value are connected in series with the number of resistor bodies R being increased in geometric progression as 1, 2, 4, 8, 16, 32, 64, and 128, and the plurality of types of parallel resistance units, with which the resistor bodies R having an equal resistance value are connected in parallel with the number of resistor bodies R being increased in geometric progression as 2, 4, 8, and 16, and therefore by selectively fusing the fuse films F, the resistance value of the resistor network 14 as a whole can be set to an arbitrary resistance value finely and digitally.

With the electric circuit shown in FIG. 72, there is a tendency for an overcurrent to flow through the reference resistance unit R/16 and the resistance units of low resistance value among the parallel connection resistance units, and the rated current that can be made to flow through the resistances must be designed to be large in setting the resistances. Therefore to disperse the current, the connection structure of the resistor network may be changed to change the electric circuit shown in FIG. 72 to that shown in FIG. 73A. That is, the reference resistance unit R/16 is eliminated and the circuit is changed to include an arrangement 140, with which the resistance units that are connected in parallel have a minimum resistance value of r and a plurality of resistance units R1 with the resistance value r are connected in parallel. FIG. 73B is an electric circuit diagram in which specific resistance values are indicated and shows a circuit that includes the arrangement 140 where a plurality of sets of serial connection of a resistance unit of 80Ω and a fuse film F are connected in parallel. Dispersion of the current that flows can thereby be achieved.

FIG. 74 is an electric circuit diagram of the circuit arrangement of the resistor network 14 included in a chip resistor according to yet another preferred embodiment of the present invention. A feature of the resistor network 14 shown in FIG. 74 is that it has the circuit arrangement where a serial connection of a plurality of types of resistance units and a parallel connection of a plurality of types of resistance units are connected in series. As in a preferred embodiment described above, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fuse film F is electrically incorporated into the resistor network 14.

On the other hand, a fuse film F is connected in series to each of the plurality of types of resistance units that are connected in parallel. Therefore by fusing a fuse film F, the resistance unit connected in series to the fuse film F can be electrically disconnected from the parallel connection of resistance units. With this arrangement, for example, a low resistance of not more than 1 kΩ can be formed at the parallel connection side, and a resistor circuit of not less than 1 kΩ can be formed at the serial connection side. Resistor circuits of a wide range, from a low resistance of several Ω to a high resistance of several MΩ, can thereby be formed using the resistor networks 14 arranged with equal basic designs.

Also if the resistance value is to be set more precisely, the fuse film of a serial connection side resistor circuit that is close in resistance value to the required resistance value can be cut in advance and the resistance value can be finely adjusted by fusing the fuse films of the resistor circuits at the parallel connection side to improve the precision of adjustment to the desired resistance value. FIG. 75 is an electric circuit diagram of a specific arrangement example of the resistor network 14 in a chip resistor having a resistance value in the range of 10Ω to 1 MΩ.

The resistor network 14 shown in FIG. 75 also has the circuit arrangement in which a serial connection of a plurality of types of resistance units short-circuited by the fuse films F and a parallel connection of a plurality of types of resistance units serially connected to the fuse films F are connected in series. With the resistor circuit of FIG. 75, an arbitrary resistance value of 10 to 1 kΩ can be set within a precision of 1% at the parallel connection side. Also, an arbitrary resistance value of 1 k to 1MΩ can be set within a precision of 1% at the serial connection side circuit. When the serial connection side circuit is used, the merit of being able to set the resistance value with higher precision is provided by fusing in advance the fuse film F of the resistance unit close to the desired resistance value and then adjusting to the desired resistance value.

In the description above, the chip resistor manufactured by the manufacturing method of the fourth reference example was described in detail. However, the manufacturing method of the fourth reference example is not restricted to a chip restrictor and may be applied to other chip parts that are discrete parts as well as to composite elements that include a resistor body and to electronic devices that include a resistor body. <Invention according to a fifth reference example> (1) Features of the invention according to the fifth reference example. For example, the features of the invention according to the fifth reference example are the following E1 to E10.

(E1) An electronic device including a substrate having an element forming surface and side surfaces, an element formed on the element forming surface of the substrate, a protective film having an element covering portion covering the element and a side surface covering portion covering the side surfaces of the substrate, and a resin film covering the element covering portion in a state where the entirety of the side surface covering portion of the protective film or a portion of the side surface covering portion at the side opposite to the element forming surface is exposed.

With this arrangement, when in manufacturing electronic devices, a plurality of elements are formed on an element forming surface of a wafer and a groove for dividing the electronic devices one by one is formed at the boundaries of the elements on the element forming surface, side surfaces of the groove become side surfaces of the electronic devices after division. Before the division into the electronic devices, a protective film is formed on the side surfaces of the groove and the element forming surface and then a resin film covering the protective film on the element forming surface (the portion that is to become the element covering portion) is formed. With the protective film on the side surfaces of the groove (the portion that is to become the side surface covering portion), at least the side (bottom surface side of the groove) opposite to the element forming surface is left exposed from the resin film, and the groove can thus be prevented from being filled with the resin film from the bottom surface side during the forming of the resin film (during the manufacture of the electronic device).

(E2) The electronic device according to E1 where the resin film has an overhanging portion that overhangs further to the sides than the side surface covering portion of the protective film.

With this arrangement, when the electronic device contacts an object in the surroundings, the overhanging portion contacts the object in the surroundings first and relaxes the impact due to the contact to prevent the impact from being applied to the element, etc.

(E3) The electronic device according to E1 or E2, where the resin film has side surfaces of round shapes that project to the sides. With this arrangement, the overhanging portion can relax the impact due to contact smoothly.

(E4) The electronic device according to any one of E1 to E3, where corner portions of the side surfaces of the substrate have round shapes and the round shapes are formed using a plasma etch or a silicon etch.

With this arrangement, occurrence of chipping (fragmenting) at the corner portions can be prevented.

(E5) The electronic device according to any one of E1 to E4, where the element includes a resistor circuit made up of a unit resistor.

(E6) The electronic device according to any one of E1 to E5, including wiring films formed on the element forming surface and connected to the element and external connection electrodes connected to the wiring films via penetrating holes penetrating through the resin film and the protective film.

(E7) The electronic device according to any one of E1 to E6, where the resin film is made of a photosensitive resin sheet.

(E8) A method for manufacturing an electronic device, including an element forming step of forming an element on an element forming surface of a substrate, a step of forming a groove around a region in which the element is formed, a step of forming a protective film covering a top surface of the element and an inner surface of the groove, a step of adhering a resin sheet from above the protective film and forming, in the groove, a space between the resin sheet and a bottom surface of the groove, a step of patterning the resin sheet so that the resin sheet is separated at portions above the groove, and a step of thinning the substrate from a surface at the opposite side of the element forming surface until the bottom surface of the groove is reached to divide the substrate at the groove.

If the resin sheet is adhered from above the protective film as in the present method, the groove will not be filled from the bottom surface side. The substrate can thus be divided at the groove into the individual electronic devices by thinning the substrate until the bottom surface of the groove is reached.

(E9) The method for manufacturing the electronic device according to E8, where the resin sheet is a photosensitive resin sheet and the step of patterning the resin sheet includes a step of exposing and developing the photosensitive resin sheet with a pattern that matches the groove.

With this method, the overhanging portion can be formed at the separated edge portions of the resin sheet after development.

(E10) The method for manufacturing the electronic device according to E8 or E9, where the step of dividing the substrate includes a step of selectively etching portions of the protective film covering the bottom surface of the groove. (2) Preferred embodiments of the invention related to the fifth reference example. Preferred embodiments of the fifth reference example shall now be described in detail with reference to the attached drawings. The symbols in FIG. 77 to FIG. 91 are effective only for these drawings and, even if used in other preferred embodiments, do not indicate the same elements as the symbols in the other preferred embodiments.

FIG. 77A is a schematic perspective view for describing the arrangement of an electronic device according to a preferred embodiment of the fifth reference example and FIG. 77B is a schematic side view of a state where the electronic device is mounted on a circuit substrate. The electronic device 1 is a minute chip part and, as shown in FIG. 77A, has a rectangular parallelepiped shape. In regard to the dimensions of the electronic device 1, the length L in the long side direction is approximately 0.3 mm, the width W in the short side direction is approximately 0.15 mm, and the thickness T is approximately 0.1 mm.

The electronic device 1 is obtained by forming several electronic devices 1 in a lattice on a wafer (silicon wafer) and then cutting the wafer to separate it into the individual electronic devices 1. The electronic device 1 mainly includes a substrate 2, a first connection electrode 3 and a second connection electrode 4 that are to be external connection electrodes, and an element 5. The first connection electrode 3, the second connection electrode 4, and the element 5 are formed on the substrate 2 by using, for example, a semiconductor manufacturing process. A semiconductor substrate (semiconductor wafer), such as a silicon substrate (silicon wafer), etc., may thus be used as the substrate 2. The substrate 2 may also be another type of substrate, such as an insulating substrate, etc.

The substrate 2 has a substantially rectangular parallelepiped chip shape. With the substrate 2, the upper surface in FIG. 77A is an element forming surface 2A. The element forming surface 2A is the top surface of the substrate 2 and has a substantially rectangular shape. The surface at the opposite side of the element forming surface 2A in the thickness direction of the substrate 2 is a rear surface 2B. The element forming surface 2A and the rear surface 2B are substantially the same in shape. Besides the element forming surface 2A and the rear surface 2B, the substrate 2 has a side surface 2C, a side surface 2D, a side surface 2E, and a side surface 2F that extend orthogonally with respect to these surfaces.

The side surface 2C is constructed between edges at one end in the long direction (the edges at the front left side in FIG. 77A) of the element forming surface 2A and the rear surface 2B, and the side surface 2D is constructed between edges at the other end in the long direction (the edges at the inner right side in FIG. 77A) of the element forming surface 2A and the rear surface 2B. The side surfaces 2C and 2D are the respective end surfaces of the substrate 2 in the long direction. The side surface 2E is constructed between edges at one end in the short direction (the edges at the inner left side in FIG. 77A) of the element forming surface 2A and the rear surface 2B, and the side surface 2F is constructed between edges at the other end in the short direction (the edges at the front right side in FIG. 77A) of the element forming surface 2A and the rear surface 2B. The side surfaces 2E and 2F are the respective end surfaces of the substrate 2 in the short direction.

With the substrate 2, the element forming surface 2A, the side surface 2C, the side surface 2D, the side surface 2E, and the side surface 2F are covered by a protective film 23. Thus to be exact, the element forming surface 2A, the side surface 2C, the side surface 2D, the side surface 2E, and the side surface 2F in FIG. 77A are positioned at the inner sides (rear sides) of the protective film 23 and are not exposed to the exterior. Further, the protective film 23 on the element forming surface 2A is covered by a resin film 24. The resin film 24 protrudes from the element forming surface 2A to respective end portions at the element forming surface 2A side (upper end portions in FIG. 77A) of the side surface 2C, the side surface 2D, the side surface 2E, and the side surface 2F. The protective film 23 and the resin film 24 shall be described in detail later.

With the substrate 2, a recess 10, by which the substrate 2 is notched in the thickness direction, is formed in a portion corresponding to a side A (one of the side surfaces 2C, 2D, 2E, and 2F, and in the present case, the side surface 2C, as shall be described later) of the element forming surface 2A of substantially rectangular shape. The side A is also a side of the electronic device 1 in a plan view. The recess 10 in FIG. 77A is formed in the side surface 2C and is recessed toward the side surface 2D side while extending in the thickness direction of the substrate 2. The recess 10 penetrates through the substrate 2 in the thickness direction, and end portions of the recess 10 in the thickness direction are exposed from the element forming surface 2A and the rear surface 2B, respectively. The recess 10 is smaller than the side surface 2C in the direction of extension of the side surface 2C (the short direction). The shape of the recess 10 in a plan view of viewing the substrate 2 in the thickness direction (which is also the thickness direction of the electronic device 1) is an oblong shape (rectangular shape) that is long in the short direction. The shape of the recess 10 in the plan view may be a trapezoidal shape that becomes narrow toward the direction in which the recess 10 is recessed (toward the side surface 2D side), or may be a triangular shape that becomes thin toward the recessing direction, or may be a U-like shape (a shape recessed in the shape of the letter U). In any case, the recess 10 can be formed easily as long as it has such a simple shape. Although the recess 10 is formed in the side surface 2C here, it may be formed in at least one of the side surface 2C to 2F instead of being formed in the side surface 2C.

The recess 10 indicates the orientation (chip direction) of the electronic device 1 when the electronic device 1 is mounted on a circuit substrate 9 (see FIG. 77B). The outline of the electronic device 1 (to be accurate, the substrate 2) in a plan view is a rectangle having the recess 10 at one side A and is therefore an asymmetrical outer shape in the long direction. That is, the asymmetrical outer shape has the recess 10 indicating the chip direction at a side (side A) among the side surfaces 2C, 2D, 2E, and 2F, and with the electronic device 1, that the recess side in the long direction is the chip direction is indicated by the asymmetrical outer shape. The chip direction of the electronic device 1 can thus be recognized by simply making the outer shape of the substrate 2 of the electronic device 1 asymmetrical in a plan view. That is, the chip direction can be recognized by the outer shape of the electronic device 1 even without a marking step. In particular, the asymmetrical outer shape of the electronic device 1 is a rectangle having the recess 10, indicating the chip direction, at the side A, and the recess 10 side in the long direction joining the side A and a side B at the opposite side can thus be made the chip direction with the electronic device 1. Therefore, for example, by enabling the electronic device 1 to be mounted correctly on the circuit substrate 9 when the side A is positioned at the left end when the long direction of the electronic device 1 in a plan view is matched with the right/left direction, that the orientation of the electronic device 1 must be set so that the side A is positioned at the left end in a plan view in the mounting process can be ascertained from the outer appearance of the electronic device 1 by the recess 10.

With the rectangular parallelepiped substrate 2, corner portions 11 that form the boundaries between mutually adjacent side surfaces (the portions 11 of intersection of the mutually adjacent side surfaces) among the side surface 2C, side surface 2D, side surface 2E, and side surface 2F are shaped (rounded) to chamfered round shapes. Also with the substrate 2, corner portions 12 that form the boundaries between the recess 10 and the side surface 2C in the periphery of the recess 10 (the corner portions 12 at the recess 10C in the side surface 2C) are also shaped to chamfered round shapes. Here, the corner portions 12 are present not only at the boundaries of the recess 10 and the side surface 2C at the periphery of the recess 10 (portions besides the recess 10) but are also present at the innermost sides of the recess 10 and are thus present at four locations in a plan view.

All of the bent portions (corner portions 11 and 12) of the outline of the substrate 2 in a plan view thus have round shapes. The occurrence of chipping can thus be prevented at the corner portions 11 and 12 of the round shapes. Improvement of yield (improvement of productivity) can thereby be achieved in the manufacture of the electronic device 1. The first connection electrode 3 and the second connection electrode 4 are formed on the element forming surface 2A of the substrate 2 and are partially exposed from the resin film 24. Each of the first connection electrode 3 and the second connection electrode 4 is formed by laminating, for example, Ni (nickel), Pd (palladium), and Au (gold) in that order on the element forming surface 2A. The first connection electrode 3 and the second connection electrode 4 are disposed across an interval in the long direction of the element forming surface 2A and are long in the short direction of the element forming surface 2A. In FIG. 77A, the first connection electrode 3 is provided at a position of the element forming surface 2A close to the side surface 2C and the second connection electrode 4 is provided at a position close to the side surface 2D. The recess 10 in the side surface 2C is recessed to a depth that does not interfere with the first connection electrode 3. However, depending on the case, the first connection electrode 3 may also be provided with a recess (that becomes a portion of the recess 10) in accordance with the recess 10.

The element 5 is a circuit element, is formed in a region of the element forming surface 2A of the substrate 2 between the first connection electrode 3 and the second connection electrode 4, and is covered from above by the protective film 23 and the resin film 24. The element 5 of the present preferred embodiment is a resistor 56 arranged by a circuit network in which a plurality of thin-film-like resistor bodies (thin film resistor bodies) R, made of TiN (titanium nitride) or TiON (titanium oxide nitride), are arrayed in a matrix on the element forming surface 2A. The element 5 is connected to wiring films 22, to be described below, and is connected to the first connection electrode 3 and the second connection electrode 4 via the wiring films 22. A resistor circuit is thus formed by the element 5 between the first connection electrode 3 and the second connection electrode 4 in the electronic device 1. Therefore in the present preferred embodiment, the electronic device 1 is a chip resistor.

The electronic device 1 can be flip-chip connected to the circuit substrate 9 by making the first connection electrode 3 and the second connection electrode 4 face the circuit substrate 9 and electrically and mechanically connecting the electrodes to circuits (not shown) of the circuit substrate 9 by solders 13 as shown in FIG. 77B. The first connection electrode 3 and the second connection electrode 4 that function as the external connection electrodes are preferably formed of gold (Au) or has gold plating applied on the surfaces thereof to improve solder wettability and improve reliability.

FIG. 78 is a plan view of the electronic device and shows the positional relationships of the first connection electrode, the second connection electrode, and the element and shows the arrangement in a plan view of the element. With reference to FIG. 78, the element 5 that is a resistor network has, for example, a total of 352 resistor bodies R arranged from 8 resistor bodies R being arrayed along the row direction (length direction of the substrate 2) and 44 resistor bodies R being arrayed along the column direction (width direction of the substrate 2). The respective resistor bodies R have an equal resistance value.

The plurality of resistor bodies R are electrically connected in groups of predetermined numbers of 1 to 64 to form a plurality of types of resistance units (unit resistors). The plurality of types of resistance units thus formed are connected in predetermined modes via connection conductor films C. Further, on the element forming surface 2A of the substrate 2, a plurality of fuse films F are provided that electrically incorporate resistance units into the element 5 or are capable of being fused to electrically separate resistance units from the element 5. The plurality of fuse films F and the connection conductor films C are arrayed along the inner side of the second connection electrode 4 so that the positioning regions thereof are rectilinear. More specifically, the plurality of fuse films F and the connection conductor films C are disposed rectilinearly.

FIG. 79A is partially enlarged plan view of the element shown in FIG. 78. FIG. 79B is a vertical sectional view in the length direction taken along B-B of FIG. 79A for describing the arrangement of resistor bodies in the element. FIG. 79C is a vertical sectional view in the width direction taken along C-C of FIG. 79A for describing the arrangement of the resistor bodies in the element. The arrangement of the resistor bodies R shall now be described with reference to FIG. 79A, FIG. 79B, and FIG. 79C.

Besides the wiring films 22, the protective film 23, and the resin film 24, the electronic device 1 further includes an insulating film 20 and resistor body films 21 (see FIG. 79B and FIG. 79C). The insulating film 20, the resistor body films 21, the wiring films 22, the protective film 23, and the resin film 24 are formed on the substrate 2 (element forming surface 2A). The insulating film 20 is made of $SiO_2$ (silicon oxide). The insulating film 20 covers the entirety of the element forming surface 2A of the substrate 2. The thickness of the insulating film 20 is approximately 10000 Å.

The resistor body films 21 make up the resistor bodies R. The resistor body films 21 are formed of TiN or TiON and are laminated on the top surface of the insulating film 20. The thickness of each resistor body film 21 is approximately 2000 Å. The resistor body films 20 form a plurality of lines (hereinafter referred to as "resistor body film lines 21A") extending as lines between the first connection electrode 3 and the second connection electrode 4, and there are cases where a resistor body film line 21A is cut at predetermined positions in the line direction (see FIG. 79A).

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A while being spaced apart by fixed intervals R in the line direction. The electrical features of the resistor body film lines 21A and the wiring films 22 are indicated in the form of circuit symbols in FIGS. 80A, 80B, and 80C. That is, as shown in FIG. 80A, each of the resistor body film line 21A portions in regions of the predetermined interval R forms a resistor body R with a fixed resistance value r.

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 80B. Also, adjacent resistor body film lines 21A are connected to each other by the resistor body films 21 and wiring films 22, and the resistor network of the element 5 shown in FIG. 79A forms the resistor circuit (made up of the unit resistors of resistor bodies R) shown in FIG. 80C.

Here, based on the characteristic that resistor body films 21 of the same shape with the same size that are formed on the substrate 2 are substantially the same in value, the plurality of resistor bodies R arrayed in a matrix on the substrate 2 have an equal resistance value. Also, the wiring films 22 laminated on the resistor body film lines 21A form the resistor bodies R and also serve the role of connection wiring films that connect a plurality of resistor bodies R to arrange a resistance unit.

FIG. 81A is partially enlarged plan view of a region including the fuse films drawn by enlarging a portion of the plan view of the electronic device shown in FIG. 78, and FIG. 81B is a structural sectional view taken along B-B in FIG. 81A. As shown in FIGS. 81A and 81B, the fuse films F and the connection conductor films C are also formed by the wiring films 22, which are laminated on the resistor body films 21 that form the resistor bodies R. That is, the fuse films F and the connection conductor films C are formed of Al or AlCu alloy, which is the same metal material as that of the wiring films 22, on the same layer as the wiring films 22, which are laminated on the resistor body film lines 21A that form the resistor bodies R.

That is, on the same layer laminated on the resistor body films 20, the wiring films for forming the resistor bodies R, the fuse films F, the connection conductor films C, and the wiring films for connecting the element 5 to the first connection electrode 3 and the second connection electrode 4 are formed as the wiring films 22 by the same manufacturing process (the sputtering and photolithography process to be described below) using the same metal material (Al or AlCu alloy).

The fuse film F may refer not only to a portion of the wiring films 22 but may also refer to an assembly (fuse element) of a portion of a resistor body R (resistor body film 21) and a portion of the wiring film 22 on the resistor body film 21. Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

FIG. 82 is an electric circuit diagram of the element according to the preferred embodiment of the fifth reference example. Referring to FIG. 82, the element 5 is arranged by serially connecting a reference resistance unit R8, a resistance unit R64, two resistance units R32, a resistance unit R16, a resistance unit R8, a resistance unit R4, a resistance unit R2, a resistance unit R1, a resistance unit R/2, a resistance unit R/4, a resistance unit R/8, a resistance unit R/16, and a resistance unit R/32 in that order from the first connection electrode 3. Each of the reference resistance unit R8 and resistance units R64 to R2 is arranged by serially connecting the same number of resistor bodies R as the number at the end of its symbol ("64" in the case of R64).

The resistance unit R1 is arranged from a single resistor body R. Each of the resistance units R/2 to R/32 is arranged by connecting the same number of resistor bodies R as the number at the end of its symbol ("32" in the case of R/32) in parallel. The meaning of the number at the end of the symbol of the resistance unit is the same in FIG. 83 and FIG. 84 to be described below.

One fuse film F is connected in parallel to each of the resistance unit R64 to resistance unit R/32, besides the reference resistance unit R8. The fuse films F are mutually connected in series directly or via the connection conductor film C (see FIG. 81A). In a state where none of the fuse films F is fused as shown in FIG. 82, the element 5 forms a resistor circuit of the reference resistance unit R8 (resistance value: 8r), formed by the serial connection of the 8 resistor bodies R provided between the first connection electrode 3 and the second connection electrode 4. For example, if the resistance value r of a single resistor body R is r=80Ω, the chip resistor (electronic device 1) is arranged with the first connection electrode 3 and the second connection electrode 4 being connected by a resistor circuit of 8r=64Ω.

Also in the state where none of the fuse films F is fused, the plurality of types of resistance units besides the reference resistance unit R8 are put in short-circuited states. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the element 5.

With the electronic device 1 according to the present preferred embodiment, a fuse film F is selectively fused, for example, by laser light in accordance with the required resistance value. The resistance unit with which the fuse film F connected in parallel is fused is thereby incorporated into the element 5. The overall resistance value of the element 5 can thus be set to the resistance value resulting from serially connecting and incorporating the resistance units corresponding to the fused fuse films F.

In particular, the plurality of types of resistance units include the plurality of types of serial resistance units, with which the resistor bodies R having the equal resistance value are connected in series with the number of resistor bodies R being increased in geometric progression as 1, 2, 4, 8, 16, 32, . . . , and the plurality of types of parallel resistance units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the element 5 (resistor 56) as a whole can be adjusted finely and digitally to an arbitrary resistance value to enable a resistance of a desired value to be formed in the electronic device 1.

FIG. 83 is an electric circuit diagram of an element according to another preferred embodiment of the fifth reference example. Instead of arranging the element 5 by serially connecting the reference resistance unit R8 and the resistance unit R64 to the resistance unit R/32 as described above, the element 5 may be arranged as shown in FIG. 83. To be detailed, the element 5 may be arranged, between the first connection electrode 3 and the second connection electrode 4, as a serial connection circuit of the reference resistance unit R/16 and the parallel connection circuit of the 12 types of resistance units R/16, R/8, R/4, R/2, R1, R2, R4, R8, R16, R32, R64, and R128.

In this case, a fuse film F is serially connected to each of the 12 types of resistance units besides the reference resistance unit R/16. In a state where none of the fuse films F is fused, the respective resistance units are electrically incorporated in the element 5. By selectively fusing a fuse film F, for example, by laser light in accordance with the required resistance value, the resistance unit corresponding to the fused fuse film F (the resistance unit connected in series to the fuse film F) is electrically separated from the element 5 and the resistance value of the electronic device 1 as a whole can thereby be adjusted.

FIG. 84 is an electric circuit diagram of an element according to yet another preferred embodiment of the fifth reference example. A feature of the element 5 shown in FIG. 84 is that it has the circuit arrangement where a serial connection of a plurality of types of resistance units and a parallel connection of a plurality of types of resistance units are connected in series. As in a previous preferred embodiment, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fused fuse film F is electrically incorporated into the element 5.

On the other hand, a fuse film F is connected in series to each of the plurality of types of resistance units that are connected in parallel. Therefore by fusing a fuse film F, the resistance unit connected in series to the fused fuse film F can be electrically disconnected from the parallel connection of resistance units. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

FIG. 85 is a schematic sectional view of the electronic device. The electronic device 1 shall now be described in further detail with reference to FIG. 85. For the sake of description, the element 5 is illustrated in a simplified form and hatching is applied to respective elements besides the substrate 2 in FIG. 85. Here, the protective film 23 and the resin film 24 shall be described.

The protective film 23 is made, for example, from SiN (silicon nitride) and the thickness thereof is approximately 3000 Å. The protective film 23 integrally includes an element covering portion 23A, provided across the entirety of the element forming surface 2A and covering the resistor body films 21 and the respective wiring films 22 on the resistor body films 21 (that is, the element 5) from the top surface (upper side in FIG. 85) (that is, covering the upper surfaces of the respective resistor bodies R in the element 5), and a side surface covering portion 23B, covering the respective entireties of the four side surfaces 2C to 2F (see FIG. 77A) of the substrate 2. The element covering portion 23A and the side surface covering portion 23B are actually substantially the same in thickness and are mutually continuous. Therefore, as a whole, the protective film 23 covers the upper surfaces of the resistor bodies R and the side surfaces 2C to 2F of the substrate 2 continuously with substantially the same thickness.

Short-circuiting across the resistor bodies R (short-circuiting across adjacent resistor body film lines 21A) at portions besides the wiring films 22 is prevented by the element covering portion 23A. The side surface covering portion 23B not only covers the respective entireties of the side surfaces 2C to 2F but also covers portions of the insulating film 20 that are exposed to the side surfaces 2C to 2F. At the side surface 2C, the side surface covering portion 23B covers the entirety including the portion at which the recess 10 is formed (see FIG. 77A). Short-circuiting at the respective side surfaces 2C to 2F (forming of a short circuit path at any of the side surfaces) is prevented by the side surface covering portion 23B.

Referring to FIG. 77A, the protective film 23 continuously covers the element forming surface 2A and the four side surfaces 2C to 2F of the substrate 2 and therefore has corner portions 26 of round shapes along the corner portions 11 and 12 of the substrate 2. In this case, the element 5 and the wiring films 22 can be protected by the protective film 23 and occurrence of chipping at the corner portions 26 of the protective film 23 can be prevented.

Returning to FIG. 85, the resin film 24, together with the protective film 23, protects the electronic device 1 and is made of a resin, such as polyimide, etc. The thickness of the resin film 24 is approximately 5 μm. The resin film 24 covers the top surface of the element covering portion 23A (upper surface of the protective film 23) across its entirety and covers end portions at the element forming surface 2A side (upper end portions in FIG. 85) of the side surface covering portion 23B on the four side surfaces 2C to 2F of the substrate 2. That is, with the side surface covering portion 23B on the four side surfaces 2C to 2F, at least a portion at the side (lower side in FIG. 85) opposite to the element forming surface 2A is left exposed from the resin film 24.

With such a resin film 24, the portion coinciding with the four side surfaces 2C to 2F in a plan view is an arcuate overhanging portion 24A that overhangs further to the sides (outward) than the side surface covering portion 23B on the side surfaces. That is, the resin film 24 (overhanging portion 24A) protrudes beyond the side surface covering portion 23B (protective film 23) at the side surfaces 2C to 2F. Such a resin film 24 has side surfaces 24B of round shapes that project to the sides at the arcuate overhanging portion 24A. The overhanging portion 24A covers corner portions 27 forming the boundaries between the element forming surface 2A and the respective side surfaces 2C to 2F. Therefore, when the electronic device 1 contacts an object in the surroundings, the overhanging portion 24A contacts the object in the surroundings first and relaxes the impact due to the contact to prevent the impact from being applied to the element 5, etc., and prevent chipping at the corner portions 27. In particular, the overhanging portion 24A has side surfaces 24B with round shapes and can thus relax the impact due to contact smoothly.

An arrangement where the resin film 24 does not cover the side surface covering portion 23B at all (an arrangement where the entire side surface covering portion 23B is exposed) is also possible. In the resin film 24, openings 25 are formed, one at each of two positions that are separated in a plan view. Each opening 25 is a penetrating hole penetrating continuously through each of the resin film 24 and the protective film 23 (element covering portion 23A) in the thickness direction. The openings 25 are thus formed not only in the resin film 24 but also in the protective film 23. Portions of wiring films 22 are exposed at the respective openings 25. The portions of the wiring films 22 exposed at the respective openings 25 are pad regions 22A for external connection.

Of the two openings 25, one opening 25 is completely filled by the first connection electrode 3 and the other opening 25 is completely filled by the second connection electrode 4. A portion of each of the first connection electrode 3 and the second connection electrode 4 protrudes from the opening 25 at the top surface of the resin film 24. The first connection electrode 3 is electrically connected via the one opening 25 to the wiring film 22 at the pad region 22A in this opening 25. The second connection electrode 4 is electrically connected via the other opening 25 to the wiring film 22 at the pad region 22A in this opening 25. The first connection electrode 3 and the second connection electrode 4 are thereby electrically connected to the element 5. Here, the wiring films 22 form wirings that are respectively connected to groups of resistor bodies R (resistor 56) and the first connection electrode 3 and the second connection electrode 4.

The resin film 24 and the protective film 23, in which the openings 25 are formed, are thus formed so that the first connection electrode 3 and the second connection electrode 4 are exposed from the openings 25. Electrical connection between the electronic device 1 and the circuit substrate 9 can thus be achieved via the first connection electrode 3 and the second connection electrode 4 protruding from the openings 25 at the top surface of the resin film 24 (see FIG. 77B).

FIG. 86A to FIG. 86F are illustrative sectional views of a method for manufacturing the electronic device shown in FIG. 85. First, as shown in FIG. 86A, a wafer 30, made of Si, is prepared. The wafer 30 is the base for the substrate 2. A top surface 30A of the wafer 30 is thus the element forming surface 2A of the substrate 2 and a rear surface 30B of the wafer 30 is the rear surface 2B of the substrate 2.

The insulating film 20, made of $SiO_2$, etc., is then formed on the top surface 30A of the wafer 30, and the element 5 (the resistor bodies R and the wiring films 22) is formed on the insulating film 20. Specifically, first, the resistor body film 21 of TiN or TiON is formed by sputtering on the entire surface of the insulating film 20 and further, the wiring film 22 of aluminum (Al) is laminated on the resistor body film 21. Thereafter, a photolithography process is used and, for example, dry etching is performed to selectively remove the resistor body film 21 and the wiring film 22 to obtain the arrangement where, as shown in FIG. 79A, the resistor body film lines 21A of fixed width, at which the resistor body film 21 is laminated, are arrayed in the column direction while being spaced apart by fixed intervals in a plan view. Regions at which the resistor body film lines 21A and the wiring films 22 are interrupted are also formed at this point. The wiring films 22 laminated on the resistor body film lines 20 are then removed selectively. The element 5 of the arrangement where the wiring films 22 are laminated on the resistor body film lines 21A while being spaced apart by the fixed intervals R is consequently obtained.

With reference to FIG. 86A, the elements 5 are formed on a plurality of locations on the top surface 30A of the wafer 30 in accordance with the number of electronic devices 1 to be formed on the single wafer 30. Then as shown in FIG. 86B, a resist pattern 41 is formed across the entirety of the top surface 30A of the wafer 30 so as to cover all of the elements 5 on the insulating film 20. An opening 42 is formed in the resist pattern 41.

FIG. 87 is a schematic plan view of a portion of the resist pattern used for forming a groove in the step of FIG. 86B. The opening 42 of the resist pattern 41 coincides with regions (hatched portions in FIG. 87) between outlines of mutually adjacent electronic devices 1 in a plan view in a case where a plurality of electronic devices 1 are disposed in an array (that is also a lattice). The overall shape of the opening 42 is thus a lattice having a plurality of mutually orthogonal rectilinear portions 42A and 42B. Also, in either of the rectilinear portions 42A and 42B (the rectilinear portions 42A in the present example), projecting portions 42C, projecting orthogonally from the rectilinear portions 42A, are provided in continuous form in correspondence to the recesses 10 of the electronic devices 1 (see FIG. 77A).

Here, with each electronic device 1, the corner portions 11 and 12 have round shapes (see FIG. 77A). Accordingly, the mutually orthogonal rectilinear portions 42A and 42B in the opening 42 are curvingly connected to each other. The mutually orthogonal rectilinear portions 42A and projecting portions 42C are also curvingly connected to each other. Intersection portions 43A of the rectilinear portions 42A and 42B and intersection portions 43B of the rectilinear portions 42A and projecting portions 42C thus have round shapes with rounded corners. Also, in each projecting portion 42C, corners besides the intersection portion 43B are also rounded.

Referring to FIG. 86B, the insulating film 20 and the wafer 30 are respectively removed selectively by plasma etching using the resist pattern 41 as a mask. A groove 44, penetrating through the insulating film 20 and reaching the middle of the thickness of the wafer 30, is thereby formed at positions coinciding with the opening 42 of the resist pattern 41 in a plan view. The groove 44 has mutually facing side surfaces 44A and a bottom surface 44B joining the lower ends (ends at the rear surface 30B side of the wafer 30) of the facing side surfaces 44A. The depth of the groove 44 on the basis of the top surface 30A of the wafer 30 is approximately 100 μm and the width of the groove 44 (interval between facing side surfaces 44A) is approximately 20 μm.

FIG. 88A is a schematic plan view of the wafer after the groove has been formed in the step of FIG. 86B, and FIG. 88B is an enlarged view of a portion in FIG. 88A. Referring to FIG. 88B, the overall shape of the groove 44 is a lattice that coincides with the opening 42 (see FIG. 87) of the resist pattern 41 in a plan view. At the top surface 30A of the wafer 30, rectangular frame portions of the groove 44 surround the regions in which the respective elements 5 are formed. In the wafer 30, each portion in which the element 5 is formed is a semi-finished product 50 of the electronic device 1. At the top surface 30A of the wafer 30, one semi-finished product 50 is positioned in each region surrounded by the groove 44, and these semi-finished products 50 are arrayed and disposed in an array.

Also, at each portion corresponding to the projecting portion 42C (see FIG. 87) in the opening 42 of the resist pattern 41, the groove 44 is formed so as to delve into a middle portion of a side A of the semi-finished product 50, and the recess 10 (see FIG. 77A) is thereby formed in the semi-finished product 50. Corner portions 60 (to become the corner portions 11 and 12 of the electronic device 1) of the semi-finished product 50 in a plan view are shaped to round shapes in accordance with the intersection portions 43A and 43B (see FIG. 87) with round shapes in the opening 42 of the resist pattern 41. Although these round shapes are formed by using a plasma etch, a silicon etch (an ordinary etch using a chemical solution) may be used in place of the plasma etch.

By thus etching the wafer 30, the outer shape of the semi-finished product 50 (in other words, the electronic device 1 in its final form) can be set to any shape and can be set, as in the present preferred embodiment, to an asymmetrical rectangle with corner portions 60 (corner portions 11 and 12) with round shapes and having the recess 10 at the side A (see also FIG. 77A). In this case, the electronic device 1, with which a chip direction can be recognized, can be manufactured without a marking step (a step of marking a mark, etc., indicating the chip direction by a laser, etc.).

After the groove 44 has been formed, the resist pattern 41 is removed and the protective film (SiN) film 45 made of SiN is formed on the top surfaces of the elements 5 by CVD (chemical vapor deposition) method as shown in FIG. 86C. The SiN film 45 has a thickness of approximately 3000 Å. The SiN film 45 is formed so as to cover not only the entireties of the top surfaces of the elements 5 but also the inner surfaces (side surfaces 44A and bottom surface 44B) of the groove 44. The SiN film 45 is a thin film that is formed to a substantially fixed thickness on the side surfaces 44A and bottom surface 44B and therefore does not fill the groove 44 completely. Also, in the groove 44, the SiN film 45 suffices to be formed on the entireties of the side surfaces 44A and does not have to be formed on the bottom surface 44B.

Thereafter, a photosensitive resin sheet 46, made of polyimide, is adhered onto the wafer 30 from above the SiN film 45 at portions besides the groove 44 as shown in FIG. 86D. FIGS. 89A and 89B are illustrative perspective views of states of adhering the polyimide sheet onto the wafer in the step of FIG. 86D. Specifically, after covering the wafer 30 (to be accurate, the SiN film 45 on the wafer 30) with the polyimide sheet 46 from the top surface 30A side as shown in FIG. 89A, the sheet 46 is pressed against the wafer 30 by a rotating roller 47 as shown in FIG. 89B.

When the sheet 46 has been adhered on the entirety of the top surface of the SiN film 45 at portions besides the groove 44 as shown in FIG. 86D, although portions of the sheet 46 are slightly indented toward the groove 44 side, only portions at the element 5 side (top surface 30A side) of the SiN film 45 on the side surfaces 44A of the groove 44 are covered and the sheet 46 does not reach the bottom surface 44B of the groove 44. A space S of substantially the same size as the groove 44 is thus formed inside the groove 44 between the sheet 46 and the bottom surface 44B of the groove 44. The thickness of the sheet 46 in this state is 10 μm to 30 μm.

Thereafter, a heat treatment is applied to the sheet 46. The thickness of the sheet 46 is thereby thermally contracted to approximately 5 μm. Thereafter, as shown in FIG. 86E, the sheet 46 is patterned and portions of the sheet 46 coinciding with the groove 44 and the respective pad regions 22A of the wiring films 22 in a plan view are selectively removed. Specifically, a mask 62, having formed therein openings 61 of a pattern matching (coinciding with) the groove 44 and the respective pad regions 22A in a plan view, is used and the sheet 46 is exposed and developed with this pattern. The sheet 46 is thereby separated at portions above the groove 44 and the respective pad regions 22A and separated edge portions of the sheet 46 droop slightly toward the groove 44 to overlap with the SiN film 45 on the side surfaces 44A of the groove 44 so that the overhanging portion 24A (having the side surfaces 24B of round shapes) is formed naturally at the edge portions.

By then performing etching using the sheet 46 that has been separated in the above manner as a mask, the portions of the SiN film 45 coinciding with the respective pad regions 22A in a plan view are removed. The openings 25 are thereby formed. The SiN film 45 is thereby formed so as to expose the respective pad regions 22A. Ni/Pd/Au laminated films, arranged by laminating Ni, Pd, and Au, are then formed by electroless plating on the pad regions 22A in the respective openings 25. In this process, the Ni/Pd/Au laminated films are formed so as to protrude onto the top surface of the sheet 46 from the openings 25. The Ni/Pd/Au laminated films inside the respective openings 25 thus become the first connection electrode 3 and the second connection electrode 4 shown in FIG. 86F.

Then after performing a conduction test across the first connection electrode 3 and the second connection electrode 4, the wafer 30 is ground from the rear surface 30B. Here, the entirety of the portions of the wafer 30 forming the side surfaces 44A of the groove 44 is covered by the SiN film 45 so that formation of microcracks, etc., in those portions during the grinding of the wafer 30 is prevented, and even if a microcrack forms, the microcrack can be embedded by the SiN film 45 to suppress expansion of the microcrack.

When the wafer 30 has been thinned by grinding to the bottom surface 44B of the groove 44 (to be accurate, the SiN film 45 on the bottom surface 44B), portions joining mutually adjacent semi-finished products 50 are no longer present and the wafer 30 is thus divided with the groove 44 as boundaries and the semi-finished products 50 are separated individually as electronic devices 1. The electronic devices 1 (see FIG. 85) are thereby completed. With each electronic device 1, each portion that formed a side surface 44A of the groove 44 becomes one of the side surfaces 2C to 2F of the substrate 2. The SiN film 45 becomes the protective film 23. Also, the separated sheet 46 becomes the resin film 24.

Even if the electronic devices 1 are small in chip size, the electronic devices 1 can be separated into individual chips by thus forming the groove 44 in advance and then grinding the wafer 30 from the rear surface 30B. Therefore in comparison to the conventional case where the wafer 30 is diced using a dicing saw to separate the electronic devices 1 into individual chips, the dicing step can be eliminated to promote cost reduction and time savings and achieve improvement of yield.

With the above, when in manufacturing the electronic devices 1, the plurality of elements 5 are formed on the top surface 30A (element forming surface 2A) of the wafer 30 and the groove 44 for dividing the electronic devices 1 one by one is formed at the boundaries of the elements 5 in the top surface 30A, the side surfaces 44A of the groove 44 become the side surfaces 2C to 2F of the respective electronic devices 1 after the division. The SiN film 45 (protective film 23) is formed on the side surfaces 44A of the groove 44 and the top surface 30A of the wafer 30 before division into the electronic devices 1. Here, as shown in FIG. 86C, the protective film (CVD protective film) 23 of substantially the same thickness of CVD is formed continuously by the CVD method on the upper surfaces of the resistor bodies R and the inner surfaces (side surfaces 44A and bottom surface 44B) of the groove 44. In this case, the CVD protective film 23 (SiN film 45) is formed under a reduced pressure environment in the process of CVD, and therefore the CVD protective film 23 can be deposited as the side surface covering portion 23B on the entireties of the side surfaces 2C to 2F of the substrate 2 (side surfaces 44A of the groove 44). The protective film 23 can thus be formed uniformly on the side surfaces 44A of the groove 44 during manufacture of the electronic device 1.

Then after forming the protective film 23, the resin film 24 is formed by the sheet 46 covering the SiN film 45 (the portion of the protective film 23 to be the element covering portion 23A) on the element forming surface 2A as shown in FIG. 86D. With the SiN film 45 on the side surfaces 44A of the groove 44 (the portion to become the side surface covering portion 23B of the protective film 23), at least the side (the bottom surface 44B side of the groove 44) opposite to the element forming surface 2A is left exposed from the resin film 24 so that the groove 44 can be prevented from being filled with the resin film 24 from the bottom surface 44B side during the forming of the resin film 24 (during the manufacture of the electronic device 1).

Specifically, the resin film 24 is formed by adhering the sheet 46 from above the protective film 23. In this case, the groove 44 will not be filled with the sheet 46 from the bottom surface 44B side. Therefore by thinning the substrate 2 until the bottom surface 44B of the groove 44 is reached as shown in FIG. 86F, the substrate 2 can be divided into the individual electronic devices 1 at the groove 44. Although a preferred embodiment of the fifth reference example has been described above, the fifth reference example may be implemented in yet other modes.

For example, in dividing the wafer 30 into the individual electronic devices 1, the wafer 30 is ground to the bottom surface 44B of the groove 44 from the rear surface 30B side (see FIG. 86F). Instead, the wafer 30 may be divided into the individual electronic devices 1 by removing the portions of the SiN film 45 covering the bottom surface 44B and portions of the wafer 30 coinciding with the groove 44 in a plan view by selectively etching from the rear surface 30B.

FIG. 90A is a plan view of an electronic device, FIG. 90B is a plan view of an electronic device according to a first modification example, and FIG. 90C is a plan view of an electronic device according to a second modification example. In each of FIGS. 90A to 90C, illustration of the element 5, the protective film 23, and the resin film 24 is omitted for the sake of description. Also, as shown in FIG. 90A, the recess 10 is provided at a position of the side A of the electronic device 1 that is shifted from the midpoint P of the side A. When the recess 10 is shifted from the midpoint P, the center 10A of the recess 10 and the midpoint P do not coincide in the direction of extension of the side A. With this arrangement, not only the recess 10 side in the direction joining the side A and the side B at the opposite side of the side A (the long direction) but the recess 10 side in the direction of extension of the side A (short direction) can also be made the chip direction. For example, the electronic device 1 is arranged to be mounted correctly on the circuit substrate 9 when, in a plan view as viewed from the element forming surface 2A side, the short direction of the electronic device 1 and the front/rear direction (up/down direction in FIG. 90) are matched, the long direction of the electronic device 1 and the right/left direction are matched, and the recess 10 is positioned so as to be biased to the front left (upper left in FIG. 90) in this state. That the orientation of the electronic device 1 must be set so that the recess 10 is positioned so as to be biased to the front left in a plan view (to the front right when the electronic device 1 is viewed from the rear surface 2B of the substrate 2) in the mounting process can thus be ascertained from the outer appearance of the electronic device 1. That is, that the orientation of the electronic device 1 must be matched in both the long direction and the short direction can be ascertained from the outer appearance of the electronic device 1.

Obviously, the recess 10 may be provided at a position of the side A that coincides with the midpoint P (position at which the center 10A of the recess 10 coincides with the midpoint P in the short direction) as shown in FIG. 90B. Also, in place of the recess 10, an outwardly projecting projection 51 may be provided as shown in FIG. 90C. The projection 51 may have a rectangular shape, a U-like shape (a shape that bulges in the shape of the letter U), or a triangular shape in a plan view. Obviously at the side surface 2C, corner portions (the four corner portions in a plan view including those at the tip side and root side of the projection 51) 52 of the projection 51 have chamfered round shapes like those of the other corner portions 11. Here, as in the case of the recess 10, the side surface covering portion 23B (see FIG. 77A) covers the entirety of the side surface 2C, including the portion at which the projection 51 is formed. Also, the depth of the recess 10 and the height (projection amount) of the projection 51 are preferably not more than 20 μm (not more than approximately one-fifth the width of the first connecting electrode 3 and the second connection electrode 4). Also the chamfer amount of each of the corner portions 11, corner portions 12, and corner portions 52, is preferably such that the distance at one side is not more than approximately 20 μm.

FIG. 91A is a diagram of the circuit arrangement of an element according to another preferred embodiment of the electronic device, and FIG. 91B is a diagram of the circuit arrangement of an element according to yet another preferred embodiment of the electronic device. Although with the preferred embodiment described above, the electronic device 1 is a chip resistor and the element 5 between the first connection electrode 3 and the second connection electrode 4 is thus the resistor 56, it may instead be a diode 55, shown in FIG. 91A, or an element with which the diode 55 and the resistor 56 are connected in series as shown in FIG. 91B. By having the diode 55, the electronic device 1 becomes a chip diode, a polarity is present in the first connection electrode 3 and the second connection electrode 4, and the chip direction is a direction that is in accordance with the polarity. The polarity of the first connection electrode 3 and the second connection electrode 4 can thereby be indicated by the chip direction and the polarity can thus be ascertained from the outer appearance of the electronic device 1. That is, which side in the chip direction (that is, which of the first connection electrode 3 and the second connection electrode 4) is the positive or negative pole side can be ascertained. The electronic device 1 can thus be mounted correctly on the circuit substrate 9 (see FIG. 77B) so that the side at which the recess 10 or the projection 51 (see FIG. 90) is provided is set at the corresponding pole side.

Obviously, the fifth reference example may be applied to an element device, having any of various elements, such as a chip capacitor, which uses a capacitor in place of the diode 55 in the element 5, a chip inductor, etc., formed on the chip-sized substrate 2. <Invention according to a sixth reference example> (1) Features of the invention according to the sixth reference example. For example, the features of the invention according to the sixth reference example are the following F1 to F10.

(F1) An electronic device including a substrate having an element forming surface and side surfaces, a resistor body formed on the element forming surface of the substrate, and a protective film covering an upper surface of the resistor body and the side surfaces of the substrate continuously and with substantially the same thickness.

With this arrangement, when in manufacturing electronic devices, a plurality of resistor bodies are formed on an element forming surface of a wafer and a groove for dividing the electronic devices one by one is formed at the boundaries of regions in which the resistor bodies are formed on the element forming surface, side surfaces of the groove become the side surfaces of the substrates of the respective electronic devices after division. For example, by continuously forming a protective film of substantially the same thickness by the CVD method on the upper surfaces of the resistor bodies and inner surfaces (side surfaces and bottom surface) of the groove, the protective film can be deposited as a side surface covering portion on the entireties of the side surfaces of the substrate. The protective film can thus be formed uniformly on the side surfaces of the groove during manufacture of the electronic devices.

(F2) The electronic device according to F1, where a plurality of the resistor bodies are formed on the element forming surface of the substrate, wiring films electrically connecting the plurality of resistor bodies are included further, and the protective film is formed to further cover the wiring films.

With this arrangement, the wiring films are covered by the protective film and short-circuiting across resistor bodies at portions besides the wiring films can be prevented.

(F3) The electronic device according to F2, further including a resin film, made of a photosensitive resin sheet and covering the protective film.

(F4) The electronic device according to F3, further including external connection electrodes connected to the wiring films via penetrating holes penetrating through the resin film and the protective film.

(F5) The electronic device according to F4, where the resin film and the protective film are formed in a manner such that the external connection electrodes are exposed.

With this arrangement, electrical connection between the electronic device and a wiring substrate on which the electronic device is mounted can be achieved via the external connection electrodes.

(F6) The electronic device according to any one of F1 to F5, where the resistor bodies form a resistor circuit made up of unit resistors.

(F7) The electronic device according to any one of F1 to F6, where corner portions of the side surfaces of the substrate have round shapes.

With this arrangement, occurrence of chipping (fragmenting) at the corner portions can be prevented.

(F8) A method for manufacturing an electronic device, including a resistor body forming step of forming resistor bodies on an element forming surface of a substrate, a step of forming a groove around a region in which the resistor bodies are formed, a step of forming, by a CVD method, a protective film covering top surfaces of the resistor bodies and inner surfaces of the groove, and a step of thinning the substrate from a surface at the opposite side of the element forming surface until the bottom surface of the groove is reached to divide the substrate at the groove.

With this method, by forming the protective film by the CVD method on the inner surfaces (side surfaces and bottom surface) of the groove, the protective film can be deposited as a side surface covering portion on entireties of side surfaces of the substrate. The protective film can thus be formed uniformly on the side surfaces of the groove during manufacture of the electronic device.

(F9) The method for manufacturing the electronic device according to F8, further including a step of forming, on the element forming surface of the substrate, wiring films for electrically connecting the resistor bodies, and where the protective film is formed to further cover the wiring films.

In this case, with the completed electronic device, the wiring films are covered by the protective film and short-circuiting across resistor bodies at portions besides the wiring films can be prevented.

(F10) The method for manufacturing the electronic device according to F9, where the protective film is formed in such a manner that external connection pad regions of the wiring film are exposed. In this case, electrical connection between the electronic device and a wiring substrate on which the electronic device is mounted can be achieved via external connection electrodes connected to the external connection pad regions. (2) Preferred embodiments of the invention related to the sixth reference example. Preferred embodiments of the sixth reference example shall now be described in detail with reference to the attached drawings. The symbols in FIG. 92 to FIG. 106 are effective only for these drawings and, even if used in other preferred embodiments, do not indicate the same elements as the symbols in the other preferred embodiments.

FIG. 92A is a schematic perspective view for describing the arrangement of an electronic device according to a preferred embodiment of the sixth reference example and FIG. 92B is a schematic side view of a state where the electronic device is mounted on a circuit substrate. The electronic device 1 is a minute chip part and, as shown in FIG. 92A, has a rectangular parallelepiped shape. In regard to the dimensions of the electronic device 1, the length L in the long side direction is approximately 0.3 mm, the width W in the short side direction is approximately 0.15 mm, and the thickness T is approximately 0.1 mm.

The electronic device 1 is obtained by forming several electronic devices 1 in a lattice on a wafer and then cutting the wafer to separate it into the individual electronic devices 1. The electronic device 1 mainly includes a substrate 2, a first connection electrode 3 and a second connection electrode 4 that are to be external connection electrodes, and an element 5. The first connection electrode 3, the second connection electrode 4, and the element 5 are formed on the substrate 2 by using, for example, a semiconductor manufacturing process. A semiconductor substrate (semiconductor wafer), such as a silicon substrate (silicon wafer), etc., may thus be used as the substrate 2. The substrate 2 may also be another type of substrate, such as an insulating substrate, etc.

The substrate 2 has a substantially rectangular parallelepiped chip shape. With the substrate 2, the upper surface in FIG. 92A is an element forming surface 2A. The element forming surface 2A is the top surface of the substrate 2 and has a substantially rectangular shape. The surface at the opposite side of the element forming surface 2A in the thickness direction of the substrate 2 is a rear surface 2B. The element forming surface 2A and the rear surface 2B are substantially the same in shape. Besides the element forming surface 2A and the rear surface 2B, the substrate 2 has a side surface 2C, a side surface 2D, a side surface 2E, and a side surface 2F that extend orthogonally with respect to these surfaces.

The side surface 2C is constructed between edges at one end in the long direction (the edges at the front left side in FIG. 92A) of the element forming surface 2A and the rear surface 2B, and the side surface 2D is constructed between edges at the other end in the long direction (the edges at the inner right side in FIG. 92A) of the element forming surface 2A and the rear surface 2B. The side surfaces 2C and 2D are the respective end surfaces of the substrate 2 in the long direction. The side surface 2E is constructed between edges at one end in the short direction (the edges at the inner left side in FIG. 92A) of the element forming surface 2A and the rear surface 2B, and the side surface 2F is constructed between edges at the other end in the short direction (the edges at the front right side in FIG. 92A) of the element forming surface 2A and the rear surface 2B. The side surfaces 2E and 2F are the respective end surfaces of the substrate 2 in the short direction.

With the substrate 2, the element forming surface 2A, the side surface 2C, the side surface 2D, the side surface 2E, and the side surface 2F are covered by a protective film 23. Thus to be exact, the element forming surface 2A, the side surface 2C, the side surface 2D, the side surface 2E, and the side surface 2F in FIG. 92A are positioned at the inner sides (rear sides) of the protective film 23 and are not exposed to the exterior. Further, the protective film 23 on the element forming surface 2A is covered by a resin film 24. The resin film 24 protrudes from the element forming surface 2A to respective end portions at the element forming surface 2A side (upper end portions in FIG. 92A) of the side surface 2C, the side surface 2D, the side surface 2E, and the side surface 2F. The protective film 23 and the resin film 24 shall be described in detail later.

With the substrate 2, a recess 10, by which the substrate 2 is notched in the thickness direction, is formed in a portion corresponding to a side A (one of the side surfaces 2C, 2D, 2E, and 2F, and in the present case, the side surface 2C, as shall be described later) of the element forming surface 2A of substantially rectangular shape. The side A is also a side of the electronic device 1 in a plan view. The recess 10 in FIG. 92A is formed in the side surface 2C and is recessed toward the side surface 2D side while extending in the thickness direction of the substrate 2. The recess 10 penetrates through the substrate 2 in the thickness direction, and end portions of the recess 10 in the thickness direction are exposed from the element forming surface 2A and the rear surface 2B, respectively. The recess 10 is smaller than the side surface 2C in the direction of extension of the side surface 2C (the short direction). The shape of the recess 10 in a plan view of viewing the substrate 2 in the thickness direction (which is also the thickness direction of the electronic device 1) is an oblong shape (rectangular shape) that is long in the short direction. The shape of the recess 10 in the plan view may be a trapezoidal shape that becomes narrow toward the direction in which the recess 10 is recessed (toward the side surface 2D side), or may be a triangular shape that becomes thin toward the recessing direction, or may be a U-like shape (a shape recessed in the shape of the letter U). In any case, the recess 10 can be formed easily as long as it has such a simple shape. Although the recess 10 is formed in the side surface 2C here, it may be formed in at least one of the side surface 2C to 2F instead of being formed in the side surface 2C.

The recess 10 indicates the orientation (chip direction) of the electronic device 1 when the electronic device 1 is mounted on a circuit substrate 9 (see FIG. 92B). The outline of the electronic device 1 (to be accurate, the substrate 2) in a plan view is a rectangle having the recess 10 at one side A and is therefore an asymmetrical outer shape in the long direction. That is, the asymmetrical outer shape has the recess 10 indicating the chip direction at a side (side A) among the side surfaces 2C, 2D, 2E, and 2F, and with the electronic device 1, that the recess side in the long direction is the chip direction is indicated by the asymmetrical outer shape. The chip direction of the electronic device 1 can thus be recognized by simply making the outer shape of the substrate 2 of the electronic device 1 asymmetrical in a plan view. That is, the chip direction can be recognized by the outer shape of the electronic device 1 even without a marking step. In particular, the asymmetrical outer shape of the electronic device 1 is a rectangle having the recess 10, indicating the chip direction, at the side A, and the recess 10 side in the long direction joining the side A and a side B at the opposite side can thus be made the chip direction with the electronic device 1. Therefore, for example, by enabling the electronic device 1 to be mounted correctly on the circuit substrate 9 when the side A is positioned at the left end when the long direction of the electronic device 1 in a plan view is matched with the right/left direction, that the orientation of the electronic device 1 must be set so that the side A is positioned at the left end in a plan view in the mounting process can be ascertained from the outer appearance of the electronic device 1.

With the rectangular parallelepiped substrate 2, corner portions 11 that form the boundaries between mutually adjacent side surfaces (the portions 11 of intersection of the mutually adjacent side surfaces) among the side surface 2C, side surface 2D, side surface 2E, and side surface 2F are shaped (rounded) to chamfered round shapes. Also with the substrate 2, corner portions 12 that form the boundaries between the recess 10 and the side surface 2C in the periphery of the recess 10 (the corner portions 12 at the recess 10C in the side surface 2C) are also shaped to chamfered round shapes. Here, the corner portions 12 are present not only at the boundaries of the recess 10 and the side surface 2C at the periphery of the recess 10 (portions besides the recess 10) but are also present at the innermost sides of the recess 10 and are thus present at four locations in a plan view.

All of the bent portions (corner portions 11 and 12) of the outline of the substrate 2 in a plan view thus have round shapes. The occurrence of chipping can thus be prevented at the corner portions 11 and 12 of the round shapes. Improvement of yield (improvement of productivity) can thereby be achieved in the manufacture of the electronic device 1. The first connection electrode 3 and the second connection electrode 4 are formed on the element forming surface 2A of the substrate 2 and are partially exposed from the resin film 24. Each of the first connection electrode 3 and the second connection electrode 4 is formed by laminating, for example, Ni (nickel), Pd (palladium), and Au (gold) in that order on the element forming surface 2A. The first connection electrode 3 and the second connection electrode 4 are disposed across an interval in the long direction of the element forming surface 2A and are long in the short direction of the element forming surface 2A. In FIG. 92A, the first connection electrode 3 is provided at a position of the element forming surface 2A close to the side surface 2C and the second connection electrode 4 is provided at a position close to the side surface 2D. The recess 10 in the side surface 2C is recessed to a depth that does not interfere with the first connection electrode 3. However, depending on the case, the first connection electrode 3 may also be provided with a recess (that becomes a portion of the recess 10) in accordance with the recess 10.

The element 5 is a circuit element, is formed in a region of the element forming surface 2A of the substrate 2 between the first connection electrode 3 and the second connection electrode 4, and is covered from above by the protective film 23 and the resin film 24. The element 5 of the present preferred embodiment is a resistor 56 arranged by a circuit network in which a plurality of thin-film-like resistor bodies (thin film resistor bodies) R, made of TiN (titanium nitride) or TiON (titanium oxide nitride), are arrayed in a matrix on the element forming surface 2A. The element 5 is connected to wiring films 22, to be described below, and is connected to the first connection electrode 3 and the second connection electrode 4 via the wiring films 22. A resistor circuit is thus formed by the element 5 between the first connection electrode 3 and the second connection electrode 4 in the electronic device 1. Therefore in the present preferred embodiment, the electronic device 1 is a chip resistor.

The electronic device 1 can be flip-chip connected to the circuit substrate 9 by making the first connection electrode 3 and the second connection electrode 4 face the circuit substrate 9 and electrically and mechanically connecting the electrodes to circuits (not shown) of the circuit substrate 9 by solders 13 as shown in FIG. 92B. The first connection electrode 3 and the second connection electrode 4 that function as the external connection electrodes are preferably formed of gold (Au) or has gold plating applied on the surfaces thereof to improve solder wettability and improve reliability.

FIG. 93 is a plan view of the electronic device and shows the positional relationships of the first connection electrode, the second connection electrode, and the element and shows the arrangement in a plan view of the element. With reference to FIG. 93, the element 5 that is a resistor network has, for example, a total of 352 resistor bodies R arranged from 8 resistor bodies R being arrayed along the row direction (length direction of the substrate 2) and 44 resistor bodies R being arrayed along the column direction (width direction of the substrate 2). The respective resistor bodies R have an equal resistance value.

The plurality of resistor bodies R are electrically connected in groups of predetermined numbers of 1 to 64 to form a plurality of types of resistance units (unit resistors). The plurality of types of resistance units thus formed are connected in predetermined modes via connection conductor films C. Further, on the element forming surface 2A of the substrate 2, a plurality of fuse films F are provided that electrically incorporate resistance units into the element 5 or are capable of being fused to electrically separate resistance units from the element 5. The plurality of fuse films F and the connection conductor films C are arrayed along the inner side of the second connection electrode 4 so that the positioning regions thereof are rectilinear. More specifically, the plurality of fuse films F and the connection conductor films C are disposed rectilinearly.

FIG. 94A is partially enlarged plan view of the element shown in FIG. 93. FIG. 94B is a vertical sectional view in the length direction taken along B-B of FIG. 94A for describing the arrangement of resistor bodies in the element. FIG. 94C is a vertical sectional view in the width direction taken along C-C of FIG. 94A for describing the arrangement of the resistor bodies in the element. The arrangement of the resistor bodies R shall now be described with reference to FIG. 94A, FIG. 94B, and FIG. 94C.

Besides the wiring films 22, the protective film 23, and the resin film 24, the electronic device 1 further includes an insulating film 20 and resistor body films 21 (see FIG. 94B and FIG. 94C). The insulating film 20, the resistor body films 21, the wiring films 22, the protective film 23, and the resin film 24 are formed on the substrate 2 (element forming surface 2A). The insulating film 20 is made of $SiO_2$ (silicon oxide). The insulating film 20 covers the entirety of the element forming surface 2A of the substrate 2. The thickness of the insulating film 20 is approximately 10000 Å.

The resistor body films 21 make up the resistor bodies R. The resistor body films 21 are formed of TiN or TiON and are laminated on the top surface of the insulating film 20. The thickness of each resistor body film 21 is approximately 2000 Å. The resistor body films 20 form a plurality of lines (hereinafter referred to as "resistor body film lines 21A") extending as lines between the first connection electrode 3 and the second connection electrode 4, and there are cases where a resistor body film line 21A is cut at predetermined positions in the line direction (see FIG. 94A).

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A while being spaced apart by fixed intervals R in the line direction. The electrical features of the resistor body film lines 21A and the wiring films 22 are indicated in the form of circuit symbols in FIGS. 95A, 95B, and 95C. That is, as shown in FIG. 95A, each of the resistor body film line 21A portions in regions of the predetermined interval R forms a resistor body R with a fixed resistance value r.

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 95B. Also, adjacent resistor body film lines 21A are connected to each other by the resistor body films 21 and wiring films 22, and the resistor network of the element 5 shown in FIG. 94A forms the resistor circuit (made up of the unit resistors of resistor bodies R) shown in FIG. 95C.

Here, based on the characteristic that resistor body films 21 of the same shape with the same size that are formed on the substrate 2 are substantially the same in value, the plurality of resistor bodies R arrayed in a matrix on the substrate 2 have an equal resistance value. Also, the wiring films 22 laminated on the resistor body film lines 21A form the resistor bodies R and also serve the role of connection wiring films that connect a plurality of resistor bodies R to arrange a resistance unit.

FIG. 96A is partially enlarged plan view of a region including the fuse films drawn by enlarging a portion of the plan view of the electronic device shown in FIG. 93, and FIG. 96B is a structural sectional view taken along B-B in FIG. 96A. As shown in FIGS. 96A and 96B, the fuse films F and the connection conductor films C are also formed by the wiring films 22, which are laminated on the resistor body films 21 that form the resistor bodies R. That is, the fuse films F and the connection conductor films C are formed of Al or AlCu alloy, which is the same metal material as that of the wiring films 22, on the same layer as the wiring films 22, which are laminated on the resistor body film lines 21A that form the resistor bodies R.

That is, on the same layer laminated on the resistor body films 21, the wiring films for forming the resistor bodies R, the fuse films F, the connection conductor films C, and the wiring films for connecting the element 5 to the first connection electrode 3 and the second connection electrode 4 are formed as the wiring films 22 by the same manufacturing process (the sputtering and photolithography process to be described below) using the same metal material (Al or AlCu alloy).

The fuse film F may refer not only to a portion of the wiring films 22 but may also refer to an assembly (fuse element) of a portion of a resistor body R (resistor body film 21) and a portion of the wiring film 22 on the resistor body film 21. Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

FIG. 97 is an electric circuit diagram of the element according to the preferred embodiment of the sixth reference example. Referring to FIG. 97, the element 5 is arranged by serially connecting a reference resistance unit R8, a resistance unit R64, two resistance units R32, a resistance unit R16, a resistance unit R8, a resistance unit R4, a resistance unit R2, a resistance unit R1, a resistance unit R/2, a resistance unit R/4, a resistance unit R/8, a resistance unit R/16, and a resistance unit R/32 in that order from the first connection electrode 3. Each of the reference resistance unit R8 and resistance units R64 to R2 is arranged by serially connecting the same number of resistor bodies R as the number at the end of its symbol ("64" in the case of R64). The resistance unit R1 is arranged from a single resistor body R. Each of the resistance units R/2 to R/32 is arranged by connecting the same number of resistor bodies R as the number at the end of its symbol ("32" in the case of R/32) in parallel. The meaning of the number at the end of the symbol of the resistance unit is the same in FIG. 98 and FIG. 99 to be described below.

One fuse film F is connected in parallel to each of the resistance unit R64 to resistance unit R/32, besides the reference resistance unit R8. The fuse films F are mutually connected in series directly or via the connection conductor film C (see FIG. 96A). In a state where none of the fuse films F is fused as shown in FIG. 97, the element 5 forms a resistor circuit of the reference resistance unit R8 (resistance value: 8r), formed by the serial connection of the 8 resistor bodies R provided between the first connection electrode 3 and the second connection electrode 4. For example, if the resistance value r of a single resistor body R is r=80Ω, the chip resistor (electronic device 1) is arranged with the first connection electrode 3 and the second connection electrode 4 being connected by a resistor circuit of 8r=64Ω.

Also in the state where none of the fuse films F is fused, the plurality of types of resistance units besides the reference resistance unit R8 are put in short-circuited states. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the element 5.

With the electronic device 1 according to the present preferred embodiment, a fuse film F is selectively fused, for example, by laser light in accordance with the required resistance value. The resistance unit with which the fuse film F connected in parallel is fused is thereby incorporated into the element 5. The overall resistance value of the element 5 can thus be set to the resistance value resulting from serially connecting and incorporating the resistance units corresponding to the fused fuse films F.

In particular, the plurality of types of resistance units include the plurality of types of serial resistance units, with which the resistor bodies R having the equal resistance value are connected in series with the number of resistor bodies R being increased in geometric progression as 1, 2, 4, 8, 16, 32, . . . , and the plurality of types of parallel resistance units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the element 5 (resistor 56) as a whole can be adjusted finely and digitally to an arbitrary resistance value to enable a resistance of a desired value to be formed in the electronic device 1.

FIG. 98 is an electric circuit diagram of an element according to another preferred embodiment of the sixth reference example. Instead of arranging the element 5 by serially connecting the reference resistance unit R8 and the resistance unit R64 to the resistance unit R/32 as described above, the element 5 may be arranged as shown in FIG. 98. To be detailed, the element 5 may be arranged, between the first connection electrode 3 and the second connection electrode 4, as a serial connection circuit of the reference resistance unit R/16 and the parallel connection circuit of the 12 types of resistance units R/16, R/8, R/4, R/2, R1, R2, R4, R8, R16, R32, R64, and R128.

In this case, a fuse film F is serially connected to each of the 12 types of resistance units besides the reference resistance unit R/16. In a state where none of the fuse films F is fused, the respective resistance units are electrically incorporated in the element 5. By selectively fusing a fuse film F, for example, by laser light in accordance with the required resistance value, the resistance unit corresponding to the fused fuse film F (the resistance unit connected in series to the fuse film F) is electrically separated from the element 5 and the resistance value of the electronic device 1 as a whole can thereby be adjusted.

FIG. 99 is an electric circuit diagram of an element according to yet another preferred embodiment of the sixth reference example. A feature of the element 5 shown in FIG. 99 is that it has the circuit arrangement where a serial connection of a plurality of types of resistance units and a parallel connection of a plurality of types of resistance units are connected in series. As in a previous preferred embodiment, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fused fuse film F is electrically incorporated into the element 5.

On the other hand, a fuse film F is connected in series to each of the plurality of types of resistance units that are connected in parallel. Therefore by fusing a fuse film F, the resistance unit connected in series to the fused fuse film F can be electrically disconnected from the parallel connection of resistance units. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

FIG. 100 is a schematic sectional view of the electronic device. The electronic device 1 shall now be described in further detail with reference to FIG. 100. For the sake of description, the element 5 is illustrated in a simplified form and hatching is applied to respective elements besides the substrate 2 in FIG. 100. Here, the protective film 23 and the resin film 24 shall be described.

The protective film 23 is made, for example, from SiN (silicon nitride) and the thickness thereof is approximately 3000 Å. The protective film 23 integrally includes an element covering portion 23A, provided across the entirety of the element forming surface 2A and covering the resistor body films 21 and the respective wiring films 22 on the resistor body films 21 (that is, the element 5) from the top surface (upper side in FIG. 100) (that is, covering the upper surfaces of the respective resistor bodies R in the element 5), and a side surface covering portion 23B, covering the respective entireties of the four side surfaces 2C to 2F (see FIG. 92A) of the substrate 2. The element covering portion 23A and the side surface covering portion 23B are actually substantially the same in thickness and are mutually continuous. Therefore, as a whole, the protective film 23 covers the upper surfaces of the resistor bodies R and the side surfaces 2C to 2F of the substrate 2 continuously with substantially the same thickness.

Short-circuiting across the resistor bodies R (short-circuiting across adjacent resistor body film lines 21A) at portions besides the wiring films 22 is prevented by the element covering portion 23A. The side surface covering portion 23B not only covers the respective entireties of the side surfaces 2C to 2F but also covers portions of the insulating film 20 that are exposed to the side surfaces 2C to 2F. At the side surface 2C, the side surface covering portion 23B covers the entirety including the portion at which the recess 10 is formed (see FIG. 92A). Short-circuiting at the respective side surfaces 2C to 2F (forming of a short circuit path at any of the side surfaces) is prevented by the side surface covering portion 23B.

Referring to FIG. 92A, the protective film 23 continuously covers the element forming surface 2A and the four side surfaces 2C to 2F of the substrate 2 and therefore has corner portions 26 of round shapes along the corner portions 11 and 12 of the substrate 2. In this case, the element 5 and the wiring films 22 can be protected by the protective film 23 and occurrence of chipping at the corner portions 26 of the protective film 23 can be prevented.

Returning to FIG. 100, the resin film 24, together with the protective film 23, protects the electronic device 1 and is made of a resin, such as polyimide, etc. The thickness of the resin film 24 is approximately 5 μm. The resin film 24 covers the top surface of the element covering portion 23A (upper surface of the protective film 23) across its entirety and covers end portions at the element forming surface 2A side (upper end portions in FIG. 100) of the side surface covering portion 23B on the four side surfaces 2C to 2F of the substrate 2. That is, with the side surface covering portion 23B on the four side surfaces 2C to 2F, at least a portion at the side (lower side in FIG. 100) opposite to the element forming surface 2A is left exposed from the resin film 24.

With such a resin film 24, the portion coinciding with the four side surfaces 2C to 2F in a plan view is an arcuate overhanging portion 24A that overhangs further to the sides (outward) than the side surface covering portion 23B on the side surfaces. That is, the resin film 24 (overhanging portion 24A) protrudes beyond the side surface covering portion 23B (protective film 23) at the side surfaces 2C to 2F. Such a resin film 24 has side surfaces 24B of round shapes that project to the sides at the arcuate overhanging portion 24A. The overhanging portion 24A covers corner portions 27 forming the boundaries between the element forming surface 2A and the respective side surfaces 2C to 2F. Therefore, when the electronic device 1 contacts an object in the surroundings, the overhanging portion 24A contacts the object in the surroundings first and relaxes the impact due to the contact to prevent the impact from being applied to the element 5, etc., and prevent chipping at the corner portions 27. In particular, the overhanging portion 24A has side surfaces 24B with round shapes and can thus relax the impact due to contact smoothly.

An arrangement where the resin film 24 does not cover the side surface covering portion 23B at all (an arrangement where the entire side surface covering portion 23B is exposed) is also possible. In the resin film 24, openings 25 are formed, one at each of two positions that are separated in a plan view. Each opening 25 is a penetrating hole penetrating continuously through each of the resin film 24 and the protective film 23 (element covering portion 23A) in the thickness direction. The openings 25 are thus formed not only in the resin film 24 but also in the protective film 23. Portions of wiring films 22 are exposed at the respective openings 25. The portions of the wiring films 22 exposed at the respective openings 25 are pad regions 22A for external connection.

Of the two openings 25, one opening 25 is completely filled by the first connection electrode 3 and the other opening 25 is completely filled by the second connection electrode 4. A portion of each of the first connection electrode 3 and the second connection electrode 4 protrudes from the opening 25 at the top surface of the resin film 24. The first connection electrode 3 is electrically connected via the one opening 25 to the wiring film 22 at the pad region 22A in this opening 25. The second connection electrode 4 is electrically connected via the other opening 25 to the wiring film 22 at the pad region 22A in this opening 25. The first connection electrode 3 and the second connection electrode 4 are thereby electrically connected to the element 5. Here, the wiring films 22 form wirings that are respectively connected to groups of resistor bodies R (resistor 56) and the first connection electrode 3 and the second connection electrode 4.

The resin film 24 and the protective film 23, in which the openings 25 are formed, are thus formed so that the first connection electrode 3 and the second connection electrode 4 are exposed from the openings 25. Electrical connection between the electronic device 1 and the circuit substrate 9 can thus be achieved via the first connection electrode 3 and the second connection electrode 4 protruding from the openings 25 at the top surface of the resin film 24 (see FIG. 92B).

FIG. 101A to FIG. 101F are illustrative sectional views of a method for manufacturing the electronic device shown in FIG. 100. First, as shown in FIG. 101A, a wafer 30 is prepared. The wafer 30 is the base for the substrate 2. A top surface 30A of the wafer 30 is thus the element forming surface 2A of the substrate 2 and a rear surface 30B of the wafer 30 is the rear surface 2B of the substrate 2.

The insulating film 20, made of $SiO_2$, etc., is then formed on the top surface 30A of the wafer 30, and the element 5 (the resistor bodies R and the wiring films 22) is formed on the insulating film 20. Specifically, first, the resistor body film 21 of TiN or TiON is formed by sputtering on the entire surface of the insulating film 20 and further, the wiring film 22 of aluminum (Al) is laminated on the resistor body film 21. Thereafter, a photolithography process is used and, for example, dry etching is performed to selectively remove the resistor body film 21 and the wiring film 22 to obtain the arrangement where, as shown in FIG. 94A, the resistor body film lines 21A of fixed width, at which the resistor body film 21 is laminated, are arrayed in the column direction while being spaced apart by fixed intervals in a plan view. Regions at which the resistor body film lines 21A and the wiring films 22 are interrupted are also formed at this point. The wiring films 22 laminated on the resistor body film lines 20 are then removed selectively. The element 5 of the arrangement where the wiring films 22 are laminated on the resistor body film lines 21A while being spaced apart by the fixed intervals R is consequently obtained.

With reference to FIG. 101A, the elements 5 are formed on a plurality of locations on the top surface 30A of the wafer 30 in accordance with the number of electronic devices 1 to be formed on the single wafer 30. Then as shown in FIG. 101B, a resist pattern 41 is formed across the entirety of the top surface 30A of the wafer 30 so as to cover all of the elements 5 on the insulating film 20. An opening 42 is formed in the resist pattern 41.

FIG. 102 is a schematic plan view of a portion of the resist pattern used for forming a groove in the step of FIG. 101B. The opening 42 of the resist pattern 41 coincides with regions (hatched portions in FIG. 102) between outlines of mutually adjacent electronic devices 1 in a plan view in a case where a plurality of electronic devices 1 are disposed in an array (that is also a lattice). The overall shape of the opening 42 is thus a lattice having a plurality of mutually orthogonal rectilinear portions 42A and 42B. Also, in either of the rectilinear portions 42A and 42B (the rectilinear portions 42A in the present example), projecting portions 42C, projecting orthogonally from the rectilinear portions 42A, are provided in continuous form in correspondence to the recesses 10 of the electronic devices 1 (see FIG. 92A).

Here, with each electronic device 1, the corner portions 11 and 12 have round shapes (see FIG. 92A). Accordingly, the mutually orthogonal rectilinear portions 42A and 42B in the opening 42 are curvingly connected to each other. The mutually orthogonal rectilinear portions 42A and projecting portions 42C are also curvingly connected to each other. Intersection portions 43A of the rectilinear portions 42A and 42B and intersection portions 43B of the rectilinear portions 42A and projecting portions 42C thus have round shapes with rounded corners. Also, in each projecting portion 42C, corners besides the intersection portion 43B are also rounded.

Referring to FIG. 101B, the insulating film 20 and the wafer 30 are respectively removed selectively by plasma etching using the resist pattern 41 as a mask. A groove 44, penetrating through the insulating film 20 and reaching the middle of the thickness of the wafer 30, is thereby formed at positions coinciding with the opening 42 of the resist pattern 41 in a plan view. The groove 44 has mutually facing side surfaces 44A and a bottom surface 44B joining the lower ends (ends at the rear surface 30B side of the wafer 30) of the facing side surfaces 44A. The depth of the groove 44 on the basis of the top surface 30A of the wafer 30 is approximately 100 μm and the width of the groove 44 (interval between facing side surfaces 44A) is approximately 20 μm.

FIG. 103A is a schematic plan view of the wafer after the groove has been formed in the step of FIG. 101B, and FIG. 103B is an enlarged view of a portion in FIG. 103A. Referring to FIG. 103B, the overall shape of the groove 44 is a lattice that coincides with the opening 42 (see FIG. 102) of the resist pattern 41 in a plan view. At the top surface 30A of the wafer 30, rectangular frame portions of the groove 44 surround the regions in which the respective elements 5 are formed. In the wafer 30, each portion in which the element 5 is formed is a semi-finished product 50 of the electronic device 1. At the top surface 30A of the wafer 30, one semi-finished product 50 is positioned in each region surrounded by the groove 44, and these semi-finished products 50 are arrayed and disposed in an array.

Also, at each portion corresponding to the projecting portion 42C (see FIG. 102) in the opening 42 of the resist pattern 41, the groove 44 is formed so as to delve into a middle portion of a side A of the semi-finished product 50, and the recess 10 (see FIG. 92A) is thereby formed in the semi-finished product 50. Corner portions 60 (to become the corner portions 11 and 12 of the electronic device 1) of the semi-finished product 50 in a plan view are shaped to round shapes in accordance with the intersection portions 43A and 43B (see FIG. 102) with round shapes in the opening 42 of the resist pattern 41. Although these round shapes are formed by using a plasma etch, a silicon etch (an ordinary etch using a chemical solution) may be used in place of the plasma etch.

By thus etching the wafer 30, the outer shape of the semi-finished product 50 (in other words, the electronic device 1 in its final form) can be set to any shape and can be set, as in the present preferred embodiment, to an asymmetrical rectangle with corner portions 60 (corner portions 11 and 12) with round shapes and having the recess 10 at the side A (see also FIG. 92A). In this case, the electronic device 1, with which the chip direction can be recognized, can be manufactured without a marking step (a step of marking a mark, etc., indicating the chip direction by a laser, etc.).

After the groove 44 has been formed, the resist pattern 41 is removed and the protective film (SiN) film 45 made of SiN is formed on the top surfaces of the elements 5 by CVD (chemical vapor deposition) method as shown in FIG. 101C. The SiN film 45 has a thickness of approximately 3000 Å. The SiN film 45 is formed so as to cover not only the entireties of the top surfaces of the elements 5 but also the inner surfaces (side surfaces 44A and bottom surface 44B) of the groove 44. The SiN film 45 is a thin film that is formed to a substantially fixed thickness on the side surfaces 44A and bottom surface 44B and therefore does not fill the groove 44 completely. Also, in the groove 44, the SiN film 45 suffices to be formed on the entireties of the side surfaces 44A and does not have to be formed on the bottom surface 44B.

Thereafter, a photosensitive resin sheet 46, made of polyimide, is adhered onto the wafer 30 from above the SiN film 45 at portions besides the groove 44 as shown in FIG. 101D. FIGS. 104A and 104B are illustrative perspective views of states of adhering the polyimide sheet onto the wafer in the step of FIG. 101D. Specifically, after covering the wafer 30 (to be accurate, the SiN film 45 on the wafer 30) with the polyimide sheet 46 from the top surface 30A side as shown in FIG. 104A, the sheet 46 is pressed against the wafer 30 by a rotating roller 47 as shown in FIG. 104B.

When the sheet 46 has been adhered on the entirety of the top surface of the SiN film 45 at portions besides the groove 44 as shown in FIG. 101D, although portions of the sheet 46 are slightly indented toward the groove 44 side, only portions at the element 5 side (top surface 30A side) of the SiN film 45 on the side surfaces 44A of the groove 44 are covered and the sheet 46 does not reach the bottom surface 44B of the groove 44. A space S of substantially the same size as the groove 44 is thus formed inside the groove 44 between the sheet 46 and the bottom surface 44B of the groove 44. The thickness of the sheet 46 in this state is 10 μm to 30 μm.

Thereafter, a heat treatment is applied to the sheet 46. The thickness of the sheet 46 is thereby thermally contracted to approximately 5 μm. Thereafter, as shown in FIG. 101E, the sheet 46 is patterned and portions of the sheet 46 coinciding with the groove 44 and the respective pad regions 22A of the wiring films 22 in a plan view are selectively removed. Specifically, a mask 62, having formed therein openings 61 of a pattern matching (coinciding with) the groove 44 and the respective pad regions 22A in a plan view, is used and the sheet 46 is exposed and developed with this pattern. The sheet 46 is thereby separated at portions above the groove 44 and the respective pad regions 22A and separated edge portions of the sheet 46 droop slightly toward the groove 44 to overlap with the SiN film 45 on the side surfaces 44A of the groove 44 so that the overhanging portion 24A (having the side surfaces 24B of round shapes) is formed naturally at the edge portions.

By then performing etching using the sheet 46 that has been separated in the above manner as a mask, the portions of the SiN film 45 coinciding with the respective pad regions 22A in a plan view are removed. The openings 25 are thereby formed. The SiN film 45 is thereby formed so as to expose the respective pad regions 22A. Ni/Pd/Au laminated films, arranged by laminating Ni, Pd, and Au, are then formed by electroless plating on the pad regions 22A in the respective openings 25. In this process, the Ni/Pd/Au laminated films are formed so as to protrude onto the top surface of the sheet 46 from the openings 25. The Ni/Pd/Au laminated films inside the respective openings 25 thus become the first connection electrode 3 and the second connection electrode 4 shown in FIG. 101F.

Then after performing a conduction test across the first connection electrode 3 and the second connection electrode 4, the wafer 30 is ground from the rear surface 30B. Here, the entirety of the portions of the wafer 30 forming the side surfaces 44A of the groove 44 is covered by the SiN film 45 so that formation of microcracks, etc., in those portions during the grinding of the wafer 30 is prevented, and even if a microcrack forms, the microcrack can be embedded by the SiN film 45 to suppress expansion of the microcrack.

When the wafer 30 has been thinned by grinding to the bottom surface 44B of the groove 44 (to be accurate, the SiN film 45 on the bottom surface 44B), portions joining mutually adjacent semi-finished products 50 are no longer present and the wafer 30 is thus divided with the groove 44 as boundaries and the semi-finished products 50 are separated individually as electronic devices 1. The electronic devices 1 (see FIG. 100) are thereby completed. With each electronic device 1, each portion that formed a side surface 44A of the groove 44 becomes one of the side surfaces 2C to 2F of the substrate 2. The SiN film 45 becomes the protective film 23. Also, the separated sheet 46 becomes the resin film 24.

Even if the electronic devices 1 are small in chip size, the electronic devices 1 can be separated into individual chips by thus forming the groove 44 in advance and then grinding the wafer 30 from the rear surface 30B. Therefore in comparison to the conventional case where the wafer 30 is diced using a dicing saw to separate the electronic devices 1 into individual chips, the dicing step can be eliminated to promote cost reduction and time savings and achieve improvement of yield.

With the above, when in manufacturing the electronic devices 1, the plurality of elements 5 are formed on the top surface 30A (element forming surface 2A) of the wafer 30 and the groove 44 for dividing the electronic devices 1 one by one is formed at the boundaries of the elements 5 in the top surface 30A, the side surfaces 44A of the groove 44 become the side surfaces 2C to 2F of the respective electronic devices 1 after the division. The SiN film 45 (protective film 23) is formed on the side surfaces 44A of the groove 44 and the top surface 30A of the wafer 30 before division into the electronic devices 1. Here, as shown in FIG. 101C, the protective film (CVD protective film) 23 of substantially the same thickness of CVD is formed continuously by the CVD method on the upper surfaces of the resistor bodies R and the inner surfaces (side surfaces 44A and bottom surface 44B) of the groove 44. In this case, the CVD protective film 23 (SiN film 45) is formed under a reduced pressure environment in the process of CVD, and therefore the CVD protective film 23 can be deposited as the side surface covering portion 23B on the entireties of the side surfaces 2C to 2F of the substrate 2 (side surfaces 44A of the groove 44). The protective film 23 can thus be formed uniformly on the side surfaces 44A of the groove 44 during manufacture of the electronic device 1.

Then after forming the protective film 23, the resin film 24 is formed by the sheet 46 covering the SiN film 45 (the portion of the protective film 23 to be the element covering portion 23A) on the element forming surface 2A as shown in FIG. 101D. With the SiN film 45 on the side surfaces 44A of the groove 44 (the portion to become the side surface covering portion 23B of the protective film 23), at least the side (the bottom surface 44B side of the groove 44) opposite to the element forming surface 2A is left exposed from the resin film 24 so that the groove 44 can be prevented from being filled with the resin film 24 from the bottom surface 44B side during the forming of the resin film 24 (during the manufacture of the electronic device 1).

Specifically, the resin film 24 is formed by adhering the sheet 46 from above the protective film 23. In this case, the groove 44 will not be filled with the sheet 46 from the bottom surface 44B side. Therefore by thinning the substrate 2 until the bottom surface 44B of the groove 44 is reached as shown in FIG. 101F, the substrate 2 can be divided into the individual electronic devices 1 at the groove 44. Although a preferred embodiment of the sixth reference example has been described above, the sixth reference example may be implemented in yet other modes.

For example, in dividing the wafer 30 into the individual electronic devices 1, the wafer 30 is ground to the bottom surface 44B of the groove 44 from the rear surface 30B side (see FIG. 101F). Instead, the wafer 30 may be divided into the individual electronic devices 1 by removing the portions of the SiN film 45 covering the bottom surface 44B and portions of the wafer 30 coinciding with the groove 44 in a plan view by selectively etching from the rear surface 30B.

FIG. 105A is a plan view of an electronic device, FIG. 105B is a plan view of an electronic device according to a first modification example, and FIG. 105C is a plan view of an electronic device according to a second modification example. In each of FIGS. 105A to 105C, illustration of the element 5, the protective film 23, and the resin film 24 is omitted for the sake of description. Also, as shown in FIG. 105A, the recess 10 is provided at a position of the side A of the electronic device 1 that is shifted from the midpoint P of the side A. When the recess 10 is shifted from the midpoint P, the center 10A of the recess 10 and the midpoint P do not coincide in the direction of extension of the side A. With this arrangement, not only the recess 10 side in the direction joining the side A and the side B at the opposite side of the side A (the long direction) but the recess 10 side in the direction of extension of the side A (short direction) can also be made the chip direction. For example, the electronic device 1 is arranged to be mounted correctly on the circuit substrate 9 when, in a plan view as viewed from the element forming surface 2A side, the short direction of the electronic device 1 and the front/rear direction (up/down direction in FIG. 105) are matched, the long direction of the electronic device 1 and the right/left direction are matched, and the recess 10 is positioned so as to be biased to the front left (upper left in FIG. 105) in this state. That the orientation of the electronic device 1 must be set so that the recess 10 is positioned so as to be biased to the front left in a plan view (to the front right when the electronic device 1 is viewed from the rear surface 2B of the substrate 2) in the mounting process can thus be ascertained from the outer appearance of the electronic device 1. That is, that the orientation of the electronic device 1 must be matched in both the long direction and the short direction can be ascertained from the outer appearance of the electronic device 1.

Obviously, the recess 10 may be provided at a position of the side A that coincides with the midpoint P (position at which the center 10A of the recess 10 coincides with the midpoint P in the short direction) as shown in FIG. 105B. Also, in place of the recess 10, an outwardly projecting projection 51 may be provided as shown in FIG. 105C. The projection 51 may have a rectangular shape, a U-like shape (a shape that bulges in the shape of the letter U), or a triangular shape in a plan view. Obviously at the side surface 2C, corner portions (the four corner portions in a plan view including those at the tip side and root side of the projection 51) 52 of the projection 51 have chamfered round shapes like those of the other corner portions 11. Here, as in the case of the recess 10, the side surface covering portion 23B (see FIG. 92A) covers the entirety of the side surface 2C, including the portion at which the projection 51 is formed. Also, the depth of the recess 10 and the height (projection amount) of the projection 51 are preferably not more than 20 μm (not more than approximately one-fifth the width of the first connecting electrode 3 and the second connection electrode 4). Also the chamfer amount of each of the corner portions 11, corner portions 12, and corner portions 52, is preferably such that the distance at one side is not more than approximately 20 μm.

FIG. 106A is a diagram of the circuit arrangement of an element according to another preferred embodiment of the electronic device, and FIG. 106B is a diagram of the circuit arrangement of an element according to yet another preferred embodiment of the electronic device. Although with the preferred embodiment described above, the electronic device 1 is a chip resistor and the element 5 between the first connection electrode 3 and the second connection electrode 4 is thus the resistor 56, it may instead be a diode 55, shown in FIG. 106A, or an element with which the diode 55 and the resistor 56 are connected in series as shown in FIG. 106B. By having the diode 55, the electronic device 1 becomes a chip diode, a polarity is present in the first connection electrode 3 and the second connection electrode 4, and the chip direction is a direction that is in accordance with the polarity. The polarity of the first connection electrode 3 and the second connection electrode 4 can thereby be indicated by the chip direction and the polarity can thus be ascertained from the outer appearance of the electronic device 1. That is, which side in the chip direction (that is, which of the first connection electrode 3 and the second connection electrode 4) is the positive or negative pole side can be ascertained. The electronic device 1 can thus be mounted correctly on the circuit substrate 9 (see FIG. 92B) so that the side at which the recess 10 or the projection 51 (see FIG. 105) is provided is set at the corresponding pole side.

Obviously, the sixth reference example may be applied to an element device, having any of various elements, such as a chip capacitor, which uses a capacitor in place of the diode 55 in the element 5, a chip inductor, etc., formed on the chip-sized substrate 2. <Invention according to a seventh reference example> (1) Features of the invention according to the seventh reference example. For example, the features of the invention according to the seventh reference example are the following G1 to G18.

(G1) A chip resistor including a substrate having an element forming surface, a resistor body formed on the element forming surface, wiring films connected to the resistor body and having a trimming region, and an insulating film formed to cover the wiring film in the trimming region, and where the insulating film is a CVD insulating film formed by a chemical vapor deposition method.

With this arrangement, when laser light is irradiated on the wiring film in the trimming region to perform laser trimming of the wiring film in that region, the laser light reaches the wiring film upon being transmitted through the insulating film on the wiring film in that region. In this case, the energy of the laser light concentrates readily on the wiring film and reliable trimming of the wiring film can thus be realized. In particular, the insulating film is a CVD insulating film, the film quality of the insulating film can thus be stabilized in the entirety of the trimming region, and reliable trimming of the wiring film can thus be realized at any portion of the region.

Also, even if a fragment is formed by the laser trimming, the fragment does not become a foreign object that contacts the wiring film to cause short-circuiting because the wiring film is covered by the insulating film. That is, short-circuiting due to trimming can be prevented.

(G2) The chip resistor according to G1, where the insulating film has a thickness of 1000 Å to 5000 Å.

With this arrangement, the energy of the laser light can be concentrated efficiently onto the wiring film to effectively realize reliable trimming of the wiring film. When the insulating film is thinner than 1000 Å, the effect of concentrating the energy of the laser light efficiently on the wiring film is reduced, and oppositely, when the insulating film is thicker than 5000 Å, it becomes difficult to cut the insulating film by the laser light and it thus becomes difficult to trim the wiring film.

(G3) The chip resistor according to G2, where the insulating film is an SiN film formed by CVD.

(G4) The chip resistor according to any one of G1 to G3, where the resistor body is formed of a plurality of resistor bodies having the same resistance value and a state of connection of the plurality of resistor bodies can be changed in the trimming region.

(G5) The chip resistor according to any one of G1 to G3, where the resistor body is formed below the wiring film in the trimming region.

(G6) The chip resistor according to any one of G1 to G5, where the insulating film serves in common as a protective film that covers the element forming surface.

With this arrangement, the insulating film enables reliable trimming of the wiring film to be realized and is capable of protecting the element forming surface in addition to preventing short-circuiting due to trimming.

(G7) The chip resistor according to any one of G1 to G6, where the wiring film in the trimming region has a fused portion.

With this arrangement, the chip resistor can be adjusted in resistance value in accordance with the fused portion.

(G8) The chip resistor according to G7, including, between the substrate and the resistor body, an insulating layer differing from the insulating film.

(G9) The chip resistor according to G8, where, at the location at which the wiring film is fused, a portion of the insulating layer is trimmed together with the wiring film.

(G10) The chip resistor according to any one of G1 to G9, where the wiring films include wiring that is disposed in the trimming region and is greater in interwiring distance than portions besides the trimming region.

With this arrangement, the resistance value of the chip resistor can be adjusted by trimming (fusing) of the wiring.

(G11) The chip resistor according to any one of G1 to G10, where the wiring films contain aluminum and the insulating film contains silicon nitride. With this arrangement, the insulating film can be formed on the wiring film without melting the wiring film because the silicon nitride formation temperature of the insulating film in the CVD process is lower than the melting temperature of aluminum of the wiring film.

(G12) A method for manufacturing a chip resistor, including a step of forming a resistor body on an element forming surface of a substrate, a step of forming, on the element forming surface, a wiring film connected to the resistor body, and a step of forming an insulating film so as to cover a trimming region of the wiring film.

With this method, when laser light is irradiated on the wiring film in the trimming region to perform laser trimming of the wiring film in that region, the laser light reaches the wiring film upon being transmitted through the insulating film on the wiring film. In this case, the energy of the laser light concentrates readily on the wiring film and reliable trimming of the wiring film can thus be realized. Also, even if a fragment is formed by the laser trimming, the fragment does not become a foreign object that contacts the wiring film to cause short-circuiting because the wiring film is covered by the insulating film. That is, short-circuiting due to trimming can be prevented.

(G13) The method for manufacturing the chip resistor according to G12, where the step of forming the insulating film includes a step of forming the insulating film by a chemical vapor deposition method.

The film quality of the insulating film can thereby be stabilized in the entirety of the trimming region, and reliable trimming of the wiring film can thus be realized at any portion of the region.

(G14) The method for manufacturing the chip resistor according to G12 or G13, where the insulating film has a thickness of 1000 Å to 5000 Å. The energy of the laser light can thereby be concentrated efficiently onto the wiring film to effectively realize reliable trimming of the wiring film. When the insulating film is thinner than 1000 Å, the effect of concentrating the energy of the laser light efficiently on the wiring film is reduced, and oppositely, when the insulating film is thicker than 5000 Å, it becomes difficult to cut the insulating film by the laser light and it thus becomes difficult to trim the wiring film.

(G15) The method for manufacturing the chip resistor according to any one of G12 to G14, where the resistor body is formed below the wiring film in the trimming region.

(G16) The method for manufacturing the chip resistor according to any one of G12 to G15, where, on the element forming surface, the insulating film is formed to extend to a region besides the trimming region and serves in common as a protective film that covers the element forming surface.

The insulating film thus enables reliable trimming of the wiring film to be realized and is capable of protecting the element forming surface in addition to preventing short-circuiting due to trimming.

(G17) The method for manufacturing the chip resistor according to any one of G12 to G16, further including a step of fusing the wiring film in the trimming region to attain a required resistance value.

With this arrangement, the resistance value of the chip resistor can be adjusted.

(G18) The method for manufacturing the chip resistor according to any of G12 to G17, where the step of forming the wiring film includes a step of forming a fuse in the trimming region. The resistance value of the chip resistor can thereby be adjusted by trimming the fuse. (2) Preferred embodiments of the invention related to the seventh reference example. Preferred embodiments of the seventh reference example shall now be described in detail with reference to the attached drawings. The symbols in FIG. 107 to FIG. 123 are effective only for these drawings and, even if used in other preferred embodiments, do not indicate the same elements as the symbols in the other preferred embodiments.

FIG. 107A is a schematic perspective view for describing the arrangement of a chip resistor according to a preferred embodiment of the seventh reference example and FIG.

107B is a schematic side view of a state where the chip resistor is mounted on a circuit substrate. The chip resistor 1 is a minute chip part and, as shown in FIG. 107A, has a rectangular parallelepiped shape. In regard to the dimensions of the chip resistor 1, the length L in the long side direction is approximately 0.3 mm, the width W in the short side direction is approximately 0.15 mm, and the thickness T is approximately 0.1 mm.

The chip resistor 1 is obtained by forming several chip resistors 1 in a lattice on a substrate, then forming a groove in the substrate, and thereafter performing rear surface grinding (or parting the substrate at the groove) to perform separation into the individual chip resistors 1. The chip resistor 1 mainly includes a substrate 2, a first connection electrode 3 and a second connection electrode 4 that are to be external connection electrodes, and an element 5.

The substrate 2 has a substantially rectangular parallelepiped chip shape. With the substrate 2, the upper surface in FIG. 107A is an element forming surface 2A. The element forming surface 2A is the top surface of the substrate 2 and has a substantially rectangular shape. The surface at the opposite side of the element forming surface 2A in the thickness direction of the substrate 2 is a rear surface 2B. The element forming surface 2A and the rear surface 2B are substantially the same in shape. Besides the element forming surface 2A and the rear surface 2B, the substrate 2 has a side surface 2C, a side surface 2D, a side surface 2E, and a side surface 2F that extend orthogonally with respect to and connect these surfaces.

The side surface 2C is constructed between edges at one end in the long direction (the edges at the front left side in FIG. 107A) of the element forming surface 2A and the rear surface 2B, and the side surface 2D is constructed between edges at the other end in the long direction (the edges at the inner right side in FIG. 107A) of the element forming surface 2A and the rear surface 2B. The side surfaces 2C and 2D are the respective end surfaces of the substrate 2 in the long direction. The side surface 2E is constructed between edges at one end in the short direction (the edges at the inner left side in FIG. 107A) of the element forming surface 2A and the rear surface 2B, and the side surface 2F is constructed between edges at the other end in the short direction (the edges at the front right side in FIG. 107A) of the element forming surface 2A and the rear surface 2B. The side surfaces 2E and 2F are the respective end surfaces of the substrate 2 in the short direction. The side surface 2C and the side surface 2D respectively intersect (to be exact, are orthogonal to) both the side surface 2E and the side surface 2F.

With the substrate 2, the entirety of the element forming surface 2A is covered by an insulating film 23. Thus to be exact, the entirety of the element forming surface 2A in FIG. 107A is positioned at the inner sides (rear sides) of the insulating film 23 and is not exposed to the exterior. Further, the insulating film 23 on the element forming surface 2A is covered by a resin film 24. The resin film 24 protrudes from the element forming surface 2A to respective end portions at the element forming surface 2A side (upper end portions in FIG. 107A) of the side surface 2C, the side surface 2D, the side surface 2E, and the side surface 2F. The insulating film 23 and the resin film 24 shall be described in detail later.

With the rectangular parallelepiped substrate 2, intersection portions 11 at which mutually adjacent surfaces among the rear surface 2B, side surface 2C, side surface 2D, side surface 2E, and side surface 2F intersect (corner portions forming the boundaries between mutually adjacent surfaces) are shaped and rounded to chamfered round shapes. Here, at each intersection portion 11, the radius of curvature of the round shape is preferably not more than 20 μm.

All of the bent portions (intersection portions 11) of the outline of the substrate 2 in each of a plan view (bottom view) and side views thus have round shapes. The occurrence of chipping can thus be prevented at the intersection portions 11 (corner portions) of the round shapes during handling and conveying of the chip resistor 1 by gripping of the intersection portions 11. Improvement of yield (improvement of productivity) can thereby be achieved in the manufacture of the chip resistor 1.

The first connection electrode 3 and the second connection electrode 4 are formed on the element forming surface 2A of the substrate 2 and are partially exposed from the resin film 24. Each of the first connection electrode 3 and the second connection electrode 4 is formed by laminating, for example, Ni (nickel), Pd (palladium), and Au (gold) in that order on the element forming surface 2A. The first connection electrode 3 and the second connection electrode 4 are disposed across an interval in the long direction of the element forming surface 2A and are long in the short direction of the element forming surface 2A. In FIG. 107A, the first connection electrode 3 is provided at a position of the element forming surface 2A close to the side surface 2C and the second connection electrode 4 is provided at a position close to the side surface 2D.

The element 5 is a circuit element, is formed in a region of the element forming surface 2A of the substrate 2 between the first connection electrode 3 and the second connection electrode 4, and is covered from above by the insulating film 23 and the resin film 24. The element 5 of the present preferred embodiment is a resistor 56 arranged by a circuit network in which a plurality of thin-film-like resistor bodies (thin film resistor bodies) R, made of TiN (titanium nitride) or TiON (titanium oxide nitride), are arrayed in a matrix on the element forming surface 2A. The element 5 (resistor bodies R) is electrically connected to wiring films 22, to be described below, and is electrically connected to the first connection electrode 3 and the second connection electrode 4 via the wiring films 22. A resistor circuit is thus formed by the element 5 between the first connection electrode 3 and the second connection electrode 4 in the chip resistor 1.

The chip resistor 1 can be mounted on (flip-chip connected to) a circuit substrate 9 by making the first connection electrode 3 and the second connection electrode 4 face the circuit substrate 9 and electrically and mechanically connecting the electrodes to circuits (not shown) of the circuit substrate 9 by solders 13 as shown in FIG. 107B. The first connection electrode 3 and the second connection electrode 4 that function as the external connection electrodes are preferably formed of gold (Au) or has gold plating applied on the surfaces thereof to improve solder wettability and improve reliability.

FIG. 108 is a plan view of the chip resistor and shows the positional relationships of the first connection electrode, the second connection electrode, and the element and shows the arrangement in a plan view of the element. With reference to FIG. 108, the element 5 that is a resistor network has, for example, a total of 352 resistor bodies R arranged from 8 resistor bodies R being arrayed along the row direction (length direction of the substrate 2) and 44 resistor bodies R being arrayed along the column direction (width direction of the substrate 2). The respective resistor bodies R have an equal resistance value. That is, groups of the resistor bodies R (element 5 and resistor 56) are formed from a plurality of resistor bodies R having the same resistance value.

The plurality of resistor bodies R are electrically connected in groups of predetermined numbers of 1 to 64 to form a plurality of types of resistance units (unit resistors). The plurality of types of resistance units thus formed are connected in predetermined modes via connection conductor films C. Further, on the element forming surface 2A of the substrate 2, a plurality of fuse films (fuses) F are provided that electrically incorporate resistance units into the element 5 or are capable of being fused to electrically separate resistance units from the element 5. The plurality of fuse films F and the connection conductor films C are arrayed along the inner side of the second connection electrode 4 so that the positioning regions thereof are rectilinear. More specifically, the plurality of fuse films F and the connection conductor films C are disposed rectilinearly.

FIG. 109A is partially enlarged plan view of the element shown in FIG. 108. FIG. 109B is a vertical sectional view in the length direction taken along B-B of FIG. 109A for describing the arrangement of resistor bodies in the element. FIG. 109C is a vertical sectional view in the width direction taken along C-C of FIG. 109A for describing the arrangement of the resistor bodies in the element. The arrangement of the resistor bodies R shall now be described with reference to FIG. 109A, FIG. 109B, and FIG. 109C.

Besides the wiring films 22, the insulating film 23, and the resin film 24, the chip resistor 1 further includes an insulating layer 20 and resistor body films 21 (see FIG. 109B and FIG. 109C). The insulating layer 20, the resistor body films 21, the wiring films 22, the insulating film 23, and the resin film 24 are formed on the substrate 2 (element forming surface 2A). The insulating layer 20 is made of $SiO_2$ (silicon oxide). The insulating layer 20 covers the entirety of the element forming surface 2A of the substrate 2. The thickness of the insulating layer 20 is approximately 10000 Å. The insulating layer 20 and the insulating film 23 are separate and different objects.

The resistor body films 21 make up the resistor bodies R. The resistor body films 21 are formed of TiN or TiON and are laminated on the top surface of the insulating layer 20. The thickness of each resistor body film 21 is approximately 2000 Å. The resistor body films 21 form a plurality of lines (hereinafter referred to as "resistor body film lines 21A") extending as lines between the first connection electrode 3 and the second connection electrode 4, and there are cases where a resistor body film line 21A is cut at predetermined positions in the line direction (see FIG. 109A).

The wiring films 22 are laminated on the resistor body film lines 21A. The wiring films 22 are made of Al (aluminum) or an alloy (AlCu alloy) of aluminum and Cu (copper). The thickness of each wiring film 22 is approximately 8000 Å. The wiring films 22 are laminated on the resistor body film lines 21A while being spaced apart by fixed intervals R in the line direction. The electrical features of the resistor body film lines 21A and the wiring films 22 are indicated in the form of circuit symbols in FIGS. 110A, 110B, and 110C. That is, as shown in FIG. 110A, each of the resistor body film line 21A portions in regions of the predetermined interval R forms a resistor body R with a fixed resistance value r.

In each region at which the wiring film 22 is laminated, the wiring film 22 electrically connects mutually adjacent resistor bodies R so that the resistor body film line 21A is short-circuited by the wiring film 22. A resistor circuit, made up of serial connections of resistor bodies R of resistance r, is thus formed as shown in FIG. 110B. Also, adjacent resistor body film lines 21A are connected to each other by the resistor body films 21 and wiring films 22, and the resistor network of the element 5 shown in FIG. 109A forms the resistor circuit (made up of the unit resistors of resistor bodies R) shown in FIG. 110C. The resistor body films 21 and the wiring films 22 thus make up the element 5.

Here, based on the characteristic that resistor body films 21 of the same shape with the same size that are formed on the substrate 2 are substantially the same in value, the plurality of resistor bodies R arrayed in a matrix on the substrate 2 have an equal resistance value. Also, the wiring films 22 laminated on the resistor body film lines 21A form the resistor bodies R and also serve the role of connection wiring films that connect a plurality of resistor bodies R to arrange a resistance unit.

FIG. 111A is partially enlarged plan view of a region including the fuse films drawn by enlarging a portion of the plan view of the chip resistor shown in FIG. 108, and FIG. 111B is a structural sectional view taken along B-B in FIG. 111A. As shown in FIGS. 111A and 111B, the fuse films F and the connection conductor films C are also formed by the wiring films 22, which are laminated on the resistor body films 21 that form the resistor bodies R. That is, the fuse films F and the connection conductor films C are formed of Al or AlCu alloy, which is the same metal material as that of the wiring films 22, on the same layer as the wiring films 22, which are laminated on the resistor body film lines 21A that form the resistor bodies R.

That is, on the same layer laminated on the resistor body films 21, the wiring films for forming the resistor bodies R, the fuse films F, the connection conductor films C, and the wiring films for connecting the element 5 to the first connection electrode 3 and the second connection electrode 4 are formed as the wiring films 22 using the same metal material (Al or AlCu alloy). The fuse films F and the wiring films 22 are differed (distinguished) by the fuse films F being formed to be thin so as to be cut easily and by the fuse films F being disposed so that other circuit components are not present in the surroundings thereof.

Here, in the wiring films 22, regions at which the fuse films F are disposed shall be referred to as a trimming region X (see FIG. 108 and FIG. 111A). The trimming region X is a rectilinear region along the inner side of the second connection electrode 4 and not only fuse films F but connection conductor films C are also disposed in the trimming region X. Also, resistor body films 21 are formed below the wiring films 22 in the trimming region X (see FIG. 111B). The fuse films F are wirings that are greater in interwiring distance (are more separated from components in the surroundings) than portions of the wiring films 22 besides the trimming region X.

The fuse film F may refer not only to a portion of the wiring films 22 but may also refer to an assembly (fuse element) of a portion of a resistor body R (resistor body film 21) and a portion of the wiring film 22 on the resistor body film 21. Also, although only a case where the same layer is used for the fuse films F as that used for the connection conductor films C has been described, the connection conductor film C portions may have another conductor film laminated further thereon to decrease the resistance value of the conductor films. Even in this case, the fusing property of the fuse films F is not degraded as long as the conductor film is not laminated on the fuse films F.

FIG. 112 is an electric circuit diagram of the element according to the preferred embodiment of the seventh reference example. Referring to FIG. 112, the element 5 is arranged by serially connecting a reference resistance unit R8, a resistance unit R64, two resistance units R32, a resistance unit R16, a resistance unit R8, a resistance unit R4, a resistance unit R2, a resistance unit R1, a resistance unit R/2, a resistance unit R/4, a resistance unit R/8, a resistance unit R/16, and a resistance unit R/32 in that order from the first connection electrode 3. Each of the reference resistance unit R8 and resistance units R64 to R2 is arranged by serially connecting the same number of resistor bodies R as the number at the end of its symbol ("64" in the case of R64). The resistance unit R1 is arranged from a single resistor body R. Each of the resistance units R/2 to R/32 is arranged by connecting the same number of resistor bodies R as the number at the end of its symbol ("32" in the case of R/32) in parallel. The meaning of the number at the end of the symbol of the resistance unit is the same in FIG. 113 and FIG. 114 to be described below.

One fuse film F is connected in parallel to each of the resistance unit R64 to resistance unit R/32, besides the reference resistance unit R8. The fuse films F are mutually connected in series directly or via the connection conductor film C (see FIG. 111A). In a state where none of the fuse films F is fused as shown in FIG. 112, the element 5 forms a resistor circuit of the reference resistance unit R8 (resistance value: 8r), formed by the serial connection of the 8 resistor bodies R provided between the first connection electrode 3 and the second connection electrode 4. For example, if the resistance value r of a single resistor body R is r=8Ω, the chip resistor 1 is arranged with the first connection electrode 3 and the second connection electrode 4 being connected by a resistor circuit of 8r=64Ω.

Also in the state where none of the fuse films F is fused, the plurality of types of resistance units besides the reference resistance unit R8 are put in short-circuited states. That is, although 13 resistance units R64 to R/32 of 12 types are connected in series to the reference resistance unit R8, each resistance unit is short-circuited by the fuse film F that is connected in parallel and thus electrically, the respective resistance units are not incorporated in the element 5.

With the chip resistor 1 according to the present preferred embodiment, a fuse film F is selectively fused, for example, by laser light in accordance with the required resistance value. The resistance unit with which the fuse film F connected in parallel is fused is thereby incorporated into the element 5. The overall resistance value of the element 5 can thus be set to the resistance value resulting from serially connecting and incorporating the resistance units corresponding to the fused fuse films F.

In particular, the plurality of types of resistance units include the plurality of types of serial resistance units, with which the resistor bodies R having the equal resistance value are connected in series with the number of resistor bodies R being increased in geometric progression as 1, 2, 4, 8, 16, 32, . . . , and the plurality of types of parallel resistance units, with which the resistor bodies R having the equal resistance value are connected in parallel with the number of resistor bodies R being increased in geometric progression as 2, 4, 8, 16, . . . . Therefore by selectively fusing the fuse films F (including the fuse elements), the resistance value of the element 5 (resistor 56) as a whole can be adjusted finely and digitally to an arbitrary resistance value to enable a resistance of a desired value to be formed in the chip resistor 1.

FIG. 113 is an electric circuit diagram of an element according to another preferred embodiment of the seventh reference example. Instead of arranging the element 5 by serially connecting the reference resistance unit R/16 and the resistance unit R64 to the resistance unit R/32 as described above, the element 5 may be arranged as shown in FIG. 113. To be detailed, the element 5 may be arranged, between the first connection electrode 3 and the second connection electrode 4, as a serial connection circuit of the reference resistance unit R/16 and the parallel connection circuit of the 12 types of resistance units R/16, R/8, R/4, R/2, R1, R2, R4, R8, R16, R32, R64, and R128.

In this case, a fuse film F is serially connected to each of the 12 types of resistance units besides the reference resistance unit R/16. In a state where none of the fuse films F is fused, the respective resistance units are electrically incorporated in the element 5. By selectively fusing a fuse film F, for example, by laser light in accordance with the required resistance value, the resistance unit corresponding to the fused fuse film F (the resistance unit connected in series to the fuse film F) is electrically separated from the element 5 and the resistance value of the chip resistor 1 as a whole can thereby be adjusted.

FIG. 114 is an electric circuit diagram of an element according to yet another preferred embodiment of the seventh reference example. A feature of the element 5 shown in FIG. 114 is that it has the circuit arrangement where a serial connection of a plurality of types of resistance units and a parallel connection of a plurality of types of resistance units are connected in series. As in a previous preferred embodiment, with the plurality of types of resistance units connected in series, a fuse film F is connected in parallel to each resistance unit and all of the plurality of types of resistance units that are connected in series are put in short-circuited states by the fuse films F. Therefore, when a fuse film F is fused, the resistance unit that was short-circuited by the fused fuse film F is electrically incorporated into the element 5.

On the other hand, a fuse film F is connected in series to each of the plurality of types of resistance units that are connected in parallel. Therefore by fusing a fuse film F, the resistance unit connected in series to the fused fuse film F can be electrically disconnected from the parallel connection of resistance units. With this arrangement, for example, by forming a low resistance of not more than 1 kΩ at the parallel connection side and forming a resistor circuit of not less than 1 kΩ at the serial connection side, resistor circuits of a wide range, from a low resistance of several Ω to a high resistance of several MΩ, can be formed using the resistor networks arranged with equal basic designs.

With the chip resistor 1, the connection states of the plurality of resistor bodies R (resistance units) in the trimming region X can be changed as described above. FIG. 115 is a schematic sectional view of the chip resistor. The chip resistor 1 shall now be described in further detail with reference to FIG. 115. For the sake of description, the element 5 is illustrated in a simplified form and hatching is applied to respective elements besides the substrate 2 in FIG. 115.

Here, the insulating film 23 and the resin film 24 shall be described. The insulating film 23 is made, for example, from SiN (silicon nitride) and the thickness thereof is 1000 Å to 5000 Å (approximately 3000 Å in the present case). The insulating film 23 is provided across the entirety of the element forming surface 2A, covers the resistor body films 21 and the respective wiring films 22 on the resistor body films 21 (that is, the element 5) from the top surface (upper side in FIG. 115), and covers the upper surfaces of the respective resistor bodies R in the element 5. The insulating film 23 thus covers the wiring films 22 in the trimming region X as well (see FIG. 111B). Also, the insulating film 23 contacts the element 5 (the wiring films 22 and the resistor body films 21) and also contacts the insulating layer 20 in regions besides the resistor body films 21. The insulating film 23 thus functions as a protective film that covers the entirety of the element forming surface 2A and protects the element 5 and the insulating layer 20.

Also, short-circuiting across the resistor bodies R (short-circuiting across adjacent resistor body film lines 21A) at portions besides the wiring films 22 is prevented by the insulating film 23. The top surface of an end portion 23A of the insulating film 23 that is positioned at edges of the element forming surface 2A are curved so as to bulge toward the sides (outward of the chip resistor 1 (substrate 2) in directions along the element forming surface 2A).

Although not illustrated, the insulating film may also cover boundary portions of the respective side surfaces 2C to 2F with respect to the element forming surface 2A and portions of the insulating layer 20 that are exposed to the side surfaces 2C to 2F. The resin film 24, together with the insulating film 23, protects the element forming surface 2A of the chip resistor 1 and is made of a resin, such as polyimide, etc. The thickness of the resin film 24 is approximately 5 μm. The resin film 24 covers the top surface of the insulating film 23 (including the resistor bodies 21 and the wiring films 22 covered by the insulating film 23) across its entirety, covers the boundary portions (upper end portions in FIG. 115) of the respective side surfaces 2C to 2F with respect to the element forming surface 2A, and portions of the insulating layer 20 that are exposed to the side surfaces 2C to 2F. Therefore, at the four side surfaces 2C to 2F, portions at the side (lower side in FIG. 115) opposite to the element forming surface 2A are left exposed to the exterior as outer surfaces of the chip resistor 1.

The thin-film resistor bodies R and the wiring films 22 (element forming surface 2A) can be protected in double by the insulating film 23 and the resin film 24 because the insulating film 23 covers the resistor body films 21 (thin-film resistor bodies R) and the wiring films 22 and the resin film 24 covers the top surface of the insulating film 23 as described above. Further, attachment of foreign matter to the thin-film resistor bodies R and the wiring films 22 is prevented by the insulating film 23 and the resin film 24 and short-circuiting at the thin-film resistor bodies R and the wiring films 22 can thereby be prevented.

With the resin film 24, the portion coinciding with the four side surfaces 2C to 2F in a plan view is an arcuate bulging portion 24A that bulges further to the sides (outward) of the substrate 2 than these side surfaces. That is, the resin film 24 (bulging portion 24A) protrudes beyond the side surfaces 2C to 2F (corresponding side surfaces) at the side surfaces 2C to 2F. Such a resin film 24 has side surfaces 24B of round shapes that project to the sides at the arcuate bulging portion 24A.

Here, at intersection portions 27 forming the boundaries between the element forming surface 2A and the respective side surfaces 2C to 2F, the element forming surface 2A intersect with the respective side surfaces 2C to 2F, and the intersection portions 27 have square shapes differing from the round shapes (round shapes of the intersection portions 11) mentioned above. The bulging portion 24A covers the respective intersection portions 27. In this case, the occurrence of chipping at the intersection portions 27 can be prevented by the resin film 24. Also, the bulging portion 24A bulges further outward (outward of the substrate 2 in directions along the element forming surface 2A) than the side surfaces 2C to 2F at the intersection portions 27, and therefore, when the chip resistor 1 contacts an object in the surroundings, the bulging portion 24A contacts the object in the surroundings first and relaxes the impact due to the contact to prevent the impact from being applied to the element 5, etc. In particular, the bulging portion 24A has side surfaces 24B with round shapes and can thus relax the impact due to contact smoothly.

Also, at the side surfaces 2C to 2F, the resin film 24 is provided at regions separated toward the intersection portion 27 sides (toward the element forming surface 2A side from the rear surface 2B). However, an arrangement where the resin film 24 does not cover the side surfaces 2C to 2F at all (an arrangement where the entireties of the side surfaces 2C to 2F are exposed) is also possible. In the resin film 24, openings 25 are formed, one at each of two positions that are separated in a plan view. Each opening 25 is a penetrating hole penetrating continuously through each of the resin film 24 and the insulating film 23 in the thickness direction. The openings 25 are thus formed not only in the resin film 24 but also in the insulating film 23. Portions of wiring films 22 are exposed at the respective openings 25. The portions of the wiring films 22 exposed at the respective openings 25 are pad regions 22A for external connection.

Of the two openings 25, one opening 25 is completely filled by the first connection electrode 3 and the other opening 25 is completely filled by the second connection electrode 4. A portion of each of the first connection electrode 3 and the second connection electrode 4 protrudes from the opening 25 at the top surface of the resin film 24. The first connection electrode 3 is electrically connected via the one opening 25 to the wiring film 22 at the pad region 22A in this opening 25. The second connection electrode 4 is electrically connected via the other opening 25 to the wiring film 22 at the pad region 22A in this opening 25. The first connection electrode 3 and the second connection electrode 4 are thereby electrically connected to the element 5. Here, the wiring films 22 form wirings that are respectively connected to groups of resistor bodies R (resistor 56) and the first connection electrode 3 and the second connection electrode 4.

The resin film 24 and the insulating film 23, in which the openings 25 are formed, are thus formed so that the first connection electrode 3 and the second connection electrode 4 are exposed from the openings 25. Electrical connection between the chip resistor 1 and the circuit substrate 9 can thus be achieved via the first connection electrode 3 and the second connection electrode 4 protruding from the openings 25 at the top surface of the resin film 24 (see FIG. 107B).

FIG. 116A to FIG. 116F are illustrative sectional views of a method for manufacturing the chip resistor shown in FIG. 115. First, as shown in FIG. 116A, a substrate 30 that is to be the base for the substrate 2 is prepared. A top surface 30A of the substrate 30 is thus the element forming surface 2A of the substrate 2 and a rear surface 30B of the substrate 30 is the rear surface 2B of the substrate 2.

The insulating layer 20, made of $SiO_2$, etc., is then formed on the top surface 30A of the substrate 30, and the element 5 (the resistor bodies R and the wiring films 22 connected to the resistor bodies R) is formed on the insulating layer 20. Specifically, first, the resistor body film 21 of TiN or TiON is formed by sputtering on the entire surface of the insulating layer 20 and further, the wiring film 22 of aluminum (Al) is laminated on the resistor body film 21. Thereafter, a photolithography process is used and, for example, dry etching is performed to selectively remove the resistor body film 21 and the wiring film 22 to obtain the arrangement where, as shown in FIG. 109A, the resistor body film lines 21A of fixed width, at which the resistor body film 21 is laminated, are arrayed in the column direction while being spaced apart by fixed intervals in a plan view. At this point, regions at which the resistor body film lines 21A and the wiring films 22 are interrupted are formed and the fuse films F and the connection conductor films C are formed in the trimming region X (see FIG. 108). The wiring films 22 laminated on the resistor body film lines 21A are then removed selectively. The element 5 of the arrangement where the wiring films 22 are laminated on the resistor body film lines 21A while being spaced apart by the fixed intervals R is consequently obtained.

With reference to FIG. 116A, the elements 5 are formed on a plurality of locations on the top surface 30A of the substrate 30 in accordance with the number of chip resistors 1 to be formed on the single substrate 30. If a single region of the substrate 30 in which an element 5 (the resistor 56) is formed is referred to as a chip resistor region Y, a plurality of chip resistor regions Y (in other words, elements 5), each having the resistor 56, are formed on the top surface 30A of the substrate 30. On the top surface 30A of the substrate 30, a region between adjacent chip resistor regions Y shall be referred to as a boundary region Z.

Then as shown in FIG. 116A, an insulating film (CVD insulating film) 45 made of SiN is formed on the entirety of the top surface 30A of the substrate 30 by a CVD (chemical vapor deposition) method. The formed CVD insulating film 45 has a thickness of 1000 Å to 5000 Å (approximately 3000 Å in the present example). The CVD insulating film 45 contacts and covers all of the insulating layer 20 and the elements 5 (resistor body films 21 and wiring films 22) on the insulating layer 20. The CVD insulating film 45 thus also covers the wiring films 22 in the trimming regions X (see FIG. 108). Also, the CVD insulating film 45 is formed across the entirety of the top surface 30A of the substrate 30 and is thus formed to extend to regions besides the trimming regions X on the top surface 30A. The CVD insulating film 45 is thus a protective film that protects the entirety of the top surface 30A (including the elements 5 on the top surface 30A).

Then as shown in FIG. 116B, a resist pattern 41 is formed across the entirety of the top surface 30A of the substrate 30 so as to cover the entirety of the CVD insulating film 45. An opening 42 is formed in the resist pattern 41. FIG. 117 is a schematic plan view of a portion of the resist pattern used for forming a groove in the step of FIG. 116B.

Referring to FIG. 117, the opening 42 of the resist pattern 41 coincides with regions (hatched portions in FIG. 117, in other words, the boundary Z) between outlines of mutually adjacent chip resistors 1 in a plan view in a case where a plurality of chip resistors 1 (in other words, the chip resistor regions Y) are disposed in an array (that is also a lattice). The overall shape of the opening 42 is thus a lattice having a plurality of mutually orthogonal rectilinear portions 42A and 42B.

In the resist pattern 41, the rectilinear portions 42A and 42B that mutually intersect in the opening 42 are connected while being maintained in mutually orthogonal states (without curving). Intersection portions 43 of the rectilinear portions 42A and 42B are thus pointed and form angles of substantially 90° in a plan view. Referring to FIG. 116B, the CVD insulating film 45, the insulating layer 20 and the substrate 30 are respectively removed selectively by plasma etching using the resist pattern 41 as a mask. The material of the substrate 30 is thereby removed in the boundary region Z between adjacent elements 5 (chip resistor regions Y). Consequently, a groove 44, penetrating through the CVD insulating film 45 and the insulating layer 20 and reaching the middle of the thickness of the substrate 30, is thereby formed at positions (boundary region Z) coinciding with the opening 42 of the resist pattern 41 in a plan view. The groove 44 has mutually facing side surfaces 44A and a bottom surface 44B joining the lower ends (ends at the rear surface 30B side of the substrate 30) of the facing side surfaces 44A. The depth of the groove 44 on the basis of the top surface 30A of the substrate 30 is approximately 100 μm and the width of the groove 44 (interval between facing side surfaces 44A) is approximately 20 μm.

FIG. 118A is a schematic plan view of the substrate after the groove has been formed in the step of FIG. 116B, and FIG. 118B is an enlarged view of a portion in FIG. 118A. Referring to FIG. 118B, the overall shape of the groove 44 is a lattice that coincides with the opening 42 (see FIG. 117) of the resist pattern 41 in a plan view. At the top surface 30A of the substrate 30, rectangular frame portions (boundary region Z) of the groove 44 surround the chip resistor regions Y in which the respective elements 5 are formed. In the substrate 30, each portion in which the element 5 is formed is a semi-finished product 50 of the chip resistor 1. At the top surface 30A of the substrate 30, one semi-finished product 50 is positioned in each chip register region Y surrounded by the groove 44, and these semi-finished products 50 are arrayed and disposed in an array.

In accordance with the pointed intersection portions 43 (see FIG. 117) in the opening 42 of the resist pattern 41, corner portions 60 (corresponding to the intersection portions 11 of the chip resistor 1) of the semi-finished products 50 are pointed and form substantially right angles in a plan view. After the groove 44 has been formed as shown in FIG. 116B, the resist pattern 41 is removed, and by etching using a mask 65, the CVD insulating film 45 is removed selectively as shown in FIG. 116C. With the mask 65, openings 66 are formed at portions of the CVD insulating film 45 coinciding with the respective pad regions 22A (see FIG. 115) in a plan view. Portions of the CVD insulating film 45 coinciding with the openings 66 are thereby removed by the etching and the openings 25 are formed at these portions. The CVD insulating film 45 is thus formed so that the respective pad regions 22A are exposed in the openings 25. Two openings 25 are formed per single semi-finished product 50.

FIG. 119A is a schematic sectional view of the chip resistor according to the preferred embodiment of the seventh reference example in the middle of manufacture. FIG. 119B is a schematic sectional view of a chip resistor according to a comparative example in the middle of manufacture. With each semi-finished product 50, after the two openings 25 have been formed in the CVD insulating film 45 as shown in FIG. 116C, probes 70 of a resistance measuring apparatus (not shown) are put in contact with the pad regions 22A in the respective openings 25 to detect the resistance value of the element 5 as a whole. Then as shown in FIG. 119A, laser light L is irradiated onto an arbitrary fuse film F via the CVD insulating film 45 to trim the wiring film 22 in the trimming region X by the laser light L and thereby fuse the corresponding fuse film F. The fused fuse film F is the portion of the wiring film 22 in the trimming region X that is trimmed (fused). By thus fusing (trimming) the fuse films F so that the required resistance value is attained, the resistance value of the semi-finished product 50 (in other words, the chip resistor 1) as a whole can be adjusted.

The power (energy) of the laser light L in the present preferred embodiment is 1.2 μJ to 2.7 μH, and the spot diameter of the laser light L is 3 μm to 5 μm. Also, when the laser light L is transmitted through the CVD insulating film 45, the portion of the CVD insulating film 45 through which the laser light L was transmitted is cut, and at the location at which the wiring film 22 is fused, the resistor body film 21 is also fused and a portion of the insulating layer 20 is trimmed together with the wiring film 22.

As mentioned above, the entirety of the wiring films 22 making up the fuse films F is covered by the CVD insulating film 45. The laser light L irradiated onto a wiring film 22 in the trimming region X thus arrives at the wiring film 22 (fuse film F) upon being transmitted through the CVD insulating film 45 in the trimming region X. The energy of the laser light L is thereby made to concentrate (accumulate) efficiently on the fuse film F and the fuse film F can thus be fused (laser-trimmed) reliably and rapidly by the laser light L. Also, by the CVD insulating film 45 being in contact with the wiring film 22 and the wiring film 22 thus being covered reliably by the CVD insulating film 45, the energy of the laser light can be concentrated on the wiring film 22 efficiently to effectively realize reliable trimming of the wiring film 22.

Also, the wiring film 22 is covered by the CVD insulating film 45 and therefore even if a fragment is formed by the laser trimming, the fragment will not become a foreign object 68 that contacts the wiring film 22 (element 5) to cause short-circuiting. That is, short-circuiting due to trimming can be prevented. By the above, in regard to the fusing of the fuse films F (in other words, the trimming of the wiring films 22 in the fuse films F), the fusing property is improved, the yield is improved, and improvement of productivity of the chip resistor 1 can thus be achieved.

Here, the CVD insulating film 45 is formed as a film by the CVD method and therefore in comparison to a case where the same material as the CVD insulating film 45 is formed as a film on the wiring film 22 by being pasted on, the film quality of the CVD insulating film 45 (in particular, the CVD insulating film 45 in the entirety of the trimming region X) can be stabilized. The wiring films 22 can thereby be covered without omission by the CVD insulating film 45. Reliable trimming of the wiring films 22 can thus be realized at any portion of the trimming region X. That is, by use of such a CVD insulating film 45, improvement of the fusing property of the fuse films F and improvement of yield can be achieved reliably.

Also, as mentioned above, the CVD insulating film 45 preferably has a thickness of 1000 Å to 5000 Å. In this case, the energy of the laser light can be concentrated reliably on the wiring films 22 to effectively realize reliable trimming of the wiring films 22. When the CVD insulating film 45 is thinner than 1000 Å, the effect of concentrating the energy of the laser light L efficiently on the fuse films F is reduced. Oppositely, when the CVD insulating film 45 is thicker than 5000 Å, it becomes difficult to cut the CVD insulating film 45 by the laser light L and it thus becomes difficult to fuse (trim) the fuse films F.

Also, the silicon nitride formation temperature of the CVD insulating film 45 in the CVD process is lower than the melting temperature of Al or the AlCu alloy of the wiring films 22 and the CVD insulating film 45 can thus be formed on the wiring films 22 without melting the wiring films 22. Oppositely, if the CVD insulating film 45 is made of $SiO_2$ (silicon oxide), the formation temperature of $SiO_2$ is higher than the melting temperature of Al or the AlCu alloy and therefore the wiring films 22 will melt during formation of the CVD insulating film 45 and the CVD insulating film 45 cannot be formed on the wiring films 22.

In the case of the comparative example, where, unlike in the seventh reference example, the wiring films 22 are exposed without being covered by the CVD insulating film 45 as shown in FIG. 119B, the energy of the laser light L cannot concentrate (accumulate) in the fuse film F and disperses in the surroundings of the fuse film F. To be detailed, the energy of the laser light L is reflected at the top surface of the wiring film 22, is dispersed inside the wiring film 22, and is absorbed by the resistor body film 21 and the insulating layer 20. It is thus difficult to reliably fuse the fuse film F by the laser light L and the fusing takes time. Further, there is a problem in that the foreign object 68 may become attached to the element 5 and cause short-circuiting in the element 5 because the wiring films 22 (element 5) are bare.

After the resistance value of the semi-finished product 50 as a whole has been adjusted as described above, a photosensitive resin sheet 46, made of polyimide, is adhered onto the substrate 30 from above the CVD insulating film 45 as shown in FIG. 116D. FIGS. 120A and 120B are illustrative perspective views of states of adhering the polyimide sheet onto the substrate in the step of FIG. 116D.

Specifically, after covering the substrate 30 (to be accurate, the CVD insulating film 45 on the substrate 30) with the polyimide sheet 46 from the top surface 30A side as shown in FIG. 120A, the sheet 46 is pressed against the substrate 30 by a rotating roller 47 as shown in FIG. 120B. When the sheet 46 has been adhered on the entirety of the top surface of the CVD insulating film 45 as shown in FIG. 116D, although portions of the sheet 46 are slightly indented toward the groove 44 side, only portions at the element 5 side (top surface 30A side) of the side surfaces 44A of the groove 44 are covered and the sheet 46 does not reach the bottom surface 44B of the groove 44. A space S of substantially the same size as the groove 44 is thus formed inside the groove 44 between the sheet 46 and the bottom surface 44B of the groove 44. The thickness of the sheet 46 in this state is 10 μm to 30 μm. Also, portions of the sheet 46 enter into the respective openings 25 in the CVD insulating film 45 and close the openings 25.

Thereafter, a heat treatment is applied to the sheet 46. The thickness of the sheet 46 is thereby thermally contracted to approximately 5 μm. Thereafter, as shown in FIG. 116E, the sheet 46 is patterned and portions of the sheet 46 coinciding with the groove 44 and the respective pad regions 22A (openings 25) of the wiring films 22 in a plan view are selectively removed. Specifically, a mask 62, having formed therein openings 61 of a pattern matching (coinciding with) the groove 44 and the respective pad regions 22A in a plan view, is used and the sheet 46 is exposed and developed with this pattern. The sheet 46 is thereby separated at portions above the groove 44 and the respective pad regions 22A and separated edge portions of the sheet 46 droop slightly toward the groove 44 to overlap with the side surfaces 44A of the groove 44 so that the bulging portion 24A (having the side surfaces 24B of round shapes) is formed naturally at the edge portions. By the forming of the bulging portion 24A, the intersection portions 27 are covered by the sheet 46.

Also at this point, the portions of the sheet 46 that entered into the respective openings 25 of the CVD insulating film 45 are also removed and the openings 25 are opened. Ni/Pd/Au laminated films, arranged by laminating Ni, Pd, and Au, are then formed by electroless plating on the pad regions 22A in the respective openings 25. In this process, the Ni/Pd/Au laminated films are formed so as to protrude onto the top surface of the sheet 46 from the openings 25. The Ni/Pd/Au laminated films inside the respective openings 25 thus become the first connection electrode 3 and the second connection electrode 4 shown in FIG. 116F.

Then after performing a conduction test across the first connection electrode 3 and the second connection electrode 4, the substrate 30 is ground from the rear surface 30B. Specifically, after the groove 44 has been formed, a thin, plate-like supporting base material 71, made of PET (polyethylene terephthalate), is adhered onto the first connection electrode 3 and second connection electrode 4 side (that is, the element forming surface 2A) of each semi-finished product 50 via an adhesive 72 as shown in FIG. 116G, and the respective semi-finished products 50 are thereby supported by the supporting base material 71. Here, for example, a laminated sheet may be used as the supporting base material 71 that is made integral with the adhesive 72.

In the state where the respective semi-finished products 50 are supported by the supporting base material 71, the substrate 30 is ground from the rear surface 30B. When the substrate 30 has been thinned by grinding to the bottom surface 44B (see FIG. 116F) of the groove 44, portions joining mutually adjacent semi-finished products 50 are no longer present and the substrate 30 is thus divided with the groove 44 as boundaries and the semi-finished products 50 are separated individually. That is, the substrate 30 is cut (divided) at the groove 44 (in other words, the boundary region Z) and the individual semi-finished products 50 are thereby cut out.

Thereafter, the rear surface 30B of the substrate 30 in each semi-finished product 50 is polished to a mirror surface. With each semi-finished product 50, each portion that formed a side surface 44A of the groove 44 becomes one of the side surfaces 2C to 2F of the substrate 2 in the chip resistor 1 and the rear surface 30B becomes the rear surface 2B. That is, the step of forming the groove 44 (see FIG. 116B) is included in the step of forming the side surfaces 2C to 2F. The CVD insulating film 45 becomes the insulating film 23. Also, the separated sheet 46 becomes the resin film 24.

Even if the chip resistors 1 are small in chip size, the semi-finished products 50 (chip resistors 1) can be separated into individual chips by thus forming the groove 44 in advance and then grinding the substrate 30 from the rear surface 30B. Therefore in comparison to the conventional case where the substrate 30 is diced using a dicing saw to separate the chip resistors 1 into individual chips, the dicing step can be eliminated to promote cost reduction and time savings and achieve improvement of yield.

FIG. 121 is an illustrative perspective view of semi-finished chip resistor products immediately after the step of FIG. 116D. In the state immediately after separating the semi-finished products 50 individually, the respective semi-finished products 50 are still attached to the supporting base material 71 and are supported by the supporting base material 71 as shown in FIG. 121. In this state, with each semi-finished product 50, the rear surface 30B (rear surface 2B) side is exposed from the supporting base material 71. As shown in the enlarged view of a portion surrounded by a broken-line circle in FIG. 121, with each semi-finished product 50, the intersection portions 11 of mutually adjacent surfaces among the rear surface 2B, side surface 2C, side surface 2D, side surface 2E, and side surface 2F are pointed and form substantially right angles.

FIG. 122 is a first schematic view of a step subsequent to that of FIG. 116G. FIG. 123 is a second schematic view of the step subsequent to that of FIG. 116G. Referring to FIG. 122, after separation into the individual semi-finished products 50 by grinding from the rear surface 30B as described above, a rotating shaft 75 is coupled to a center-of-gravity position at a side surface (lower side surface in FIG. 122) of the supporting base material 71 at the side opposite to the side on which the semi-finished products 50 are attached. The rotating shaft 75 can be rotated around its axis in both a clockwise direction CW and a counterclockwise direction CCW by receiving a driving force from an unillustrated motor (not shown). The supporting base material 71, in the state of supporting the semi-finished products 50, rotates together (rotates integrally) with the rotating shaft 75 within a plane lying along the rear surfaces 30B of the semi-finished products 50.

An etching nozzle 76 is then disposed to face the side of the supporting base material 71 on which the semi-finished products 50 are attached. The etching nozzle 76 has, for example, a tubular shape that extends in parallel to the supporting base material 71 and has a supply port 77 formed at a position facing the semi-finished products 50. The etching nozzle 76 is connected to a tank (not shown) filled with a chemical liquid, etc. With reference to FIG. 123, the etching nozzle 76 is swingable around a side opposite to the supply port 77 side as a pivot P in a state of being parallel to the supporting base material 71 as indicated by the broken-line arrows. The rotating shaft 75 and the etching nozzle 76 form a portion of a spin etcher 80.

After the semi-finished products 50 have been separated individually and the rear surfaces 30B have been polished, the supporting base material 71 is rotated in either or both of the clockwise direction CW and counterclockwise direction CCW in a predetermined pattern and the etching nozzle 76 swings. In this state, an etching agent (etching liquid) is sprayed uniformly on the rear surface 2B sides of the respective semi-finished products 50 supported by the supporting base material 71 from the supply port 77 of the etching nozzle 76. The respective semi-finished products 50 supported by the supporting base material 71 are thereby chemically etched (wet etched) isotropically from the rear surface 2B side. In particular, with each semi-finished product 50, the intersection portions 11 of mutually adjacent surfaces among the rear surface 2B, side surface 2C, side surface 2D, side surface 2E, and side surface 2F are etched isotropically. If the intersection portions 11 before etching are pointed (see FIG. 121), the corners of the respective intersection portions 11 are made easy to grind due to crystal defects, etc., associated with the etching, and eventually, the intersection portions 11 are shaped to round shapes by the isotropic etching (see the enlarged portion surrounded by the broken-line circle in FIG. 123). Also, the isotropic etching is executed in a state of rotating the supporting base material 71, the etching agent is thus sprayed uniformly on the intersection portions 11 of the respective semi-finished products 50, and the intersection portions 11 of the respective semi-finished products 50 can thus be shaped to round shapes uniformly. Further, the isotropic etching is executed on the plurality of semi-finished products 50 (chip resistors 1) that are supported by the supporting base material 71. The intersection portions 11 of the respective semi-finished products 50 can thus be shaped to round shapes in the plurality of semi-finished products 50 at once.

Also, preferably in the process of isotropic etching, the etching liquid is discharged (sprayed) as a mist toward the rear surface 2B sides of the respective semi-finished products 50. Although if the etching liquid remains in the liquid state, not only the intersection portions 11 but the rear surface 2B, side surface 2C, side surface 2D, side surface 2E, and side surface 2F are also etched, when the etching liquid is discharged onto the semi-finished products 50 in the state of a mist, the etching liquid in the mist form readily deposits on the intersection portions 11 so that the intersection portions 11 are etched with priority and the respective intersection portions 11 can thus be shaped to round shapes while suppressing the etching of the rear surface 2B, side surface 2C, side surface 2D, side surface 2E, and side surface 2F.

When the respective intersection portions 11 have become rounded, the etching treatment is ended and the chip resistors 1 (see FIG. 115) are completed. Thereafter, a rinse liquid (water) is sprayed onto the chip resistors 1 from the etching nozzle 76 to perform washing of the chip resistors 1. The supporting base material 71 may be rotated and the etching nozzle 76 may be swung in this process. After washing, the chip resistors 1 are peeled from the supporting base material 71 and, for example, mounted on the circuit substrate 9 (see FIG. 107B).

Although the etching liquid here may be either acidic or alkaline, use of an acidic etching liquid is preferable when performing isotropic etching of the intersection portions 11. If an alkaline etching liquid is used, the intersection portions 11 are etched anisotropically and more time is required to make the respective intersection portions 11 round in comparison to the case of using an acidic etching solution. As an example of an acidic etching solution, a mixture of $H_2SO_4$ (sulfuric acid) and $CH_3COOH$ (acetic acid) in a base liquid of HF (hydrofluoric acid) and $HNO_3$ (nitric acid) is used. With this etching liquid, the viscosity is adjusted by the sulfuric acid and the etching rate is adjusted by the acetic acid.

Although a preferred embodiment of the seventh reference example has been described above, the seventh reference example may be implemented in yet other modes. For example, in dividing the substrate 30 into the individual chip resistors 1, the substrate 30 is ground to the bottom surface 44B of the groove 44 from the rear surface 30B side (see FIG. 116F). Instead, the substrate 30 may be divided into the individual chip resistors 1 by selectively removing by etching portions of the substrate 30 coinciding in a plan view with the groove 44 from the rear surface 30B. Also, the substrate 30 may be diced using a dicing blade (not shown) and thereby divided into the individual chip resistors 1.

Also, the chip resistor 1 (first connection electrode 3, second connection electrode 4, element 5, etc.) may be formed on the substrate 2 using a semiconductor manufacturing process and in this case, the substrate 2 and the substrate 30 may be a substrate made of Si (silicon).

DESCRIPTION OF THE SYMBOLS

10, 30 . . . chip resistor 11 . . . substrate 12 . . . first connection electrode 13 . . . second connection electrode 14 . . . resistor network 20 . . . resistor body film 21 . . . conductor film (wiring film) R . . . resistor body F . . . fuse film C . . . connection conductor film

What is claimed is:

1. A chip resistor comprising:

a substrate;

a first connection electrode and a second connection electrode formed on the substrate; and a resistor network formed on the substrate and having one end side connected to the first connection electrode and another end side connected to the second connection electrode, and wherein the resistor network includes:

a plurality of resistor body films arrayed in a matrix on the substrate and having an equal resistance value;

connection wiring films electrically connecting the resistor body films;

a plurality of types of resistance units each arranged from one or a plurality of connection films being connected electrically by the connection wiring films;

network connection wiring films connecting the plurality of types of resistance units in predetermined modes; and a plurality of fuse films respectively provided in correspondence to each individual resistance unit, the plurality of fuse films electrically incorporating a resistance unit into the resistor network or being fused to electrically separate a resistance unit from the resistor network, and at least a portion of the connection wiring films has a laminated wiring structure including a first wiring layer laminated on the resistor body film and a second wiring layer laminated on the first wiring film.

2. The chip resistor according to claim 1, wherein the resistor body films include:

a resistor body film line extending on the substrate and the wiring films laminated on the resistor body film line while being spaced apart by predetermined intervals in the line direction, and a single resistor body film is arranged from the resistor body film line of the fixed interval portion on which the wiring film is not laminated.

3. The chip resistor according to claim 2, wherein the wiring films partitioning the resistor body films, the connection wiring films included in the resistance units, the network connection wiring films, and the fuse films include metal films of the same material formed on the same layer.

4. The chip resistor according to claim 1, wherein the resistance units include a resistance unit with which a plurality of the resistor body films are connected in series.

5. The chip resistor according to claim 1, wherein the resistance units include a resistance unit with which a plurality of the resistor body films are connected in parallel.

6. The chip resistor according to claim 5, wherein the parallel connection of resistor body films include a comb-shaped portion, with which the wiring films take on a comb-like form, and the comb-shaped portion has the laminated wiring structure.

7. The chip resistor according to claim 1, wherein, with the plurality of types of resistance units, the numbers of resistor body films connected are set and the resistance values form a geometric progression with respect to each other.

8. The chip resistor according to claim 1, wherein the network connection wiring films include connection wiring films connecting the plurality of types of resistance units in series.

9. The chip resistor according to claim 1, wherein the network connection wiring films include connection wiring films connecting the plurality of types of resistance units in parallel.

10. The chip resistor according to claim 9, wherein the network connection wiring films connecting the plurality of types of resistance units in parallel include a comb-shaped portion and the comb-shaped portion has the laminated wiring structure.

11. An electronic device comprising:

a substrate;

a first connection electrode and a second connection electrode formed on the substrate; and a resistor network formed on the substrate, the resistor network having a plurality of resistor bodies connected each other by a wiring film which has one end side connected to the first connection electrode and another end side connected to the second connection electrode; and a plurality of fuse films electrically incorporating the resistor bodies into the resistor network or being fused to electrically separate the resistor bodies from the resistor network, and wherein at least a portion of the wiring films includes a first wiring layer laminated on the resistor body film and a second wiring layer laminated on the first wiring film, and the fuse films have a laminated wiring structure made of only the first wiring film or only the second wiring film.

12. The electronic device according to claim 11, wherein the resistor bodies are made of TiON or TiSiON.

13. The electronic device according to claim 11, wherein the resistor bodies and the wiring films are patterned collectively.

* * * * *